US012136639B2

(12) United States Patent
Ohura et al.

(10) Patent No.: US 12,136,639 B2
(45) Date of Patent: Nov. 5, 2024

(54) IMAGING ELEMENT AND ELECTRONIC EQUIPMENT

(71) Applicant: SONY SEMICONDUCTOR SOLUTIONS CORPORATION, Kanagawa (JP)

(72) Inventors: Masashi Ohura, Kanagawa (JP); Yusuke Kohyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 386 days.

(21) Appl. No.: 17/289,817

(22) PCT Filed: Oct. 24, 2019

(86) PCT No.: PCT/JP2019/041608
§ 371 (c)(1),
(2) Date: Apr. 29, 2021

(87) PCT Pub. No.: WO2020/095689
PCT Pub. Date: May 14, 2020

(65) Prior Publication Data

US 2021/0399029 A1 Dec. 23, 2021

(30) Foreign Application Priority Data

Nov. 6, 2018 (JP) ................................ 2018-208679
Jun. 26, 2019 (JP) ................................ 2019-118399

(51) Int. Cl.
*H01L 27/146* (2006.01)

(52) U.S. Cl.
CPC .... *H01L 27/1463* (2013.01); *H01L 27/14623* (2013.01); *H01L 27/14627* (2013.01); *H01L 27/14643* (2013.01); *H01L 27/14683* (2013.01)

(58) Field of Classification Search
CPC ... H01L 21/768; H01L 21/31; H01L 21/2007; H01L 21/76898; H01L 21/76224;
(Continued)

(56) References Cited

U.S. PATENT DOCUMENTS 8,637,910 B2 * 1/2014 Koo .................... H01L 27/1463
257/292
8,692,303 B2 * 4/2014 Ohri .................... H04N 25/622
257/292
(Continued)

FOREIGN PATENT DOCUMENTS

CN 101556964 A 10/2009
CN 101998070 A 3/2011
(Continued)

OTHER PUBLICATIONS

W.F. List, Solid-state imaging—Methods of approach, Apr. 1968, IEEE Transactions on Electron Devices, vol. 15, 256-261 (Year: 1968).*
(Continued)

*Primary Examiner* — Samuel Park
(74) *Attorney, Agent, or Firm* — Sheridan Ross PC

(57) ABSTRACT

The present technology relates to an imaging element and electronic equipment that enable an increase in the amount of saturated charge. The imaging element includes a substrate, a first photoelectric conversion region adjacent a second photoelectric conversion region in the substrate, a pixel isolation section between the first photoelectric conversion region and the second photoelectric conversion region, and a junction region in a side wall of the pixel isolation section, the junction region including a first impurity region including first impurities and a second impurity region including second impurities. The length of a side of the first impurity region, the side perpendicularly intersecting two parallel sides of four sides of the pixel isolation
(Continued)

section enclosing the first photoelectric conversion region, is larger than the length between the two parallel sides of the pixel isolation section. The present technology is applicable to, for example, an imaging apparatus.

17 Claims, 86 Drawing Sheets

(58) Field of Classification Search
CPC ............... H01L 23/485; H01L 27/1463; H01L 27/14621; H01L 27/14612; H01L 27/14623; H01L 27/14627; H01L 27/14643; H01L 27/14683; H01L 27/14641; H01L 27/14607; H01L 27/1461; H01L 27/1462; H01L 27/14614; H01L 27/14634; H01L 27/14636; H01L 27/1464; H01L 27/14645; H01L 27/14689; H01L 27/14603; H01L 27/14609; H01L 27/1469; H01L 27/14605; H01L 27/14679
USPC .............. 257/21, 83, 257, 292, 443, 29.266, 257/31.097, 31.099; 438/57, 116, 163, 438/250, 257, 332, 383, 136, 157
See application file for complete search history.

(56) References Cited

U.S. PATENT DOCUMENTS 9,024,361 B2 * 5/2015 Ohri .................. H01L 27/14609 438/57
9,219,175 B2 12/2015 Fukumizu
11,127,771 B2 * 9/2021 Tanaka .............. H01L 27/14689
11,398,515 B2 * 7/2022 Honda ................... H04N 25/67
2011/0032405 A1 * 2/2011 Nozaki ............. H01L 27/14603 257/E31.097
2011/0042552 A1 2/2011 Furuya
2012/0267747 A1 * 10/2012 Watanabe ......... H01L 27/14683 257/443
2015/0002712 A1 1/2015 Maeda et al.
2015/0028442 A1 1/2015 Miyanami
2015/0228684 A1 * 8/2015 Yamashita ........ H01L 27/14641 257/292
2016/0099267 A1 * 4/2016 Lee .................. H01L 27/14689 257/294
2018/0204861 A1 7/2018 Borthakur
2019/0057999 A1 2/2019 Hatabu et al.
2021/0005647 A1 * 1/2021 Kwag .............. H01L 27/14643
2021/0134863 A1 5/2021 Suzuki
2021/0143196 A1 5/2021 Uchida
2021/0242257 A1 * 8/2021 Lee ........................ H04N 25/77

FOREIGN PATENT DOCUMENTS

| | | | | | |
|---|---|---|---|---|---|
| CN | 108432352 | A | | 8/2018 | |
| EP | 3576152 | A1 | | 12/2019 | |
| EP | 3709359 | A1 | | 9/2020 | |
| JP | H08-97391 | | | 4/1996 | |
| JP | 2008153428 | A | | 7/2008 | |
| JP | 2011044489 | A | | 3/2011 | |
| JP | 2015-012074 | | | 1/2015 | |
| JP | 2015-162603 | | | 9/2015 | |
| JP | 2017-092149 | | | 5/2017 | |
| JP | 2018-148116 | | | 9/2018 | |
| JP | 2018139269 | A | * | 9/2018 | ....... H01L 27/14607 |
| WO | WO-2016006474 | A1 | * | 1/2016 | ....... H01L 27/14603 |
| WO | WO-2016189792 | A1 | * | 12/2016 | ........... H01L 23/481 |
| WO | WO-2017077880 | A1 | | 5/2017 | |
| WO | WO-2017169754 | A1 | * | 10/2017 | ....... H01L 27/14605 |
| WO | WO-2018139279 | A1 | | 8/2018 | |
| WO | WO-2018163838 | A1 | | 9/2018 | |
| WO | WO-2018189999 | A1 | * | 10/2018 | ........... H01L 27/146 |

OTHER PUBLICATIONS

International Search Report prepared by the Japan Patent Office on Dec. 17, 2019, for International Application No. PCT/JP2019/041608.

* cited by examiner

IMAGING ELEMENT AND ELECTRONIC EQUIPMENT

CROSS REFERENCE TO RELATED APPLICATIONS

This application is a national stage application under 35 U.S.C. 371 and claims the benefit of PCT Application No. PCT/JP2019/041608 having an international filing date of 24 Oct. 2019, which designated the United States, which PCT application claimed the benefit of Japanese Patent Application Nos. 2018-208679, filed 6 Nov. 2018, and 2019-118399, filed 26 Jun. 2019, the entire disclosures of each of which are incorporated herein by reference.

TECHNICAL FIELD

The present technology relates to an imaging element and electronic equipment, and in particular, to an imaging element and electronic equipment in which a P-type solid phase diffusion layer and an N-type solid phase diffusion layer are formed in a side wall of an inter-pixel light shielding wall formed between pixels, to form an intense electric field region in which charge is held, thus increasing the amount of saturated charge Qs of each pixel.

BACKGROUND ART

In the related art, known is a technology in which, for the purpose of increasing the amount of saturated charge Qs in each pixel in an imaging element, a P-type diffusion layer and an N-type diffusion layer are formed in a side wall of a trench formed between pixels, to form an intense electric field region in which charge is held (see, for example, PTL 1).

CITATION LIST

Patent Literature

[PTL 1]
Japanese Patent Laid-Open No. 2015-162603

SUMMARY

Technical Problems

However, in a structure disclosed in PTL 1, pinning on a light incidence side of an Si (silicon) substrate may be weakened, and charge generated may flow into a photodiode, degrading a Dark property. This may lead to, for example, occurrence of voids and generation of a dark current. Additionally, a further increase in the amount of saturated charge is desired.

In view of these circumstances, an object of the present technology is to enable inhibition of degradation of the Dark property and to increase the amount of saturated charge.

Solution to Problems

An imaging element of an aspect of the present technology includes a substrate, a first photoelectric conversion region provided in the substrate, a second photoelectric conversion region provided in the substrate, the second photoelectric conversion region being adjacent to the first photoelectric conversion region, a pixel isolation section provided in the substrate and between the first photoelectric conversion region and the second photoelectric conversion region, and a junction region provided in a side wall of the pixel isolation section, the junction region including a first impurity region including first impurities and a second impurity region including second impurities, and a length of a side of the first impurity region formed in the side wall of the pixel isolation section, the side perpendicularly intersecting two parallel sides of four sides of the pixel isolation section enclosing the first photoelectric conversion region, is larger than a length between the two parallel sides of the pixel isolation section.

Electronic equipment of an aspect of the present technology is electronic equipment including an imaging element, the imaging element including a substrate, a first photoelectric conversion region provided in the substrate, a second photoelectric conversion region provided in the substrate, the second photoelectric conversion region being adjacent to the first photoelectric conversion region, a pixel isolation section provided in the substrate and between the first photoelectric conversion region and the second photoelectric conversion region, and a junction region provided in a side wall of the pixel isolation section, the junction region including a first impurity region including first impurities and a second impurity region including second impurities. In the electronic equipment, a length of a side of the first impurity region formed in the side wall of the pixel isolation section, the side perpendicularly intersecting two parallel sides of four sides of the pixel isolation section enclosing the first photoelectric conversion region, is larger than a length between the two parallel sides of the pixel isolation section.

The imaging element of the aspect of the present technology includes the substrate, the first photoelectric conversion region provided in the substrate, the second photoelectric conversion region provided in the substrate, the second photoelectric conversion region being adjacent to the first photoelectric conversion region, the pixel isolation section provided in the substrate and between the first photoelectric conversion region and the second photoelectric conversion region, and the junction region provided in the side wall of the pixel isolation section, the junction region including the first impurity region including first impurities and the second impurity region including second impurities. Additionally, the imaging element is configured such that the length of the side of the first impurity region formed in the side wall of the pixel isolation section, the side perpendicularly intersecting the two parallel sides the four sides of the pixel isolation section enclosing the first photoelectric conversion region, is larger than the length between the two parallel sides of the pixel isolation section.

Note that the electronic equipment may be an independent apparatus or an internal block constituting one apparatus.

BRIEF DESCRIPTION OF DRAWINGS

FIG. 81 is a schematic plan view illustrating another example of a pixel isolation section depicted in FIG. 50 and the like.

DESCRIPTION OF EMBODIMENTS

Embodiments of the present technology (hereinafter referred to as embodiments) will be described below.

The present technology is applicable to an imaging apparatus, and thus the following description takes, as an example, a case where the present technology is applied to an imaging apparatus. Note that the description will be continued taking the imaging apparatus as an example but the present technology is not limited to the application to the imaging apparatus and is applicable to electronic equipment using an imaging apparatus as an image reading section (photoelectric conversion region) in general, for example, imaging apparatuses such as digital still cameras and video cameras, portable terminal apparatuses, such as cellular phones, which include an imaging function, and copiers using an imaging apparatus as an image reading section. Note that a modular configuration mounted in the electronic equipment, that is, a camera module, may be regarded as an imaging apparatus.

Figure 1:
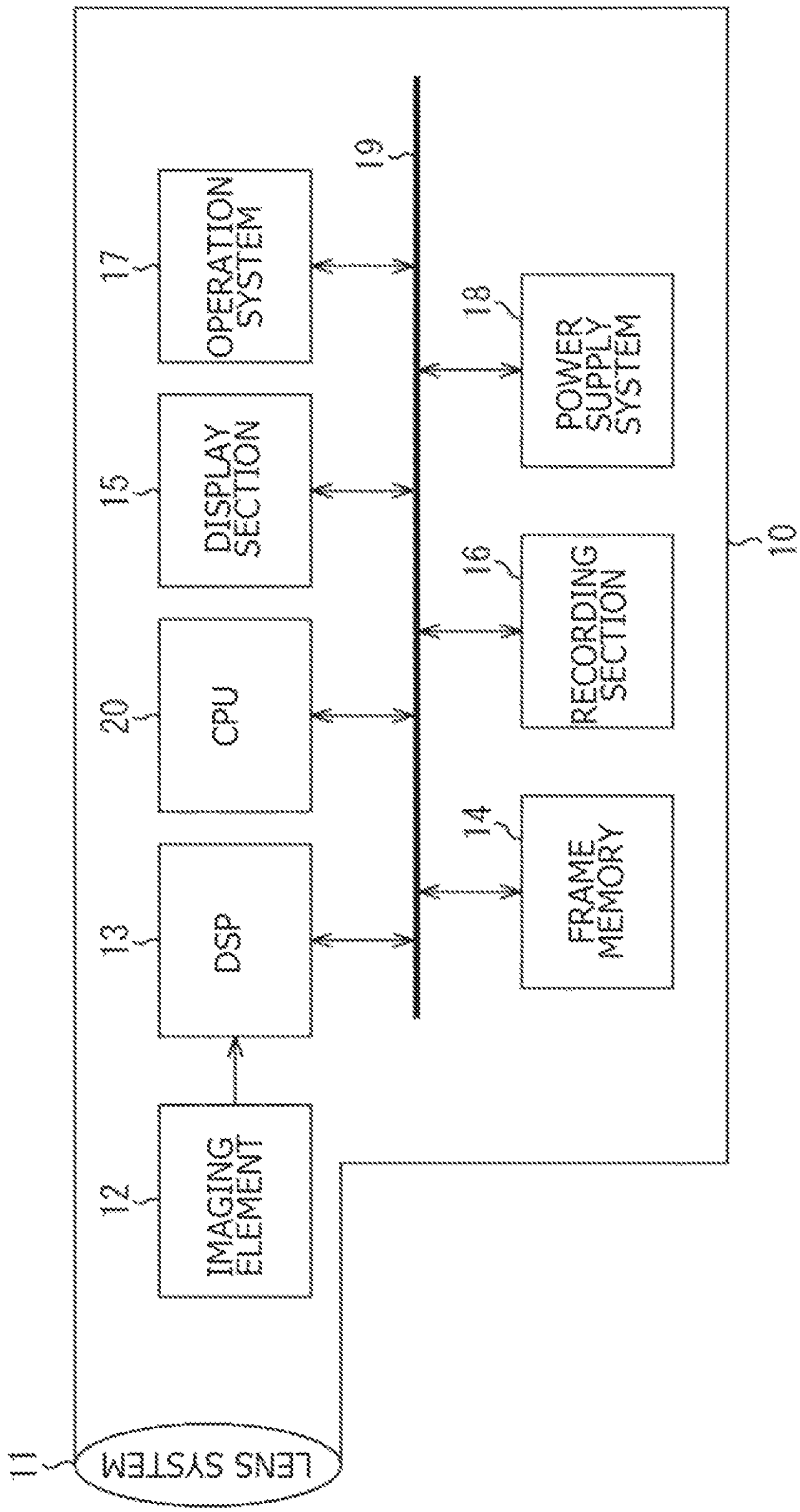
FIG. 1 is a diagram depicting a configuration example of an imaging element.

FIG. 1 is a block diagram depicting a configuration example of an imaging apparatus as an example of electronic equipment of the present disclosure. As depicted in FIG. 1, an imaging apparatus 10 includes an optical system including a lens group 11 and the like, an imaging element 12, a DSP circuit 13 corresponding to a camera signal processing section, a frame memory 14, a display section 15, a recording section 16, an operation system 17, a power supply system 18, and the like.

In addition, the imaging apparatus 10 is configured such that the DSP circuit 13, the frame memory 14, the display section 15, the recording section 16, the operation system 17, and the power supply system 18 are connected together via a bus line 19. A CPU 20 controls sections in the imaging apparatus 10.

The lens group 11 captures incident light (image light) from a subject and forms the light into an image on an imaging surface of the imaging element 12. The imaging element 12 converts, into an electric signal in units of pixels, the amount of incident light formed into an image on the imaging surface by the lens group 11, and outputs the electric signal as a pixel signal. As the imaging element 12, an imaging element including pixels described below (image sensor) can be used.

The display section 15 includes a panel display section, such as a liquid crystal display section or an organic EL (electro luminescence) display section, and displays moving images or still images captured by the imaging element 12. The recording section 16 records, in a recording medium such as an HDD (Hard Disk Drive) or a memory card, moving images or still images captured by the imaging element 12.

The operation system 17 provides operation commands for various functions of the imaging apparatus under the operation of a user. The power supply system 18 provides various types of power supplies used as operating power supplies for the DSP circuit 13, the frame memory 14, the display section 15, the recording section 16, and the operation system 17, to these supply targets as appropriate.

<Configuration of Imaging Element>

Figure 2:
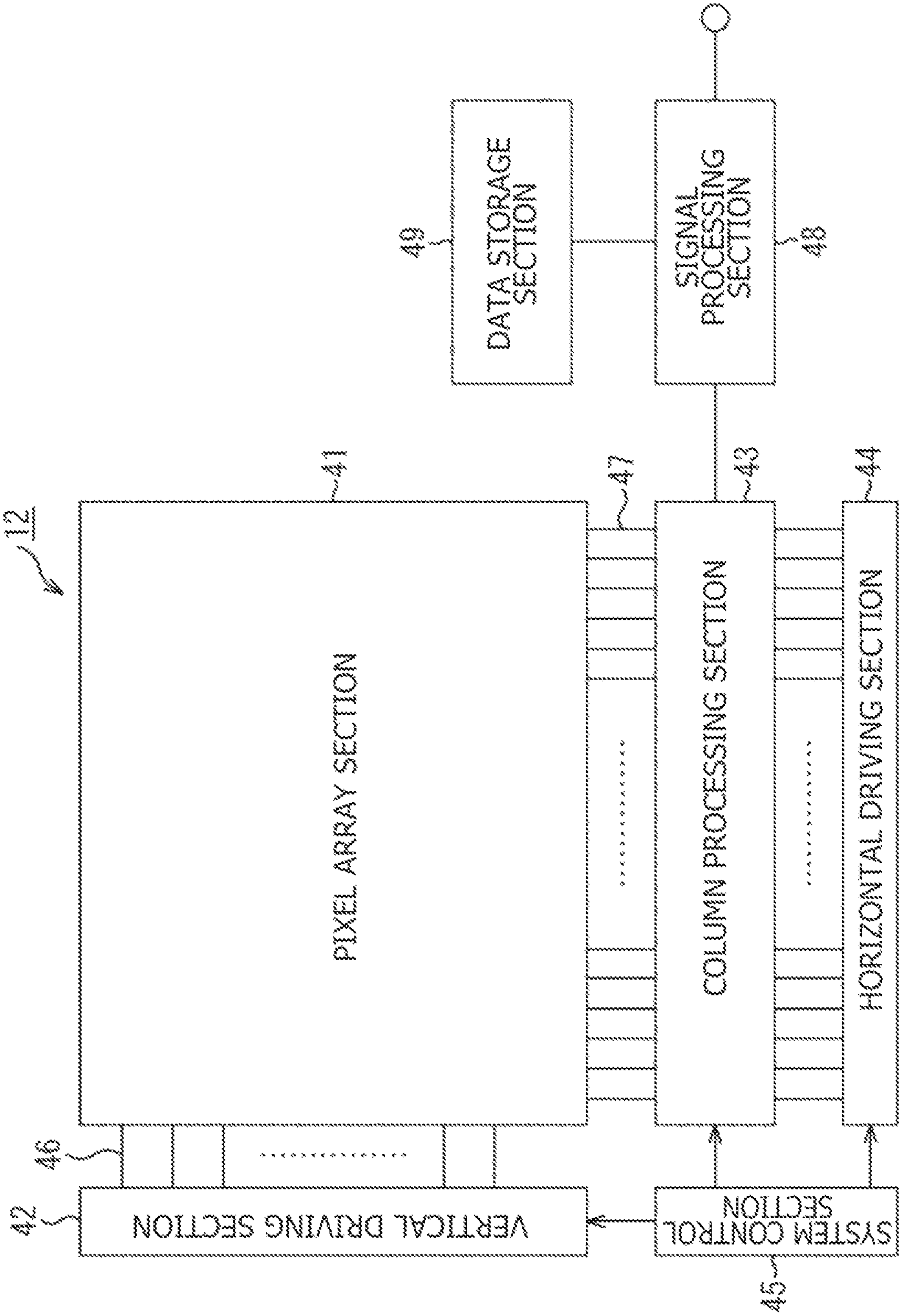
FIG. 2 is a diagram depicting a configuration example of the imaging element.

FIG. 2 is a block diagram depicting a configuration example of the imaging element 12. The imaging element 12 may be a CMOS (Complementary Metal Oxide Semiconductor) image sensor.

The imaging element 12 includes a pixel array section 41, a vertical driving section 42, a column processing section 43, a horizontal driving section 44, and a system control section 45. The pixel array section 41, the vertical driving section 42, the column processing section 43, the horizontal driving section 44, and the system control section 45 are formed in an unillustrated semiconductor substrate (chip).

The pixel array section 41 includes unit pixels (for example, a pixel 50 in FIG. 3) arranged two-dimensionally in a matrix, the unit pixels each including a photoelectric conversion element generating photocharge with an amount of charge corresponding to the amount of incident light and storing the photocharge inside. Note that the photocharge with an amount of charge corresponding to the amount of incident light is hereinafter simply referred to as a "charge" and that the unit pixel may simply be described as a "pixel."

The pixel array section 41 further includes pixel driving lines 46 formed for the respective rows of the matrix-like pixel array along the lateral direction of the figure (array direction of the pixels in pixel rows) and vertical signal lines 47 formed for the respective columns of the matrix-like pixel array along the up-down direction of the figure (array direction of the pixels in pixel columns). One end of each of the pixel driving lines 46 is connected to one of output ends of the vertical driving section 42 that corresponds to the row corresponding to the pixel driving line 46.

The imaging element 12 further includes a signal processing section 48 and a data storage section 49. The signal processing section 48 and the data storage section 49 may include processing executed by an external signal processing unit, for example, a DSP (Digital Signal Processor) or software, provided in a substrate different from a substrate in which the imaging element 12 is provided, or may be mounted on the same substrate as that in which the imaging element 12 is provided.

The vertical driving section 42 includes a shift register, an address decoder, or the like, and simultaneously drives all the pixels in the pixel array section 41 or drives the pixels in units of rows or the like. Although a specific configuration of the vertical driving section 42 is not illustrated, the vertical driving section 42 includes a readout scanning system, a sweep-out scanning system, or batch sweep-out and batch transfer.

To read out signals from the unit pixels, the readout scanning system selectively scans the unit pixels in the pixel array section 41 sequentially in units of rows. In a case of row driving (rolling shutter operation), for sweep-out, sweep-out scanning is performed, earlier than readout scanning by a time corresponding to a shutter speed, on readout rows on which readout scanning is to be performed by the readout scanning system. Additionally, in a case of global exposure (global shutter operation), batch sweep-out is performed earlier than batch transfer by the time corresponding to the shutter speed.

The sweepout sweeps out unnecessary charge from photoelectric conversion elements in the unit pixels in the readout rows (reset). Then, sweep-out of the unnecessary charge (reset) causes what is called an electronic shutter operation to be performed. Here, the electronic shutter operation refers to an operation discarding photocharge from the photoelectric conversion elements and newly starting exposure (starting storage of photocharge).

Signals read out by the readout operation of the readout scanning system correspond to the amount of light having been incident since the last readout operation or electronic shutter operation. In a case of row driving, a photocharge storage period (exposure period) for the unit pixel corresponds to the period from the timing of readout by the last readout operation or the timing of sweep-out by the last electronic shutter operation to the timing of readout by the current readout operation. In a case of global exposure, the storage period (exposure period) corresponds to the period from batch sweep-out to batch transfer.

Pixel signals output from the unit pixels in the pixel row selectively scanned by the vertical driving section 42 are fed to the column processing section 43 through the vertical signal lines 47. The column processing section 43 executes, for each pixel column of the pixel array section 41, predetermined signal processing on the pixel signals output from the unit pixels in the selected row through the vertical signal lines 47, and temporarily holds the pixel signal subjected to the signal processing.

Specifically, the column processing section 43 executes, as signal processing, at least noise removal processing, for example, CDS (Correlated Double Sampling). The correlated double sampling by the column processing section 43 removes pixel-specific fixed pattern noise such as reset noise and variation in threshold for amplifying transistors. Note that the column processing section 43 can be provided with, for example, an AD (Analog-Digital) conversion function, besides the noise removal processing, to output a signal level using a digital signal.

The horizontal driving section 44 includes a shift register, an address decoder, or the like and sequentially selects unit circuits corresponding to pixel columns in the column processing section 43. The selective scanning by the horizontal driving section 44 causes the pixel signals subjected to the signal processing by the column processing section 43 to be sequentially output to the signal processing section 48.

The system control section 45 includes, for example, a timing generator generating various timing signals, and drives and controls the vertical driving section 42, the column processing section 43, the horizontal driving section 44, and the like on the basis of the various timing signals generated by the timing generator.

The signal processing section 48 includes at least an addition processing function to execute various types of signal processing, such as addition processing, on pixel signals output from the column processing section 43. The data storage section 49 temporarily stores, for signal processing in the signal processing section 48, data required for the processing.

<Structure of Unit Pixel>

Now, a specific structure of each of unit pixels 50 arranged in the pixel array section 41 in a matrix will be described. The pixel 50 described below can reduce the possibility that pinning on a light incidence side of an Si (silicon) substrate (in FIG. 3, an Si substrate 70) is weakened to cause charge generated to flow into a photodiode (in FIG. 3, a PD 71) to degrade the Dark property, leading to, for example, occurrence of voids or generation of a dark current.

<Configuration Example of Pixel in First Embodiment>

Figure 3:
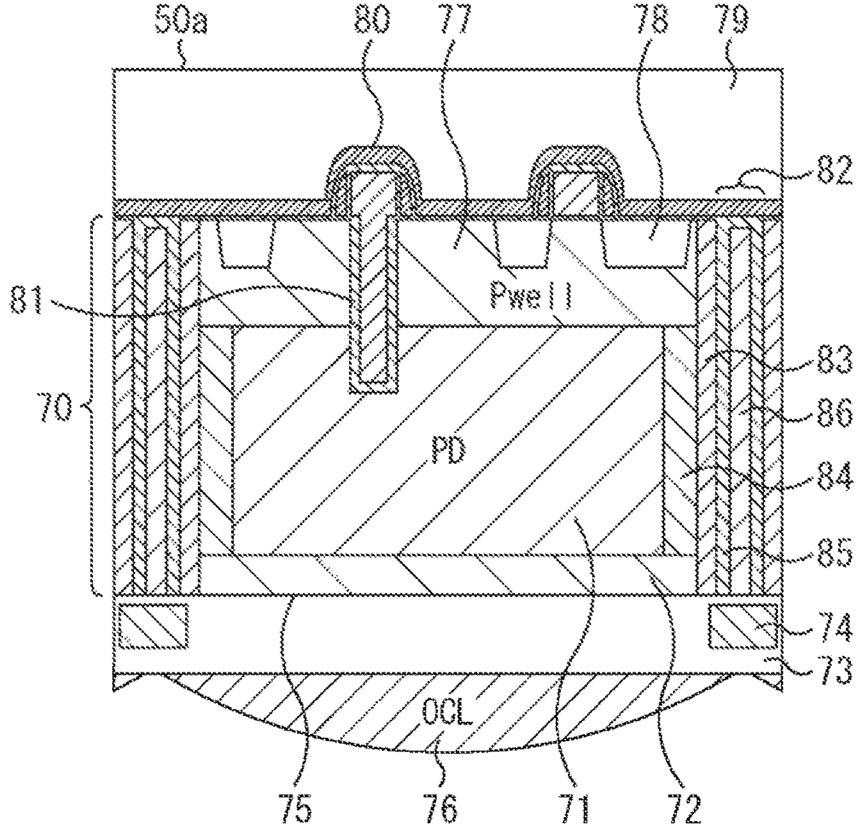
FIG. 3 is a vertical cross-sectional view of assistance in describing a first configuration example of a pixel to which the present technology is applied.
Figure 4:
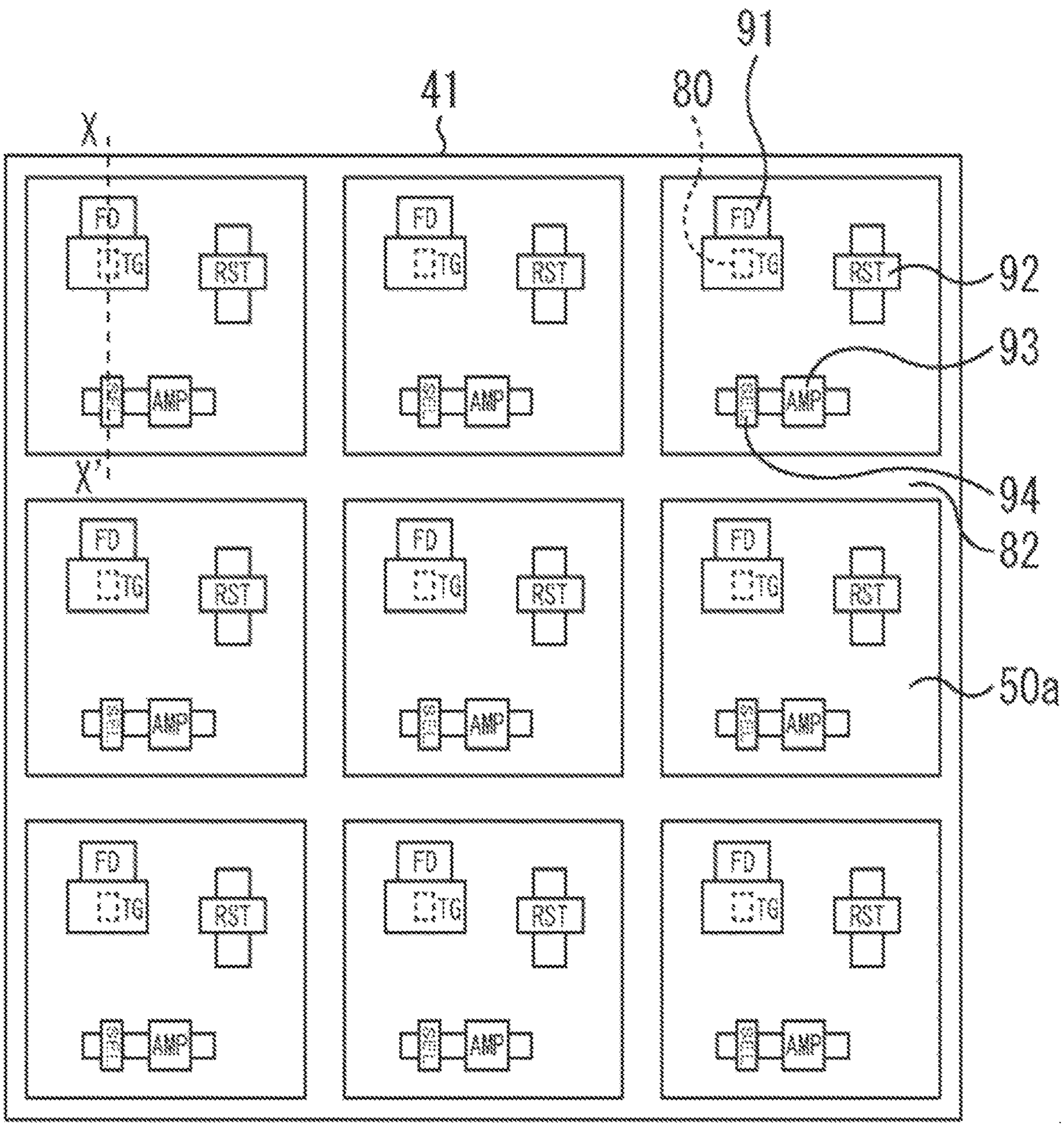
FIG. 4 is a plan view of a front side of a first embodiment of pixels to which the present technology is applied.

FIG. 3 is a vertical cross-sectional view of a pixel 50*a* in a first embodiment of the pixel 50 to which the present technology is applied, and FIG. 4 is a plan view of a front side of the pixel 50*a*. Note that FIG. 3 corresponds to the position of a segment X-X' in FIG. 4.

The pixel 50 will be described below taking, as an example, a configuration in which the pixel 50 is of a back-illuminated type. However, the present technology can also be applied to a front-illuminated type.

The pixel 50 depicted in FIG. 3 includes a PD (photodiode) 71 used as a photoelectric conversion element in each of the pixels formed inside the Si substrate 70. A P-type region 72 is formed on a light incidence side of the PD 71 (in the figure, a lower side corresponding to a back side), and a planarization film 73 is further formed below the P-type region 72. The boundary between the P-type region 72 and the planarization film 73 corresponds to a back side Si interface 75.

Light shielding films 74 are formed in the planarization film 73. The light shielding films 74 are provided to prevent light from leaking into adjacent pixels and are formed between the adjacent PDs 71. The light shielding films 74 include a metal material, for example, W (tungsten).

An OCL (On Chip Lens) 76 focusing incident light on the PD 71 is formed on the planarization film 73 and thus on the back side of the Si substrate 70. The OCL 76 may include an inorganic material, and for example, SiN, SiO, or SiOxNy (provided, $0<x\leq 1$ and $0<y\leq 1$) can be used as the inorganic material.

Although not depicted in FIG. 3, the pixel can be configured such that a transparent plate such as cover glass or resin is bonded onto the OCL 76. Additionally, although not depicted in FIG. 3, the pixel may be configured such that a color filter layer is formed between the OCL 76 and the planarization film 73. In addition, the pixel can be configured such that, in the color filter layer, a plurality of color filters are provided in each pixel and such that the colors of the color filers are, for example, arranged according to a Bayer arrangement.

An active region (Pwell) 77 is formed opposite to the light incidence side of the PD 71 (in the figure, an upper side corresponding to the front side). Element isolation regions (hereinafter referred to as STI (Shallow Trench Isolation)) 78 isolating pixel transistors and the like from one another are formed in the active region 77.

An interconnect layer 79 is formed on the front side of the Si substrate 70 (in the drawing, the upper side) and thus on the active region 77, and a plurality of transistors are formed in the interconnect layer 79. FIG. 3 depicts an example in which transfer transistors 80 are formed in the interconnect layer 79. The transfer transistors (gates) 80 include vertical transistors. Specifically, for the transfer transistors (gates) 80, a vertical transistor trench 81 is formed, and then a transfer gate (TG) 80 for reading out charge from the PD 71 is formed at the vertical transistor trench 81.

Further, pixel transistors such as an amplifying (AMP) transistor, a select (SEL) transistor, and a reset (RST) transistor are formed on the front side of the Si substrate 70. The arrangement of the transistors will be described with reference to FIG. 4, and operations of the transistors will be described with reference to a circuit diagram in FIG. 5.

A trench is formed between the pixels 50*a* and is described as DTI (Deep Trench Isolation) 82. The DTI 82 is formed between the adjacent pixels 50*a* and is shaped to penetrate the Si substrate 70 in a depth direction (in the figure, the vertical direction corresponding to a direction from the front surface to the back surface). Additionally, the DTI 82 also functions as a light shielding wall between the pixels to prevent unnecessary light from leaking to the adjacent pixels 50*a*.

Between the PD 71 and the DTI 82, a P-type solid phase diffusion layer 83 and an N-type solid phase diffusion layer 84 are formed in this order from the DTI 82 side toward the PD 71. The P-type solid phase diffusion layer 83 is formed to extend along the DTI 82 until coming into contact with the back side Si interface 75 of the Si substrate 70. The N-type solid phase diffusion layer 84 is formed to extend along the DTI 82 until coming into contact with the P-type region 72 of the Si substrate 70.

Note that the solid phase diffusion layers refer to layers formed in accordance with a manufacturing method described below and used to form a P-type layer and an N-type layer by impurity doping but the present technology is not limited to the manufacturing method based on solid phase diffusion and a P type layer and an N type layer generated in accordance with another manufacturing method such as ion injection may each be provided between the DTI 82 and the PD 71. Additionally, the PD 71 in the embodiment includes an N-type region. Photoelectric conversion is performed in some or all of the N-type regions.

The P-type solid phase diffusion layer 83 is formed to extend until coming into contact with the back side Si interface 75, whereas the N-type solid phase diffusion layer 84 does not contact the back side Si interface 75, with a space provided between the N-type solid phase diffusion layer 84 and the back side Si interface 75.

In such a configuration, a PN junction region between the P-type solid phase diffusion layer 83 and the N-type solid phase diffusion layer 84 forms an intense electric field region to hold charge generated by the PD 71. According to such a configuration, the P-type solid phase diffusion layer 83 and the N-type solid phase diffusion layer 84 formed along the DTI 82 can form an intense electric field region to hold charge generated by the PD 71.

If the N-type solid phase diffusion layer 84 is formed to extend along the DTI 82 until coming into contact with the back side Si interface 75 of the Si substrate 70, pinning of charge is weakened in a portion in which the N-type solid phase diffusion layer 84 contacts the back side Si interface 75 of the Si substrate 70 corresponding to the light incidence surface side, and charge generated flows into the PD 71 to degrade the Dark property, leading to, for example, occurrence of voids and generation of a dark current.

However, the pixel 50*a* depicted in FIG. 3 is configured such that the N-type solid phase diffusion layer 84 does not contact the back side Si interface 75 of the Si substrate 70 but contacts the P-type region 72 of the Si substrate 70 along the DTI 82. Such a configuration allows prevention of weakening of pinning of charge, enabling prevention of flow of the charge into the PD 71 that would otherwise degrade the Dark property.

Additionally, in the pixel 50*a* depicted in FIG. 3, a side wall film 85 including SiO2 is formed on an inner wall of the DTI 82, and a filler 86 including polysilicon is embedded inside the side wall film 85.

The pixel 50*a* in the first embodiment is configured such that the P-type region 72 is provided on the back side, precluding the PD 71 and the N-type solid phase diffusion layer 84 from being present near the back side Si interface 75. This prevents weakening of pinning near the back side Si interface 75, allowing generated charge to be inhibited from flowing into the PD 71 to degrade the Dark property.

Note that, instead of SiO2 adopted for the side wall film 85, SiN may be used for the DTI 82. Additionally, instead of polysilicon adopted for the filler 86, doping polysilicon may be used. In a case where the DTI 82 is filled with doping polysilicon or is doped with N-type impurities or P-type impurities after being filled with polysilicon, application of a negative bias to the DTI 82 allows enhancing of the pinning on the side wall of the DTI 82, enabling the Dark property to be further improved.

Figure 5:
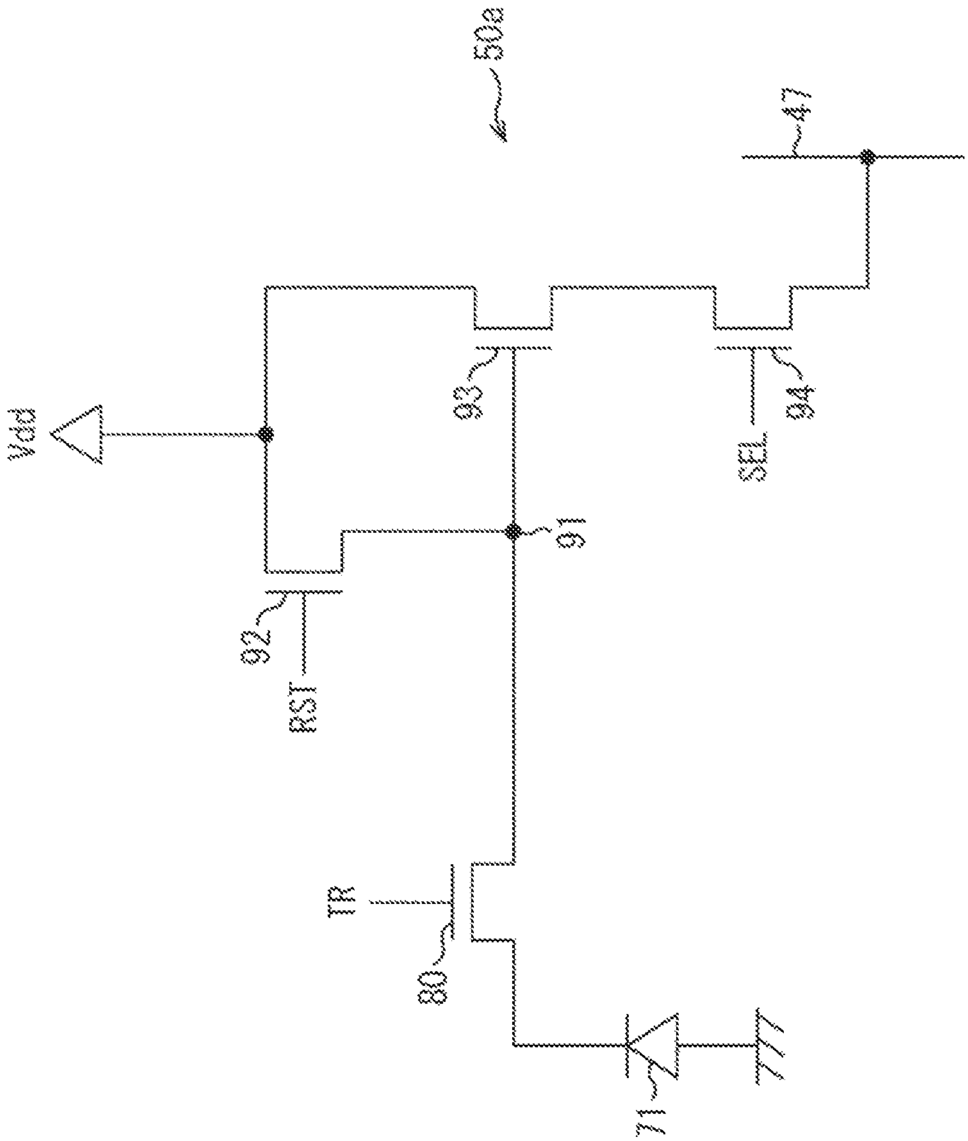
FIG. 5 is a circuit diagram of the pixel.

With reference to FIG. 4 and FIG. 5, the arrangement of the transistors formed in the pixel 50*a* and the operations of the transistors will be described. FIG. 4 is a plan view of 3×3=9 pixels 50*a* arranged in the pixel array section 41 (FIG. 2) as viewed from the front side (in FIG. 3, from the upper side). FIG. 5 is a circuit diagram of assistance in describing a connection relation among the transistors depicted in FIG. 4.

In FIG. 4, one rectangle represents one pixel 50*a*. As depicted in FIG. 4, the DTI 82 is formed to enclose the pixel 50*a* (PD 71 included in the pixel 50*a*). Additionally, transfer transistors (gates) 80, FD (floating diffusion) 91, reset transistors 92, amplifying transistors 93, and select transistors 94 are formed on the front side of the pixel 50*a*.

The PD 71 generates and stores charge (signal charge) corresponding to the amount of light received. The PD 71 includes an anode terminal grounded and a cathode terminal connected to the FD 91 via the transfer transistor (gate) 80.

When turned on by a transfer signal TR, the transfer transistor 80 reads out charge generated by the PD 71 and transfers the charge to the FD 91.

The FD 91 holds the charge read out from the PD 71. When the reset transistor 92 is turned on by a reset signal RST, the charge stored in the FD 91 is discharged to a drain (constant voltage source Vdd) to reset the potential of the FD 91.

The amplifying transistor 93 outputs a pixel signal corresponding to the potential of the FD 91. Specifically, the amplifying transistor 93 constitutes a source follower circuit along with a load MOS (not depicted) connected to the amplifying transistor 93 via a vertical signal line 33 and used as a constant current source. A pixel signal indicating a level corresponding to the charge stored in the FD 91 is output from the amplifying transistor 93 to the column processing section 43 (FIG. 2) via the select transistor 94 and the vertical signal line 47.

The select transistor 94 is turned on when a pixel 31 is selected by a select signal SEL, and outputs a pixel signal from the pixel 31 to the column processing section 43 via the vertical signal line 33. Signal lines through which the transfer signal TR, the select signal SEL, and the reset signal RST are transmitted correspond to the pixel driving lines 46 in FIG. 2.

The pixel 50*a* can be configured as described above. However, the pixel 50*a* is not limited to this configuration, and another configuration can be adopted.

<Method for Manufacturing DTI 82 and Peripheral Regions>

Figure 6:
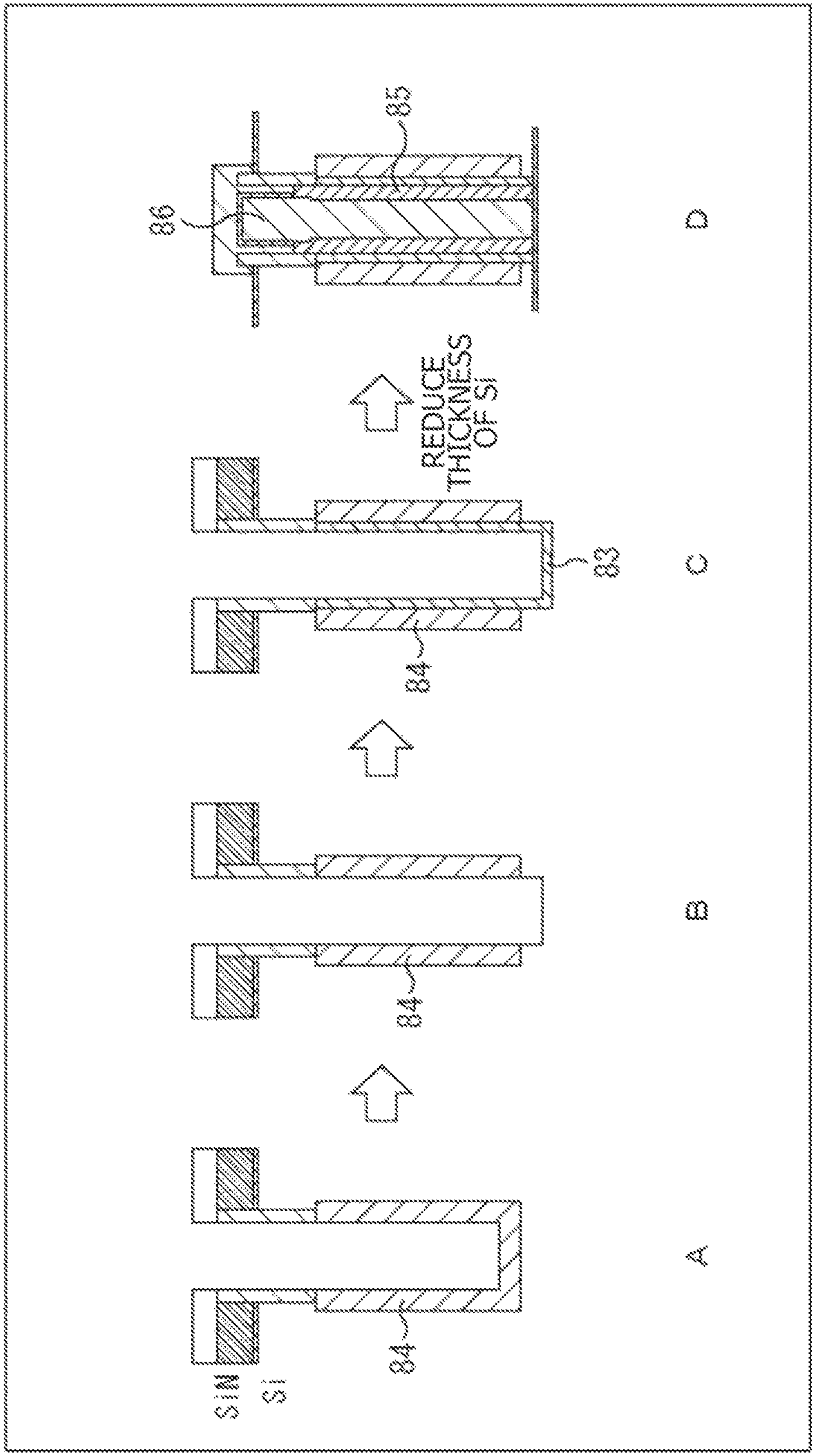
FIG. 6 depicts diagrams of assistance in describing a method for manufacturing the DTI 82 and peripheral regions.

FIG. 6 is a diagram of assistance in describing a method for manufacturing the DTI 82 and peripheral regions.

When the DTI 82 is formed in the Si substrate 70, the entire Si substrate 70 except for the position where the DTI 82 is to be formed is covered with a hard mask including SiN and SiO2, and the portion not covered with the hard mask is dry etched to form a trench extending through the Si substrate 70 in the vertical direction down to a predetermined depth, as depicted in A of FIG. 6.

Then, an SiO2 film including P (phosphorous) corresponding to N-type impurities is formed inside the trench formed, and is thermally treated to dope the Si substrate 70 with P (phosphorous) from the SiO2 film (the doping is hereinafter referred to as solid phase diffusion).

Then, as depicted in B of FIG. 6, the SiO2 film that is formed inside the trench formed and that includes P is removed, and thermal treatment is executed again to diffuse P (phosphorous) into the Si substrate 70 and thereby form an N-type solid phase diffusion layer 84 self-aligned with the current shape of the trench. Subsequently, a bottom portion of the trench is etched by dry etching to extend the trench in the depth direction.

Then, as depicted in C of FIG. 6, an SiO2 film including B (boron) corresponding to P-type impurities is formed inside the extended trench and thermally treated to cause solid phase diffusion to diffuse B (boron) from the SiO2 film toward the Si substrate 70 side. Accordingly, formed is a P-type solid phase diffusion layer 83 that is self-aligned with the shape of the extended trench.

Subsequently, the SiO2 films that are formed on the inner walls of the trench and that include B (boron) are removed.

Then, as depicted in D of FIG. 6, a side wall film 85 including SiO2 is formed on the inner wall of the trench formed, and the trench is filled with polysilicon to form DTI 82. Subsequently, pixel transistors and interconnects are formed. Then, the Si substrate 70 is thinned from the back side. During the thinning, including the P-type solid phase diffusion layer 83, the bottom portion of the DTI 82 is simultaneously thinned. The thinning is performed up to a depth not reaching the N-type solid phase diffusion layer 84.

The above-described process allows an intense electric field region to be formed adjacent to PD 71, the intense electric field region including the N-type solid phase diffusion layer 84 not in contact with the back side Si interface 75 and the P-type solid phase diffusion layer 83 in contact with the back side Si interface 75.

Second Embodiment

Figure 7:
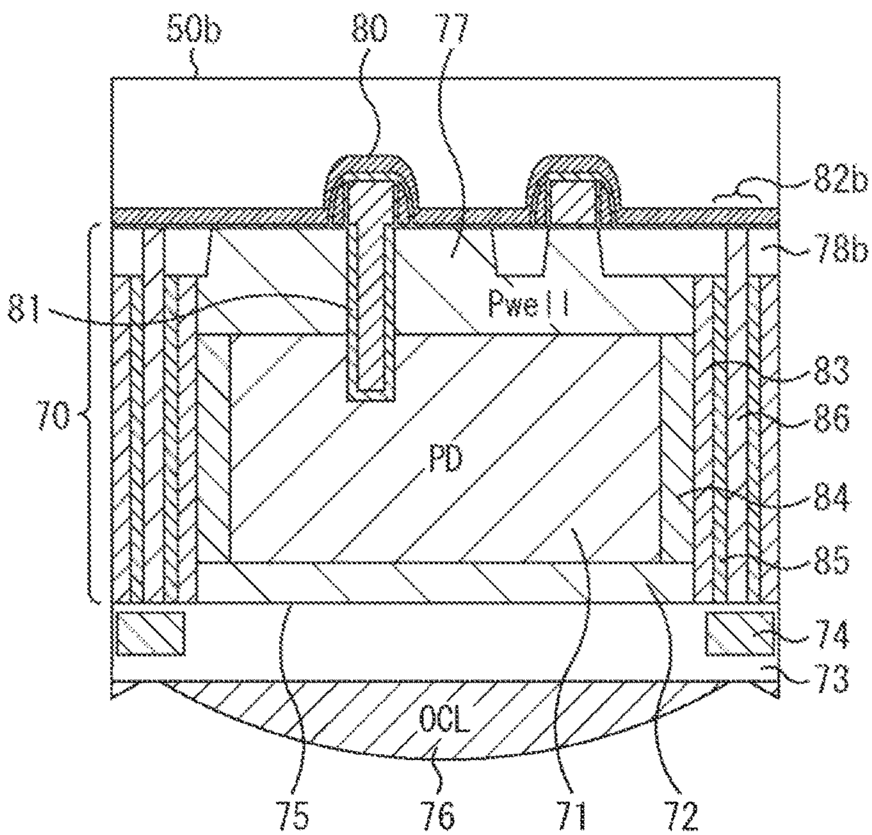
FIG. 7 is a vertical cross-sectional view depicting a second configuration example of the pixel to which the present technology is applied.

FIG. 7 is a vertical cross-sectional view of a pixel 50*b* in a second embodiment to which the present technology is applied.

The second embodiment differs from the first embodiment in that the DTI 82 is formed in the STI 78, but is otherwise similar to the first embodiment. Similar components of the embodiments are denoted by the same reference signs, and description of such components is omitted as appropriate. In the description below of the pixel 50, the same components as those of the pixel 50*b* in the first embodiment are denoted by the same reference signs, and description of the components is omitted as appropriate.

In the pixel 50*b* depicted in FIG. 7, STI 78*b* formed in the active region 77 is formed to extend to a portion in which the DTI 82*b* is formed (extend to an end of the pixel 50*b*). In addition, the DTI 82*b* is formed below the STI 78*b*.

In other words, the STI 78*b* is formed at the portion in which the DTI 82*b* is formed, and the STI 78*b* and the DTI 82*b* are formed at a position where the STI 78*b* and the DTI 82*b* contact each other.

Such formation enables the pixel 50*b* to be made smaller as compared to the configuration where the STI 78*b* and the DTI 82*b* are formed at different positions (for example, the pixel 50*a* in the first embodiment (FIG. 3)).

Additionally, the pixel 50*b* in the second embodiment can also produce an effect similar to the effect of the pixel 50*a*, that is, the effect of enabling prevention of degradation of the Dark property.

Third Embodiment

Figure 8:
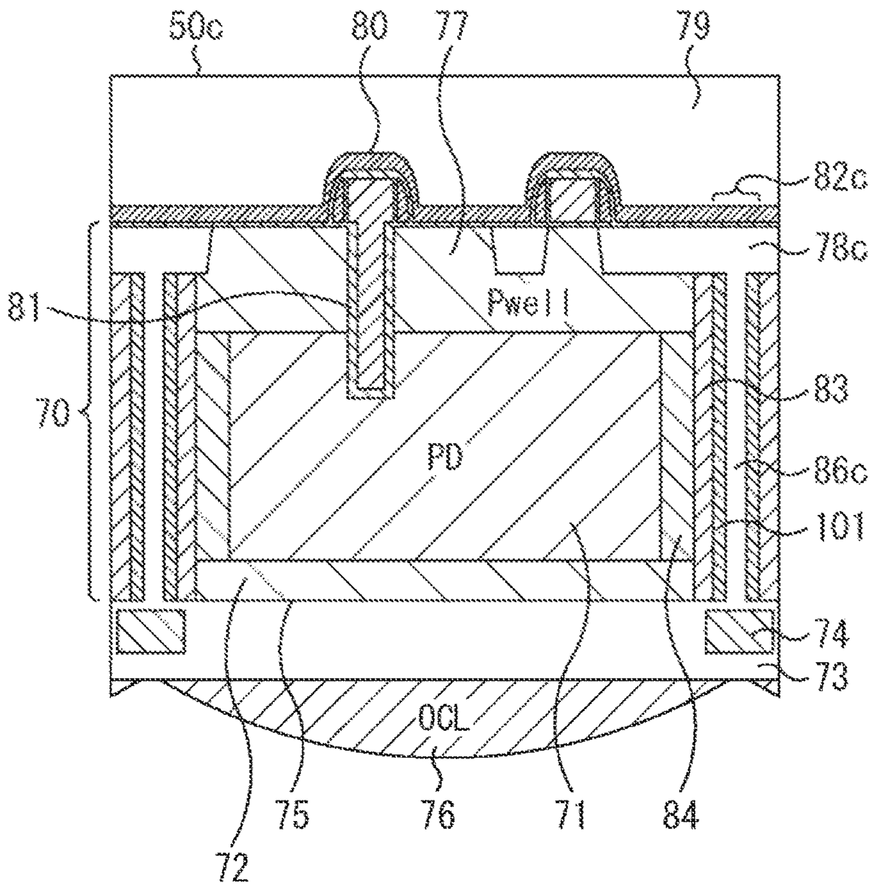
FIG. 8 is a vertical cross-sectional view depicting a third configuration example of the pixel to which the present technology is applied.

FIG. 8 is a vertical cross-sectional view of a pixel 50*c* in a third embodiment to which the present technology is applied.

A pixel in the third embodiment differs from the pixel 50*a* and the pixel 50*b* in the first and second embodiments in that a film 101 with a negative fixed charge is formed on a side wall of DTI 82*c* and that the inside of the film 101 is filled with SiO2 as a filler 86*c*.

The pixel 50*a* in the first embodiment is configured such that the side wall film 85 of SiO2 is formed on the side wall of the DTI 82 which is filled with polysilicon, whereas, in the pixel 50*c* in the third embodiment, the film 101 with the negative fixed charge is formed on the side wall of the DTI 82*c*, with the inside of the film 101 filled with SiO2.

The film 101 that is formed on the side wall of the DTI 82*c* and that has the negative fixed charge may include, for example, a hafnium oxide (HfO2) film, an aluminum oxide (Al2O3) film, a zirconium oxide (ZrO2) film, a tantalum oxide (Ta2O5) film, or a titanium oxide (TiO2) film. The above-described types of films have successfully been used as gate insulating films in insulated-gate field effect transistors. Thus, film formation methods have been established, allowing easy film formation.

Examples of the film formation method include chemical vapor deposition, sputtering, and atomic layer deposition, and the atomic layer deposition is suitably used because this method allows an SiO2 layer reducing an interface state to be simultaneously formed to a thickness of approximately 1 nm during film formation.

Additionally, materials other than those listed above include lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), erbium oxide (Er2O3), thulium oxide (Tm2O3), ytterbium oxide (Yb2O3), lutetium oxide (Lu2O3), yttrium oxide (Y2O3), and the like.

Further, the film 101 with the negative fixed charge may include a hafnium nitride film, an aluminum nitride film, a hafnium oxynitride film, or an aluminum oxynitride film.

The film 101 with the negative fixed charge may include silicon (Si) or nitrogen (N) added into the film to the extent that the insulation property is not impaired. The concentration of silicon or nitrogen is determined as appropriate to the extent that the insulation property is not impaired. However, for prevention of image defects such as voids, additives such as the silicon and nitrogen described above are preferably added to a front surface of the film 101 with the negative fixed charge, that is, the surface of the film 101 opposite to the PD 71 side. As described above, addition of silicon (Si) or nitrogen (N) enables improvement of heat resistance of the film and the capability of inhibiting ion injection during the process.

In the third embodiment, pinning of the trench side wall of the DTI 82 can be enhanced. Accordingly, for example, compared to the pixel 50*a* in the first embodiment, the pixel 50*c* enables the Dark property to be reliably prevented from being degraded.

For formation of the DTI 82 in the third embodiment, in a state depicted in D of FIG. 6, the back side may be polished until the polysilicon provided as the filler 86 is exposed. Then, the filler 86 (polysilicon) inside the trench and the side wall film 85 (SiO2) may be removed using photoresist and wet etching, the film 101 may be formed, and the trench may be filled with SiO2.

Note that, instead of SiO2, a metal material such as W (tungsten) may be used to fill the inside of the trench. This reduces the light transmission, through the DTI 82, of incident light traveling in an oblique direction, allowing color mixing to be reduced.

Fourth Embodiment

Figure 9:
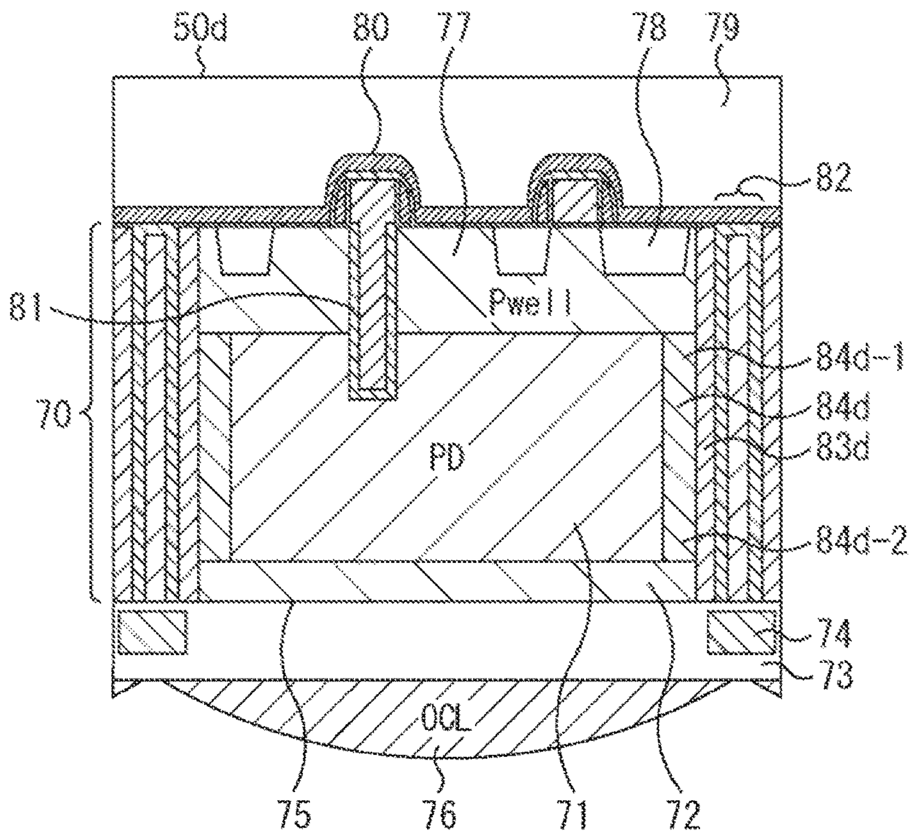
FIG. 9 is a vertical cross-sectional view depicting a fourth configuration example of the pixel to which the present technology is applied.

FIG. 9 is a vertical cross-sectional view of a pixel 50*d* in a fourth embodiment to which the present technology is applied.

The fourth embodiment differs from the first embodiment in that an N-type solid phase diffusion layer 84*d* formed along the DTI 82 has a concentration gradient in the depth direction of the Si substrate 70, but the pixel in the fourth embodiment is otherwise similar to the pixel 50*a* in the first embodiment.

The N-type impurities in the N-type solid phase diffusion layer 84 in the pixel 50*a* in the first embodiment have a constant concentration regardless of the depth direction, whereas N-type impurities in an N-type solid phase diffusion layer 84*d* of a pixel 50*d* in the fourth embodiment have a concentration depending on the depth direction.

Specifically, an N-type solid phase diffusion layer 84*d*-1 close to a front side of the N-type solid phase diffusion layer 84*d* in the pixel 50*d* has a high concentration of N-type impurities, whereas an N-type solid phase diffusion layer 84*d*-2 close to a back side of the N-type solid phase diffusion layer 84*d* has a low concentration of N-type impurities.

In addition to producing an effect similar to the effect of the pixel 50*a* in the first embodiment, the pixel 50*d* in the fourth embodiment can exert a new effect of allowing facilitation of readout of charge as a result of a shallow potential on the back side resulting from the concentration gradient provided in the N-type solid phase diffusion layer 84*d*.

The concentration gradient can be provided in the N-type solid phase diffusion layer 84*d* as follows. For example, when the trench of the DTI 82 is formed, etching damage is caused to the side wall of the trench, and thus a variation in solid phase diffusion doping level depending on the amount of the damage can be used to provide the concentration gradient.

Note that, instead of the N-type solid phase diffusion layer 84*d* being provided with the concentration gradient, the P-type solid phase diffusion layer 83*d* close to the front side may have a reduced concentration of P-type impurities, whereas the P-type solid phase diffusion layer 83*d* close to the back side may have an increased concentration of P-type impurities. Even in this case, an effect similar to the effect of providing the concentration gradient in the N-type solid phase diffusion layer 84*d* can be produced.

Additionally, both the N-type solid phase diffusion layer 84*d* and the P-type solid phase diffusion layer 83*d* may be provided with the respective concentration gradients.

Fifth Embodiment

Figure 10:
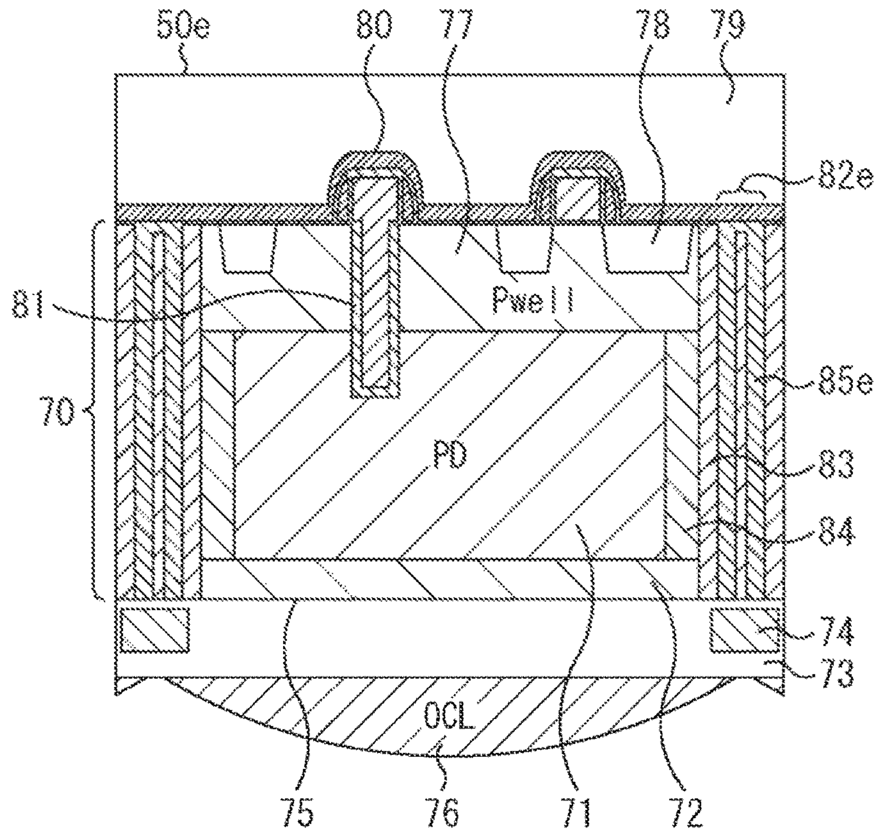
FIG. 10 is a vertical cross-sectional view depicting a fifth configuration example of the pixel to which the present technology is applied.

FIG. 10 is a vertical cross-sectional view of a pixel 50*e* in a fifth embodiment to which the present technology is applied.

The pixel 50*e* in the fifth embodiment differs from the pixel 50*a* in the first embodiment in that a side wall film 85*e* that is formed on an inner wall of DTI 82*e* and that includes SiO2 is thicker than the side wall film 85 in the pixel 50*e* in the first embodiment, but the pixel 50*e* in the fifth embodiment is otherwise similar to the pixel 50*a* in the first embodiment.

SiO2 has a lower refractive index than Si, and thus incident light entering the Si substrate 70 is reflected in accordance with the Snell's law, reducing transmittance of light to the adjacent pixels 50. However, a reduced thickness of the side wall film 85 may prevent the Snell's law from being completely established, leading to an increased amount of transmitted light.

The increased film thickness of the side wall film 85*e* formed in the pixel 50*e* in the fifth embodiment enables a reduction in deviation from the Snell's law, allowing for an increase in reflection of incident light at the side wall film 85*e* to reduce transmission of the light to the adjacent pixel 50*e*. Accordingly, in addition to producing an effect similar to the effect of the pixel 50*a* in the first embodiment, the pixel 50*e* in the fifth embodiment can exert an effect of allowing inhibition of color mixing into the adjacent pixels 50*e* caused by oblique incident light.

Sixth Embodiment

Figure 11:
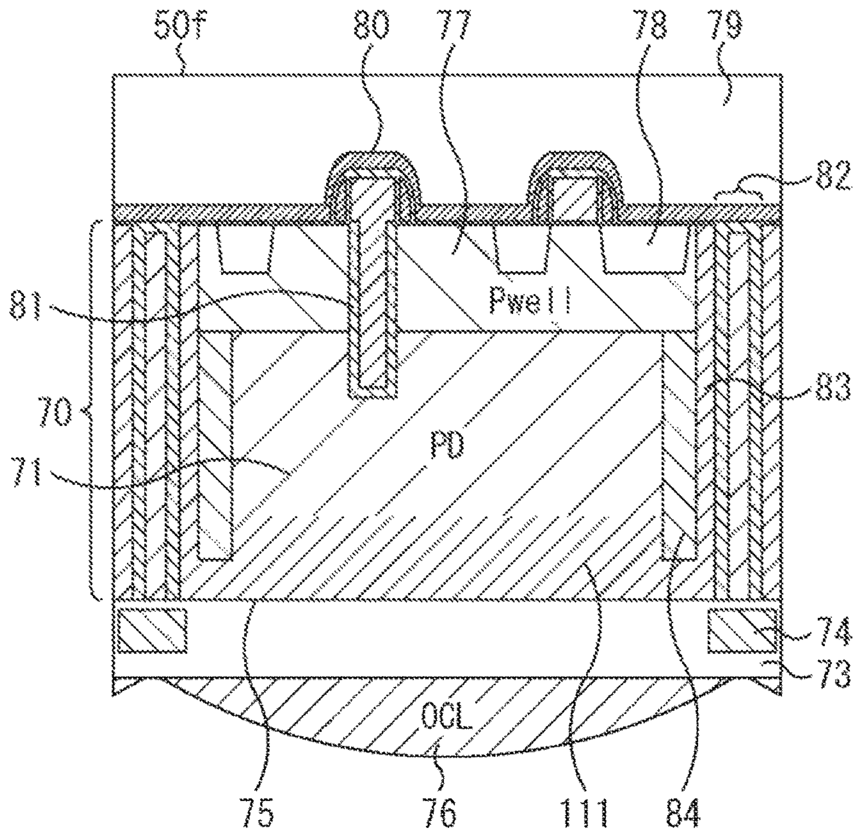
FIG. 11 is a vertical cross-sectional view depicting a sixth configuration example of the pixel to which the present technology is applied.

FIG. 11 is a vertical cross-sectional view of a pixel 50*f* in a sixth embodiment to which the present technology is applied.

The pixel 50*f* in the sixth embodiment differs from the pixel 50*a* in the first embodiment in that a region 111 between the PD 71 and the back side Si interface 75 is doped with P-type impurities to provide a concentration gradient such that the concentration of the P-type impurities in the Si substrate 70 is higher on the front side than on the back side, but the pixel 50*f* in the sixth embodiment is otherwise similar to the pixel 50*a* in the first embodiment.

Referring back to FIG. 3, the pixel 50*a* of the first embodiment has no concentration gradient in the Si substrate 70 and includes the P-type region 72 between the Si substrate 70 and the back side Si interface 75. In the pixel 50*f* in the sixth embodiment, the Si substrate 70 is provided with a concentration gradient. The concentration gradient is such that the concentration of the P-type impurities is higher on the back side (P-type region 111 side) than on the front side.

In addition to producing an effect similar to the effect of the pixel 50*a* in the first embodiment, the pixel 50*f* in the sixth embodiment having the concentration gradient as described above can exert a further effect of allowing charge to be read out more easily as compared to the pixel 50*a* in the first embodiment.

Seventh Embodiment

Figure 12:
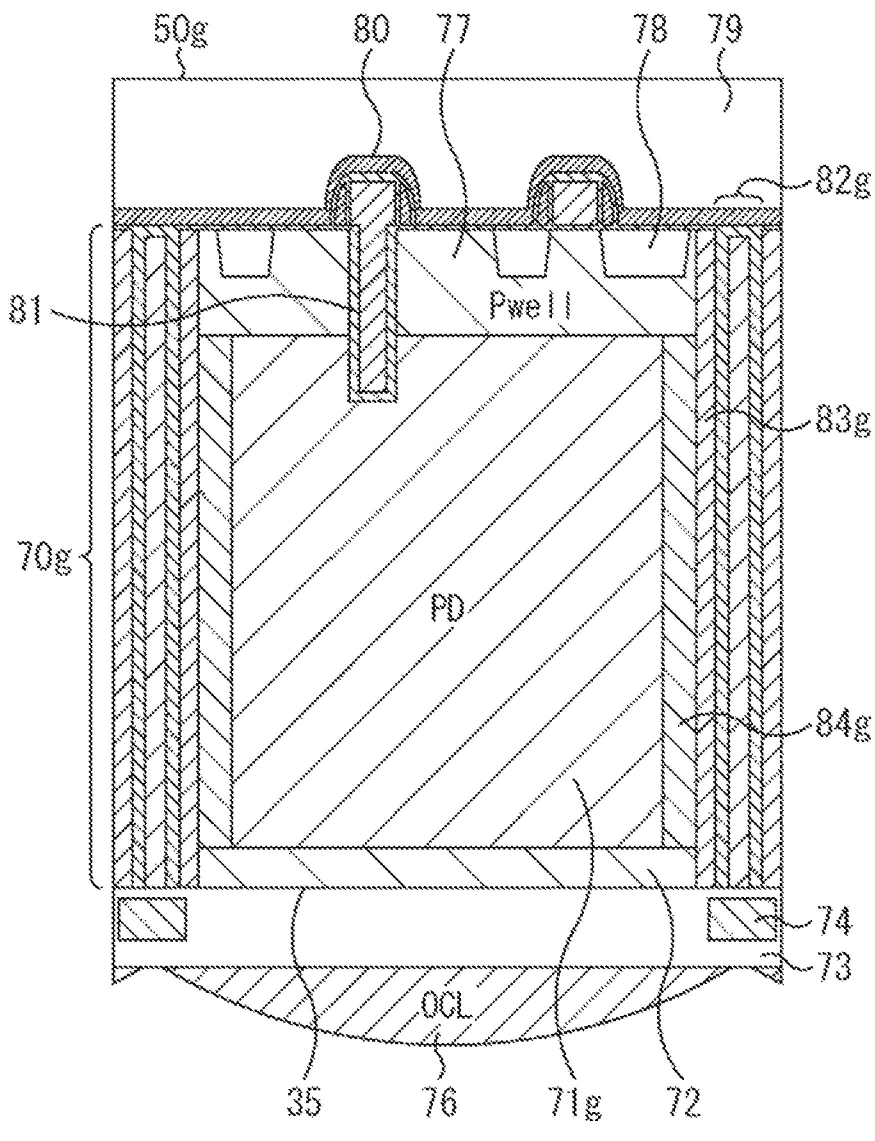
FIG. 12 is a vertical cross-sectional view depicting a seventh configuration example of the pixel to which the present technology is applied.

FIG. 12 is a vertical cross-sectional view of a pixel 50*g* in a seventh embodiment to which the present technology is applied.

The pixel 50*g* in the seventh embodiment differs from the pixel 50*a* in the first embodiment in that the Si substrate 70 is thicker in the pixel 50*g* than in the pixel 50*a* and that the increased thickness of the Si substrate 70 increases the depths of the DTI 82 and the like formed in the pixel 50*g*.

An Si substrate 70*g* formed in the pixel 50*g* in the seventh embodiment has an increased thickness. The increased thickness of the Si substrate 70*g* increases the area (volume) of a PD 71*g* and the depth of DTI 82*g*. Additionally, formation of the DTI 82*g* with the increased depth leads to formation of a P-type solid phase diffusion layer 83*g* and an N-type solid phase diffusion layer 84*g* both having an increased depth (increased area).

The increased areas of the P-type solid phase diffusion layer 83*g* and the N-type solid phase diffusion layer 84*g* increase the area of the PN junction region including the P-type solid phase diffusion layer 83*g* and the N-type solid phase diffusion layer 84*g*. Consequently, in addition to producing an effect similar to the effect of the pixel 50*a* in the first embodiment, the pixel 50*g* in the seventh embodiment can further increase the amount of saturated charge Qs compared to the pixel 50*a* in the first embodiment.

Eighth Embodiment

Figure 13:
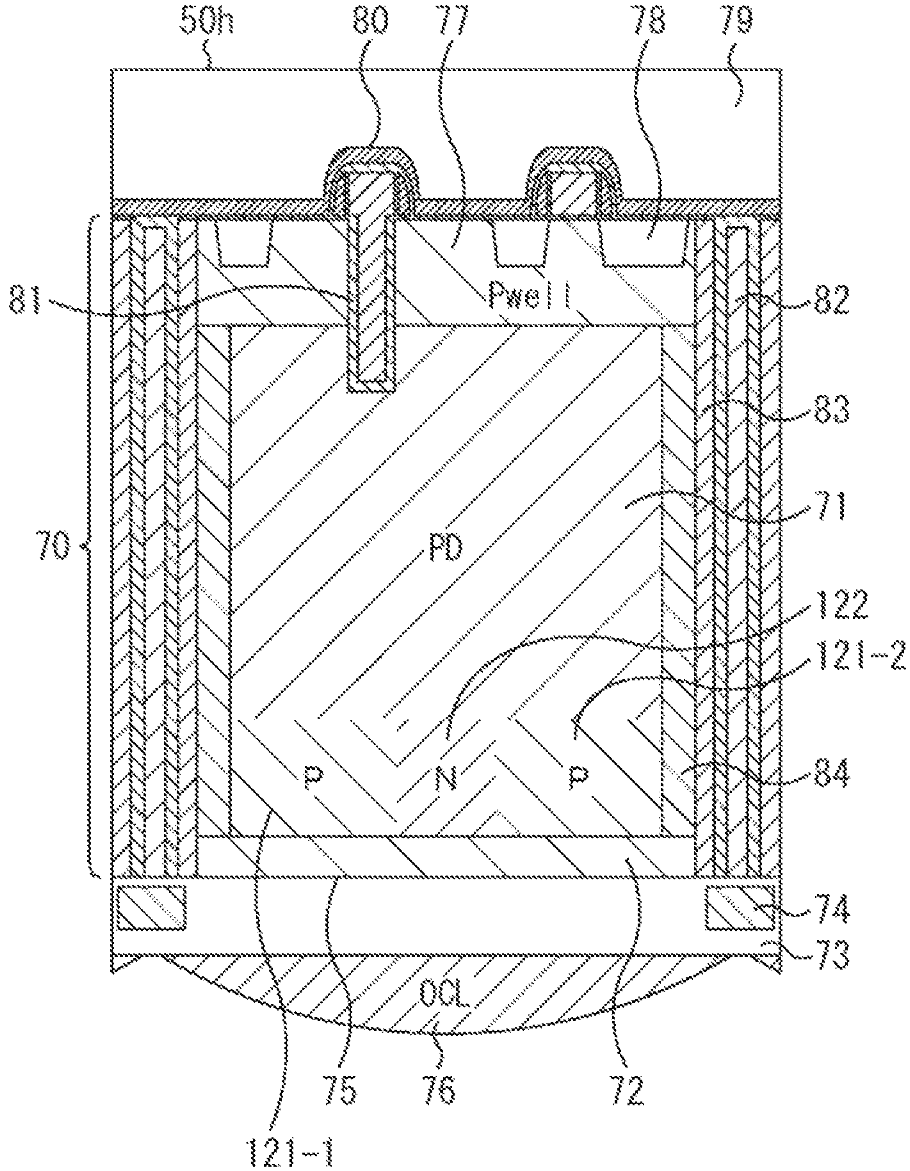
FIG. 13 is a vertical cross-sectional view depicting an eighth configuration example of the pixel to which the present technology is applied.

FIG. 13 is a vertical cross-sectional view of a pixel 50*h* in an eighth embodiment to which the present technology is applied.

In the pixel 50*h* in the eighth embodiment, as in the pixel 50*g* in the seventh embodiment depicted in FIG. 12, the Si substrate 70*g* has an extended length in the depth direction.

Furthermore, in a pixel 50*r*, a P-type region 121-1, an N-type region 122, and a P-type region 121-2 are formed on the back side of the PD 71 by ion injection. A PN junction portion defined by the P-type region 121-1, the N-type region 122, and the P-type region 122-2 is subjected to an intense electric field and can thus hold charge.

Consequently, in addition to producing an effect similar to the effect of the pixel 50*g* in the seventh embodiment, the pixel 50*h* in the eighth embodiment can further increase the amount of saturated charge Qs.

Ninth Embodiment

Figure 14:
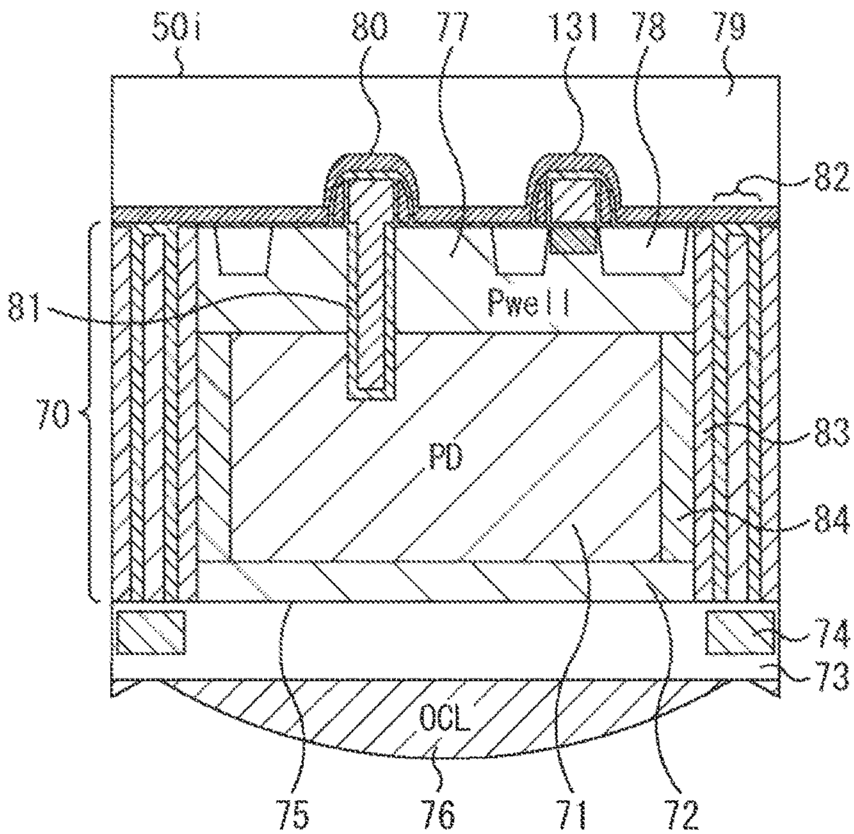
FIG. 14 is a vertical cross-sectional view depicting a ninth configuration example of the pixel to which the present technology is applied.

FIG. 14 is a vertical cross-sectional view of a pixel 50*i* in a ninth embodiment to which the present technology is applied.

The pixel 50*i* in the ninth embodiment differs from the pixel 50*a* in the first embodiment in that a MOS capacitor 131 and a pixel transistor (not depicted) are formed on the front side of the Si substrate 70, but the pixel 50*i* in the ninth embodiment is otherwise similar to the pixel 50*a* in the first embodiment.

Normally, even with an increased amount of saturated charge Qs of the PD 71, the amplitude limit of vertical signal lines VSL (vertical signal lines 47 depicted in FIG. 2) limits output unless conversion efficiency is reduced, leading to difficulty in making the most of the increased amount of saturated charge Qs.

Reducing the conversion efficiency of the PD 71 requires addition of a capacity to the FD 91 (FIG. 4). Thus, the pixel 50*i* in the ninth embodiment is configured such that the MOS capacitor 131 is added as a capacity to be added to the FD 91 (not depicted in FIG. 11).

The pixel 50*i* in the ninth embodiment can be configured not only to produce an effect similar to the effect of the pixel 50*a* in the first embodiment but also to enable a reduction in the conversion efficiency of the PD 71 by addition of the MOS capacitor 131 to the FD 91, allowing the increased amount of saturated charge Qs to be made the most of.

10th Embodiment

Figure 15:
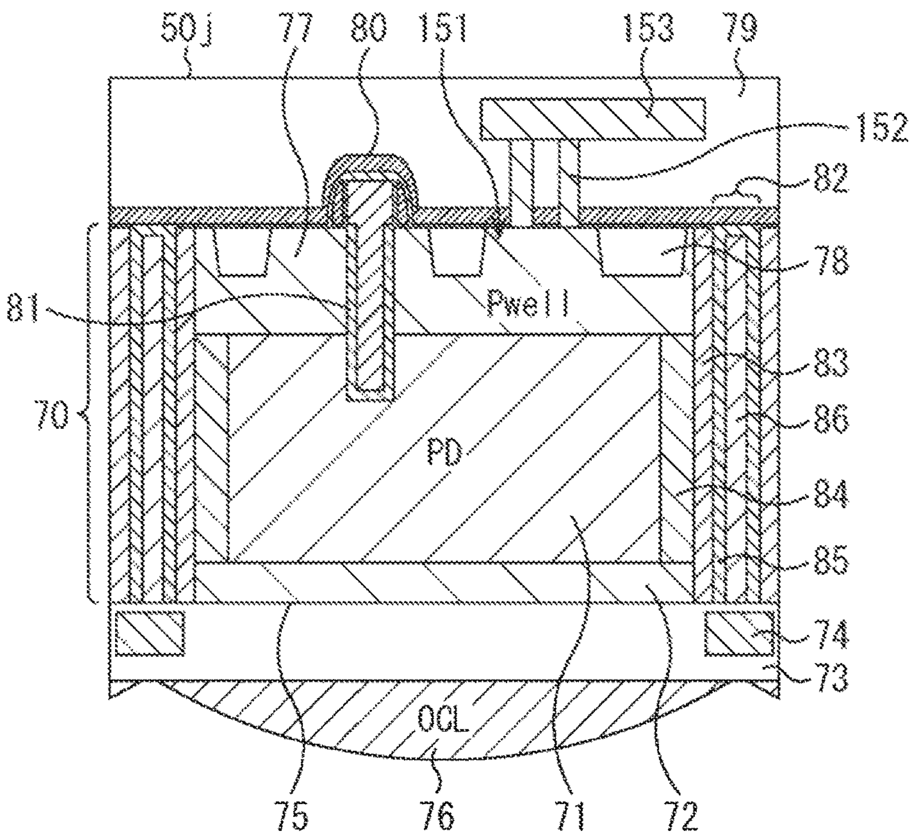
FIG. 15 is a vertical cross-sectional view depicting a 10th configuration example of the pixel to which the present technology is applied.

FIG. 15 is a vertical cross-sectional view of a pixel 50*j* in a 10th embodiment to which the present technology is applied.

The pixel 50*j* in the 10th embodiment differs from the pixel 50*a* in the first embodiment in that two contacts 152 are formed on a well contact portion 151 formed in the active region 77 and that the contacts 152 are connected to a Cu interconnect 153, but the pixel 50*j* in the 10th embodiment is otherwise similar to the pixel 50*a* in the first embodiment.

As described above, a configuration including the well contact portion 151 can be provided. Note that FIG. 15 depicts an example in which two contacts 152 are formed but two or more contacts 152 may be formed on the well contact portion 151.

In addition to producing an effect similar to the effect of the pixel 50*a* in the first embodiment, the pixel 50*j* in the 10th embodiment can improve major defect yield.

11th Embodiment

Figure 16:
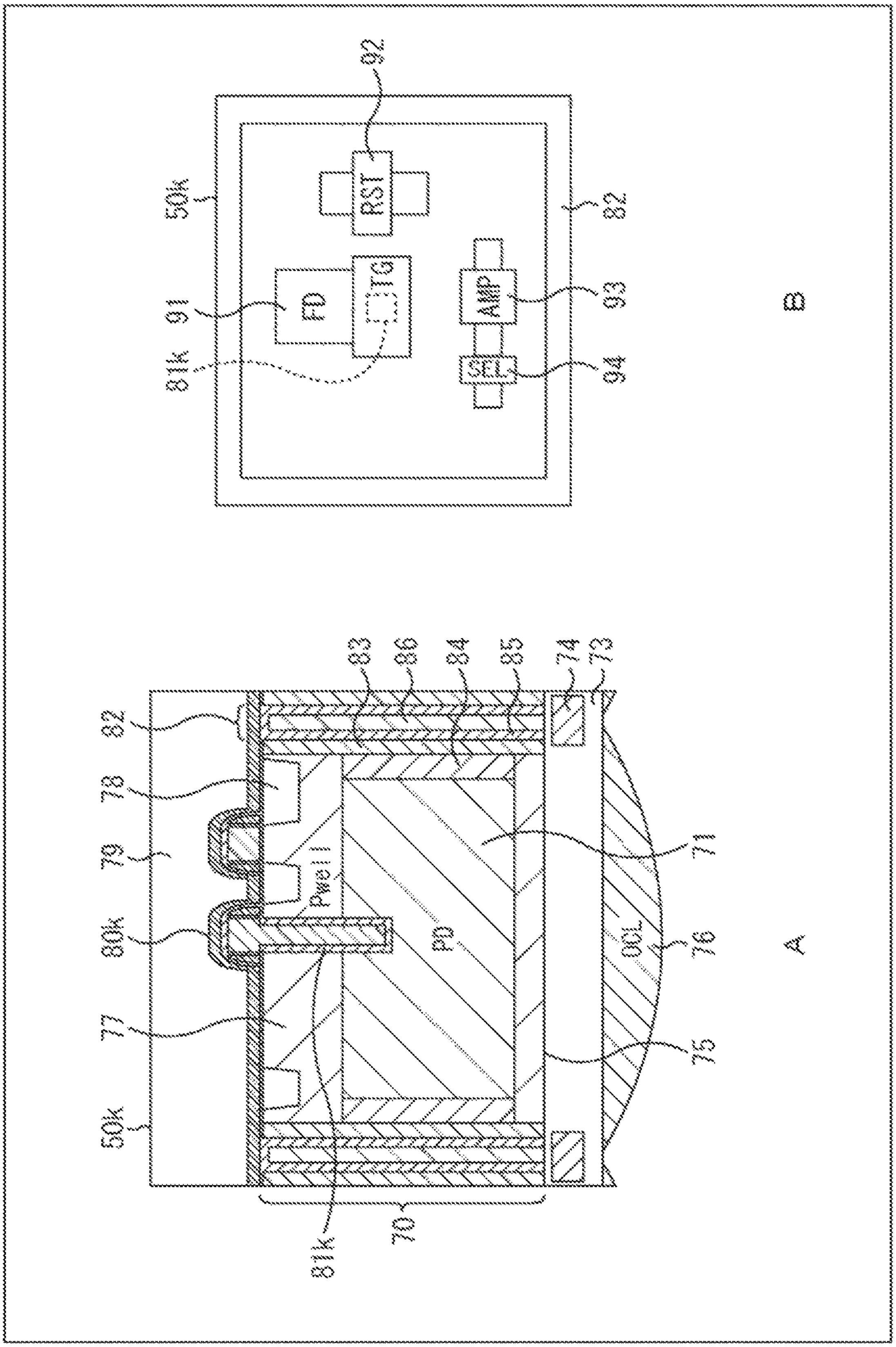
FIG. 16 depicts a vertical cross-sectional view and a plan view illustrating an 11th configuration example of the pixel to which the present technology is applied.

FIG. 16 illustrates a vertical cross-sectional view and a plan view of a pixel 50*k* in an 11th embodiment to which the present technology is applied.

The pixel 50*k* in the 11th embodiment differs from the pixel 50*a* in the first embodiment in that a vertical transistor trench 81*k* is formed in the center of the pixel 50*k* to form a transfer transistor (gate) 80*k*, but the pixel 50*k* in the 11th embodiment is otherwise similar to the pixel 50*a* in the first embodiment.

The pixel 50*k* depicted in FIG. 16 is formed such that the transfer transistor (gate) 80*k* is located at an equal distance from each outer circumference of the PD 71. Accordingly, in addition to producing an effect similar to the effect of the pixel 50*a* in the first embodiment, the pixel 50*k* in the 11th embodiment includes the transfer transistor (gate) present at the equal distance from each outer circumference of the PD 71, allowing transfer of charge to be improved.

12th Embodiment

Figure 17:
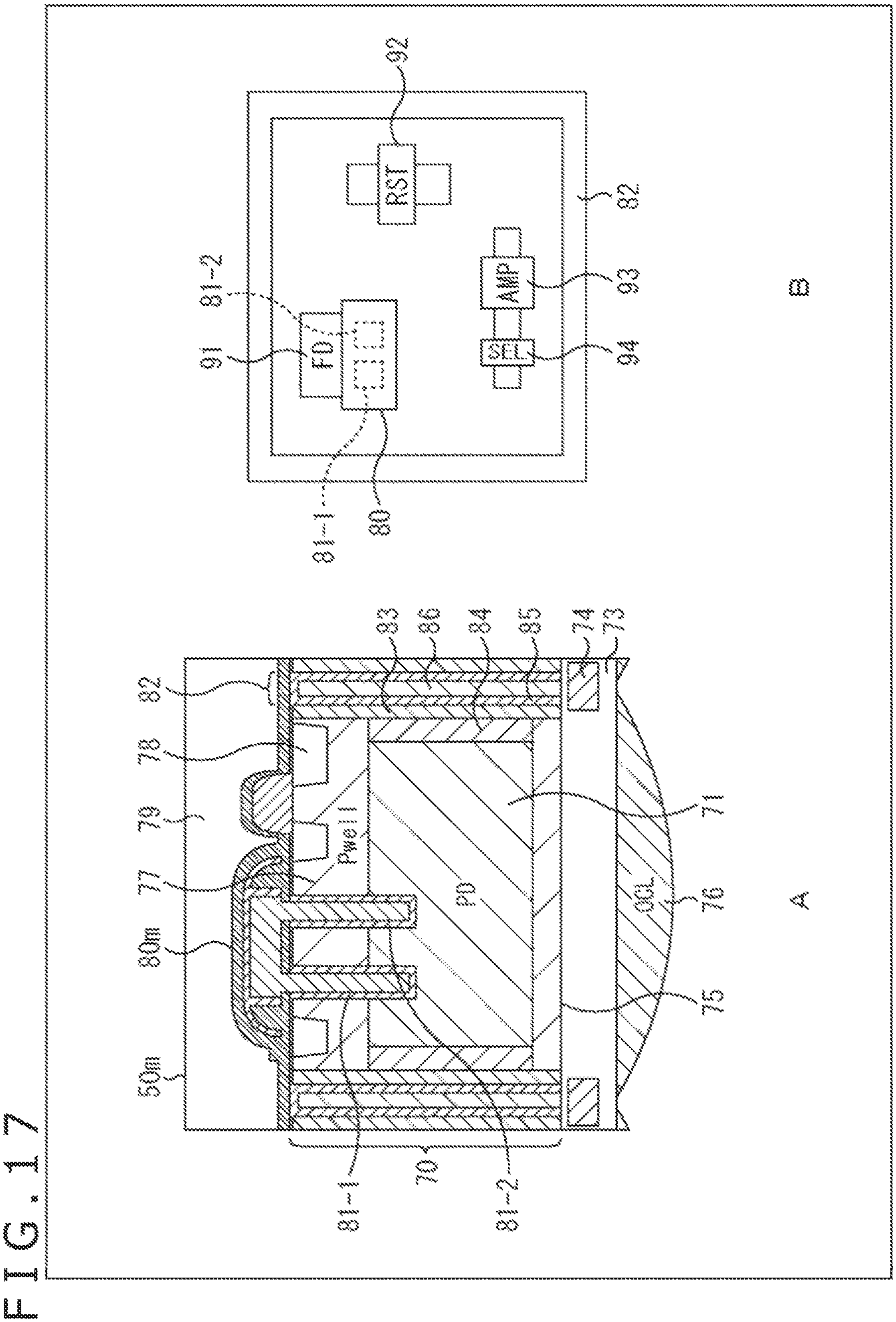
FIG. 17 depicts a vertical cross-sectional view and a plan view illustrating a 12th configuration example of the pixel to which the present technology is applied.

FIG. 17 illustrates a vertical cross-sectional view and a plan view of a pixel 50*m* in a 12th embodiment to which the present technology is applied.

The pixel 50*m* in the 12th embodiment differs from the pixel 50*a* in the first embodiment in that a transfer transistor 80*m* includes two vertical transistor trenches 81-1 and 81-2, but the pixel 50*m* in the 12th embodiment is otherwise similar to the pixel 50*a* in the first embodiment.

The pixel 50*a* in the first embodiment (FIG. 3) is configured such that the transfer transistor 80 includes the single vertical transistor trench 81, whereas, in the pixel 50*m* in the 12th embodiment, the transfer transistor 80*m* includes two vertical transistor trenches 81-1 and 81-2.

The configuration with the two vertical transistor trenches 81-1 and 81-2 as described above improves the followability of the potential of the region sandwiched between the two vertical transistor trenches 81-1 and 81-2 observed when the potential of the transfer transistor 80*k* is changed. Accordingly, a modulation factor can be increased. As a result, the charge transfer efficiency can be improved.

Additionally, an effect similar to the effect of the pixel 50*a* in the first embodiment is obtained.

Note that, although the description takes, as an example, the transfer transistor 80*k* including the two vertical transistor trenches 81-1 and 81-2, two or more vertical transistor trenches 81 may be formed in each pixel region.

Additionally, in the depicted example, the two vertical transistor trenches 81-1 and 81-2 formed are the same in size (length and thickness). However, in a case that a plurality of vertical transistor trenches 81 are formed, the vertical transistor trenches 81 formed may be different from each other in size. For example, the two vertical transistor trenches 81-1 and 81-2 may be formed such that one of the vertical transistor trenches 81-1 and 81-2 is longer or thicker than the other.

13th Embodiment

Figure 18:
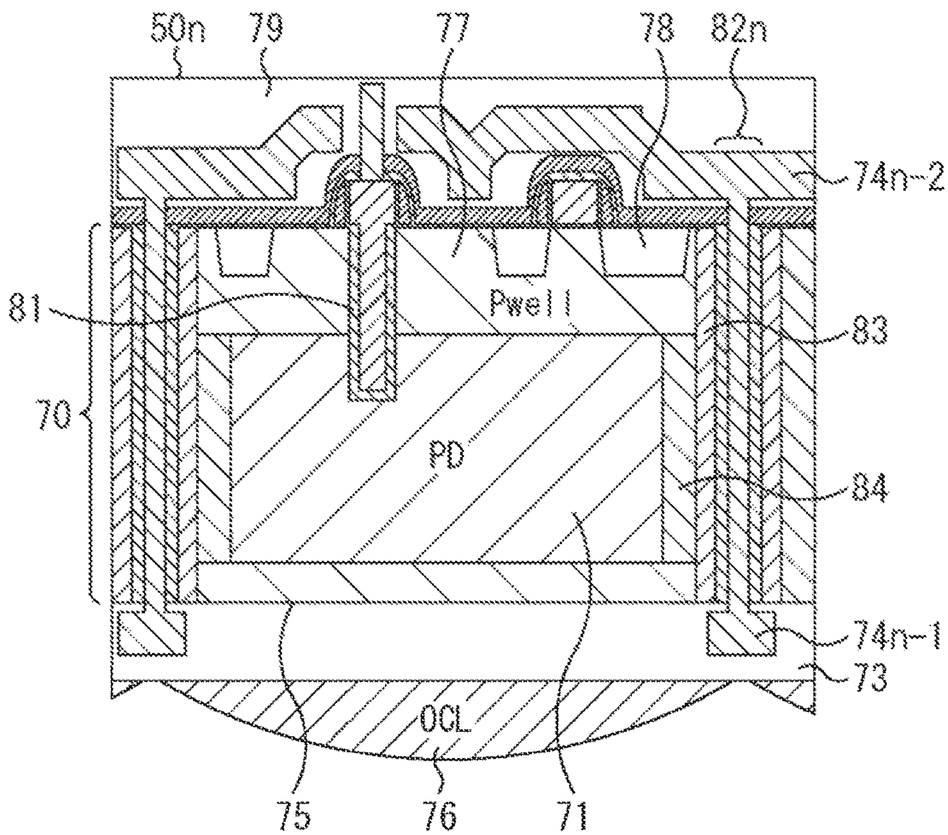
FIG. 18 is a vertical cross-sectional view depicting a 13th configuration example of the pixel to which the present technology is applied.

FIG. 18 is a vertical cross-sectional view of a pixel 50*n* in a 13th embodiment to which the present technology is applied.

The pixel 50*n* in the 13th embodiment differs from the pixel 50*a* in the first embodiment in the configuration of the light shielding films 74, but is otherwise similar to the pixel 50*a*.

In the pixel 50*n* in the 13th embodiment, a light shielding film 74*n*-1 and a light shielding film 74*n*-2 are respectively formed above and below DTI 82*n*. In the pixel 50*a* in the first embodiment (FIG. 3), the light shielding film 74 is formed on the back side of the DTI 82 (in the figure, the lower side) to cover the back side. However, in the pixel 50*n* (FIG. 18), the inside of the DTI 82*n* is filled with the same metal material (for example, tungsten) as that of the light shielding film 74, and the front side of the Si substrate 70 (in the figure, the upper side) is also covered with the metal material.

In other words, the pixel 50*n* is configured such that each entire pixel region except for the back side (except for the light incidence surface) is enclosed by the metal material. However, in a case where the pixel 50*n* is configured such that the entire pixel 50*n* except for the back side is enclosed by the metal material, an opening portion is formed as appropriate at a required position, for example, the portion of the light shielding film 74*n*-2 at which the transfer transistor 80*n* is located is opened and a terminal for connection to the outside is formed in the opening.

Note that a metal material other than tungsten (W) may be used for the light shielding films 74 and the like.

The pixel 50_n_ in the 13th embodiment can prevent incident light from leaking to the adjacent pixel 50_n_, thus allowing color mixing to be inhibited.

Additionally, the pixel 50_n_ can be configured such that light having reached the front side without being photoelectrically converted after being incident from the back side is reflected by the metal material (light shielding film 74_n_-2) and enters the PD 71 again. Accordingly, in addition to producing an effect similar to the effect of the pixel 50_a_ in the first embodiment, the pixel 50_n_ in the 13th embodiment can improve the sensitivity of the PD 71.

14th Embodiment

Figure 19:
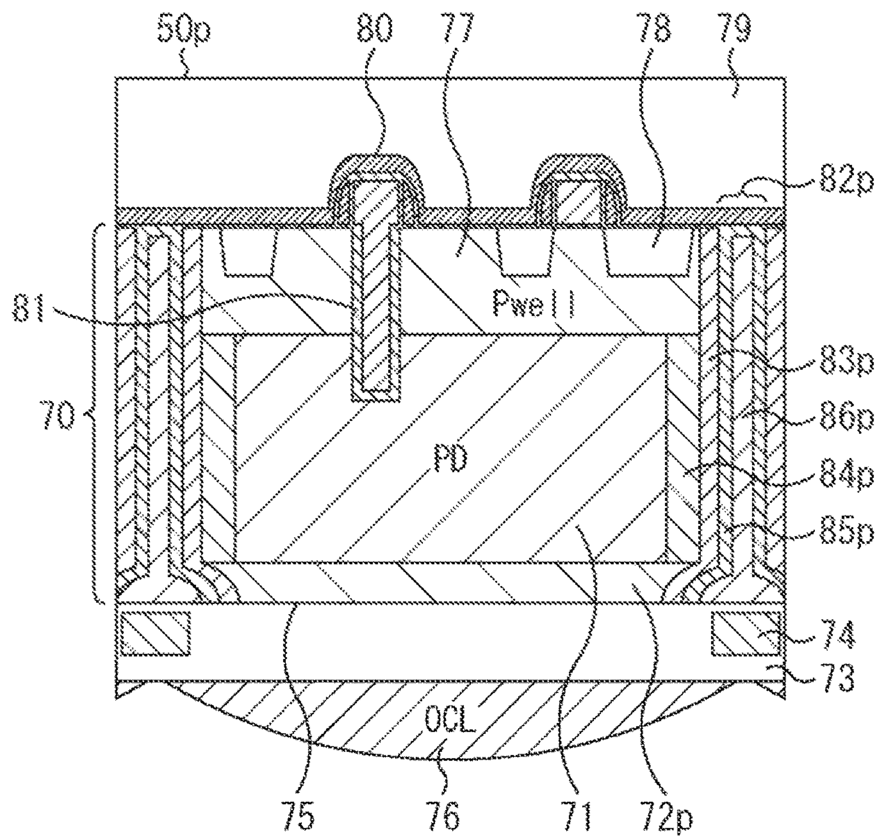
FIG. 19 is a vertical cross-sectional view depicting a 14th configuration example of the pixel to which the present technology is applied.

FIG. 19 is a vertical cross-sectional view of a pixel 50_p_ in a 14th embodiment to which the present technology is applied.

The pixel 50_p_ in the 14th embodiment differs from the pixel 50_a_ in the first embodiment in the shapes of a P-type solid phase diffusion layer 83_p_ and a side wall film 85_p_ formed on the back side, but is otherwise similar to the pixel 50_a_ in the first embodiment.

The P-type solid phase diffusion layer 83_p_ on the back side of the pixel 50_p_ is shaped to project toward an area below the N-type solid phase diffusion layer 84_p_. The pixel 50_p_ includes the P-type solid phase diffusion layer 83_p_ formed at an end of a P-type region 72_p_ and shaped to project into the P-type region 72_p_. Additionally, the side wall film 85_p_ formed in the P-type solid phase diffusion layer 83_p_ is also shaped to project toward the P-type region 72_p_. Furthermore, a filler 86_p_ formed in the side wall film 85_p_ is shaped to project toward the P-type region 72_p_.

Such a shape provides a configuration in which the N-type solid phase diffusion layer 84_p_ is more reliably prevented from contacting the back side Si interface 75 of the Si substrate 70. This allows pinning of charge to be prevented from being weakened, enabling prevention of flow of charge into the PD 71 which would otherwise degrade the Dark property.

When the N-type solid phase diffusion layer 84_p_ is formed, the depth or the concentration of the N-type solid phase diffusion layer 84_p_ may vary. For example, a variation may occur such that the N-type solid phase diffusion layer 84 formed in an A pixel 50 is deeper than the N-type solid phase diffusion layer 84 formed in a B pixel 50. In this case, the deeper N-type solid phase diffusion layer 84 may extend through the P-type region 72 or penetrate the P-type region 72 to reach the back side Si interface 75 of the Si substrate 70.

Additionally, a variation may occur such that the N-type impurities in the N-type solid phase diffusion layer 84 formed in the A pixel 50 have higher concentration than the N-type impurities in the N-type solid phase diffusion layer 84 formed in the B pixel 50. In this case, the N-type solid phase diffusion layer 84 with higher concentration may extend through the P-type region 72 or penetrate the P-type region 72 to reach the back side Si interface 75 of the Si substrate 70.

In the pixel 50_p_, on the back side Si interface 75 side of the N-type solid phase diffusion layer 84_p_, not only the P-type region 72, but also the P-type solid phase diffusion layer 83_p_ is shaped to project to the area below the N-type solid phase diffusion layer 84_p_. Thus, given that the depth or concentration of the N-type solid phase diffusion layer 84 varies as described above, the variation can be absorbed, and the P-type solid phase diffusion layer 83_p_ can reliably prevent the N-type solid phase diffusion layer 84_p_ from contacting the back side Si interface 75 of the Si substrate 70.

The pixel 50_p_ in the 14th embodiment can produce an effect similar to the effect of the pixel 50_a_ in the first embodiment.

<Shape of Intense Electric Field Region>

Figure 20:
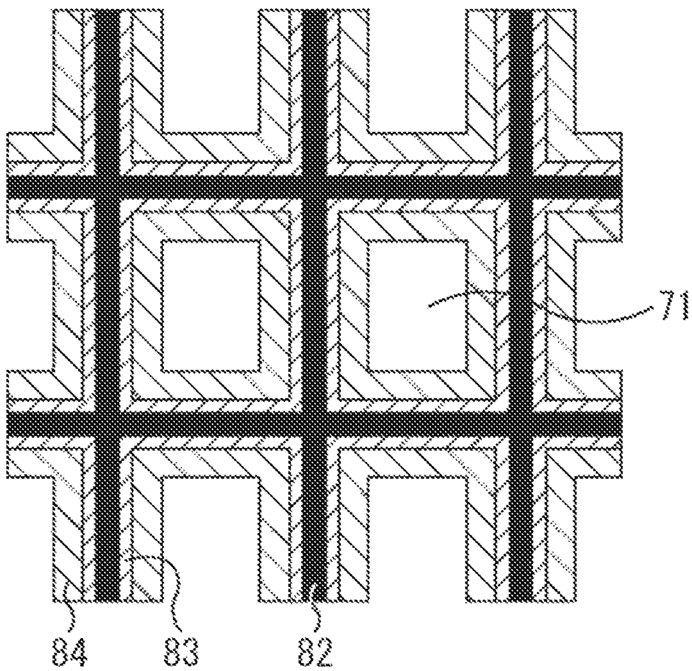
FIG. 20 is a plan view depicting a configuration example of pixels to which the present technology is applied.

The pixel 50 in the first to 14th embodiments is formed to be enclosed by the DTI 82 in plan view, for example, as depicted in FIG. 20. On the side wall of the DTI 82, a PN junction region including the P-type solid phase diffusion layer 83 and the N-type solid phase diffusion layer 84 is formed to provide an intense electric field region. Note that the above description and the description below include a configuration in which a depletion layer region is present between the P-type solid phase diffusion layer 83 and the N-type solid phase diffusion layer 84, as well as a configuration in which the PN junction region includes only the P-type solid phase diffusion layer 83 and the N-type solid phase diffusion layer 84.

As depicted in FIG. 20, the PD 71 is enclosed by the N-type solid phase diffusion layer 84. The N-type solid phase diffusion layer 84 is enclosed by the P-type solid phase diffusion layer 83. Further, the P-type solid phase diffusion layer 83 is enclosed by the DTI 82.

As described above, the P-type solid phase diffusion layer 83 and the N-type solid phase diffusion layer 84 form the PN junction region, leading to formation of an intense electric field region around the PD 71. This enables an increase in the amount of saturated charge. Description will be given below of the shape, in plan view, of a PN junction region further increasing the amount of saturated charge Qs compared to the linearly shaped PN junction region, as depicted in FIG. 20.

The shape of the intense electric field region will be described below as 15th to 19th embodiments, and any of the 15th to 19th embodiments can be combined with any of the first to 14th embodiments described above.

Additionally, the above description and the description below take, as an example, the PN junction region including the P-type solid phase diffusion layer 83 and the N-type solid phase diffusion layer 84 arranged in this order from the DTI 82 side toward the PD 71 side. However, depending on the configuration of the PD 71, the PN junction region may include the N-type solid phase diffusion layer 84 and the P-type solid phase diffusion layer 83 arranged in this order from the DTI 82 side toward the PD 71 side. The present technology is applicable in a case where the PN junction region provided in the side wall of the DTI 82 includes a first impurity region including first impurities and a second impurity region including second impurities and the first impurities are N-type impurities, whereas the second impurities are P-type impurities, or the first impurities are P-type impurities, whereas the second impurities are N-type impurities.

Additionally, the P type and the N type described above and below represent functioning as the P type or the N type with respect to a predetermined material. The description here takes, as an example, the pixels using the Si substrate 70, and thus the description below takes, as an example, a configuration in which impurities functioning as the P type with respect to Si (silicon) are treated as P-type impurities and impurities functioning as the N type with respect to Si (silicon) are treated as N-type impurities.

15th Embodiment

Figure 21:
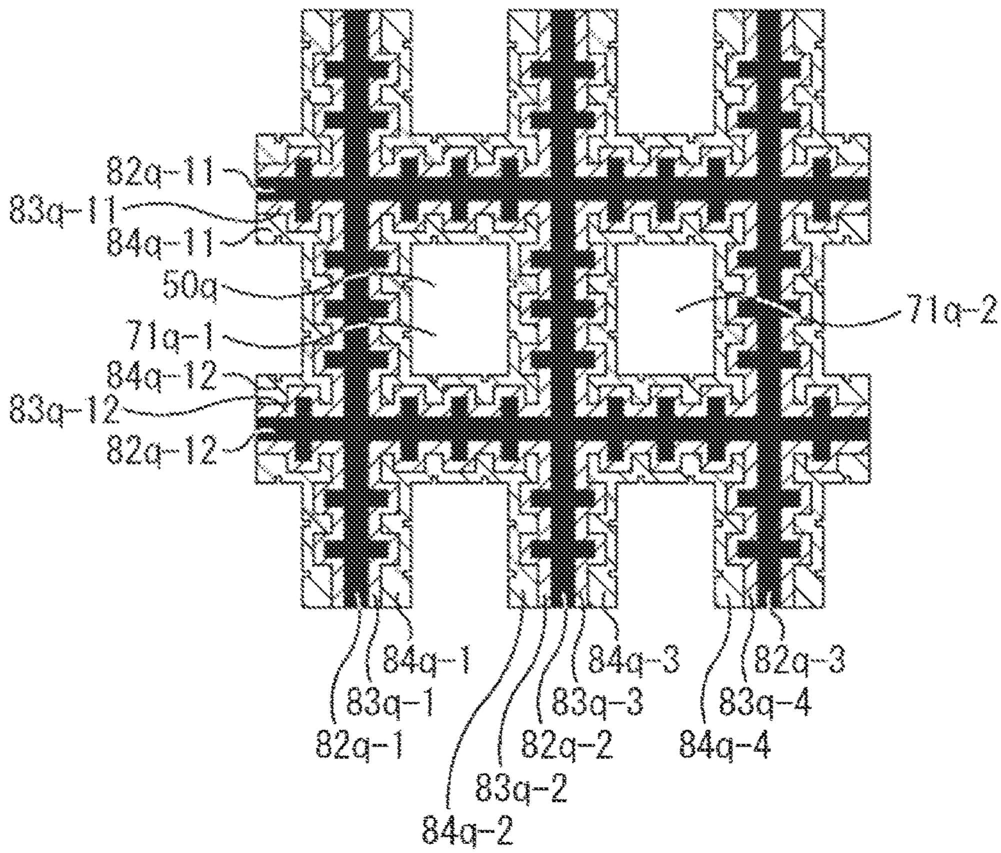
FIG. 21 is a plan view depicting a 15th configuration example of the pixel to which the present technology is applied.

FIG. 21 is a horizontal cross-sectional view (plan view) of a pixel 50_q_ in a 15th embodiment to which the present technology is applied.

The pixel 50q in the 15th embodiment is shaped such that an intense electric field region enclosing a PD 71q includes recesses and protrusions. Referring to the pixel 50q depicted in FIG. 21, when focus is placed on a PD 71q-1 included in the pixel 50q, DTI 82q corresponding to sides enclosing the PD 71q-1 is shaped with protruding portions (recessed portions).

The description will be continued in conjunction with the protruding portions. However, whether the portion protrudes or is recessed with respect to a side used as a reference depends on which of the sides is used as the reference. Here, the description will be continued by defining a portion of the DTI 82q that has a linear shape and that is continuously formed (in FIG. 20, a portion described as DTI 82), as a reference, and describing the portions protruding with respect to the DTI 82q defined as the reference, as the protruding portions.

According to the shape of the DTI 82q, the P-type solid phase diffusion layer 83q is shaped to include protruding portions. Further, according to the shape of the P-type solid phase diffusion layer 83q, the N-type solid phase diffusion layer 84q is also shaped to include protruding portions (the protruding portions of the P-type solid phase diffusion layer 83q correspond to recessed portions of the N-type solid phase diffusion layer 84q).

The P-type solid phase diffusion layer 83q is provided with the protruding portions, enabling an increase in the area where the P-type solid phase diffusion layer 83q contacts the N-type solid phase diffusion layer 84q. This enlarges the PN junction region including the P-type solid phase diffusion layer 83q and the N-type solid phase diffusion layer 84q, enlarging the intense electric field region. The enlarged intense electric field region increases the amount of charge that can be held in the intense electric field region, enabling an increase in the amount of saturated charge.

In the pixel 50q depicted in FIG. 21, for example, a DTI 82q-1 side that is included in four sides enclosing the PD 71q-1 and that is formed to the left of the PD 71q-1 is provided with three protruding portions. The number of the protruding portions is illustrative, and it is sufficient to form one or more protruding portions. Additionally, instead of the rectangle, another shape may be used. The other shape may be a triangle described below as a 16th embodiment.

Additionally, the pixel 50q depicted in FIG. 21 is an example in which each of the four sides enclosing the PD 71q-1 is provided with three protruding portions. However, at least one of the four sides can be provided with protruding portions. For example, as in the pixel 50q depicted in FIG. 22, one of the four sides enclosing the PD 71q can be provided with protruding portions.

Figure 22:
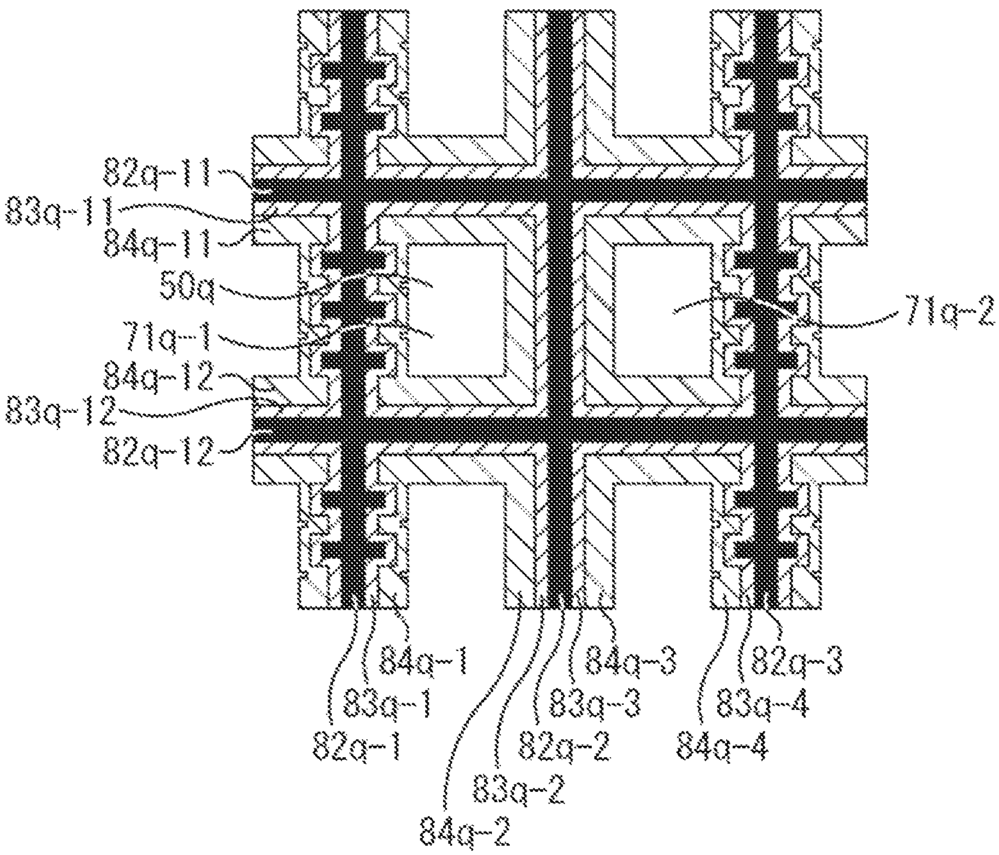
FIG. 22 is a plan view depicting another 15th configuration example of the pixel to which the present technology is applied.

In the pixel 50q depicted in FIG. 22, when focus is placed on the PD 71q-1 included in the pixel 50q, protruding portions are formed on left DTI 82q-1, and no protruding portions are formed on right DTI 82q-2, upper DTI 82q-11, and lower DTI 82q-12. As described above, a configuration in which protruding portions are formed on one of the four sides enclosing the PD 71q to form an intense electric field region larger than the other intense electric field regions can be provided.

Additionally, although not depicted, a configuration in which protruding portions are provided on two or three of the four sides may be provided.

Provision of the protruding portions allows the intense electric field region to be enlarged. However, the light receiving area of the PD 71q may be reduced. The size of the protruding portion can be set in association with the size of the PD 71q. Additionally, the size of the protruding portion can be adjusted by setting sides provided with the protruding portions (how many of the one to four sides are provided with the protruding portions) as described above. In addition, the size of the intense electric field region can also be adjusted by adjusting the size of the protruding portion itself.

Figure 23:
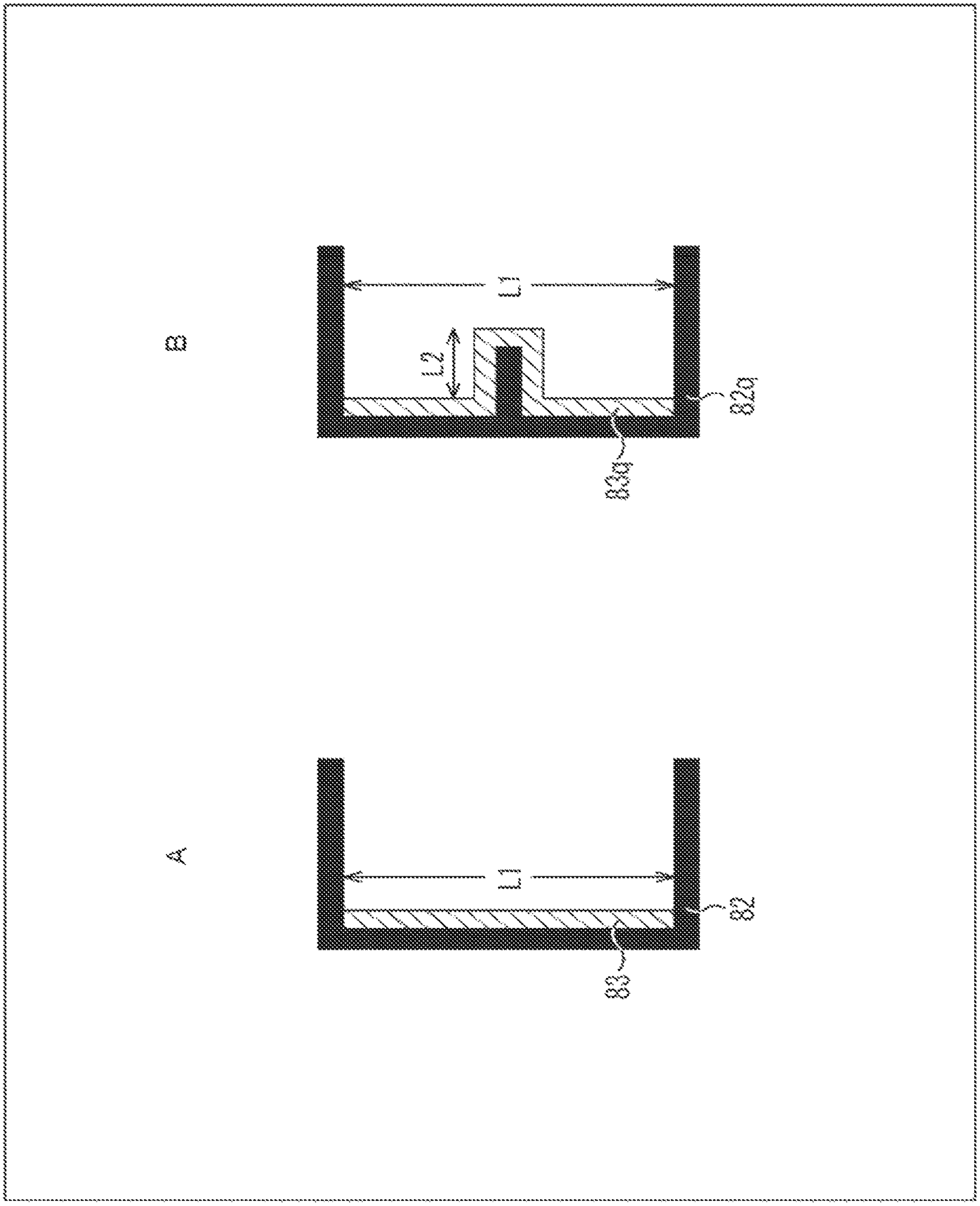
FIG. 23 depicts diagrams of assistance in describing the size of a protruding portion.

With reference to FIG. 23, the size of the protruding portion will be described. With reference to FIG. 23, the description takes, as an example, one side enclosing the PD 71. In FIG. 23, A illustrates one side in a configuration in which the protruding portions depicted in FIG. 20 are not formed. In FIG. 23, B illustrates one side in a configuration in which the protruding portions depicted in FIG. 21 or FIG. 22 are formed. Note that the description with respect to FIG. 23 does not take the thickness of the layer into account.

Referring to A of FIG. 23, in a case where no protruding portions are formed, DTI 82 is shaped linearly, and the P-type solid phase diffusion layer 83 is formed along the DTI 82. Thus, the P-type solid phase diffusion layer 83 is also shaped linearly. The P-type solid phase diffusion layer 83 has a length L1. The length L1 corresponds to a distance between an upper side and a lower side of the DTI 82 formed around the PD 71.

With reference to B of FIG. 23, the description takes, as an example, a configuration in which protruding portions are formed. With reference to B of FIG. 23, the description takes, as an example, a configuration in which one protruding portion is formed on one side. Referring to B of FIG. 23, the DTI 82q is shaped to include one protruding portion on a straight line, and the P-type solid phase diffusion layer 83q is formed along the DTI 82q. Thus, the P-type solid phase diffusion layer 83q is also shaped to include a combination of a straight line and one protruding portion.

A portion of the P-type solid phase diffusion layer 83q corresponding to the height of the protruding portion has a length denoted by L2. The length L2 corresponds to a length from a linearly shaped portion of the P-type solid phase diffusion layer 83q to a tip part of the protruding portion. The P-type solid phase diffusion layer 83q with the protruding portion has a length (L1+2×L2) as depicted in B of FIG. 23.

In a case where a structure in which the P-type solid phase diffusion layer 83 is provided with no protruding portion is compared with a structure in which the P-type solid phase diffusion layer 83 is provided with one protruding portion, provision of one protruding portion increases the length of the P-type solid phase diffusion layer 83 by (2×L2). The length of the P-type solid phase diffusion layer 83 is equal to the length of a portion of the P-type solid phase diffusion layer 83 contacting the N-type solid phase diffusion layer 84q (not depicted in B of FIG. 23). Accordingly, provision of one protruding portion increases, by (2×L2), the portion of the P-type solid phase diffusion layer 83 contacting the N-type solid phase diffusion layer 84, increasing the PN junction area to allow the intense electric field region to be enlarged.

Provision of a plurality of protruding portions allows enlargement of the junction region between the P-type solid phase diffusion layer 83 and the N-type solid phase diffusion layer 84, enabling the intense electric field region to be enlarged.

The length L2 of the protruding portion can be set to, for example, 10 nm or more, though the length L2 may vary depending on the size of the pixel 50q. Additionally, in a case where the length L1 of the P-type solid phase diffusion layer 83 with no protruding portion formed is 1, the length L3 of the P-type solid phase diffusion layer 83 with a protruding portion formed is set to a predetermined value or larger, for example, 1.3 times or more. The length L3 can be adjusted by the length L2 of the one protruding portion or the number of protruding portions.

When the length L3 of the P-type solid phase diffusion layer 83*q* is larger than the length between two sides parallel to each other, of the four sides enclosing the PD 71*q*, for example, the upper and lower sides of the DTI 82, as described above, the PN junction area can be increased, allowing the intense electric field region to be enlarged. Since the P-type solid phase diffusion layer 83*q* is formed along the DTI 82*q*, the length L3 of the P-type solid phase diffusion layer 83*q* depends on the length of the side wall of the DTI 82*q*. Thus, the DTI 82*q* is formed such that the length of the side wall of the DTI 82*q* is larger than the length between the parallel-arranged portions of the DTI 82*q* of the DTI 82*u* enclosing the PD 71*q*, enabling an increase in the PN junction area to enlarge the intense electric field region.

The protruding portions thus formed on the P-type solid phase diffusion layer 83 enable an increase in a junction area between the P-type solid phase diffusion layer 83 and the N-type solid phase diffusion layer 84, thus allowing the amount of saturated charge to be increased.

Figure 24:
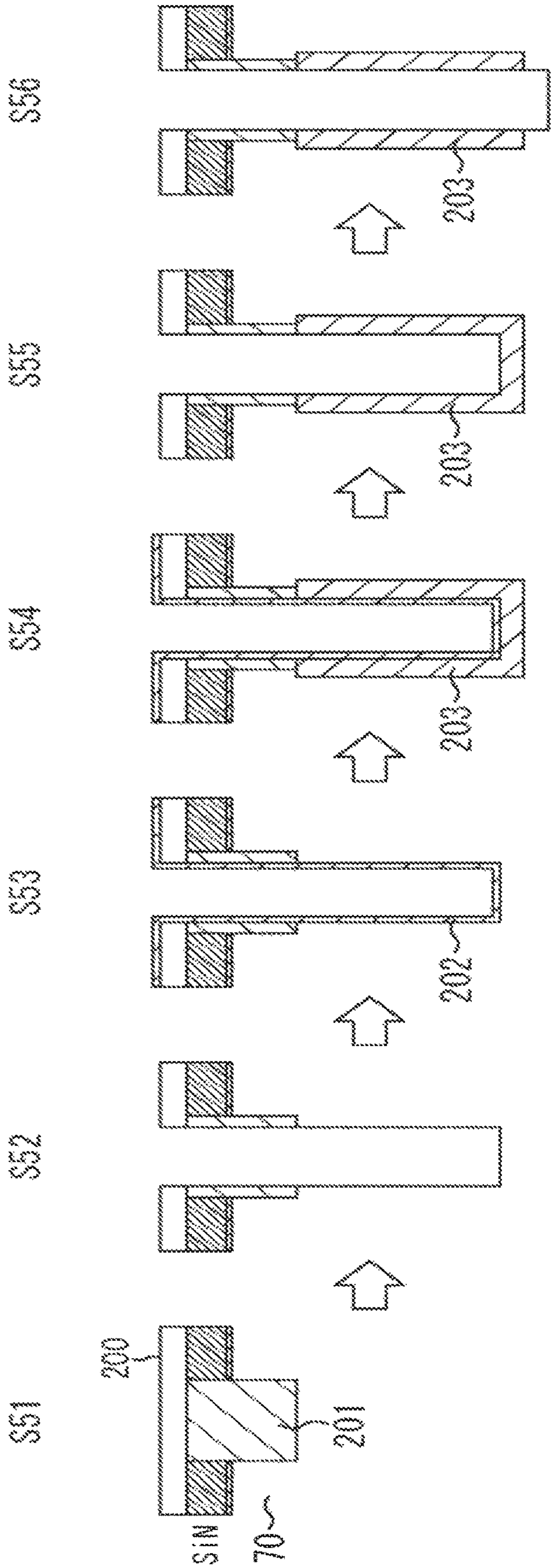
FIG. 24 is a diagram of assistance in describing manufacturing of a pixel to which the present technology is applied.
Figure 25:
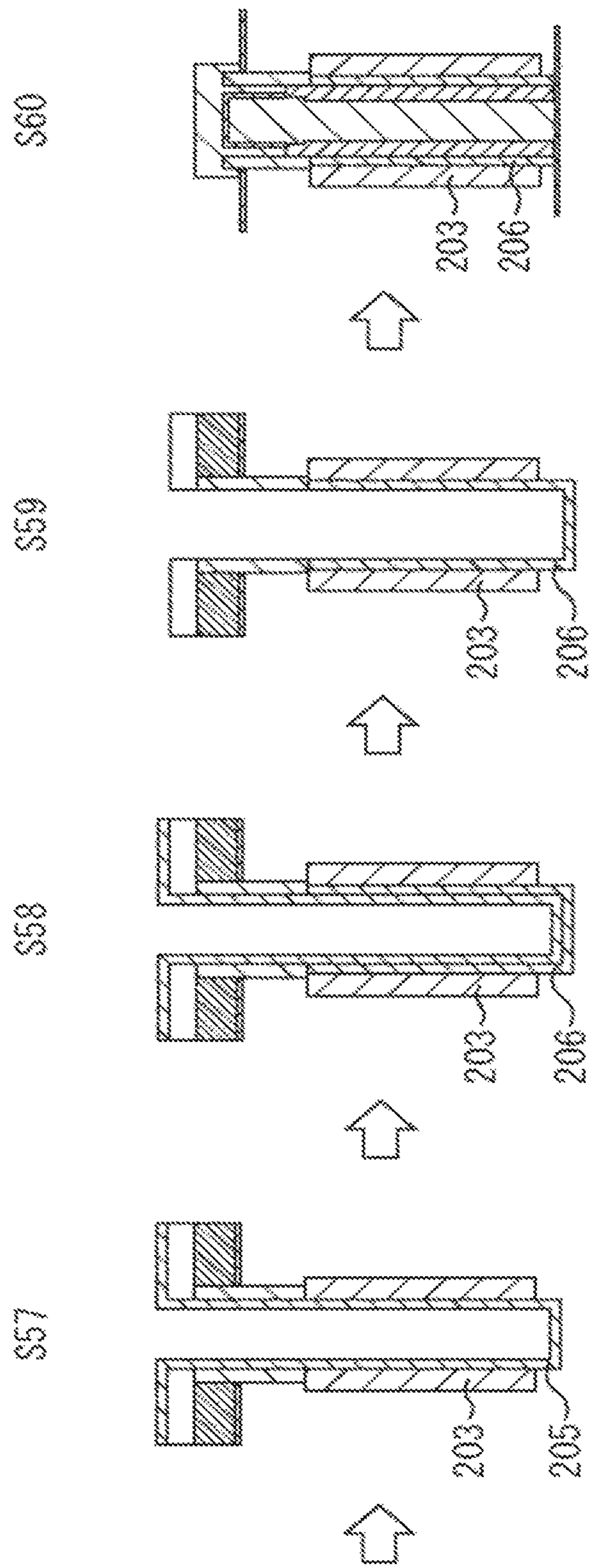
FIG. 25 is a diagram of assistance in describing manufacturing of a pixel to which the present technology is applied.

With reference to FIGS. 24 and 25, description will be given of a manner of manufacturing an intense electric field region in a case where the protruding portions are formed as described above. Here, the description will be continued taking, as an example, a structure in which each of the four sides enclosing the PD 71 illustrated in FIG. 21 includes protruding portions.

In step S51 (FIG. 24), a substrate in which the DTI 82 is formed is prepared. In the substrate, a silicon oxide film 200 is formed, and an insulating film (insulating material) 201 is embedded in trenches previously formed. As the silicon oxide film 200, for example, LP-TEOS is deposited.

Figure 26:
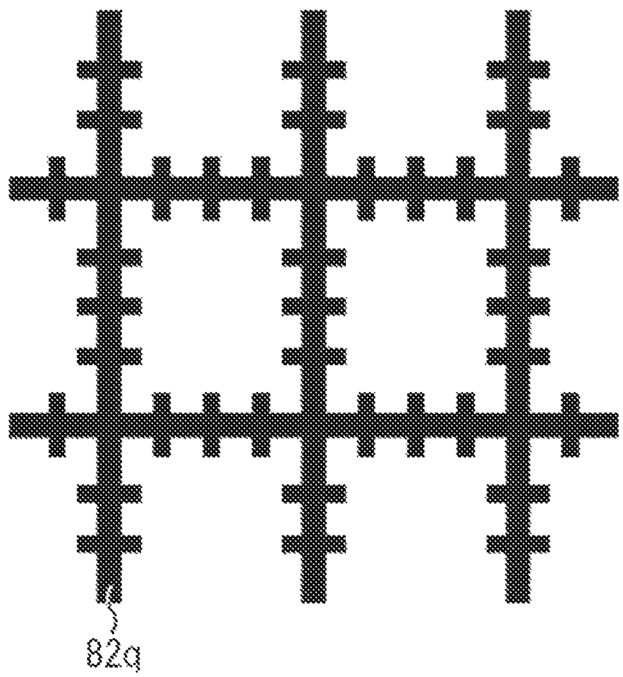
FIG. 26 is a diagram of assistance in describing the shape of a trench resulting from etching.

In step S52, a part of the silicon oxide film 200, a part of the insulating film 201, a part of SiN, and a part of the Si substrate 70 are dug by dry etching. In step S52, a deep trench is formed. In a planar shape, the deep trench is, for example, a combination of a grid shape and protruding portions as depicted in FIG. 26, and has a depth reaching the lower end of a region in which an N-type region is to be formed by solid-phase diffusion during the subsequent step.

In step S53, an ALD (Atomic Layer Deposition) method is used to deposit, on the entire surface of the wafer, a silicon oxide film (PSG) 202 including P (phosphorous). The treatment in step S53 forms the PSG film 202 on a front surface of the wafer in which no deep trench is formed, a side surface of the deep trench, and a bottom surface of the deep trench. Here, the use of P (phosphorous) causes the PSG film 202 to be formed as an N-type film.

In step S54, thermal diffusion treatment is executed. In step S54, the wafer is annealed to cause solid-phase diffusion in a region where the PSG film 202 is in contact with the Si substrate 70, and P (phosphorous) is diffused from the PSG film 202 to the Si substrate 70. As a result, as depicted in step S54 in FIG. 20, an N-type impurity region 203 is formed. The N-type impurity region 203 is a region corresponding to an N-type solid phase diffusion layer 84*q*.

In step S55, the PSG film 202 on the wafer is removed. Removal of the PSG film 202 is performed by, for example, wet etching using hydrofluoric acid.

Figure 27:
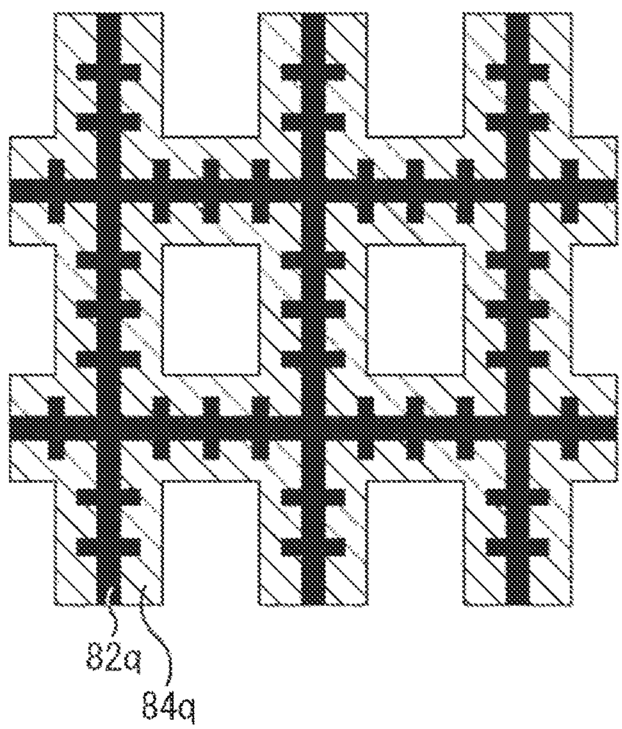
FIG. 27 is a diagram of assistance in describing the shape of an N-type solid phase diffusion layer resulting from etching.

In step S56, the silicon on the bottom surface of the deep trench in the wafer is dug further deeper by dry etching. At this time, grid-like train portions and trench portions of protruding portions depicted in FIG. 26 are both dug deeper. At this point of time, as depicted in FIG. 27, a region that corresponds to the N-type solid phase diffusion layer 84*q* has been formed. The N-type solid phase diffusion layer 84*q* depicted in FIG. 27 has a substantially linear shape on the PD 71 side.

In step S54, when phosphorous diffuses through the Si substrate 70, the diffusion progresses to the extent that the PD 71 side has a substantially linear shape depending on the shape and number of the protruding portions of the trench (DTI 82*q*), as illustrated in FIG. 27. The N-type solid phase diffusion layer 84*q* is not necessarily formed in the same shape as that of the trench. The N-type solid phase diffusion layer 84*q* may be shaped either as depicted in FIG. 27 or as depicted in FIG. 21, and both shapes are within the scope of the present technology. Either shape produces similar effects.

In step S57 (FIG. 25), the ALD (Atomic Layer Deposition) method is used to deposit a silicon oxide film (BSG) 205 including B (boron). The treatment in step S57 forms the BSG film 205 on a front surface of the wafer in which no deep trench is formed, a side surface of the deep trench, and a bottom surface of the deep trench. Here, the use of B (boron) causes the BSG film 205 to be formed as a P-type film.

In step S58, thermal diffusion treatment is executed. In step S58, the wafer is annealed to cause solid-phase diffusion in a region where the BSG film 205 is in contact with the Si substrate 70, and B (boron) is diffused from the BSG film 205 to the Si substrate 70. As a result, as depicted in step S58 in FIG. 25, a P-type impurity region 206 is formed. The P-type impurity region 206 is a region corresponding to a P-type solid phase diffusion layer 83*q* (FIG. 21).

In step S59, the BSG film 205 is removed. Removal of the BSG film 205 is performed by, for example, wet etching using hydrofluoric acid.

In step S60, polysilicon is embedded into the trenches as a filler 86*p*, and unnecessary polysilicon deposited on an upper surface of the wafer is removed. Additionally, pixel transistors, interconnects, and the like are formed. Subsequently, the Si substrate 70 is thinned from the back side. The thinning is performed to the degree that the bottom portion of the deep trench is exposed.

The P-type solid phase diffusion layer 83*q* with protruding portions as depicted in FIG. 21 or FIG. 22 is thus formed, leading to formation of the pixel 50*q* with an enlarged intense electric field region.

16th Embodiment

Figure 28:
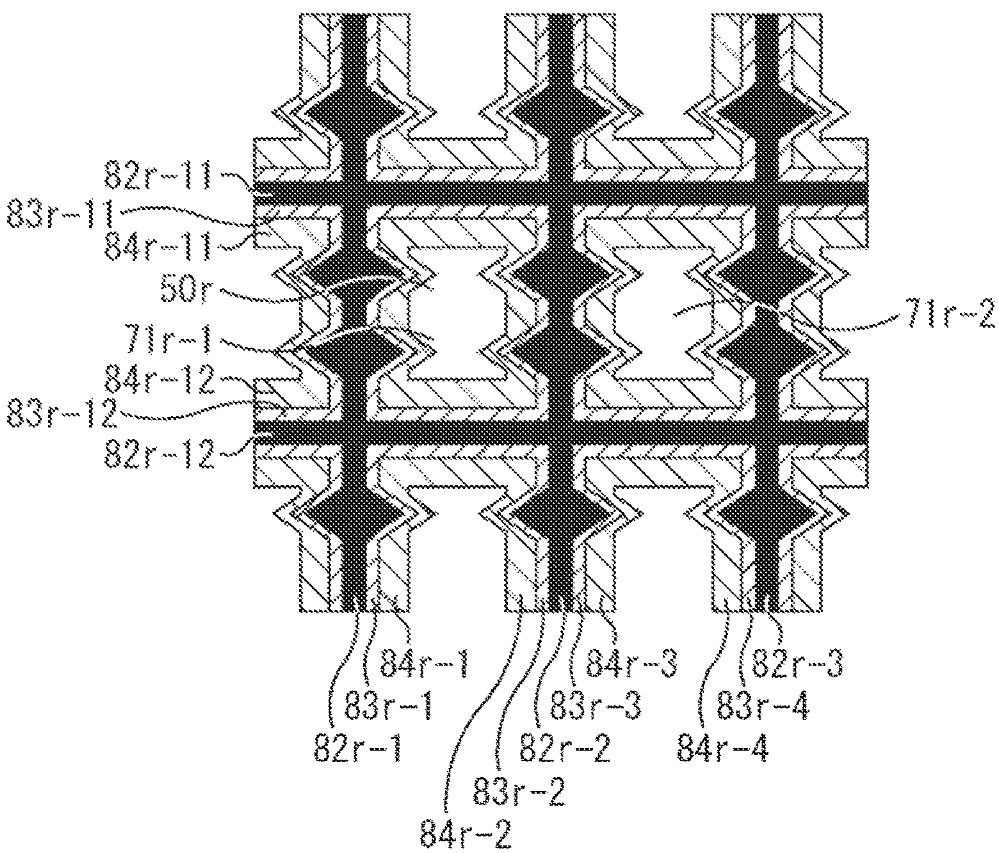
FIG. 28 is a plan view depicting a 16th configuration example of pixels to which the present technology is applied.

FIG. 28 is a plan view of a pixel 50*r* in a 16th embodiment to which the present technology is applied.

The pixel 50*r* in the 16th embodiment is shaped such that an intense electric field region enclosing a PD 71*r* includes protrusions and recesses as is the case with the pixel 50*q* in the 15th embodiment. The pixel 50*r* depicted in FIG. 28 differs from the pixel 50*q* depicted in FIG. 21 in that the protruding portions of the pixel 50*r* are triangular, but the pixel 50*r* is otherwise basically similar to the pixel 50*q*. Thus, duplicate descriptions are omitted.

For the pixel 50*r* depicted in FIG. 28, an example in which protruding portions are formed on two of the four sides enclosing the PD 71 is illustrated. The pixel 50*r* can be configured such that protruding portions are formed on at least one of the four sides enclosing the PD 71 or such that protruding portions are formed on one, two, three, or all of the four sides.

For the pixel 50*r* depicted in FIG. 28, illustrated is the example in which two triangular protruding portions are formed on, for example, a side of DTI 82*r*-1 that is included in the four sides enclosing a PD 71*r*-1 and that is formed to the left of the PD 71*r*-1. The number of protruding portions is illustrative, and it is sufficient that the number is one or more. Additionally, the shape of the protruding portion may be such that the protruding portion is triangular or includes rounded vertexes or such that sides constituting the triangle are curves instead of straight lines. Alternatively, the protruding portion may have a shape close to a semi-circle or an ellipse instead of the triangle or may be polygonal.

In a case where triangular protruding portions are formed, the height of the protruding portion can be set to, for example, 10 nm or more though the height depends on the size of the pixel 50*q*. Additionally, as described with reference to FIG. 23, the length of the P-type solid phase diffusion layer 83*r* provided with protruding portions is set to at least a predetermined value times, for example, at least 1.3 times, as large as the length of the P-type solid phase diffusion layer 83 provided with no protruding portions. The length can be adjusted on the basis of the height of one protruding portion or the number of protruding portions.

Similarly to the pixel 50*q* in the 15th embodiment, the pixel 50*r* in the 16th embodiment can be formed such that the length of the P-type solid phase diffusion layer 83*q* is larger than the length between two parallel-arranged sides of the four sides enclosing the PD 71*q*. This enables an increase in the PN junction area to allow the intense electric field region to be enlarged. In other words, when the DTI 82*r* is formed such that the length of the side wall of the DTI 82*r* is larger than the length between parallel-arranged portions of the DTI 82*r* enclosing the PD 71*r*, the PN junction area can be increased to allow the intense electric field region to be enlarged.

Description will be given of a manner of manufacturing an intense electric field region in a case where the protruding portions are formed as described above. The manner of manufacturing the pixel 50*r* depicted in FIG. 28 is basically similar to the manner of manufacturing the pixel 50*q* as depicted in FIG. 21 and to the manner of manufacturing described with reference to FIG. 24 and FIG. 25. Thus, description of similar portions is omitted and differences will be described.

In a case where triangular protruding portions are formed as is the case with the pixel 50*r*, the steps of manufacturing the pixel 50*r* differ from the steps of manufacturing the pixel 50*q* (FIG. 21) in that S52 (FIG. 24) of forming a deep trench is divided into two steps.

Figure 29:
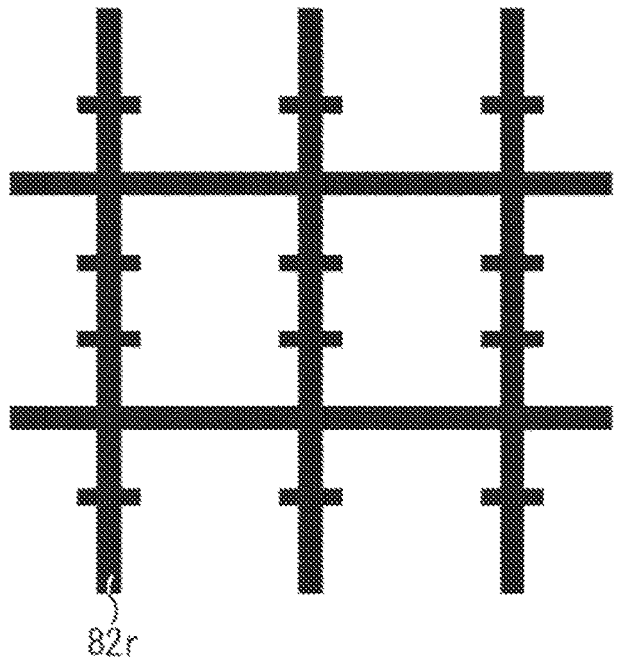
FIG. 29 is a diagram of assistance in describing the shape of trenches resulting from etching.

First, in step S52-1, a part of the silicon oxide film 200, a part of the insulating film 201, a part of SiN, and a part of the Si substrate 70 are dug by dry etching. Step S52 forms a deep trench. In a planar shape, the deep trench is, for example, a combination of a grid shape and protruding portions as depicted in FIG. 29, and has a depth reaching the lower end of a region in which an N-type region is to be formed by solid-phase diffusion during the subsequent step.

Figure 30:
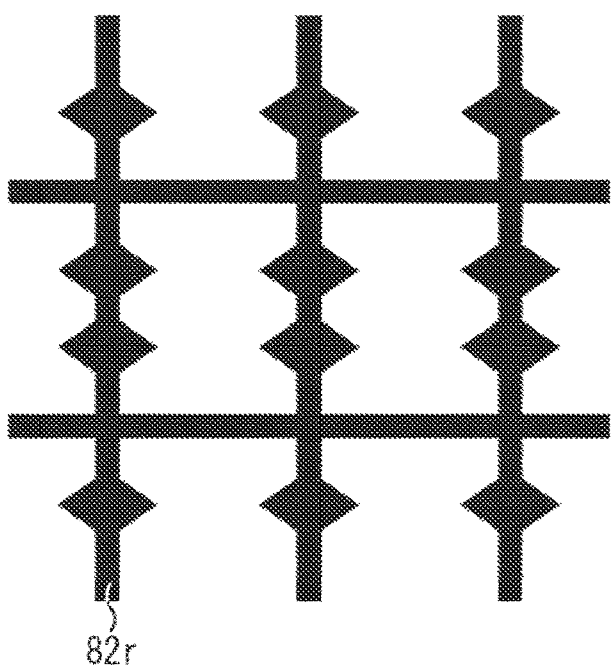
FIG. 30 is a diagram of assistance in describing the shape of trenches resulting from etching.

In step S52-2, a part of the silicon oxide film 200, a part of the insulating film 201, a part of SiN, and a part of the Si substrate 70 are further dug by wet etching. The wet etching specifically etches such that the protruding portions are uniform in shape on a crystal face. In a planar shape, the deep trench includes, for example, protruding portions shaped like triangles as depicted in FIG. 30, and has a depth reaching the lower end of a region in which an N-type region is to be formed by solid-phase diffusion during the subsequent step.

The combination of dry etching and wet etching as described above forms a desired shape, in this case, a deep trench with triangular protruding portions. Subsequent steps of forming a region corresponding to an N-type solid phase diffusion layer 84*r* and a region corresponding to a P-type solid phase diffusion layer 83*r* are executed similarly to the corresponding steps described with reference to FIG. 24 and FIG. 25.

Figure 31:
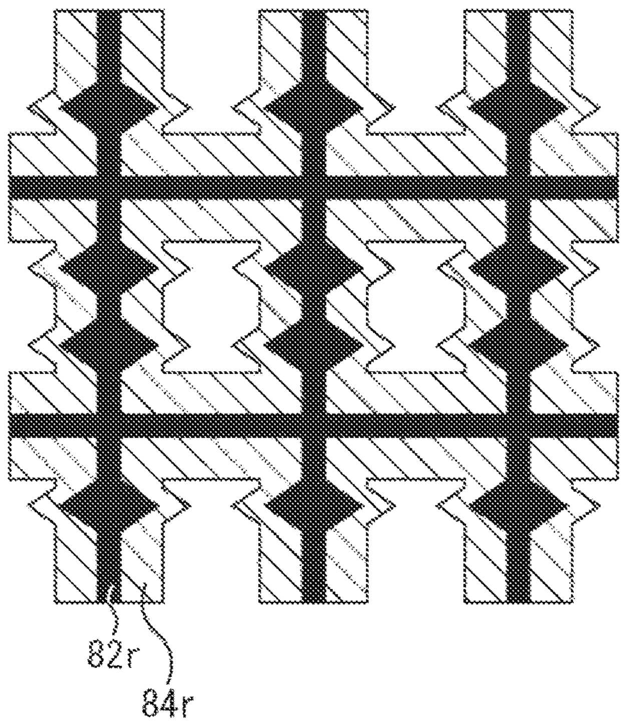
FIG. 31 is a diagram of assistance in describing the shape of an N-type solid phase diffusion layer resulting from etching.

FIG. 31 depicts the configuration of the pixel 50*r* resulting from further digging of the silicon on the bottom surface of the deep trench by dry etching in step S56. In step S56, grid-like train portions and trench portions of triangular protruding portions depicted in FIG. 30 are both dug deeper. At this point of time, as depicted in FIG. 31, a region corresponding to the N-type solid phase diffusion layer 84*r* has been formed.

In step S54, when phosphorous diffuses through the Si substrate 70, an N-type solid phase diffusion layer 84*r* with a shape substantially similar to the shape of the trench is formed depending on the shape and number of the protruding portions of the trench (DTI 82*r*) as depicted in FIG. 31. Alternatively, as described with reference to FIG. 27, the diffusion may progress to the extent that the PD 71 side has a substantially linear shape instead of the trench shape, depending on the shape and number of the protruding portions of the trench.

Consequently, the N-type solid phase diffusion layer 84*r* is not necessarily formed in the same shape as that of the trench. The N-type solid phase diffusion layer 84*r* may or may not be equal in shape to the trench, and both shapes are within the scope of the present technology.

The P-type solid phase diffusion layer 83*r* with the triangular protruding portions as depicted in FIG. 28 is thus formed, leading to formation of the pixel 50*r* with an enlarged intense electric field region.

17th Embodiment

Figure 32:
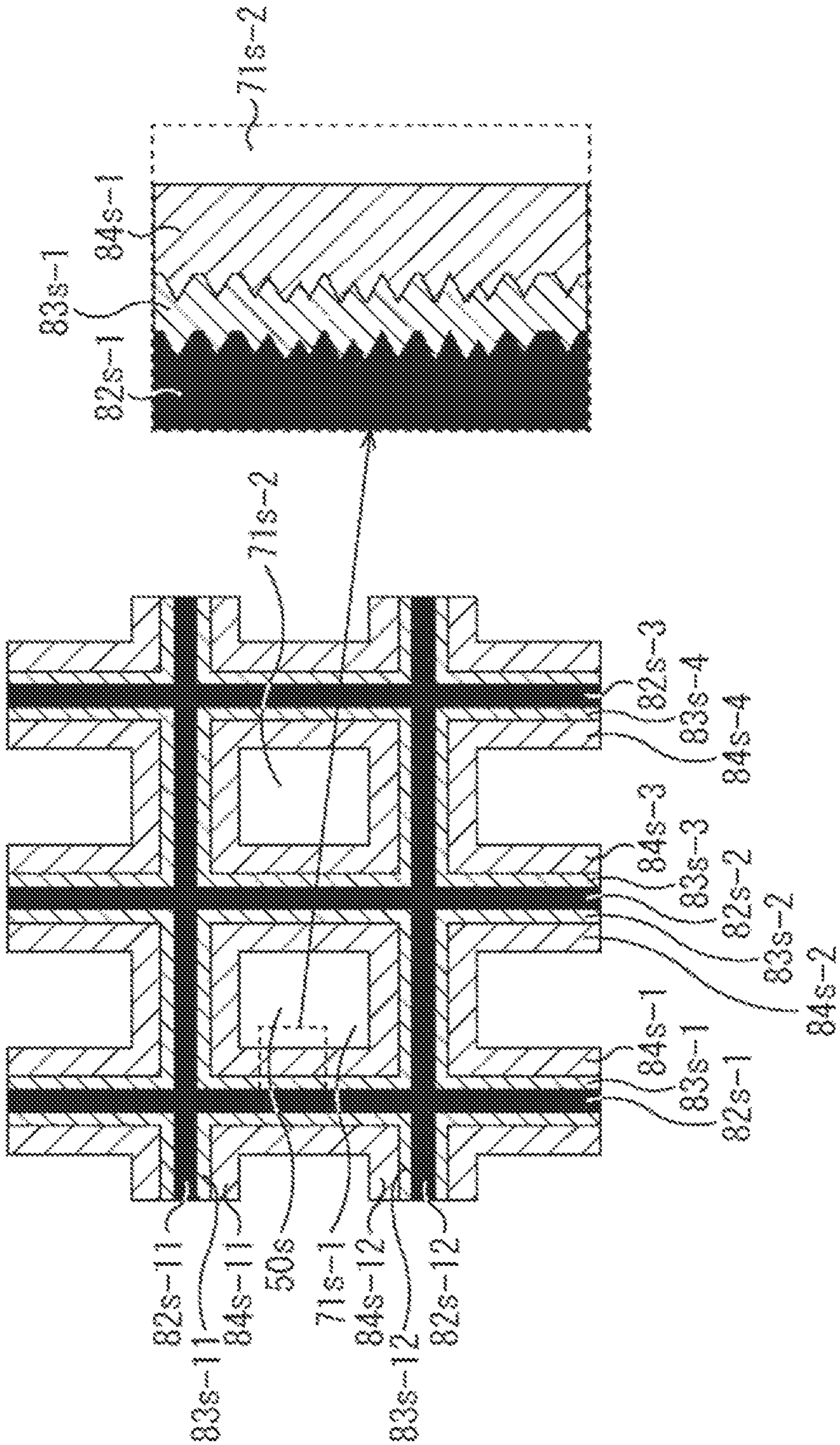
FIG. 32 is a plan view depicting a 17th configuration example of pixels to which the present technology is applied.

FIG. 32 is a plan view of a pixel 50*s* in a 17th embodiment to which the present technology is applied.

The pixel 50*s* in the 17th embodiment is shaped such that an intense electric field region enclosing a PD 71*r* includes recesses and protrusions as is the case with the pixel 50*q* in the 15th embodiment. The pixel 50*s* depicted in FIG. 32 differs from the pixel 50*q* in formation of fine recesses and protrusions.

Referring to FIG. 32, in the configuration, in plan view, of the pixel 50*s*, a PD 71*s* is formed to be enclosed by DTI 82*s* and a PN junction region including a P-type solid phase diffusion layer 83*s* and an N-type solid phase diffusion layer 84*s* is formed in a side wall of the DTI 82*s*, as in the configuration, in plan view, of the pixel 50 depicted in FIG. 20.

An enlarged view of a portion including the DTI 82*s* is as depicted in a right diagram of FIG. 32. Referring to the right diagram of FIG. 32, the PD 71*s*-1 side of the DTI 82*s*-1 is shaped to include protrusions and recesses. As is the case with the shape of DTI 82*s*-1 including protrusions and recesses, a DTI 82*s*-1-side surface and a PD 71*s*-1-side surface of a P-type solid phase diffusion layer 83*s*-1 are shaped to include protrusions and recesses. Further, as is the case with the shape of the P-type solid phase diffusion layer 83*s*-1 including protrusions and recesses, a P-type solid phase diffusion layer 83*s*-1 side of an N-type solid phase diffusion layer 84*s*-1 is shaped to include protrusions and recesses.

The P-type solid phase diffusion layer 83*s* shaped to include fine protrusions and recesses enables an increase in junction area in which the P-type solid phase diffusion layer

83s and the N-type solid phase diffusion layer 84s are in contact with each other. This allows enlargement of the intense electric field region including the P-type solid phase diffusion layer 83s and the N-type solid phase diffusion layer 84s, enabling an increase in the amount of saturated charge.

Similarly to the pixel 50q in the 15th embodiment, the pixel 50s in the 17th embodiment can be formed such that the length of the P-type solid phase diffusion layer 83s is larger than the length between the two parallel-arranged sides of the four sides enclosing the PD 71s, enabling an increase in PN junction area to allow the intense electric field region to be enlarged. In other words, the DTI 82s is formed such that the length of the side wall of the DTI 82s is larger than the length between the parallel-arranged portions of the DTI 82s enclosing the PD 71s, enabling an increase in PN junction area to allow the intense electric field region to be enlarged.

Description will be given of a manner of manufacturing an intense electric field region in a case where fine recesses and protrusions are formed as described above. The manner of manufacturing the pixel 50s depicted in FIG. 32 is similar, halfway through the process, to the manner of manufacturing the pixel 50q depicted in FIG. 21. By executing the treatment from step S51 (FIG. 24) to step S56, the manufacturing process for the pixel 50s similarly includes execution of steps from the start to formation of a region corresponding to the N-type solid phase diffusion layer 84s in the side wall of the deep trench.

Figure 33:
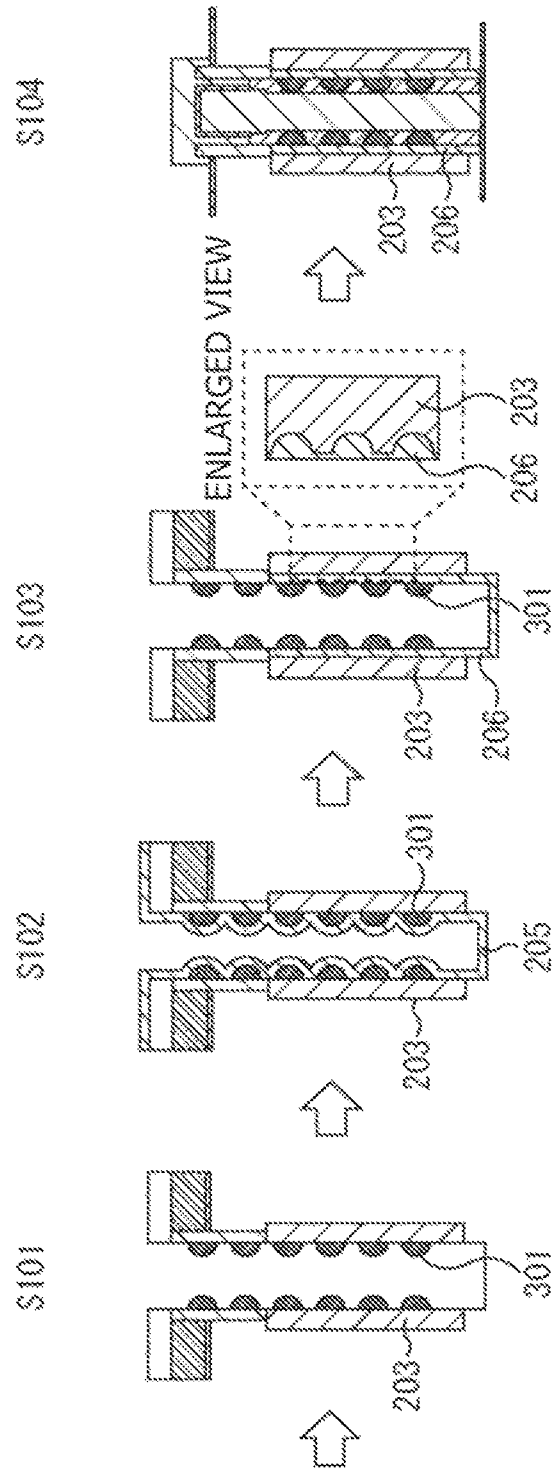
FIG. 33 is a diagram of assistance in describing manufacturing of a pixel to which the present technology is applied.

With reference to FIG. 33, description will be given of processing following formation, in the side wall of the deep trench, the region corresponding to the N-type solid phase diffusion layer 84s.

A method in which recesses and protrusions are formed on the front surface of polysilicon to increase the surface area has been proposed. Resultant polysilicon in this case may be referred to as rugged polysilicon in light of the state of the front surface. Here, the description takes, as an example, a configuration in which rugged polysilicon is formed to form a recess and protrusion shape on the DTI 82s, thus also forming a protrusion and recess shape on the P-type solid phase diffusion layer 83s and the N-type solid phase diffusion layer 84s.

In step S101 (FIG. 33), in the Si substrate 70 in which the region corresponding to the N-type solid phase diffusion layer 84s is formed in the side wall of the deep trench, a protrusion and recess shape (film of rugged polysilicon) is formed on the side wall of the trench. The film of rugged polysilicon is described as an RP film 301. The RP film 301 can be formed by, for example, forming a doped polysilicon film and an amorphous silicon film on a silicon oxide film and applying predetermined roughening treatment to the amorphous silicon film.

Step S102 is the same as step S57 (FIG. 25), and the ALD method is used to deposit a silicon oxide film (BSG) 205 including B (boron). The treatment in step S102 forms the BSG film 205 on the front surface of the wafer in which no deep trench is formed, on the RP film 301 corresponding to the side surface of the deep trench, and on the bottom surface of the deep trench. In this regard, the use of B (boron) leads to formation of the BSG film 205 as a P-type film.

Step S103 is the same as step S58 and step S59 (FIG. 25), and thermal diffusion treatment is first executed. The wafer is annealed to cause solid phase diffusion in the region where the BSG film 205 and the Si substrate 70 are in contact, and B (boron) diffuses from the BSG film 205 to the Si substrate 70. As a result, as depicted in step S103 in FIG. 33, a P-type impurity region 206 is formed. The P-type impurity region 206 is a region corresponding to the P-type solid phase diffusion layer 83s (FIG. 32).

In the solid phase diffusion of boron, the RP film 301 acts as a diffusion inhibition layer, and thus the boron diffusing through the side wall on the trench side is non-uniform. The non-uniform diffusion of boron leads to formation of recesses and protrusions in the P-type impurity region 206 as depicted in step S103 in FIG. 33. The P-type impurity region 206 is shaped to include recesses and protrusions, and thus a portion in contact with the N-type impurity region 203 previously formed is shaped to include recesses and protrusions. This enables, compared to uniform diffusion of boron, an increase in junction area in which the P-type solid phase diffusion layer 83s and the N-type solid phase diffusion layer 84s are in contact.

After the thermal treatment, the BSG film 205 is removed. The removal of the BSG film 205 can be performed by, for example, wet etching using hydrofluoric acid.

Step S104 is the same as step S60 (FIG. 25), and polysilicon is embedded in the trench as the filler 86p. Unnecessary polysilicon deposited on the upper surface of the wafer is removed. Additionally, pixel transistors, interconnects, and the like are formed. Subsequently, the Si substrate 70 is thinned from the back side. The thinning is performed to the extent that the bottom portion of the deep trench is exposed.

The P-type solid phase diffusion layer 83s including fine recesses and protrusions as depicted in FIG. 32 is thus formed, leading to formation of the pixel 50s with an enlarged intense electric field region.

18th Embodiment

Figure 34:
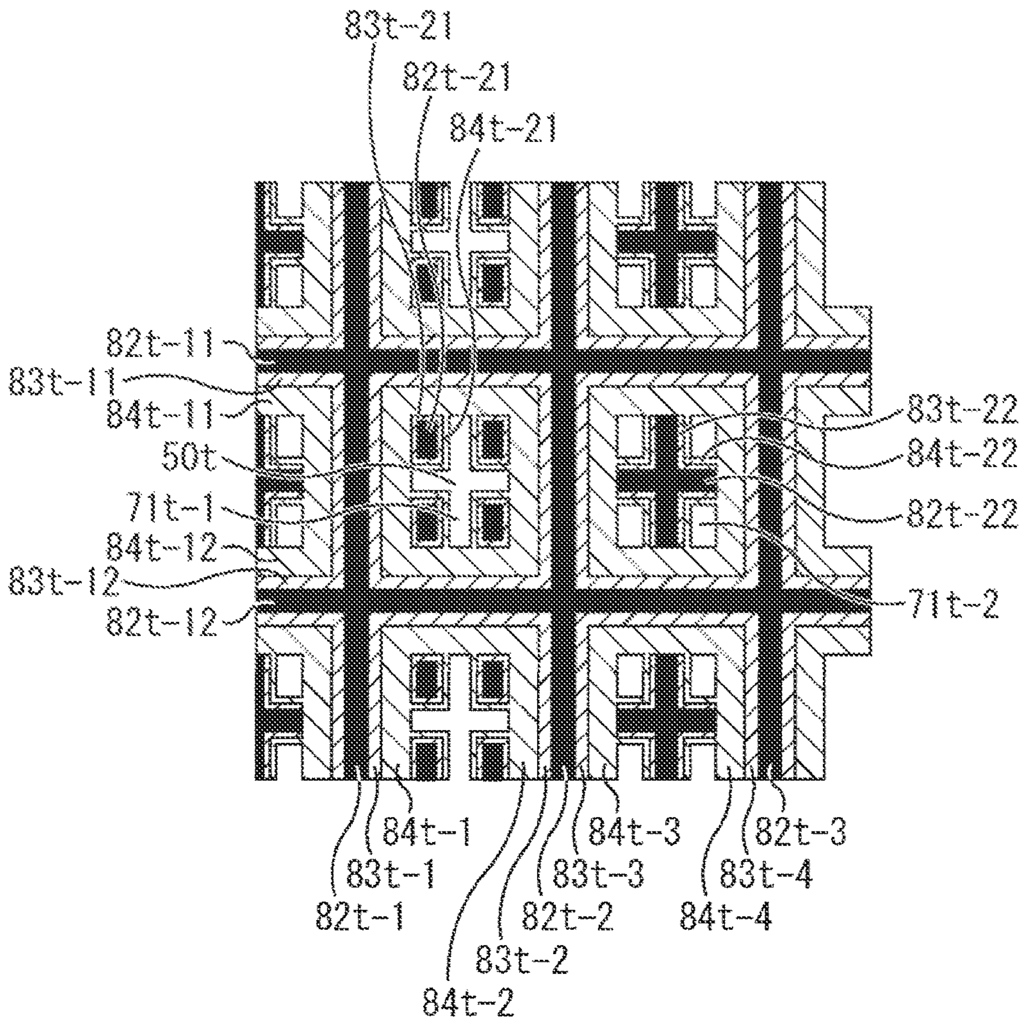
FIG. 34 is a plan view depicting an 18th configuration example of pixels to which the present technology is applied.

FIG. 34 is a plan view of a pixel 50t in an 18th embodiment to which the present technology is applied.

In the pixel 50t in the 18th embodiment, for an enlarged intense electric field region, an intense electric field enlarged region is formed in a part of the PD 71. The intense electric field enlarged region is a PN junction region formed to enlarge the intense electric field region. FIG. 34 illustrates an example in which a rectangular intense electric field region is formed in each of four corners of a region of a PD 71t-1 and in which a cross-shaped intense electric field region is formed in the middle of a region of a PD 71t-2.

The rectangular intense electric field region formed in each of the four corners of the region of the PD 71t-1 includes DTI 82t-21 formed in a central portion and a P-type solid phase diffusion layer 83t-21 formed around the DTI 82t-21. Further, an N-type solid phase diffusion layer 84t-21 is formed around the P-type solid phase diffusion layer 83t-21. Such a configuration is the same as the configuration of the intense electric field region formed in the DTI 82t enclosing the PD 71t.

A part of the N-type solid phase diffusion layer 84t-21 is shared with an N-type solid phase diffusion layer 84t-1 formed in the side wall of the DTI 82t-1. Additionally, a part of the N-type solid phase diffusion layer 84t-21 is shared with an N-type solid phase diffusion layer 84t-11 formed in a side wall of DTI 82t-11.

The cross-shaped intense electric field region formed in the region of the PD 71t-2 is provided with cross-shaped DTI 82t-22 around which a P-type solid phase diffusion layer 83t-22 is formed. Further, an N-type solid phase diffusion layer 84t-22 is formed around the P-type solid phase diffusion layer 83t-22. Such a configuration is the same as the configuration of the intense electric field region formed in the DTI 82t enclosing the PD 71t.

A part of the N-type solid phase diffusion layer 84_t_-22, in other words, the N-type solid phase diffusion layer 84_t_-22 corresponding to tip portions of the cross, is shared with each of an N-type solid phase diffusion layer 84_t_-3 formed in a side wall of DTI 82_t_-2, an N-type solid phase diffusion layer 84_t_-4 formed in a side wall of the DTI 82_t_-3, an N-type solid phase diffusion layer 84_t_-11 formed in a side wall of the DTI 82_t_-11, and an N-type solid phase diffusion layer 84_t_-12 formed in a side wall of DTI 82_t_-12.

The example depicted in FIG. 34 illustrates the rectangular intense electric field region and the cross-shaped intense electric field region. However, other shapes may be used. Additionally, in the illustrated example, the rectangular intense electric field region and the cross-shaped intense electric field region are formed within one pixel 50_t_. The intense electric field regions formed within the pixel 50_t_ need not have different shapes and may all be rectangular or cross-shaped.

Additionally, FIG. 34 depicts a case in which the rectangular intense electric field region is formed in the four corners of the PD 71_t_-1. However, instead of the four intense electric field regions, one, two, or three intense electric field regions may be formed in any of the four corners of the PD 71.

Further, FIG. 34 depicts a case in which the cross-shaped intense electric field region is formed in the PD 71_t_-2. However, the cross-shaped intense electric field region need not be cross-shaped, and an intense electric field region shaped like a part of a cross, for example, an L-shaped intense electric field region or an intense electric field region including only a vertical bar (or a horizontal bar), may be formed.

Additionally, this example may be combined with the pixels 50_q_ to 50_s_ in the 15th to 17th embodiments such that recesses and protrusions are formed in the intense electric field region formed on the side wall of the DTI 82_t_ enclosing the PD 71_t_.

By thus forming an intense electric field region including the P-type solid phase diffusion layer 83_t_ and the N-type solid phase diffusion layer 84_t_ in a region other than the DTI 82_t_ enclosing the PD 71_t_, the intense electric field region provided in one pixel 50_t_ can be enlarged, enabling an increase in the amount of saturated charge.

Similarly to the pixel 50_q_ in the 15th embodiment, the pixel 50_t_ in the 18th embodiment can be formed such that the length of the P-type solid phase diffusion layer 83_t_ is larger than the length between the two parallel-arranged sides of the four sides enclosing the PD 71_t_, enabling an increase in the PN junction area to allow the intense electric field region to be enlarged.

In the pixel 50_t_ in the 18th embodiment, the length of the P-type solid phase diffusion layer 83_t_ includes the length of the P-type solid phase diffusion layer 83_t_ included in the rectangular intense electric field region formed in each of the four corners of the PD 71_t_ and the length of the P-type solid phase diffusion layer 83_t_ included in the cross-shaped intense electric field region formed in the PD 71_t_, as well as the length of the side wall of the DTI 82_t_. Thus, the pixel 50_t_ can be formed such that the length of the P-type solid phase diffusion layer 83_t_ is larger than the length between two parallel-arranged sides of the four sides enclosing the PD 71_t_, as described above.

Thus, in other words, the DTI 82_t_ can be formed such that the length of the side wall of the DTI 82_t_ is larger than parallel-arranged portions of the DTI 82_t_ enclosing the PD 71_t_, enabling an increase in the PN junction area to allow the intense electric field region to be enlarged.

Description will be given of a manner of manufacturing the pixel 50_t_ including an intense electric field region formed in the region of the PD 71_t_ as described above. The manner of manufacturing the pixel 50_t_ depicted in FIG. 34 can be achieved by steps similar to the steps for the pixel 50_q_ depicted in FIG. 21 and described with reference to FIG. 25, and description of the manner is omitted. However, the DTI 82_t_ formed in step S52 (FIG. 24) has a different shape, and thus this will be described below.

Figure 35:
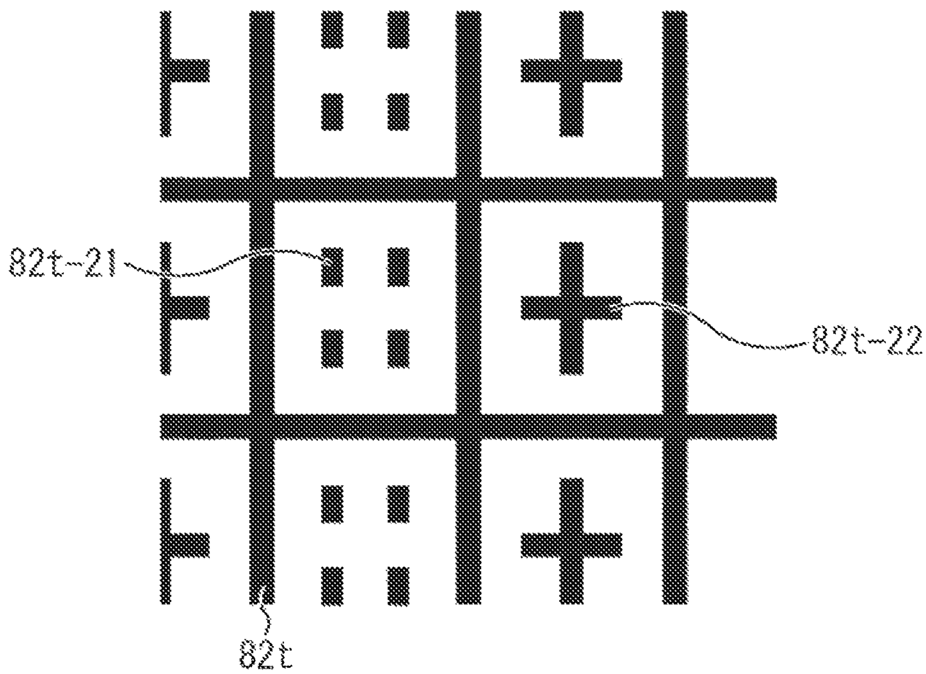
FIG. 35 is a diagram of assistance in describing the shape of trenches resulting from etching.

In step S52, a part of the silicon oxide film 200, a part of the insulating film 201, a part of SiN, and a part of the Si substrate 70 are dug by dry etching to form a deep trench. The shape of the deep trench is such that, in planar shape, the deep trench is provided with, for example, grid-like DTI 82_t_, DTI 82_t_-21 corresponding to portions in which a rectangular intense electric field region is formed, and DTI 82_t_-22 corresponding to portions in which a cross-shaped intense electric field region that are depicted in FIG. 35 is formed. The trench formed has a depth reaching the lower end of a region in which an N-type region is to be formed by solid-phase diffusion during the subsequent step.

As described above, a deep trench is formed in a desired shape in a portion in which an intense electric field region is formed by dry etching. The subsequent steps of forming a region corresponding to the N-type solid phase diffusion layer 84_r_ and a region corresponding to the P-type solid phase diffusion layer 83_r_ are executed as described with reference to FIG. 24 and FIG. 25.

By thus forming an intense electric field region including the rectangular or cross-shaped intense electric field regions as depicted in FIG. 34, a pixel 50_t_ with an enlarged intense electric field region is formed.

19th Embodiment

Figure 36:
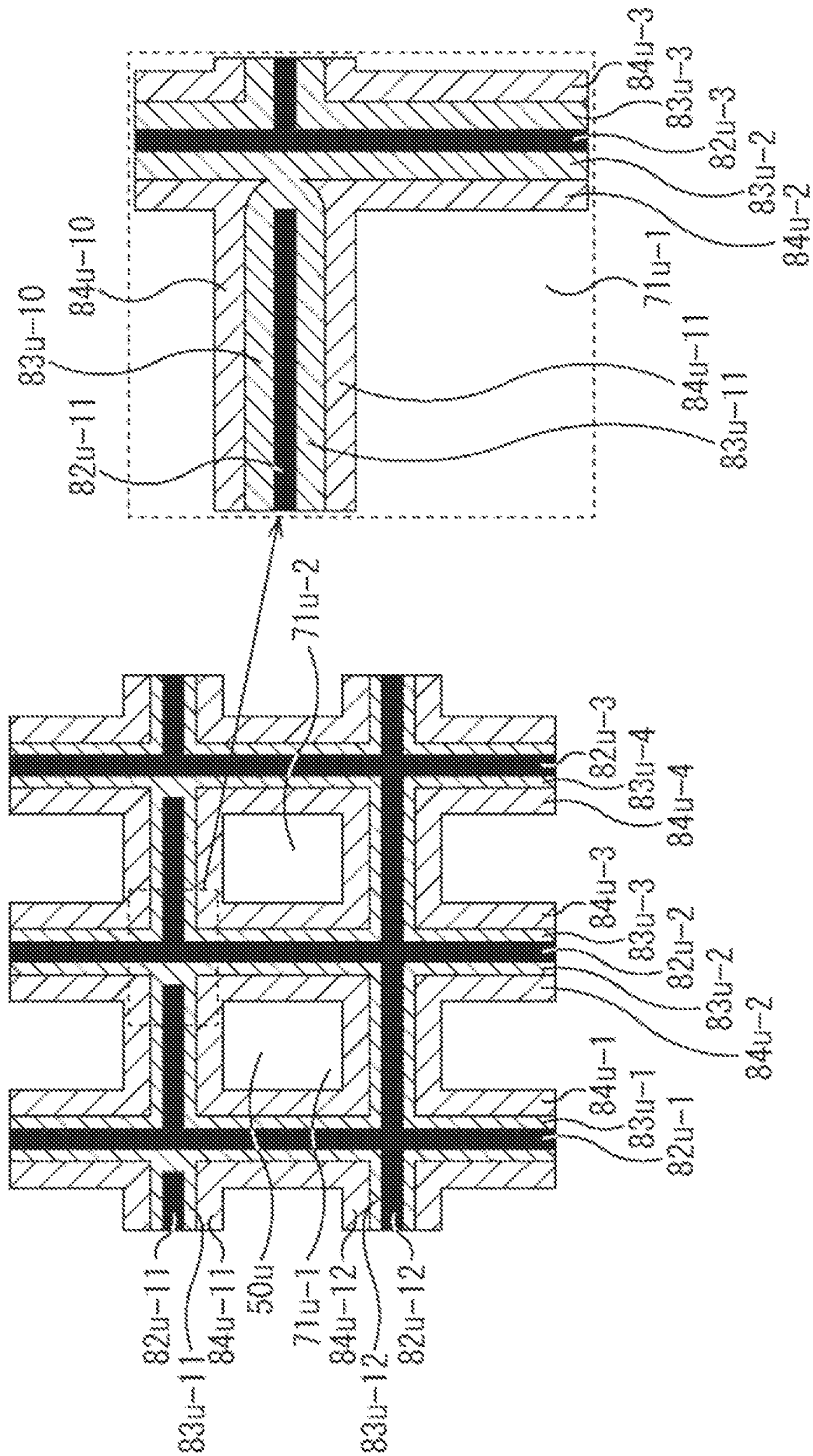
FIG. 36 is a plan view depicting a 19th configuration example of pixels to which the present technology is applied.

FIG. 36 is a plan view of a pixel 50_u_ in a 19th embodiment to which the present technology is applied.

The pixel 50_u_ in the 19th embodiment is formed such that DTI 82_u_ enclosing a PD 71_u_ is partly discontinued. Referring to FIG. 36, DTI 82_u_-11 formed in the lateral direction (transverse direction) of the figure is partly discontinued. Other DTI 82_u_, for example, DTI 82_u_-12, is continuously formed.

An enlarged view of a portion including the DTI 82_u_-11 is as depicted in a right diagram of FIG. 36. Referring to the right diagram of FIG. 36, the DTI 82_u_-11 is formed to include discontinued portions. The discontinued portion is formed between the DTI 82_u_-11 and DTI 82_u_-2 included in DTI 82_u_ enclosing the PD 71_u_-1. In other words, in the example depicted in FIG. 36, the discontinued portion of the DTI 82_u_ is provided at the upper right of the PD 71-1.

The discontinued portion of the DTI 82-11 is covered with a P-type solid phase diffusion layer 83_u_.

The P-type solid phase diffusion layer 83_u_-10 formed above the DTI 82_u_-11 in the figure and the P-type solid phase diffusion layer 83_u_-11 formed below the DTI 82-11 in the figure are formed to contact each other in the discontinued portion of the DTI 82_u_-11. Thus, as depicted in FIG. 36, the DTI 82_u_-11 is formed such that the discontinued portion of the DTI 82_u_-11 is covered with the P-type solid phase diffusion layer 83_u_.

With reference to a portion of the P-type solid phase diffusion layer 83_u_-10 formed above the DTI 82_u_-11 in the figure, the P-type solid phase diffusion layer 83_u_-10 is shaped like a circular arc (like a curved surface) in the discontinued portion of the DTI 82_u_-11. Additionally, with reference to a portion of the P-type solid phase diffusion layer 83u-10 formed below the DTI 82u-11 in the figure, the P-type solid phase diffusion layer 83u-11 is shaped like a circular arc (like a curved surface) in the discontinued portion of the DTI 82u-11.

The curved surface shape of the P-type solid phase diffusion layer 83u enlarges the portion (junction surface) in which the P-type solid phase diffusion layer 83u contacts an N-type solid phase diffusion layer 84u, thus enabling the intense electric field region to be enlarged to increase the amount of saturated charge.

In the example illustrated in FIG. 32, for example, when focus is placed on the PD 71u-1, the discontinued portion of the DTI 82u is formed at one position at the upper right of the PD 71u-1. The positions and number of discontinued portions are not limited to the positions and number depicted in FIG. 32.

Figure 37:
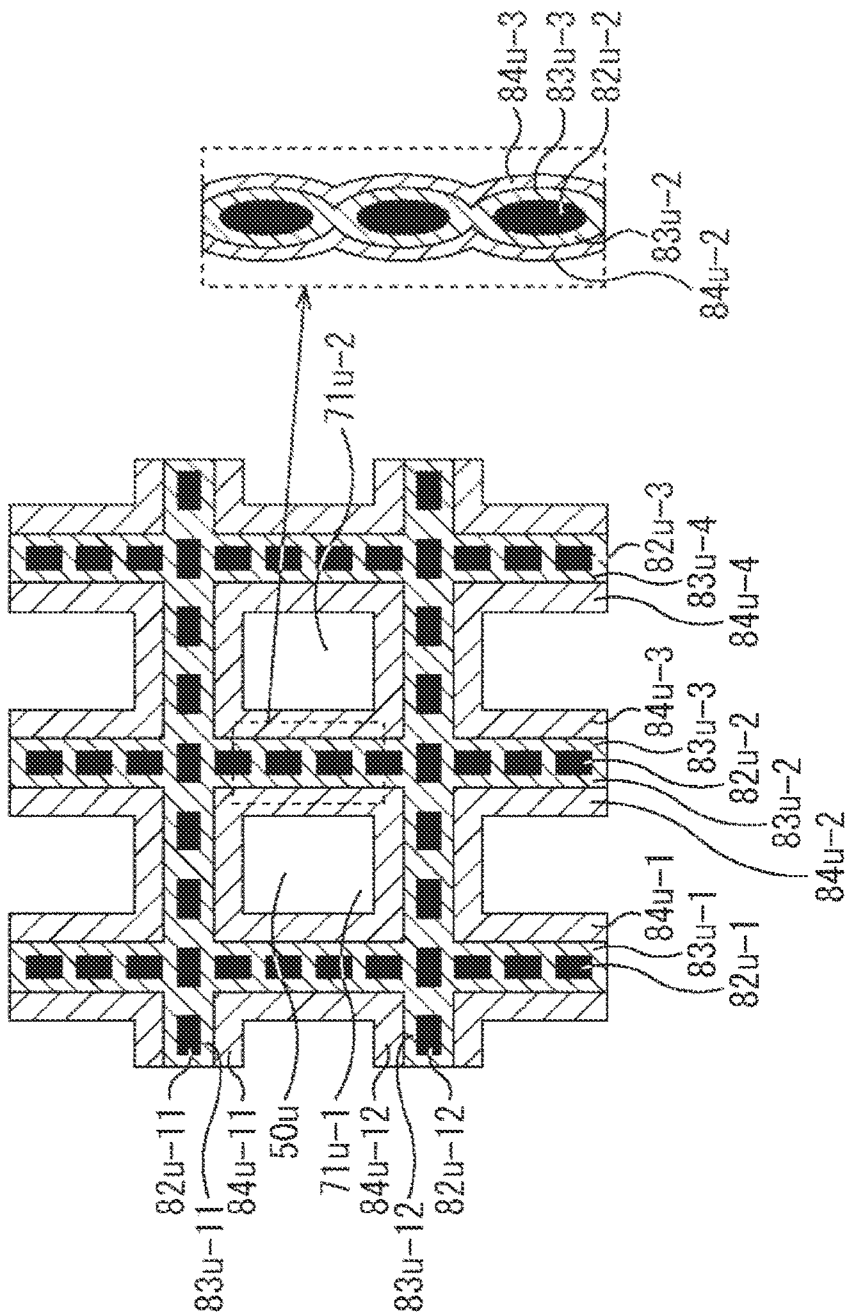
FIG. 37 is a plan view depicting another 19th configuration example of pixels to which the present technology is applied.

For example, the discontinued portion of the DTI 82u may be formed at each of four corners with respect to the PD 71u. Additionally, for example, the discontinued portion of the DTI 82u may be formed at the center of a side. In addition, for example, the discontinued portion of the DTI 82u may be formed at a plurality of positions on one side. FIG. 37 illustrates an example of a plurality of discontinued portions formed on one side.

FIG. 37 is a plan view depicting another configuration of the pixel 50u in the 19th embodiment to which the present technology is applied. In the pixel 50u depicted in FIG. 37, a plurality of discontinued portions are formed on one side of the DTI 82u.

An enlarged view of a portion including the DTI 82u-2 is as depicted in a right diagram of FIG. 37. Referring to the right diagram of FIG. 37, the DTI 82u-2 is formed discontinuously to include discontinued portions. The DTI 82u-2 includes a plurality of portions of the DTI 82u-2, and each portion of the DTI 82u-2 is enclosed by the P-type solid phase diffusion layer 83u. The P-type solid phase diffusion layer 83u-2 formed to the left of the DTI 82u-2 in the figure and the P-type solid phase diffusion layer 83u-11 formed below the DTI 82u-2 in the figure are formed to contact each other in the discontinued portion of the DTI 82-11.

Thus, as depicted in FIG. 37, the DTI 82-2 is formed such that discontinued portions of the DTI 82-2 are covered with the P-type solid phase diffusion layer 83u and is shaped such that individual portions of the DTI 82u-2 are enclosed by the P-type solid phase diffusion layer 83u.

By thus forming the P-type solid phase diffusion layer 83u enclosing the individual portions of the DTI 82u, the portion (junction surface) in which the P-type solid phase diffusion layer 83u contacts the N-type solid phase diffusion layer 84u is enlarged, thus enabling the intense electric field region to be enlarged to increase the amount of saturated charge.

In the left diagram of FIG. 37, the individual portions of the DTI 82u are depicted as rectangles, and in a right diagram of FIG. 37, the individual portions of the DTI 82u are depicted as ellipses. The individual portions of the DTI 82u may have a rectangular or elliptic shape or any other shape. By forming the individual portions of the DTI 82u shaped to include curves as in ellipses, the portion (junction surface) of contact with the N-type solid phase diffusion layer 84u can be enlarged.

This configuration can be combined with the pixels 50q to 50t in the 15th to 18th embodiments described above such that recesses and protrusions are formed in the intense electric field region formed in the side wall of the DTI 82u enclosing the PD 71t, or an intense electric field region can be formed in the region of the PD 71u.

Similarly to the pixel 50q in the 15th embodiment, the pixel 50u in the 19th embodiment can be formed such that the length of the P-type solid phase diffusion layer 83s is larger than the length between the two parallel-arranged sides of the four sides enclosing the PD 71s, enabling an increase in the PN junction area to allow the intense electric field region to be enlarged.

Description will be given of a manner of manufacturing an intense electric field region in a case where the DTI 82u is formed discontinuously as described above. The manner of manufacturing the pixel 50t depicted in FIG. 36 or FIG. 37 can be achieved by steps similar to the steps that involve the pixel 50q depicted in FIG. 21 and that have been described with reference to FIG. 24 and FIG. 25, and description of the manner is omitted here. However, the trench formed in step S52 (FIG. 24) has a different shape, and thus this will be described below.

Figure 38:
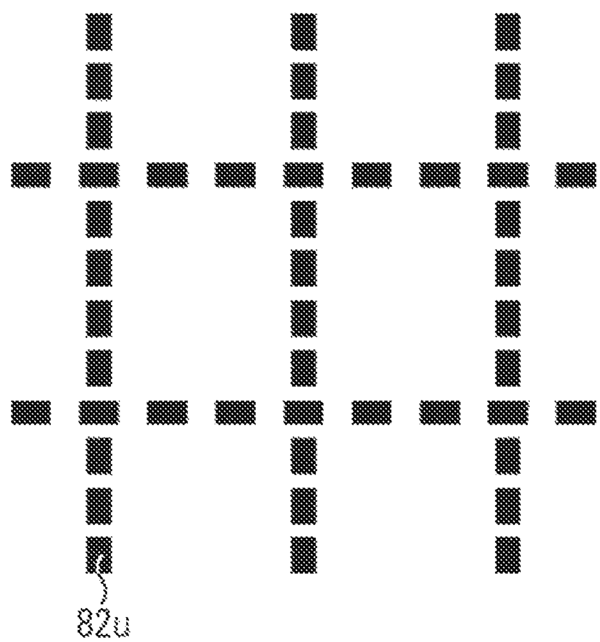
FIG. 38 is a diagram of assistance in describing the shape of trenches resulting from etching.

In step S52, a part of the silicon oxide film 200, a part of the insulating film 201, a part of SiN, and a part of the Si substrate 70 are dug by dry etching to form a deep trench. The shape of the deep trench is such that, in planar shape, for example, in a case where the discontinuous DTI 82u depicted in FIG. 37 is formed, DTI 82u that is shaped like a grid but is discontinuous as depicted in FIG. 38 is formed. The trench formed has a depth reaching the lower end of a region in which an N-type region is to be formed by solid-phase diffusion during the subsequent step.

As described above, a deep trench is formed in a desired shape in a portion in which an intense electric field region is formed by dry etching. In the subsequent steps S53 and S54 (FIG. 24), a region corresponding to the N-type solid phase diffusion layer 84u is formed. In these steps, the N-type solid phase diffusion layer 84u is formed such that portions of the N-type solid phase diffusion layer 84u are joined at discontinued portions of the DTI 82u.

Additionally, in steps S57 and S58 (FIG. 25), a region corresponding to the P-type solid phase diffusion layer 83u is formed. In these steps, the P-type solid phase diffusion layer 83u is formed such that portions of the P-type solid phase diffusion layer 83u are joined at the discontinued portions of the DTI 82u.

As described above, the pixel 50t as depicted in FIG. 36 or FIG. 37 in which the DTI 82u includes discontinued portions that enlarge the intense electric field region is formed.

According to the 15th to 19th embodiments, the PN junction area of the solid phase diffusion layers can be increased, enabling an increase in the amount of saturated charge.

20th Embodiment

Figure 39:
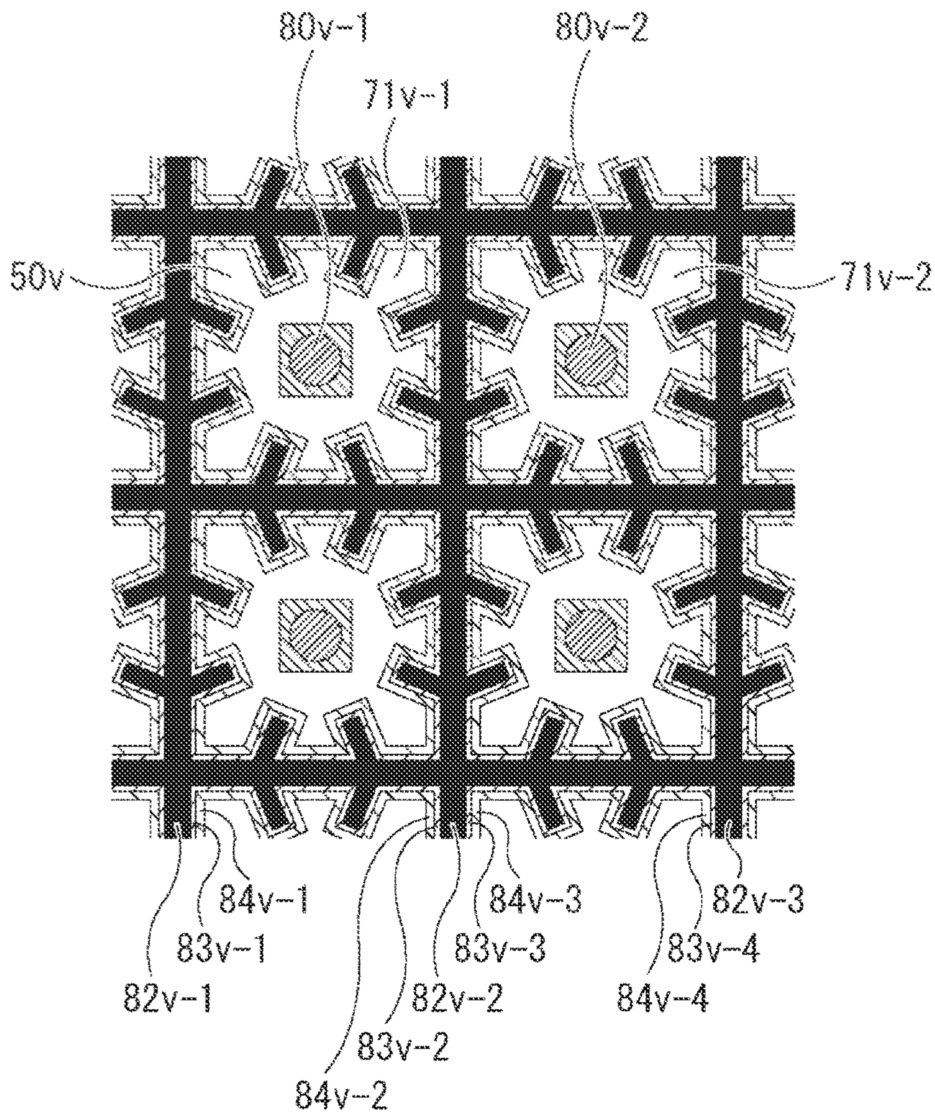
FIG. 39 is a plan view depicting a 20th configuration example of pixels to which the present technology is applied.

FIG. 39 is a plan view of a pixel 50v in a 20th embodiment to which the present technology is applied.

The pixel 50v in the 20th embodiment is shaped such that an intense electric field region enclosing a PD 71v includes recesses and protrusions. Such a configuration is the same as the configuration of the pixel 50q in the 15th embodiment depicted in FIG. 21 except that the protruding portions are radially formed.

In the pixel 50v depicted in FIG. 39, when focus is placed on a PD 71v-1 included in the pixel 50v, DTI 82v enclosing the PD 71v-1 is shaped such that sides of the DTI 82v include protruding portions. When a linearly continuously formed portion of the DTI 82v is used as a reference and portions protruding with respect to the DTI 82v, used as the reference, are designated as protruding portions, the protruding portions are radially formed.

In the example illustrated in FIG. 39, the (gate of) transfer transistor 80 is formed approximately at the center of the pixel 50*v*. In a case where the transfer transistor 80 is thus formed at the central portion, the tips of the protruding portions face the transfer transistor 80, as described above.

In conformance with the shape of the DTI 82*v* including such protruding portions, a P-type solid phase diffusion layer 83*v* is also shaped to include protruding portions. Further, in conformance with the shape of the P-type solid phase diffusion layer 83*v*, an N-type solid phase diffusion layer 84*v* is also shaped to include protruding portions.

The P-type solid phase diffusion layer 83*v* provided with the protruding portions enables an increase in the area in which the P-type solid phase diffusion layer 83*v* contacts the N-type solid phase diffusion layer 84*v*. This enlarges the PN junction region including the P-type solid phase diffusion layer 83*v* and the N-type solid phase diffusion layer 84*v*, thus enlarging the intense electric field region. The enlarged intense electric field region increases the amount of charge that can be held in the intense electric field region, enabling an increase in the amount of saturated charge.

Here, with reference to FIG. 40, description will be given of an effect of radially forming the protruding portions, in other words, forming the protruding portions such that the tips of the protruding portions face the transfer transistor 80.

Figure 40:
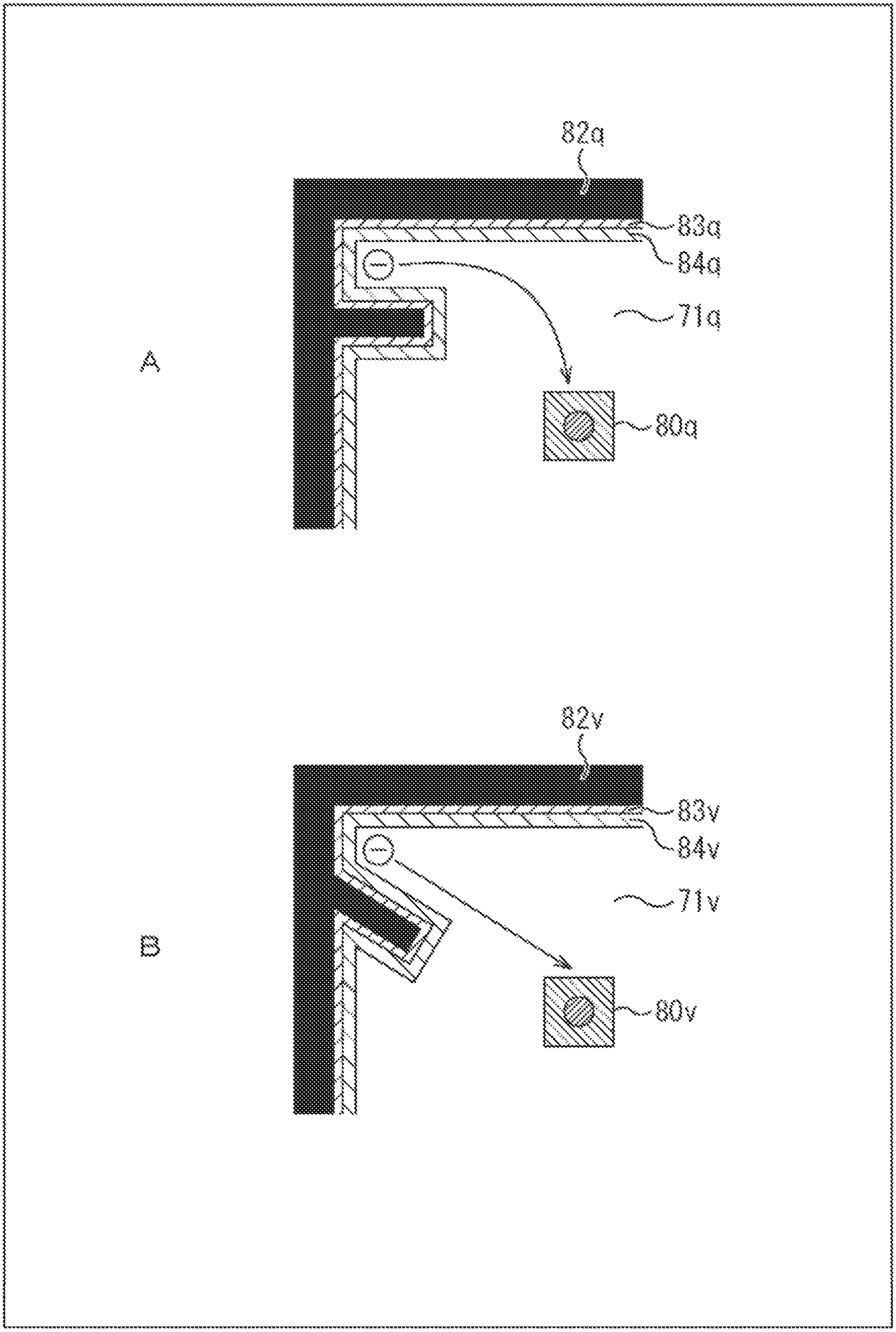
FIG. 40 depicts diagrams of assistance in describing effects.

For comparison, A of FIG. 40 illustrates a part of the PD 71*q* depicted in FIG. 21. In FIG. 40, B is a partly enlarged view of the PD 71*v* depicted in FIG. 39. Referring to A of FIG. 40, in a case where the protruding portions are formed perpendicularly to the linearly continuously formed DTI 82*q*, electrons stored in the corner portions of the PD 71*q* reach the transfer transistor 80 while avoiding the protruding portions, and are then read out. When the protruding portions are enlarged (elongated), the electrons stored in the corner portions do not reach the transfer transistor 80 unless the electrons make a detour. The enlarged protruding portions hinder the electrons stored in the corner portions of the PD 71*q* from being read out.

Referring to B of FIG. 40, also in a case where the protruding portions are formed obliquely with respect to the linearly continuously formed DTI 82*v* and directed toward the transfer transistor 80, electrons stored in the corner portions of the PD 71*v* reach the transfer transistor 80 while avoiding the protruding portions, and are then read out, as is the case with PD 71*q* depicted in A of FIG. 40. However, in the PD 71*v*, each of the obliquely formed protruding portions enlarges a portion of the corner of the PD 71*v* that is open toward the transfer transistor 80, allowing formation of a path through which the electrons flow smoothly.

Thus, in the case of the PD 71*v*, the electrons stored in the corner portions of the PD 71*v* migrate smoothly to the transfer transistor 80 and can thus be prevented from having difficulty being read out. Additionally, although not depicted in the figures, a path toward the transfer transistor 80*v* is also formed in portions other than the corner portions of the PD 71*v*, providing a structure in which the electrons are easily read out.

By thus forming the protruding portions such that the tips of the protruding portions face the (gate of) transfer transistor 80, the reading efficiency of the transfer transistor 80 can be improved. Thus, depending on the position where the gate of the transfer transistor 80 is formed, for example, a configuration as depicted in FIG. 41 can be used.

Figure 41:
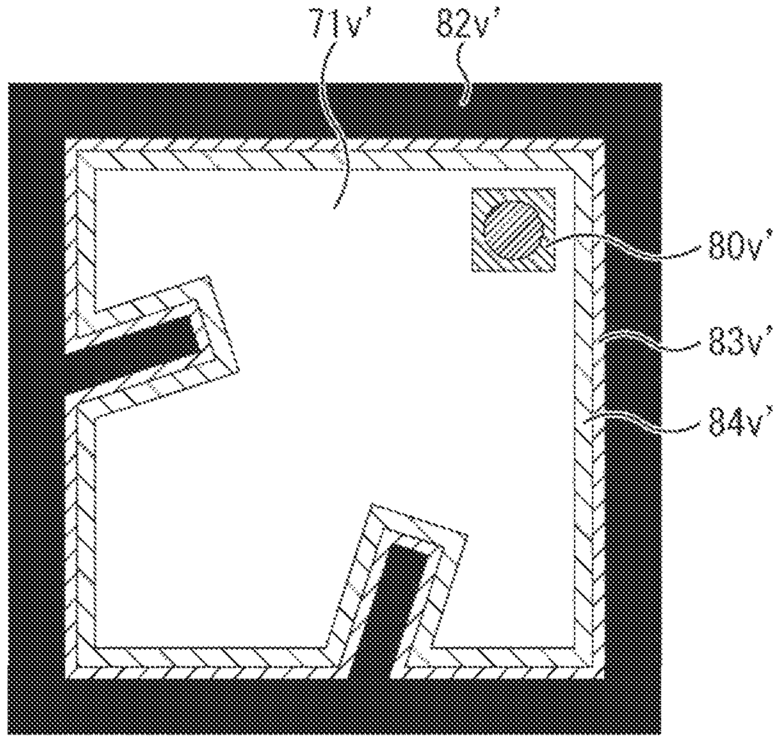
FIG. 41 is a plan view depicting another 20th configuration example of a pixel to which the present technology is applied.

In a PD 71*v*' depicted in FIG. 41 (the PD 71*v*' is described with a dash for distinction from the PD 71*v* depicted in FIG. 39), a gate of a transfer transistor 80*v*' is formed near one of four corners of the PD 71*v*'. Even in a case where the transfer transistor 80*v*' is formed at such a position, the protruding portions are formed to face the transfer transistor 80*v*'.

In the example illustrated in FIG. 41, the PD 71*v*' is formed such that a protruding portion is formed on each of two sides opposite to a corner in which the transfer transistor 80*v*' is formed and such that the tip of the protruding portion faces the transfer transistor 80*v*'.

The 20th embodiment can be combined with any of the first to 19th embodiments described above.

21st Embodiment

Figure 42:
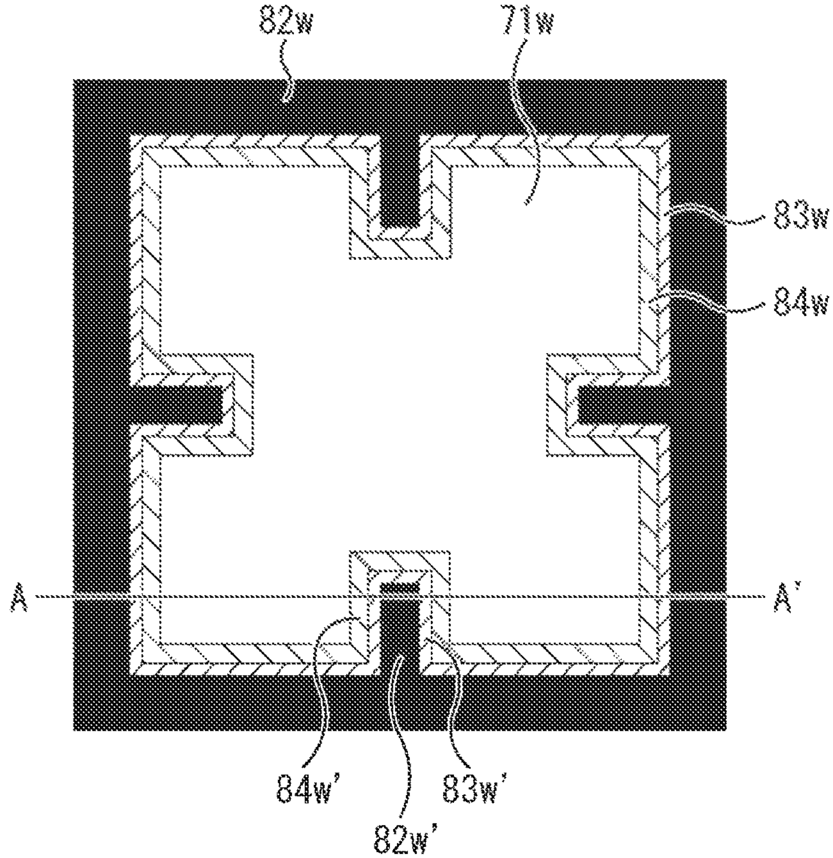
FIG. 42 is a plan view depicting a 21st configuration example of a pixel to which the present technology is applied.
Figure 43:
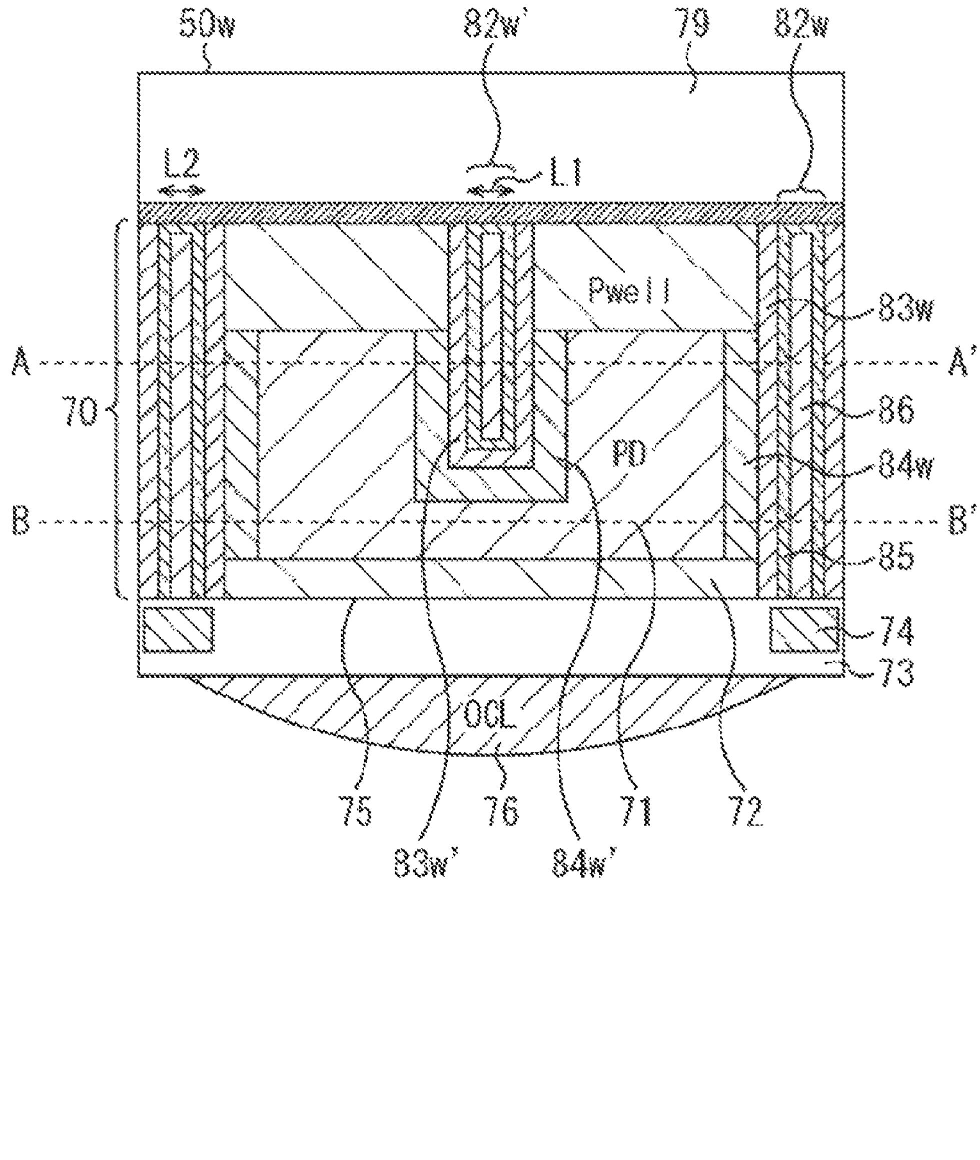
FIG. 43 is a cross-sectional view depicting the 21st configuration example of the pixel to which the present technology is applied.

FIG. 42 and FIG. 43 are diagrams depicting a configuration example of a pixel 50*w* in a 21st embodiment to which the present technology is applied.

As is the case with the pixel 50*q* (FIG. 21) in the 15th embodiment described above, in the pixel 50*w* in the embodiment in FIG. 21, a PD 71*w* is shaped such that an intense electric field region enclosing the PD 71*w* includes protruding portions. In this regard, as depicted in FIG. 42, the description takes, as an example, a configuration in which a protruding portion is provided at one position on each of four sides enclosing the PD 71*w* and a configuration in which protruding portions are formed perpendicularly.

A configuration of the PD 71*w* depicted in FIG. 42 is the same as the configuration of the PD 71*q* depicted in FIG. 21 except that one protruding portion is formed on one side. FIG. 43 depicts a cross-sectional view of the PD 71*w* depicted in FIG. 42 taken along segment A-A'.

A protruding portion is formed in the portion of segment A-A'. Here, DTI 82*w*', a P-type solid phase diffusion layer 83*w*', and an N-type solid phase diffusion layer 84*w*' constituting the protruding portion are described with dashes for distinction from DTI 82*w*, a P-type solid phase diffusion layer 83*w*, and an N-type solid phase diffusion layer 84*w* constituting the remaining part.

Referring to FIG. 43, penetrating DTI 82 is formed on both sides of the PD 71*w*. In contrast, in the protruding portion, non-penetrating DTI 82*w*' is formed instead of the penetrating DTI 82*w*. In other words, the DTI 82*w*' formed in the protruding portion is formed with a PD 71*w* constituting portion remaining on an on-chip lens 76*w* side.

Now, FIG. 20 and FIG. 21 are referred to again. FIG. 20 is a plan view of the PD 71 in a case where no protruding portions are formed, and FIG. 21 is a plan view of the PD 71*q* in a case where protruding portions are formed. As described with reference to FIG. 21, provision of protruding portions allows the intense electric field region to be enlarged. However, the light receiving area of the PD 71*q* may be reduced.

A comparison between the region of the PD 71 depicted in FIG. 20 and the region of the PD 71*q* depicted in FIG. 21 indicates that the region of the PD 71 depicted in FIG. 20 is larger than the region of the PD 71*q* depicted in FIG. 21 due to the lack of protruding portions.

FIG. 20 corresponds to, for example, a plan view taken along the portion of segment B-B' in FIG. 43, and FIG. 21 corresponds to, for example, a plan view taken along the portion of segment A-A' in FIG. 43. Thus, even in a case where protruding portions are formed, the region of the PD 71*w* is enlarged on a light incident surface side as depicted in FIG. 20, thus allowing sensitivity to be prevented from being degraded by the formation of the protruding portions. On the other hand, in a region distant from the light incident surface side, the protruding portions formed as depicted in FIG. 21 enlarge the PN junction region, allowing the intense electric field region to be enlarged.

Thus, the amount of saturated charge can be increased without degradation of sensitivity.

The 21st embodiment can be combined with the 50*q* in the 15th embodiment (FIG. 21), the 50*r* in the sixteenth embodiment (FIG. 28), the 50*t* in the 18th embodiment, and the 50*v* in the 20th embodiment (FIG. 39). Specifically, when the configuration includes protruding portions, the protruding portions can be formed in a non-penetrating manner.

In a case where the portions corresponding to the protruding portions are formed in a non-penetrating manner and the portions other than the protruding portions are formed in a penetrating manner as described above, penetrating portions and non-penetrating portions can be formed by making the width of the DTI 82 different during manufacture. FIG. 43 is referred to again. The width of the DTI 82*w'* in the protruding portions is assumed to be a width L1, and the width of the DTI 82*w* corresponding to the portions other than the protruding portions is assumed to be a width L2. The width L1 is assumed to be smaller than the width L2.

In a case where the width is thus made different, then in the step of forming a trench, a loading effect makes narrower portions of the trench shallower, while making wider portions of the trench deeper. In this case, the portions of the trench having the width L1 are shallower, whereas the portions of the trench having the width L2 are deeper.

The manner of manufacturing an intense electric field region including protruding portions has been described, for example, with reference to FIGS. 24 to 27, and in step S52, the silicon substrate is dug by dry etching. As the dry etching, for example, RIE (Reactive Ion Etching) can be used. When the trench is formed by the dry etching, the loading effect makes the narrower portions of the trench shallower than the wider portions of the trench.

The depth of the DTI 82*w'* in the protruding portion can be set to a desired value by adjusting the width L1. Thus, even in a case where the portions corresponding to the protruding portions are formed in a non-penetrating manner and the portions other than the protruding portions are formed in a penetrating manner, the DTI 82 with the different widths can be formed without addition of a process.

The first to 21st embodiments can be applied to an imaging apparatus 1 described below. The imaging apparatus 1 will be described below.

[Functional Configuration of Imaging Apparatus 1]

Figure 44:
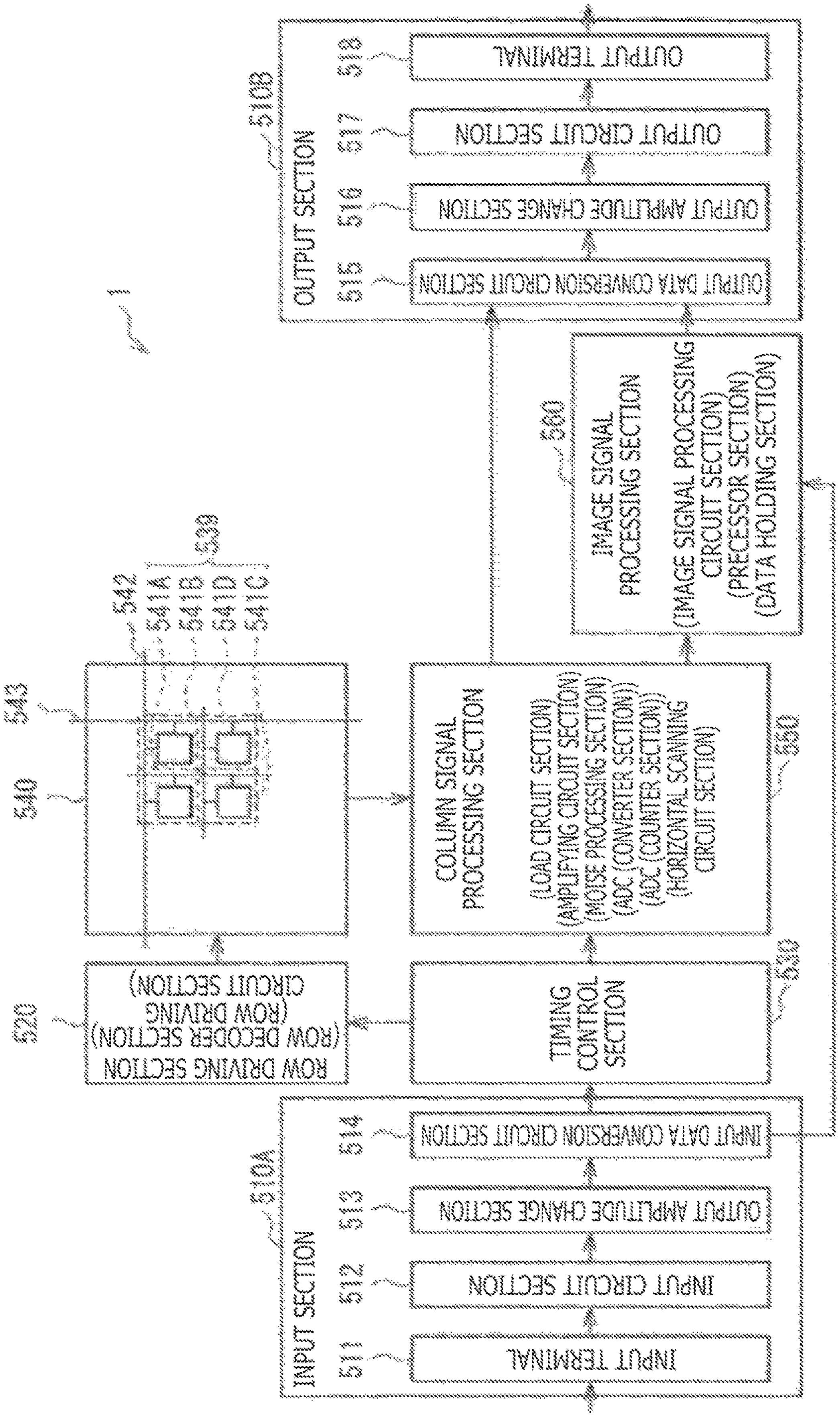
FIG. 44 is a block diagram of assistance in describing a functional configuration of an imaging apparatus according to an embodiment of the present disclosure.

FIG. 44 is a block diagram depicting an example of a functional configuration of an imaging apparatus (imaging apparatus 1) according to an embodiment of the present disclosure.

The imaging apparatus 1 in FIG. 44 includes, for example, an input section 510A, a row driving section 520, a timing control section 530, a pixel array section 540, a column signal processing section 550, an image signal processing section 560, and an output section 510B.

The pixel array section 540 includes pixels 541 repeatedly arranged in an array. More specifically, pixel sharing units 539 each including a plurality of pixels are used as a repeating unit and are repeatedly arranged in an array including a row direction and a column direction. Note that, in the present specification, for convenience of description, the row direction may be referred to as an H direction and the column direction, which is orthogonal to the row direction, may be referred to as a V direction. In the example in FIG. 44, one pixel sharing unit 539 includes four pixels (pixels 541A, 541B, 541C, and 541D). Each of the pixels 541A, 541B, 541C, and 541D includes a photodiode PD (depicted in FIG. 49 and the like described below). The pixel sharing unit 539 is a unit sharing one pixel circuit (a pixel circuit 210 in FIG. 46 described below). In other words, the pixel sharing unit 539 includes one pixel circuit (pixel circuit 210 described below) for every four pixels (pixels 541A, 541B, 541C, and 541D). By operating the pixel circuit on a time-sharing basis, pixel signals are sequentially read out from the pixels 541A, 541B, 541C, and 541D. The pixels 541A, 541B, 541C, and 541D are arranged, for example, in 2 rows×2 columns. The pixel array section 540 is provided with a plurality of row driving signal lines 542 and a plurality of vertical signal lines (column readout lines) 543, along with the pixels 541A, 541B, 541C, and 541D. The row driving signal lines 542 drive the pixels 541 included in each of the plurality of pixel sharing units 539 arranged in juxtaposition in the row direction in the pixel array section 540. The pixels arranged in juxtaposition in the row direction in the pixel sharing unit 539 are driven. As described below in detail with reference to FIG. 4, the pixel sharing unit 539 is provided with a plurality of transistors. To drive each of the plurality of transistors, a plurality of the row driving signal lines 542 are connected to one pixel sharing unit 539. The pixel sharing unit 539 is connected to each of the vertical signal lines (column readout lines) 543. Pixel signals are read out, via the vertical signal line (column readout line) 543, from the pixels 541A, 541B, 541C, and 541D included in the pixel sharing unit 539.

The row driving section 520 includes a row address control section for deciding the position of the row for pixel driving, in other words, a row decoder section, and a row driving circuit section generating signals for driving the pixels 541A, 541B, 541C, and 541D.

The column signal processing section 550 includes, for example, a load circuit section that is connected to the vertical signal lines 543 and that constitutes a source-follower circuit along with the pixels 541A, 541B, 541C, and 541D (pixel sharing unit 539). The column signal processing section 550 may include an amplifying circuit section amplifying a signal read out from the pixel sharing unit 539 via the vertical signal lines 543. The column signal processing section 550 may include a noise processing section. The noise processing section, for example, removes the noise level of the system from a signal read out from the pixel sharing unit 539 as a result of photoelectric conversion.

The column signal processing section 550 includes, for example, an analog digital converter (ADC). The analog digital converter converts, into a digital signal, the signal read out from the pixel sharing unit 539 or an analog signal subjected to the above-described noise processing. The ADC includes, for example, a comparator section and a counter section. The comparator section compares the analog signal to be converted with a reference signal to be compared with the analog signal. The counter section is adapted to measure the time until a comparison result from the comparator section is inverted. The column signal processing section 550 may include a horizontal scanning circuit section performing control for scanning the readout row.

The timing control section 530 feeds signals for controlling timings to the row driving section 520 and the column signal processing section 550 on the basis of a reference clock signal and a timing control signal input to the apparatus.

The image signal processing section 560 is a circuit executing various types of signal processing on data obtained as a result of photoelectric conversion, in other words, data obtained as a result of an imaging operation in the imaging apparatus 1. The image signal processing section 560 includes, for example, an image signal processing circuit section and a data holding section. The image signal processing section 560 may include a processor section.

An example of signal processing executed in the image signal processing section 560 is tone curve correction processing in which imaging data resulting from AD conversion is provided with many gray levels in a case where the imaging data is obtained by imaging a dark subject and in which imaging data resulting from AD conversion is provided with fewer gray levels in a case where the imaging data is obtained by imaging a bright subject. In this case, to determine what kind of tone curve is used as a basis for correcting the gray level of the imaging data, characteristic data regarding tone curves is desirably stored in the data holding section of the image signal processing section 560 in advance.

The input section 510A is used, for example, to input the reference clock signal, timing control signal, characteristic data, and the like from the outside of the apparatus to the imaging apparatus 1. The timing control signal includes, for example, a vertical synchronizing signal, a horizontal synchronizing signal, and the like. The characteristic data is, for example, stored in the data holding section of the image signal processing section 560. The input section 510A includes, for example, an input terminal 511, an input circuit section 512, an input amplitude change section 513, an input data conversion circuit section 514, and a power supply section (not depicted).

The input terminal 511 is an external terminal through which data is input. The input circuit section 512 is used to load, into the imaging apparatus 1, a signal input to the input terminal 511. The input amplitude change section 513 changes the amplitude of the signal loaded by the input circuit section 512 to an amplitude easily used inside the imaging apparatus 1. The input data conversion circuit section 514 changes arrangement of the data sequence of input data. The input data conversion circuit section 514 includes, for example, a serial parallel conversion circuit. The serial parallel conversion circuit converts, into a parallel signal, a serial signal received as input data. Note that the input amplitude change section 513 and the input data conversion circuit section 514 may be omitted from the input section 510A. On the basis of a power supply provided from the outside to the imaging apparatus 1, the power supply section provides power supplies set to various voltages required inside the imaging apparatus 1.

When the imaging apparatus 1 is connected to an external memory device, the input section 510A may be provided with a memory interface circuit receiving data from an external memory device. The external memory device is, for example, a flash memory, an SRAM, a DRAM, or the like.

The output section 510B outputs image data to the outside of the apparatus. The image data is, for example, image data obtained by imaging by the imaging apparatus 1, image data subjected to signal processing by the image signal processing section 560, and the like. The output section 510B includes, for example, an output data conversion circuit section 515, an output amplitude change section 516, an output circuit section 517, and an output terminal 518.

The output data conversion circuit section 515 includes, for example, a parallel serial conversion circuit and converts, into a serial signal, a parallel signal used inside the imaging apparatus 1. The output amplitude change section 516 changes the amplitude of the signal used inside the imaging apparatus 1. The signal with the changed amplitude is easily used by an external device connected to the outside of the imaging apparatus 1. The output circuit section 517 is a circuit outputting data from the inside to the outside of the imaging apparatus 1, and drives external wiring of the imaging apparatus 1 connected to the output terminal 518. Through the output terminal 518, the imaging apparatus 1 outputs data to the outside of the apparatus. The output data conversion circuit section 515 and the output amplitude change section 516 may be omitted from the output section 510B.

When the imaging apparatus 1 is connected to the external memory device, the output section 510B may be provided with a memory interface circuit outputting data to the external memory device. The external memory device is, for example, a flash memory, an SRAM, a DRAM, or the like.

[General Configuration of Imaging Apparatus 1]

Figure 45:
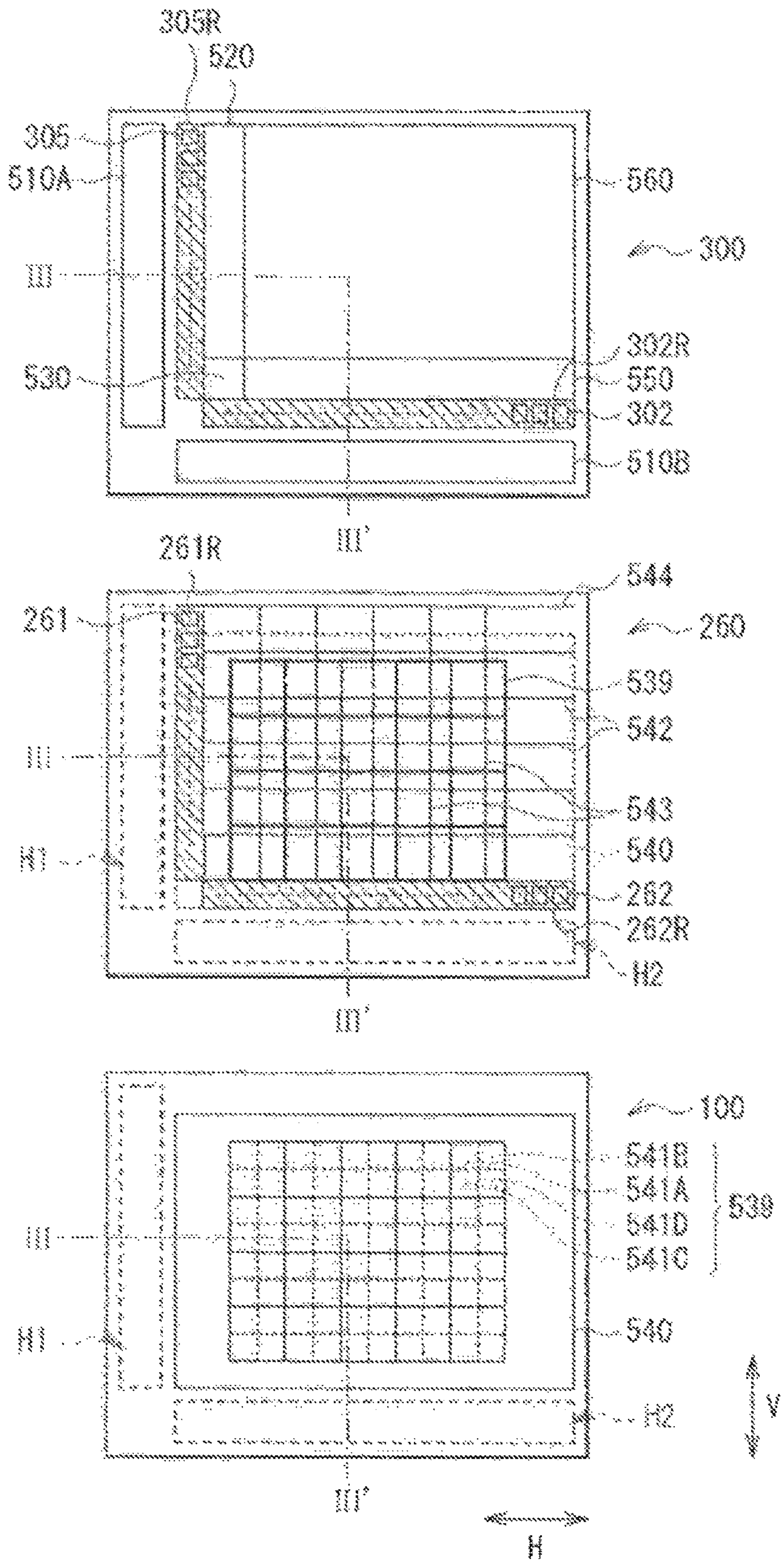
FIG. 45 is a schematic plan view of assistance in describing a general configuration of the imaging apparatus depicted in FIG. 44.
Figure 46:
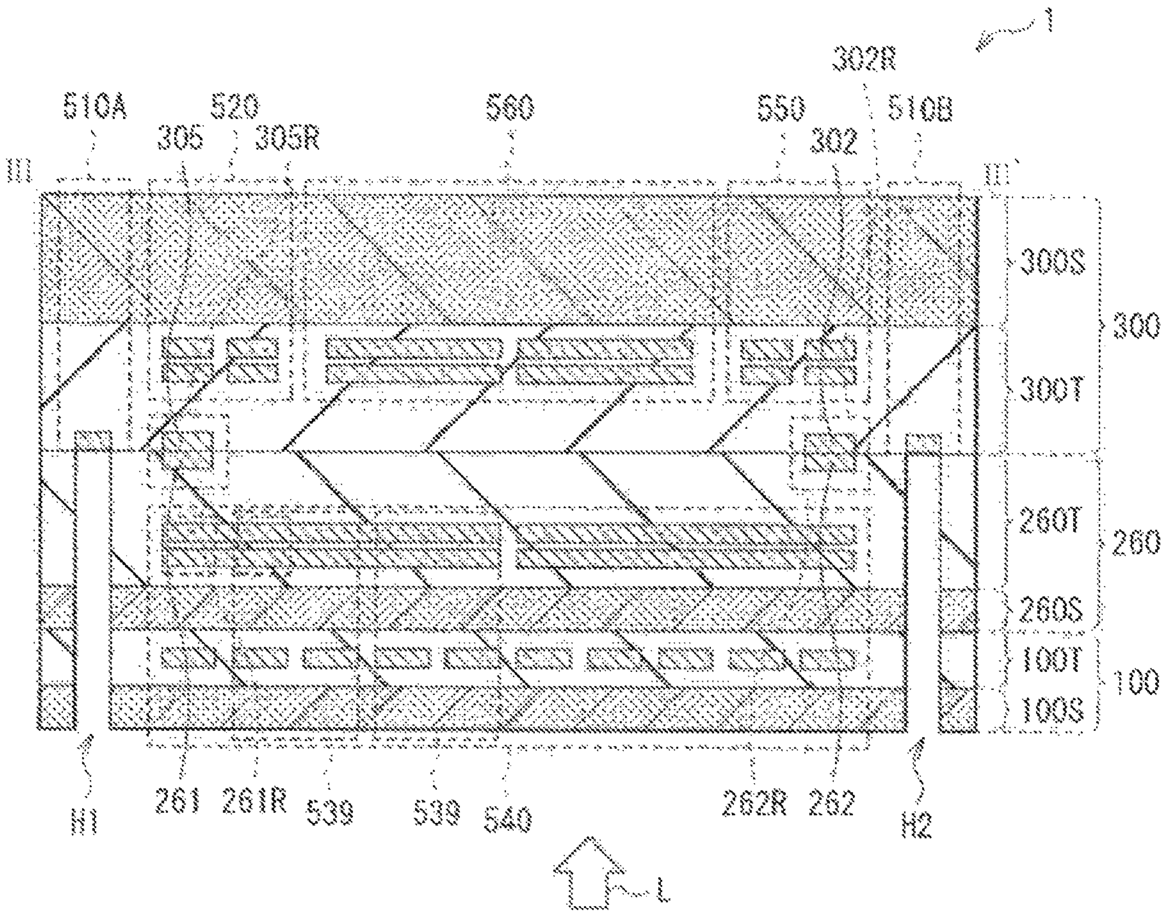
FIG. 46 is a schematic diagram illustrating a cross-sectional configuration taken along line III-III' depicted in FIG. 45.

FIG. 45 and FIG. 46 illustrate an example of a general configuration of the imaging apparatus 1. The imaging apparatus 1 includes three substrates (first substrate 100, second substrate 260, and third substrate 300). FIG. 45 schematically illustrates a planar configuration of each of the first substrate 100, the second substrate 260, and the third substrate 300. FIG. 46 schematically illustrates a cross-sectional configuration of the first substrate 100, the second substrate 200, and the third substrate 300 laminated together. FIG. 46 corresponds to a cross-sectional configuration along line III-III' depicted in FIG. 45. The imaging apparatus 1 is an imaging apparatus with a three-dimensional structure including three substrates (first substrate 100, second substrate 260, and third substrate 300) laminated together. The first substrate 100 includes a semiconductor layer 100S and an interconnect layer 100T. The second substrate 260 includes a semiconductor layer 260S and an interconnect layer 260T. The third substrate 300 includes a semiconductor layer 300S and an interconnect layer 300T. In this regard, a combination of the interconnects and a surrounding interlayer insulating film included in each of the first substrate 100, the second substrate 260, and the third substrate 300 is hereinafter referred to as an interconnect layer (100T, 260T, 300T) provided in each of the substrates (first substrate 100, second substrate 260, and third substrate 300), for the sake of convenience. The first substrate 100, the second substrate 260, and the third substrate 300 are laminated together in this order, and include the semiconductor layer 100S, the interconnect layer 100T, the semiconductor layer 260S, the interconnect layer 260T, the interconnect layer 300T, and the semiconductor layer 300S arranged in this order along a lamination direction. Specific configurations of the first substrate 100, the second substrate 260, and the third substrate 300 will be described below. An arrow depicted in FIG. 46 indicates an incidence direction in which light L enters the imaging apparatus 1. In the present specification, for convenience of description, the light incidence side in the imaging apparatus 1 may be referred to as "down," "lower side," or "downward," and the side opposite to the light incidence side may be referred to as "up," "upper side," or "upward" in the following cross-sectional views. Additionally, in the present specification, for convenience of description, with respect to each of the substrates including the semiconductor layer and the interconnect layer, the side of the interconnect layer may be referred to as a front surface, whereas the side of the semiconductor layer may be referred to as a back surface. Note that the descriptions herein are not limited to the above-described designations. The imaging apparatus 1 is, for example, a back-illuminated imaging apparatus in which light is incident on the imaging apparatus from the back side of the first substrate 100 including photodiodes.

Both the pixel array section 540 and the pixel sharing unit 539 included in the pixel array section 540 are configured using both the first substrate 100 and the second substrate 260. The first substrate 100 is provided with the plurality of pixels 541A, 541B, 541C, and 541D included in the pixel sharing unit 539. Each of the pixels 541 includes a photodiode (photodiode PD described below) and a transfer transistor (transfer transistor TR described below). The second substrate 260 is provided with a pixel circuit (pixel circuit 210 described below) included in the pixel sharing unit 539. The pixel circuit reads out a pixel signal transferred from the photodiode of each of the pixels 541A, 541B, 541C, and 541D via the transfer transistor or resets the photodiode. The second substrate 260 includes, in addition to such a pixel circuit, a plurality of row driving signal lines 542 extending in the row direction and a plurality of vertical signal lines 543 extending in the column direction. The second substrate 260 further includes a power supply line 544 extending in the row direction. The third substrate 300 includes, for example, the input section 510A, the row driving section 520, the timing control section 530, the column signal processing section 550, the image signal processing section 560, and the output section 510B. The row driving section 520 is, for example, provided in a region where the row driving section 520 partly overlaps the pixel array section 540 in the lamination direction of the first substrate 100, the second substrate 260, and the third substrate 300 (hereinafter simply referred to as the lamination direction). More specifically, the row driving section 520 is provided in a region where the row driving section 520 overlaps the vicinity of an H direction end of the pixel array section 540 in the lamination direction (FIG. 45). The column signal processing section 550 is, for example, provided in a region where the column signal processing section 550 partly overlaps the pixel array section 540 in the lamination direction. More specifically, the column signal processing section 550 is provided in a region where the column signal processing section 550 overlaps the vicinity of a V direction end of the pixel array section 540 in the lamination direction (FIG. 45). Although not depicted, the input section 510A and the output section 510B may be disposed in a portion other than the third substrate 300 or, for example, in the second substrate 260. Alternatively, the input section 510A and the output section 510B may be provided on the back (light incidence) side of the first substrate 100. Note that the pixel circuit provided in the second substrate 260 has different designations and may be referred to as a pixel transistor circuit, a pixel transistor group, a pixel transistor, a pixel readout circuit, or a readout circuit. The designation pixel circuit is used herein.

The first substrate 100 and the second substrate 260 are electrically connected, for example, by through electrodes (through electrodes 120E and 121E in FIG. 49 described below). The second substrate 260 and the third substrate 300 are electrically connected, for example, via contact portions 261, 262, 305, and 302. The contact portions 261 and 262 are provided in the second substrate 260, and the contact portions 305 and 302 are provided in the third substrate 300. The contact portions 261 of the second substrate 260 are in contact with the contact portions 305 of the third substrate 300, and the contact portions 262 of the second substrate 260 are in contact with the contact portions 302 of the third substrate 300. The second substrate 260 includes a contact region 261R in which the plurality of contact portions 261 are provided and a contact region 262R in which the plurality of contact portions 262 are provided. The third substrate 300 includes a contact region 305R in which the plurality of contact portions 305 are provided and a contact region 302R in which the plurality of contact portions 302 are provided. The contact regions 261R and 305R are provided between the pixel array section 540 and the row driving section 520 in the lamination direction (FIG. 46). In other words, the contact regions 261R and 305R are provided, for example, in a region where the row driving section 520 (third substrate 300) overlaps the pixel array section 540 (second substrate 260) in the lamination direction or in the vicinity of the region. The contact regions 261R and 305R are disposed, for example, at an H direction end of such region as described above (FIG. 45). On the third substrate 300, for example, the contact region 305R is provided at a position where the contact region 305R overlaps a part of the row driving section 520, specifically, an H direction end of the row driving section 520 (FIG. 45 and FIG. 46). The contact portions 261 and 305 are intended, for example, to connect the row driving section 520 provided in the third substrate 300 to the row driving line 542 provided in the second substrate 260. The contact portions 261 and 305 may, for example, connect the input section 510A provided in the third substrate 300 to the power supply line 544 and a reference potential line (reference potential line VSS described below). The contact regions 262R and 302R are provided between the pixel array section 540 and the column signal processing section 550 in the lamination direction (FIG. 46). In other words, the contact regions 262R and 302R are provided, for example, in a region where the column signal processing section 550 (third substrate 300) overlaps the pixel array section 540 (second substrate 260) in the lamination direction or in the vicinity of the region. The contact regions 262R and 302R are disposed, for example, at a V direction end of such region as described above (FIG. 45). On the third substrate 300, for example, the contact region 305R is provided at a position where the contact region 305R overlaps a part of the column signal processing section 550, specifically, a V direction end of the column signal processing section 550 (FIG. 45 and FIG. 46). The contact portions 262 and 302 are, for example, intended to connect, to the column signal processing section 550 provided in the third substrate 300, a pixel signal (corresponding to the amount of charge resulting from photoelectric conversion by the photodiode) output from each of the plurality of pixel sharing units 539 included in the pixel array section 540. The pixel signal is transmitted from the second substrate 260 to the third substrate 300.

FIG. 46 is an example of a cross-sectional view of the imaging apparatus 1 as described above. The first substrate 100, the second substrate 260, and the third substrate 300 are electrically connected via the interconnect layers 100T, 260T, and 300T. For example, the imaging apparatus 1 includes an electric connection portion electrically connecting the second substrate 260 and the third substrate 300. Specifically, the contact portions 261, 262, 305, and 302 are formed using electrodes including a conductive material. The conductive material includes, for example, a metal material such as copper (Cu), aluminum (Al), or gold (Au). The contact regions 261R, 262R, 305R, and 302R, for example, directly join interconnects formed as electrodes, to electrically connect the second substrate and the third substrate, enabling input and/or output of signals between the second substrate 260 and the third substrate 300.

The electric connection portion electrically connecting the second substrate 260 and the third substrate 300 can be provided at a desired position. For example, the electric connection portion may be provided in a region in which the electric connection portion overlaps the pixel array section 540 in the lamination direction and which has been described as the contact region 261R, 262R, 305R, or 302R with reference to FIG. 46. Additionally, the electric connection portion may be provided in a region where the electric connection portion does not overlap the pixel array section 540 in the lamination direction. Specifically, the electric connection portion may be provided in a region overlapping, in the lamination direction, a peripheral portion disposed outside the pixel array section 540.

The first substrate 100 and the second substrate 260 are provided with, for example, connection hole portions H1 and H2. The connection hole portions H1 and H2 penetrate the first substrate 100 and the second substrate 260 (FIG. 46). The connection hole portions H1 and H2 are provided outside the pixel array section 540 (or outside a portion overlapping the pixel array section 540) (FIG. 45). For example, the connection hole portion H1 is disposed outside the pixel array section 540 in the H direction, and the connection hole portion H2 is disposed outside the pixel array section 540 in the V direction. For example, the connection hole portion H1 reaches the input section 510A provided in the third substrate 300, and the connection hole portion H2 reaches the output section 510B provided in the third substrate 300. The connection hole portions H1 and H2 may be cavities or may at least partially include a conductive material. For example, in a certain configuration, a bonding wire is connected to an electrode formed as the input section 510A and/or the output section 510B. Alternatively, in a certain configuration, an electrode formed as the input section 510A and/or the output section 510B is connected to the conductive material provided in the connection hole portion H1 or H2. The conductive material provided in the connection hole portion H1 or H2 may be embedded in a part or all of the connection hole portion H1 or H2 or formed in the side wall of the connection hole portion H1 or H2.

Note that, in the structure in FIG. 46, the third substrate 300 is provided with the input section 510A and the output section 510B but the present disclosure is not limited to this structure. For example, a signal from the third substrate 300 is transmitted to the second substrate 260 via the interconnect layers 260T and 300T to allow the input section 510A and/or the output section 510B to be provided in the second substrate 260. Similarly, a signal from the second substrate 260 is transmitted to the first substrate 1000 via the interconnect layers 100T and 260T to allow the input section 510A and/or the output section 510B to be provided in the first substrate 100.

FIG. 4 is an equivalent circuit diagram illustrating an example of a configuration of the pixel sharing unit 539. The pixel sharing unit 539 includes a plurality of pixels 541 (in FIG. 4, representing four pixels 541 including the pixels 541A, 541B, 541C, and 541D), one pixel circuit 210 connected to the plurality of pixels 541, and a vertical signal line 5433 connected to the pixel circuit 210. The pixel circuit 210 includes, for example, four transistors, specifically, an amplifying transistor AMP, a select transistor SEL, a reset transistor RST, and an FD conversion gain switching transistor FD. As described above, the pixel sharing unit 539 is adapted to operate one pixel circuit 210 on a time sharing basis to cause pixel signals from the respective four pixels 541 (pixels 541A, 541B, 541C, and 541D) included in the pixel sharing unit 539 to be sequentially output to the vertical signal lines 543. The following aspect is represented as "the plurality of pixels 541 share the one pixel circuit 210": one pixel circuit 210 is connected to the plurality of pixels 541, and pixel signals are output by the one pixel circuit 210 from the plurality of pixels 541 on a time sharing basis.

The pixels 541A, 541B, 541C, and 541D include common components. For distinction of the components of the pixels 541A, 541B, 541C, and 541D, reference signs for the components of the pixel 541A include identification number 1 as a trailing digit, reference signs for the components of the pixel 541B include identification number 2 as a trailing digit, reference signs for the components of the pixel 541C include identification number 3 as a trailing digit, and reference signs for the components of the pixel 541D include identification number 4 as a trailing digit. In a case where the components of the pixels 541A, 541B, 541C, and 541D need not be distinguished from one another, the trailing identification numbers of the reference signs for the components of the pixels 541A, 541B, 541C, and 541D are omitted.

Each of the pixels 541A, 541B, 541C, and 541D includes, for example, the photodiode PD, the transfer transistor TR electrically connected to the photodiode PD, and floating diffusion FD electrically connected to the transfer transistor TR. The photodiode PD (PD1, PD2, PD3, and PD4) includes a cathode electrically connected to a source of the transfer transistor TR and an anode electrically connected to the reference potential line (for example, ground). The photodiode PD photoelectrically converts incident light to generate charge corresponding to the amount of light received. The transfer transistor TR (transfer transistors TR1, TR2, TR3, and TR4) is, for example, an n-type CMOS (Complementary Metal Oxide Semiconductor) transistor. The transfer transistor TR includes a drain electrically connected to the floating diffusion FD and a gate electrically connected to a driving signal line. The driving signal line is a part of the plurality of row driving signal lines 542 (see FIG. 44) connected to one pixel sharing unit 539. The transfer transistor TR transfers, to the floating diffusion FD, charge generated by the photodiode PD. The floating diffusion FD (floating diffusion FD1, FD2, FD3, and FD4) is an n-type diffusion layer region formed in a p-type semiconductor layer. The floating diffusion FD is charge holding means for temporarily holding charge transferred from the photodiode PD and charge-voltage conversion means for generating a voltage corresponding to the amount of charge.

Four pieces of the floating diffusion FD included in one pixel sharing unit 539 (pieces of floating diffusion FD1, FD2, FD3, and FD4) are electrically connected together and to a gate of the amplifying transistor AMP and a source of the FD conversion gain switching transistor FDG. The FD conversion gain switching transistor FDG includes a drain connected to a source of the reset transistor RST and a gate connected to a driving signal line. The driving signal line is a part of the plurality of row driving signal lines 542 connected to one pixel sharing unit 539. The reset transistor RST includes a drain connected to a power supply line VDD and a gate connected to a driving signal line. The driving signal line is a part of the plurality of row driving signal lines 542 connected to one pixel sharing unit 539. The amplifying transistor AMP includes a gate connected to the floating diffusion FD, a drain connected to the power supply line VDD, and a source connected to a drain of the select transistor SEL. The select transistor SEL includes a source connected to the vertical signal lines 543 and a gate connected to a driving signal line. The driving signal line is a part of the plurality of row driving signal lines 542 connected to one pixel sharing unit 539.

Turning on the transfer transistor TR causes the transfer transistor TR to transfer charge in the photodiode PD to the floating diffusion FD. The gate of the transfer transistor TR (transfer gate TG) includes, for example, what is generally called a vertical electrode and extends from the front surface of the semiconductor layer (semiconductor layer 100S in FIG. 49 described below) to a depth reaching the PD as depicted in FIG. 49 described below. The reset transistor RST resets the potential of the floating diffusion FD to a predetermined potential. Setting the reset transistor RST to an on state resets the potential of the floating diffusion FD to the potential of the power supply line VDD. The select transistor SEL controls an output timing for a pixel signal from the pixel circuit 210. The amplifying transistor AMP generates, as a pixel signal, a signal with a voltage corresponding to the level of charge held in the floating diffusion FD. The amplifying transistor AMP is connected to the vertical signal lines 543 via the select transistor SEL. In the column signal processing section 550, the amplifying transistor AMP constitutes a source follower along with the load circuit section (see FIG. 44) connected to the vertical signal lines 543. Setting the select transistor SEL to the on state causes the amplifying transistor AMP to output the voltage of the floating diffusion FD to the column signal processing section 550 via the vertical signal lines 543. The reset transistor RST, the amplifying transistor AMP, and the select transistor SEL are, for example, N-type CMOS transistors.

The FD conversion gain switching transistor FDG is used to change the gain of charge-voltage conversion by the floating diffusion FD. Normally, the pixel signal is small during imaging in a dark place. On the basis of Q=CV, a large capacitance (FD capacitance C) of the floating diffusion FD during charge-voltage conversion leads to a small V resulting from conversion into a voltage performed by the amplifying transistor AMP. On the other hand, a bright place involves a large pixel signal, and thus, the floating diffusion FD fails to accommodate charge from the photodiode PD unless the floating diffusion FD has a large FD capacitance C. Further, the FD capacitance C needs to be properly large such that the V resulting from conversion into a voltage performed by the amplifying transistor AMP is prevented from being excessively large (in other words, the V is made small). On the basis of this, turning on the FD conversion gain switching transistor FDG increases the gate capacitance by an amount corresponding to the FD conversion gain switching transistor FDG, leading to an increase in FD capacitance C of the whole pixel. On the other hand, turning off the FD conversion gain switching transistor FDG reduces the FD capacitance C of the whole pixel. Thus, switching on and off the FD conversion gain switching transistor FDG allows the FD capacitance C to be varied, switching the conversion efficiency. The FD conversion gain switching transistor FDG is, for example, an N-type CMOS transistor.

Note that, in a possible configuration, the FD conversion gain switching transistor FDG is omitted. At this time, for example, the pixel circuit 210 includes, for example, three transistors including the amplifying transistor AMP, the select transistor SEL, and the reset transistor RST. The pixel circuit 210 includes at least one of the pixel transistors, for example, the amplifying transistor AMP, the select transistor SEL, the reset transistor RST, the FD conversion gain switching transistor FDG, and the like.

The select transistor SEL may be provided between the power supply line VDD and the amplifying transistor AMP. In this case, the drain of the reset transistor RST is electrically connected to the power supply line VDD and the drain of the select transistor SEL. The source of the select transistor SEL is electrically connected to the drain of the amplifying transistor AMP, and the gate of the select transistor SEL is electrically connected to the row driving signal lines 542 (see FIG. 44). The source of the amplifying transistor AMP (output end of the pixel circuit 210) is electrically connected to the vertical signal lines 543, and the gate of the amplifying transistor AMP is electrically connected to the source of the reset transistor RST. Note that, although not depicted, the number of pixels 541 sharing one pixel circuit 210 may be other than four. For example, two or eight pixels 541 may share one pixel circuit 210.

Figure 48:
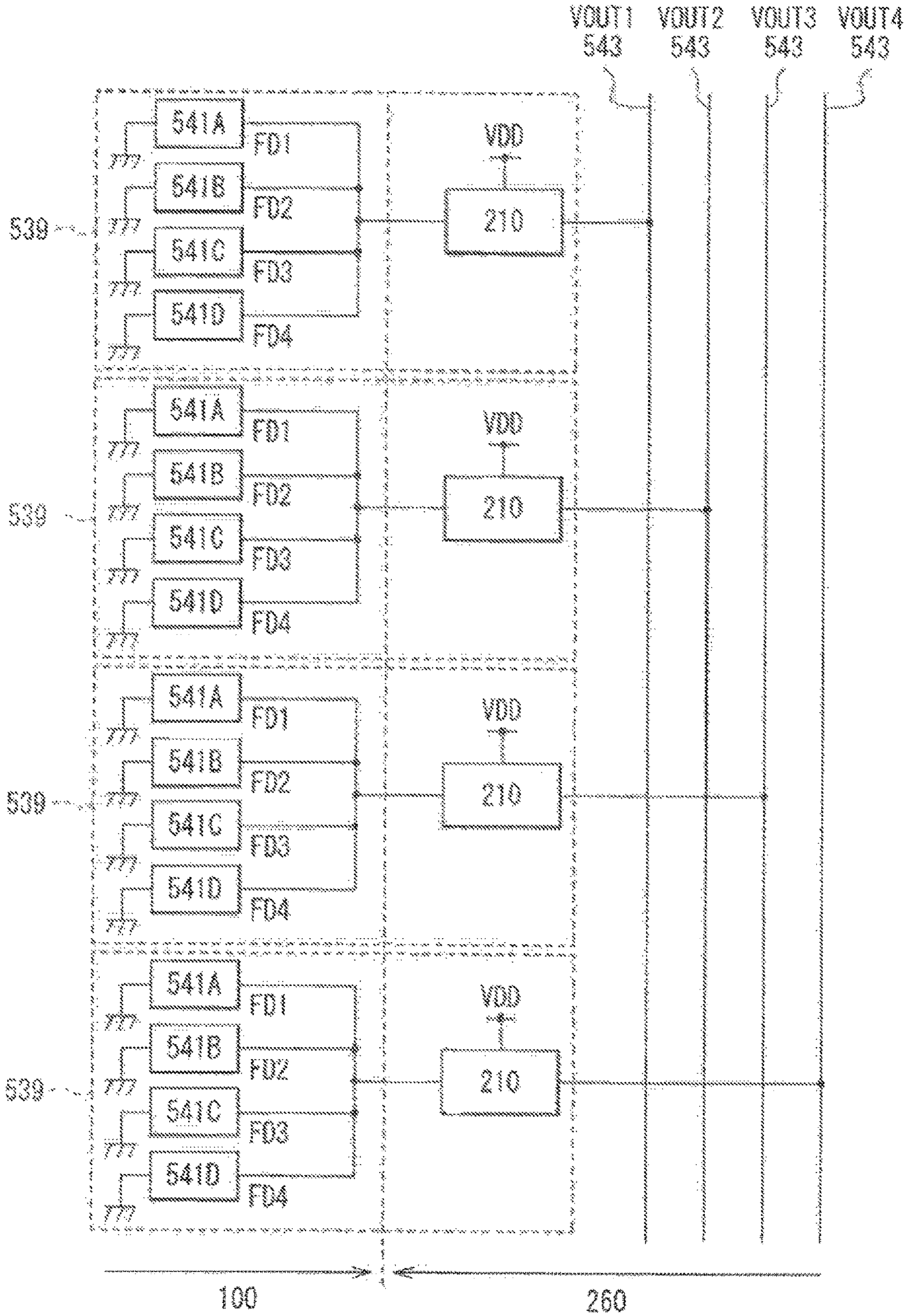
FIG. 48 is a diagram illustrating an example of a connection aspect of a plurality of pixel sharing units and a plurality of vertical signal lines.

FIG. 48 illustrates an example of a connection aspect between a plurality of the pixel sharing units 539 and a plurality of the vertical signal lines 543. For example, four pixel sharing units 539 arranged in juxtaposition in the column direction are divided into four groups each connecting to the vertical signal line 543. For simplified description, FIG. 48 illustrates an example in which each of the four groups includes one pixel sharing unit 539. However, each of the four groups may include a plurality of pixel sharing units 539. As described above, in the imaging apparatus 1, the plurality of pixel sharing units 539 arranged in juxtaposition in the column direction may be divided into groups each including one or a plurality of pixel sharing units 539. For example, the vertical signal line 543 and the column signal processing section 550 are connected to each of the groups to allow pixel signals to be simultaneously read out from the respective groups. Alternatively, in the imaging apparatus 1, one vertical signal line 543 may be connected to a plurality of the pixel sharing units 539 arranged in juxtaposition in the column direction. At this time, pixel signals are sequentially read out on a time sharing basis from the plurality of pixel sharing units 539 connected to one vertical signal line 543.

[Specific Configuration of Imaging Apparatus 1]

Figure 49:
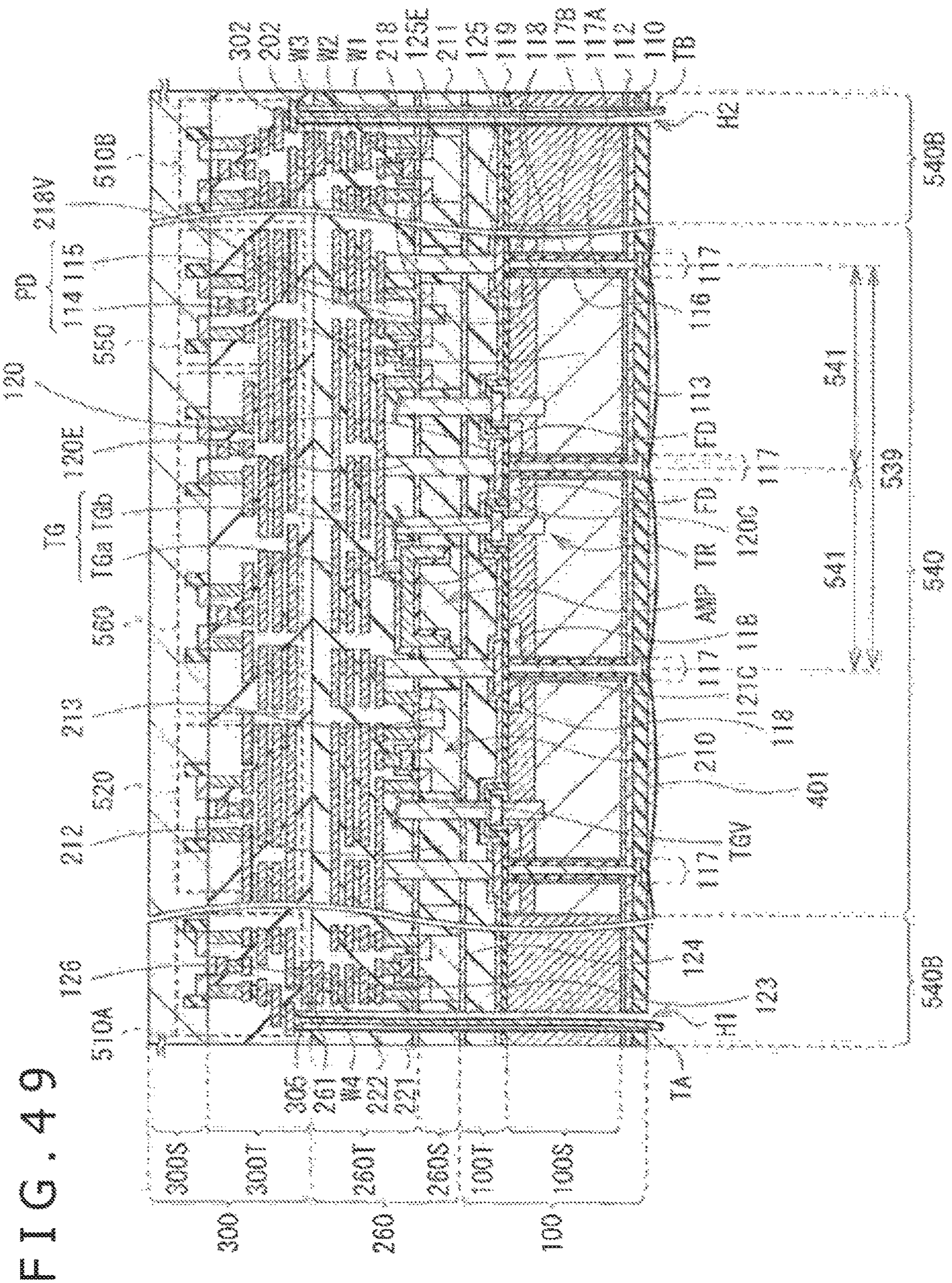
FIG. 49 is a schematic cross-sectional view illustrating an example of a specific configuration of the imaging apparatus depicted in FIG. 46.

FIG. 49 illustrates an example of a cross-sectional configuration perpendicular to principal surfaces of the first substrate 100, the second substrate 260, and the third substrate 300 of the imaging apparatus 1. FIG. 49 schematically illustrates the cross-sectional configuration to facilitate understanding of the positional relation of components, and may differ from the actual cross section. The imaging apparatus 1 includes the first substrate 100, the second substrate 260, and the third substrate 300 laminated together in this order. The imaging apparatus 1 further includes a light receiving lens 401 on the back side (light incidence side) of the first substrate 100. A color filter layer (not depicted) may be provided between the light receiving lens 401 and the first substrate 100. The light receiving lens 401 is provided, for example, in each of the pixels 541A, 541B, 541C, and 541D. The imaging apparatus 1 is, for example, a back-illuminated type imaging apparatus. The imaging apparatus 1 includes the pixel array section 540 disposed in the central portion and a peripheral portion 540B disposed outside the pixel array section 540.

The first substrate 100 includes an insulating film 110, a fixed charge film 112, a semiconductor layer 100S, and an interconnect layer 100T arranged in this order from the light receiving lens 401 side. The semiconductor layer 100S includes, for example, a silicon substrate. The semiconductor layer 100S includes, for example, a p well layer 115 in a part of a front surface (interconnect layer 100T-side surface) and in the vicinity of the part, and includes an n-type semiconductor region 114 as the other region (region deeper than the p well layer 115). For example, the n-type semiconductor region 114 and the p well layer 115 constitute a pn junction photodiode PD. The p well layer 115 is a p-type semiconductor region.

Figure 50:
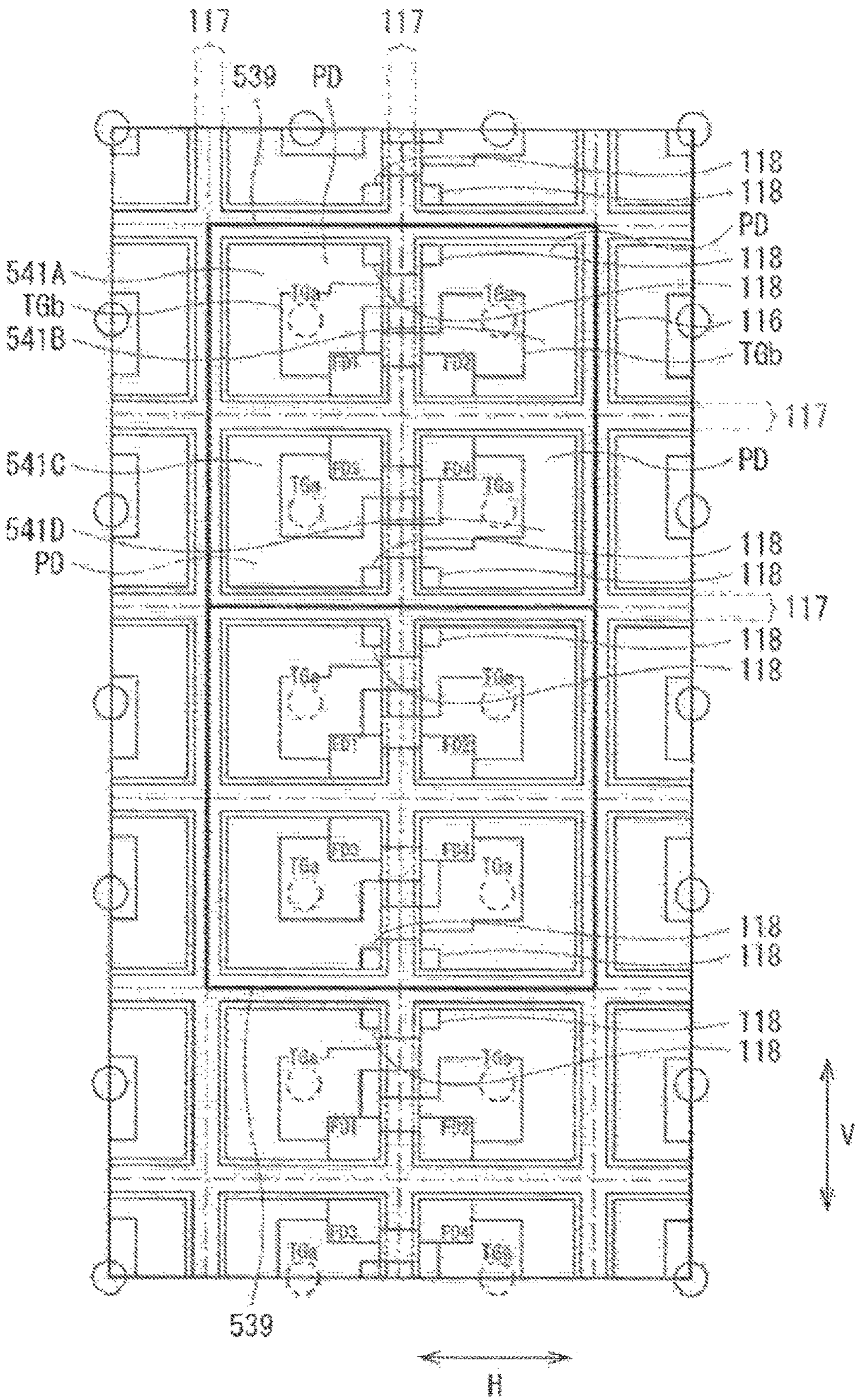
FIG. 50 is a schematic diagram illustrating an example of a planar configuration of a main part of a first substrate depicted in FIG. 49.

FIG. 50 illustrates an example of a planar configuration of the first substrate 100. FIG. 50 mainly illustrates a planar configuration of a pixel isolation section 117, the photodiode PD, the floating diffusion FD, a VSS contact region 118, and the transfer transistor TR of the first substrate 100. The configuration of the first substrate 100 will be described using FIG. 50 along with FIG. 49.

The floating diffusion FD and the VSS contact region 118 are provided in the vicinity of the front surface of the semiconductor layer 100S. The floating diffusion FD includes an n-type semiconductor region provided in the p well layer 115. The pieces of floating diffusion FD (pieces of floating diffusion FD1, FD2, FD3, and FD4) of each of the pixels 541A, 541B, 541C, and 541D are provided, for example, in proximity to each other in the central portion of the pixel sharing unit 539 (FIG. 50). Although described below in detail, the four pieces of floating diffusion (pieces of floating diffusion FD1, FD2, FD3, and FD4) included in the sharing unit 539 are electrically connected together via electric connection means (pad portions 120 described below) in the first substrate 100 (more specifically, in the interconnect layer 100T). Further, the pieces of floating diffusion FD are connected from the first substrate 100 to the second substrate 260 (more specifically, from the interconnect layer 100T to the interconnect layer 260T) via electric means (through electrodes 120E described below). In the second substrate 260 (more specifically, the inside of the interconnect layer 260T), the floating diffusion FD is electrically connected to the gate of the amplifying transistor AMP and to the source of the FD conversion gain switching transistor FDG by the electric means.

The VSS contact region 118 is a region electrically connected to the reference potential line VSS, and is spaced apart from the floating diffusion FD. For example, in the pixels 541A, 541B, 541C, and 541D, the floating diffusion FD is disposed at one V direction end of each pixel, whereas the VSS contact region 118 is disposed at the other end (FIG. 50). The VSS contact region 118 includes, for example, a p-type semiconductor region. The VSS contact region 118 is connected to, for example, the ground potential or a fixed potential. This causes a reference potential to be supplied to the semiconductor layer 100S.

The first substrate 100 is provided with the transfer transistor TR as well as the photodiode PD, the floating diffusion FD, and the VSS contact region 118. The photodiode PD, the floating diffusion FD, the VSS contact region 118, and the transfer transistor TR are provided in each of the pixels 541A, 541B, 541C, and 541D. The transfer transistor TR is provided on the front surface side (opposite to the light incidence side, on the second substrate 260 side) of the semiconductor layer 100S. The transfer transistor TR includes a transfer gate TG. The transfer gate TG includes, for example, a horizontal portion TGb facing the front surface of the semiconductor layer 100S and a vertical portion TGa provided in the semiconductor layer 100S. The vertical portion TGa extends in a thickness direction of the semiconductor layer 100S. One end of the vertical portion TGa is in contact with the horizontal portion TGb, and the other end of the vertical portion TGa is provided in the n-type semiconductor region 114. When the transfer transistor TR includes such a vertical transistor, improper transfer of pixel signals is less likely to occur, allowing improvement of the readout efficiency of the pixel signals.

The horizontal portion TGb of the transfer gate TG extends from a position facing the vertical portion TGa, for example, toward the central portion of the pixel sharing unit 539 in the H direction (FIG. 50). This allows a through electrode (through electrode TGV described below) reaching the transfer gate TG to be located, in the H direction, closer to the position of a through electrode (through electrode 120E or 121E described below) connected to the VSS contact region 118, in the H direction. For example, the plurality of pixel sharing units 539 provided in the first substrate 100 have the same configuration (FIG. 50).

Figure 51:
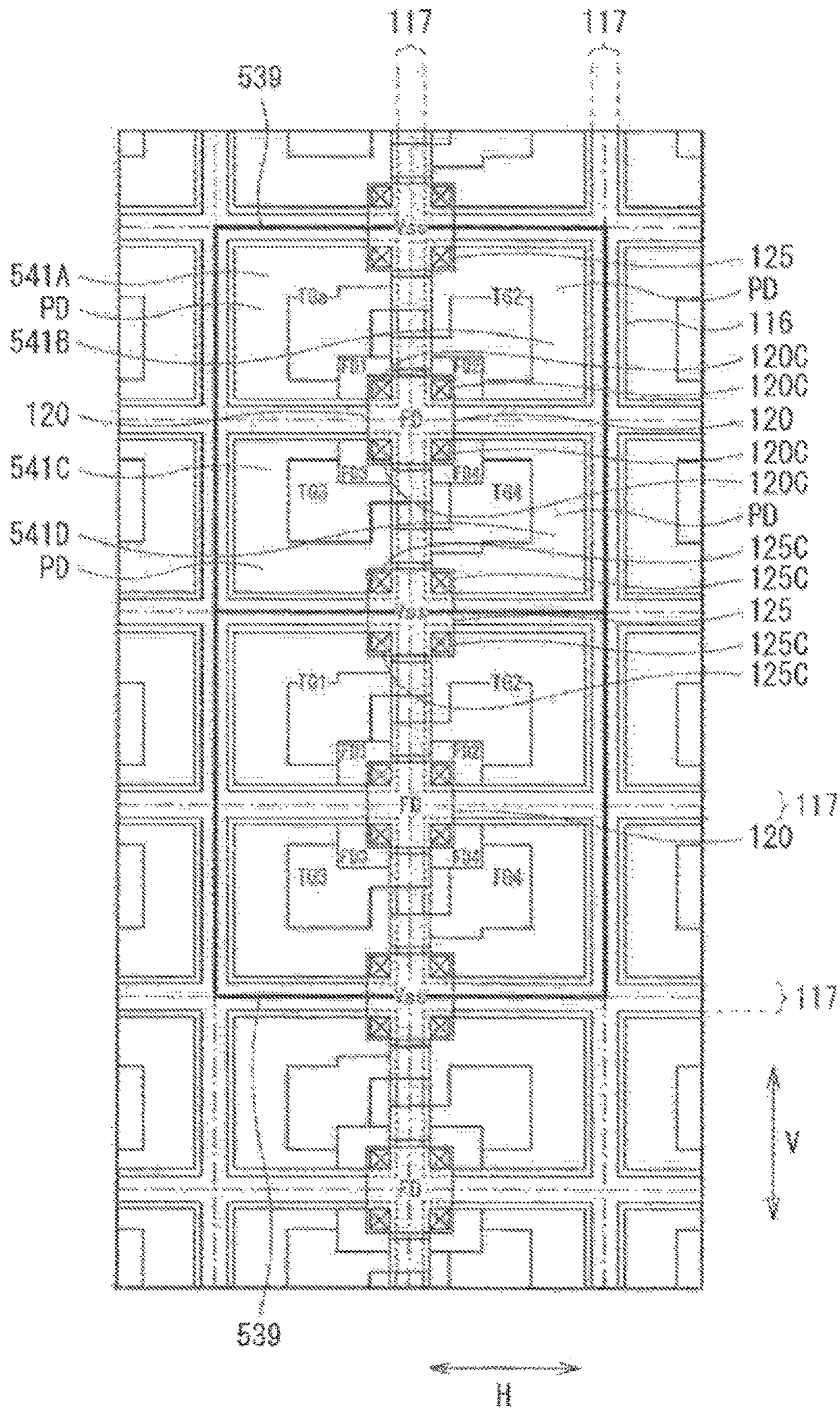
FIG. 51 is a schematic diagram illustrating a planar configuration of a pad portion along with the main part of the first substrate depicted in FIG. 50.

The semiconductor layer 100S is provided with the pixel isolation section 117 isolating the pixels 541A, 541B, 541C, and 541D from one another. The pixel isolation section 117 is formed to extend in a normal direction of the semiconductor layer 100S (direction perpendicular to the front surface of the semiconductor layer 100S). The pixel isolation section 117 is provided to partition the pixels 541A, 541B, 541C, and 541D from one another, and has, for example, a grid-like planar shape (FIG. 50 and FIG. 51). The pixel isolation section 117 electrically and optically separates the pixels 541A, 541B, 541C, and 541D from one another. The pixel isolation section 117 includes, for example, a light shielding film 117A and an insulating film 117B. As the light shielding film 117A, for example, tungsten (W) or the like is used. The insulating film 117B is provided between the light shielding films 117A and the p well layer 115 or the n-type semiconductor region 114. The insulating film 117B includes, for example, silicon oxide (SiO). The pixel isolation section 117 has, for example, an FTI (Full Trench Isolation) structure and penetrates the semiconductor layer 100S. Although not depicted, the pixel isolation section 117 is not limited to the FTI structure penetrating the semiconductor layer 100S. For example, the pixel isolation section 117 may have a DTI (Deep Trench Isolation) structure not penetrating the semiconductor layer 100S. The pixel isolation section 117 extends in the normal direction of the semiconductor layer 100S and is formed in a partial region of the semiconductor layer 100S.

The semiconductor layer 100S is provided with, for example, a first pinning region 113 and a second pinning region 116. The first pinning region 113 is provided in the vicinity of the back surface of the semiconductor layer 100S and disposed between the n-type semiconductor region 114 and the fixed charge film 112. The second pinning region 116 is provided in a side surface of the pixel isolation section 117, specifically, between the pixel isolation section 117 and the p well layer 115 or the n-type semiconductor region 114. Each of the first pinning region 113 and the second pinning region 116 includes, for example, a p-type semiconductor region.

The fixed charge film 112 including negative fixed charge is provided between the semiconductor layer 100S and the insulating film 110. An electric field induced by the fixed charge film 112 causes the first pinning region 113 for a Hall storage layer to be formed at a light receiving surface (back) side interface of the semiconductor layer 100S. This reduces generation of a dark current caused by an interface state on the light receiving surface side of the semiconductor layer 100S. The fixed charge film 112 includes, for example, an insulating film including negative fixed charge. Examples of a material for the insulating film including negative fixed charge include hafnium oxide, zircon oxide, aluminum oxide, titanium oxide, or tantalum oxide.

The light shielding film 117A is provided between the fixed charge film 112 and the insulating film 110. The light shielding films 117A may be provided continuously with the light shielding films 117A constituting the pixel isolation section 117. The light shielding films 117A between the fixed charge film 112 and the insulating film 110 are selectively provided at a position facing the pixel isolation section 117 in the semiconductor layer 100S, for example. The insulating film 110 is provided over the light shielding films 117A. The insulating film 110 includes, for example, silicon oxide.

The interconnect layer 100T provided between the semiconductor layer 100S and the second substrate 260 includes an interlayer insulating film 119, the pad portions 120 and 121, a passivation film 126, an interlayer insulating film 123, and a junction film 124 in this order from the semiconductor layer 100S side. The horizontal portion TGb of the transfer gate TG is provided, for example, in the interconnect layer 100T. The interlayer insulating film 119 is provided all over the front surface of the semiconductor layer 100S in contact with the semiconductor layer 100S. The interlayer insulating film 119 includes, for example, a silicon oxide film. Note that the interconnect layer 100T is not limited to the above-described configuration and that any configuration may be used as long as the interconnect layer 100T includes an interconnect and an insulating film.

FIG. 51 illustrates a configuration of the pad portions 120 and 121 along with the planar configuration depicted in FIG. 50. The pad portions 120 and 121 are provided in selective regions on the interlayer insulating film 119. The pad portion 120 is intended to connect the pieces of floating diffusion FD (pieces of floating diffusion FD1, FD2, FD3, and FD4) of the respective pixels 541A, 541B, 541C, and 541D to one another. The pad portion 120 is disposed, for example, in each pixel sharing unit 539 at the central portion of the pixel sharing unit 539 in plan view (FIG. 51). The pad portion 120 is provided to span the pixel isolation section 117 and disposed overlapping at least a part of each of the pieces of floating diffusion FD1, FD2, FD3, and FD4 (FIG. 49 and FIG. 51). Specifically, the pad portion 120 is formed in a region overlapping, in a direction perpendicular to the front surface of the semiconductor layer 100S, at least a part of each of the plurality of pieces of floating diffusion FD (pieces of floating diffusion FD1, FD2, FD3, and FD4) sharing the pixel circuit 210 and at least a part of the pixel isolation section 117 formed between the plurality of photodiodes PD (photodiodes PD1, PD2, PD3, and PD4) sharing the pixel circuit 210. The interlayer insulating film 119 is provided with connection vias 120C for electrically connecting the pad portion 120 to the pieces of floating diffusion FD1, FD2, FD3, and FD4. The connection via 120C is provided in each of the pixels 541A, 541B, 541C, and 541D. For example, a part of the pad portion 120 is embedded in the connection via 120C to electrically connect the pad portion 120 to each of the pieces of floating diffusion FD1, FD2, FD3, and FD4.

The pad portion 121 is intended to connect a plurality of VSS contact regions 118 together. For example, the pad portion 121 electrically connects the VSS contact region 118 provided for the pixels 541C and 541D in one of the pixel sharing units 539 adjacent to each other in the V direction and the VSS contact region 118 provided for the pixels 541A and 541B in the other pixel sharing unit 539. The pad portion 121 is provided, for example, to span the pixel isolation section 117 and is disposed overlapping at least a part of each of the four VSS contact regions 118. Specifically, the pad portion 121 is formed in a region overlapping, in the direction perpendicular to the front surface of the semiconductor layer 100S, at least a part of each of the plurality of VSS contact regions 118 and at least a part of the pixel isolation section 117 formed between the plurality of VSS contact regions 118. The interlayer insulating film 119 is provided with connection vias 121C for electrically connecting the pad portion 121 to the VSS contact regions 118. The connection via 121C is provided in each of the pixels 541A, 541B, 541C, and 541D. For example, a part of the pad portion 121 is embedded in the connection via 121C to electrically connect the pad portion 121 to each of the VSS contact regions 118. For example, the pad portions 120 and 121 in each of the plurality of pixel sharing units 539 arranged in the V direction are disposed approximately at the same position in the H direction (FIG. 51).

Provision of the pad portions 120 enables, in the entire chip, a reduction in interconnects for connecting each of the pieces of floating diffusion FD to the pixel circuit 210 (for example, the gate electrode of the amplifying transistor AMP). Similarly, provision of the pad portions 121 enables, in the entire chip, a reduction in interconnects for supplying a potential to each of the VSS contact regions 118. This allows for a reduction in the area of the entire chip, a decrease of electric interference between interconnects in miniaturized pixels, and/or a cost reduction resulting from a reduced number of components.

The pad portions 120 and 121 can be provided at desired positions in the first substrate 100 and the second substrate 260. Specifically, the pad portions 120 and 121 can be provided in any of the interconnect layer 100T or an insulating region 212 of the semiconductor layer 260S. In a case where the pad portions 120 and 121 are provided in the interconnect layer 100T, the pad portions 120 and 121 may be disposed in contact with the semiconductor layer 100S. Specifically, in a certain configuration, the pad portions 120 and 121 may be directly connected to at least a part of each of the pieces of floating diffusion FD and/or the VSS contact regions 118. Additionally, in a certain configuration, the connection vias 120C and 121C may be provided to extend from each of the pieces of floating diffusion FD and/or the VSS contact regions 118 connected to the pad portions 120 and 121, and the pad portions 120 and 121 may be provided at desired positions in the interconnect layer 100T and the insulating region 212 of the semiconductor layer 260S.

In particular, the pad portions 120 and 121 provided in the interconnect layer 100T enable a reduction in interconnects connected to the floating diffusion FD and/or the VSS contact regions 118 in the insulating region 212 of the semiconductor layer 260S. This in turn enables a reduction in the area of the insulating region 212 of the second substrate 260 in which the pixel circuit 210 is formed, the insulating region 212 being configured such that through interconnects for connecting the floating diffusion FD to the pixel circuit 210 are formed in the insulating region 212. Thus, the area of a portion of the second substrate 260 in which the pixel circuit 210 is formed can be increased. Providing a large area for the pixel circuit 210 enables a large pixel transistor to be formed, allowing contribution to improvement of image quality based on a noise reduction and the like.

In particular, in a case where an FTI structure is used for the pixel isolation section 117, the floating diffusion FD and/or the VSS contact region 118 are preferably provided in each of the pixels 541. Thus, the use of the configuration of the pad portions 120 and 121 enables a drastic reduction in interconnects connecting the first substrate 100 and the second substrate 260.

Additionally, as in FIG. 51, for example, the pad portions 120 to which the plurality of pieces of floating diffusion FD are connected and the pad portions 121 to which the plurality of VSS contact regions 118 are connected are linearly alternately arranged in the V direction. Additionally, the pad portions 120 and 121 are formed at positions surrounded by a plurality of photodiodes PD, a plurality of transfer gates TG, or a plurality of pieces of floating diffusion FD. Thus, in the first substrate 100 in which a plurality of elements are formed, elements other than the floating diffusion FD and the VSS contact regions 118 can be freely disposed, allowing the layout of the entire chip to be made more efficient. Additionally, the layout of the elements formed in each pixel sharing unit 539 is reliably made symmetric, allowing a reduction of variation in characteristics of each pixel 541.

The pad portions 120 and 121 include, for example, polysilicon (Poly Si), more specifically, doped polysilicon doped with impurities. The pad portions 120 and 121 preferably include a conductive material with high heat resistance such as polysilicon, tungsten (W), titanium (Ti), and titanium nitride. Thus, after the semiconductor layer 260S of the second substrate 260 is laminated to the first substrate 100, the pixel circuit 210 can be formed. The reason for this will be explained below. Note that, in the following description, a first manufacturing method refers to a method in which the pixel circuit 210 is formed after the semiconductor layer 260S of the second substrate 260 is laminated to the first substrate 100.

In this regard, it is also possible that, after the pixel circuit 210 is formed in the second substrate 260, the second substrate 260 is laminated to the first substrate 100 (this is hereinafter referred to as a second manufacturing method). In the second manufacturing method, an electrode for electric connection is pre-formed on each of the front surface of the first substrate 100 (front surface of the interconnect layer 100T) and the front surface of the second substrate 260 (front surface of the interconnect layer 260T). When the first substrate 100 and the second substrate 260 are laminated to each other, the electrode for electric connection formed on the front surface of the first substrate 100 simultaneously comes into contact with the electrode for electric connection formed on the front surface of the second substrate 260. This forms electric connection between the interconnects included in the first substrate 100 and the interconnects included in the second substrate 260. Thus, when the imaging apparatus 1 is configured using the second manufacturing method, the imaging apparatus 1 can be manufactured using a proper process depending on the configuration of each of the first substrate 100 and the second substrate 260, for example. Thus, an imaging apparatus with high quality and high performance can be manufactured.

In such a second manufacturing method, when the first substrate 100 and the second substrate 260 are laminated, an alignment error may occur due to a manufacturing apparatus for lamination. Additionally, the first substrate 100 and the second substrate 260 have, for example, a diameter of approximately several dozen cm, and when the first substrate 100 and the second substrate 260 are laminated, expansion and contraction of the substrate may occur in a microscopic region of each section of the first substrate 100 and the second substrate 260. The expansion and contraction of the substrate are caused by a small timing gap generated when the substrates come into contact with each other. Due to such expansion and contraction of the first substrate 100 and the second substrate 260, an error may occur in the position of an electrode for electric connection formed on each of the front surfaces of the first substrate 100 and the second substrate 260. The second manufacturing method preferably allows the electrode of the first substrate 100 and the electrode of the second substrate 260 to come into contact with each other in spite of such an error. Specifically, at least one of and preferably both the electrode of the first substrate 100 and the electrode of the second substrate 260 are enlarged in consideration of the error. Thus, the use of the second manufacturing method, for example, makes the size of the electrode formed on the front surface of the first substrate 100 or the second substrate 260 (size in a substrate plane direction) larger than the size of an internal electrode extending from the inside of the first substrate 100 or the second substrate 260 to the front surface in the thickness direction.

On the other hand, in a case where the pad portions 120 and 121 include a heat-resistant conductive material, the use of the above-described first manufacturing method becomes possible. In the first manufacturing method, the first substrate 100 including the photodiode PD, the transfer transistor TR, and the like is formed, and then the first substrate 100 and the second substrate 260 (semiconductor layer 260S) are laminated. At this time, a pattern of active elements, an interconnect layer, and the like constituting the pixel circuit 210 has not been formed yet in the second substrate 260. The pattern has not been formed yet in the second substrate 260, and thus when the first substrate 100 and the second substrate 260 are laminated, even in a case where an error occurs in the lamination position, no error occurs in alignment between the pattern of the first substrate 100 and the pattern of the second substrate 260. This is because the pattern of the second substrate 260 is formed after the first substrate 100 and the second substrate 260 are laminated. Note that, when the pattern is formed in the second substrate, for example, an exposure apparatus for pattern formation is used to form a pattern by using, as a target for alignment, the pattern formed in the first substrate 100. For the above-described reason, for the first manufacturing method, an error in lamination position between the first substrate 100 and the second substrate 260 poses no problem in manufacturing the imaging apparatus 1. For a similar reason, for the first manufacturing method, an error due to expansion and contraction of the substrate occurring in the second manufacturing method poses no problem in manufacturing the imaging apparatus 1.

In the first manufacturing method, after the first substrate 100 and the second substrate 260 (semiconductor layer 260S) are thus laminated, active elements are formed in the second substrate 260. Subsequently, through electrodes 120E and 121E and a through electrode TGV (FIG. 49) are formed. In formation of the through electrodes 120E, 121E, and TGV, for example, reduced projection exposure by the exposure apparatus is used to form a pattern of the through electrodes from above the second substrate 260. Due to the use of reduced projection exposure, even in a case where an error occurs in alignment between the second substrate 260 and the exposure apparatus, the magnitude of the error in the second substrate 260 is a fraction of an error in the second manufacturing method (reciprocal of reduced exposure projection magnification). Thus, in a case where the imaging apparatus 1 is configured using the first manufacturing method, elements formed in the first substrate 100 are easily aligned with elements formed in the second substrate 260, allowing an imaging apparatus with high quality and high performance to be manufactured.

The imaging apparatus 1 manufactured using the first manufacturing method as described above has features different from the features of the imaging apparatus manufactured using the second manufacturing method. Specifically, in the imaging apparatus 1 manufactured by the first manufacturing method, for example, the through electrodes 120E, 121E, and TGV have an approximately constant thickness (dimension in the substrate plane direction) from the second substrate 260 to the first substrate 100. Alternatively, when the through electrodes 120E, 121E, and TGV have a tapered shape, the tapered shape has a certain inclination. The imaging apparatus 1 with such through electrodes 120E, 121E, and TGV facilitates miniaturization of the pixels 541.

In this regard, when the imaging apparatus 1 is manufactured using the first manufacturing method, active elements are formed in the second substrate 260 after the first substrate 100 and the second substrate 260 (semiconductor layer 260S) are laminated, and thus the first substrate 100 is affected by heat treatment required during formation of the active elements. Thus, as described above, a conductive material with high heat resistance is preferably used for the pad portions 120 and 121 provided in the first substrate 100. For example, for the pad portions 120 and 121, preferably used is a material that has a higher melting point (that is, offers higher heat resistance) than at least a part of an interconnect material included in the interconnect layer 260T of the second substrate 260. For example, for the pad portions 120 and 121, a conductive material with high heat resistance such as doped polysilicon, tungsten, titanium, or titanium nitride is used. This enables the imaging apparatus 1 to be manufactured using the first manufacturing method described above.

The passivation film 126 is, for example, provided all over the front surface of the semiconductor layer 100S in such a manner as to cover the pad portions 120 and 121 (FIG. 49). The passivation film 126 includes, for example, a silicon nitride (SiN) film. The interlayer insulating film 123 covers the pad portions 120 and 121 via the passivation film 126. The interlayer insulating film 123 is, for example, provided all over the front surface of the semiconductor layer 100S. The interlayer insulating film 123 includes, for example, a silicon oxide (SiO) film. The junction film 124 is provided at a junction surface between the first substrate 100 (specifically, the interconnect layer 100T) and the second substrate 260. Specifically, the junction film 124 is in contact with the second substrate 260. The junction film 124 is provided all over the principal surface of the first substrate 100. The junction film 124 includes, for example, a silicon nitride film.

The light receiving lens 401, for example, faces the semiconductor layer 100S across the fixed charge film 112 and the insulating film 110 (FIG. 49). The light receiving lens 401 is provided at positions facing the respective photodiodes PD of the pixels 541A, 541B, 541C, and 541D, for example.

The second substrate 260 includes the semiconductor layer 260S and the interconnect layer 260T arranged in this order from the first substrate 100 side. The semiconductor layer 260S includes a silicon substrate. In the semiconductor layer 260S, a well region 211 is provided extending in the thickness direction. The well region 211 is, for example, a p-type semiconductor region. The second substrate 20 is provided with the pixel circuits 210 arranged for the respective pixel sharing units 539. The pixel circuits 210 are provided, for example, on the front side (interconnect layer 260T side) of the semiconductor layer 260S. In the imaging apparatus 1, the second substrate 260 is laminated to the first substrate 100 with the front side (interconnect layer 100T side) of the first substrate 100 facing the back side (semiconductor layer 260S side) of the second substrate 260. In other words, the second substrate 260 is laminated to the first substrate 100 face-to-back.

Figure 52:
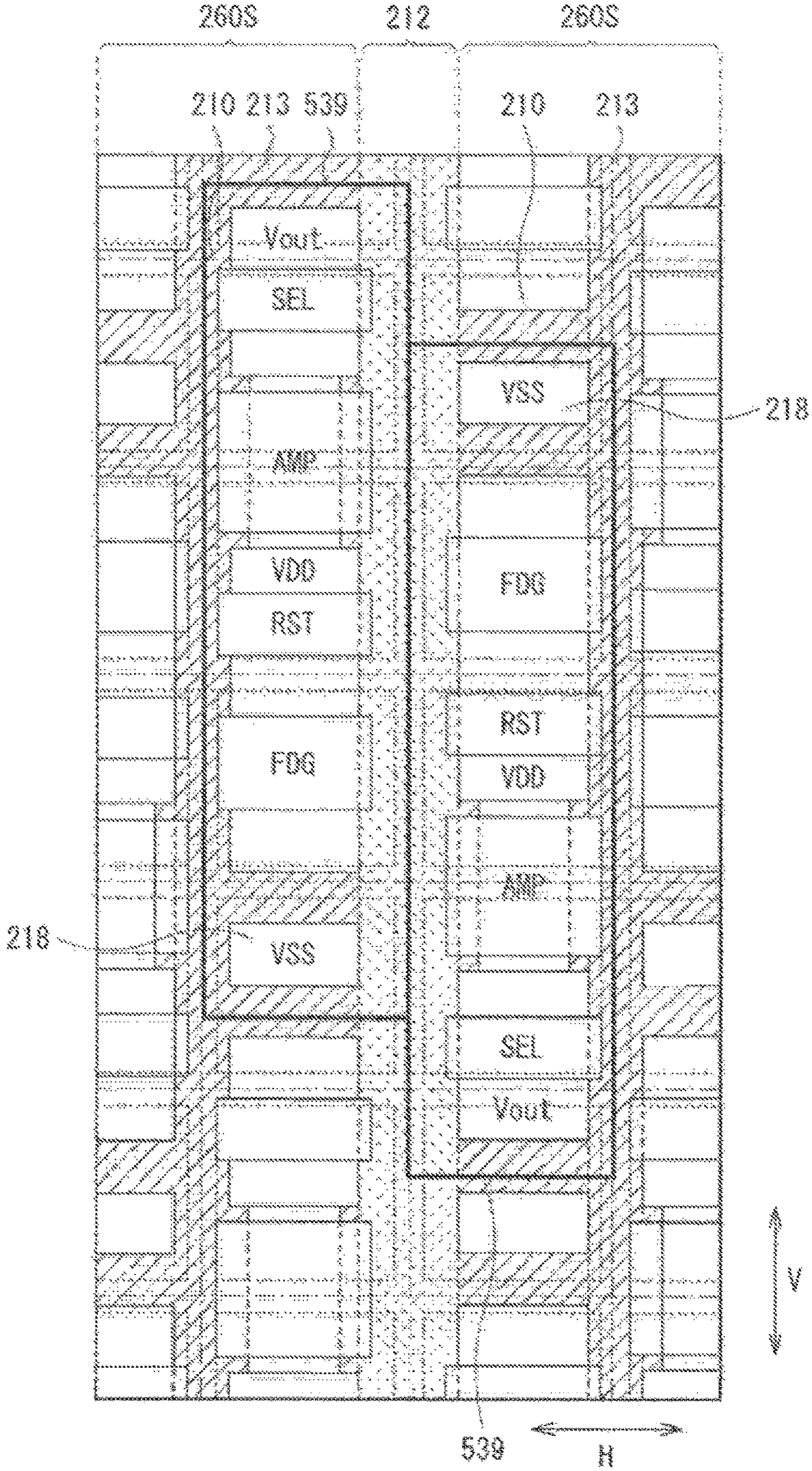
FIG. 52 is a schematic diagram illustrating an example of a planar configuration of a second substrate (semiconductor layer) depicted in FIG. 49.
Figure 53:
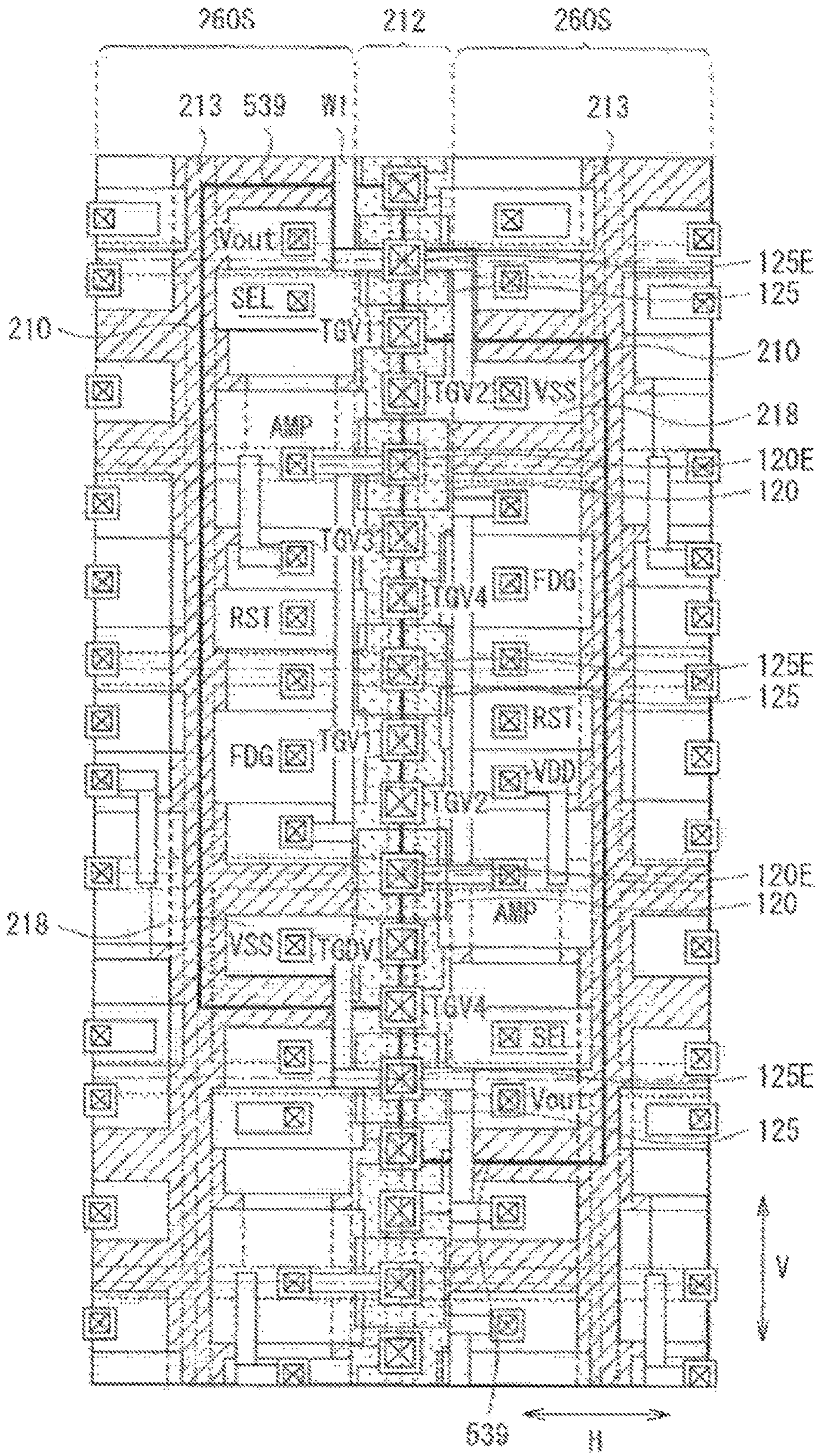
FIG. 53 is a schematic diagram illustrating an example of a planar configuration of main parts of pixel circuits and a first substrate along with a first interconnect layer depicted in FIG. 49.
Figure 54:
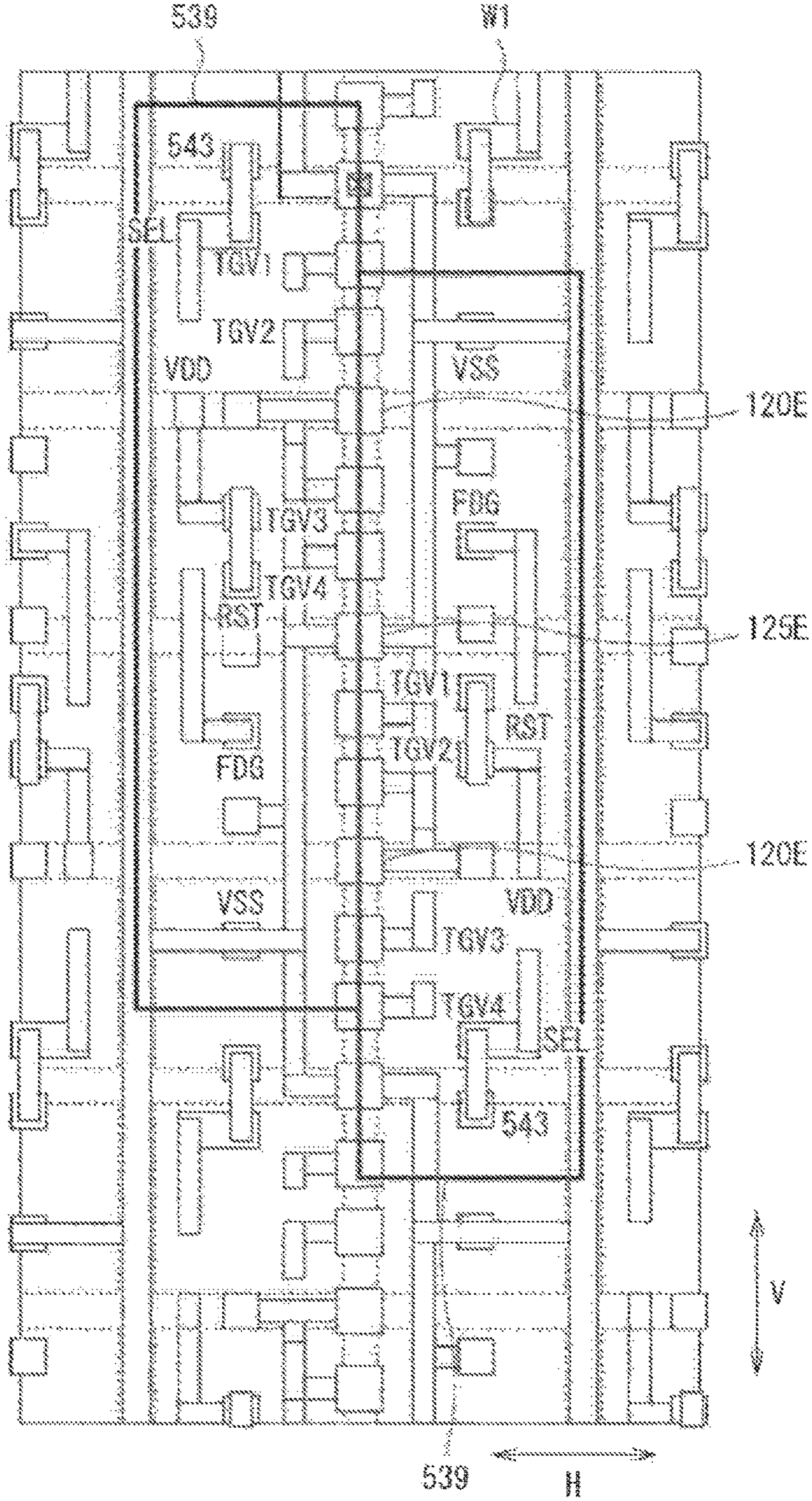
FIG. 54 is a schematic diagram illustrating an example of a planar configuration of a first interconnect layer and a second interconnect layer depicted in FIG. 49.
Figure 55:
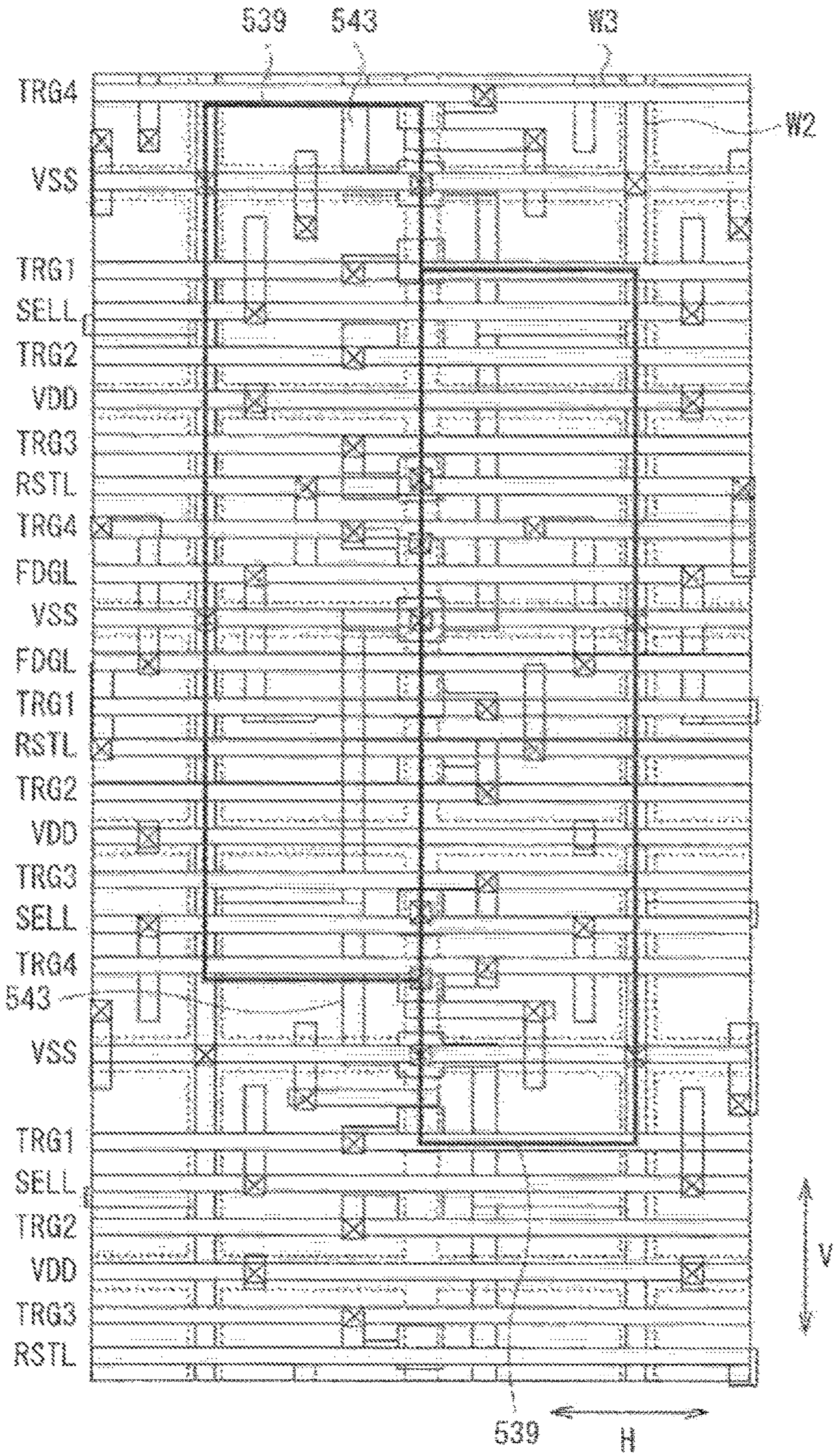
FIG. 55 is a schematic diagram illustrating an example of a planar configuration of a second interconnect layer and a third interconnect layer depicted in FIG. 49.
Figure 56:
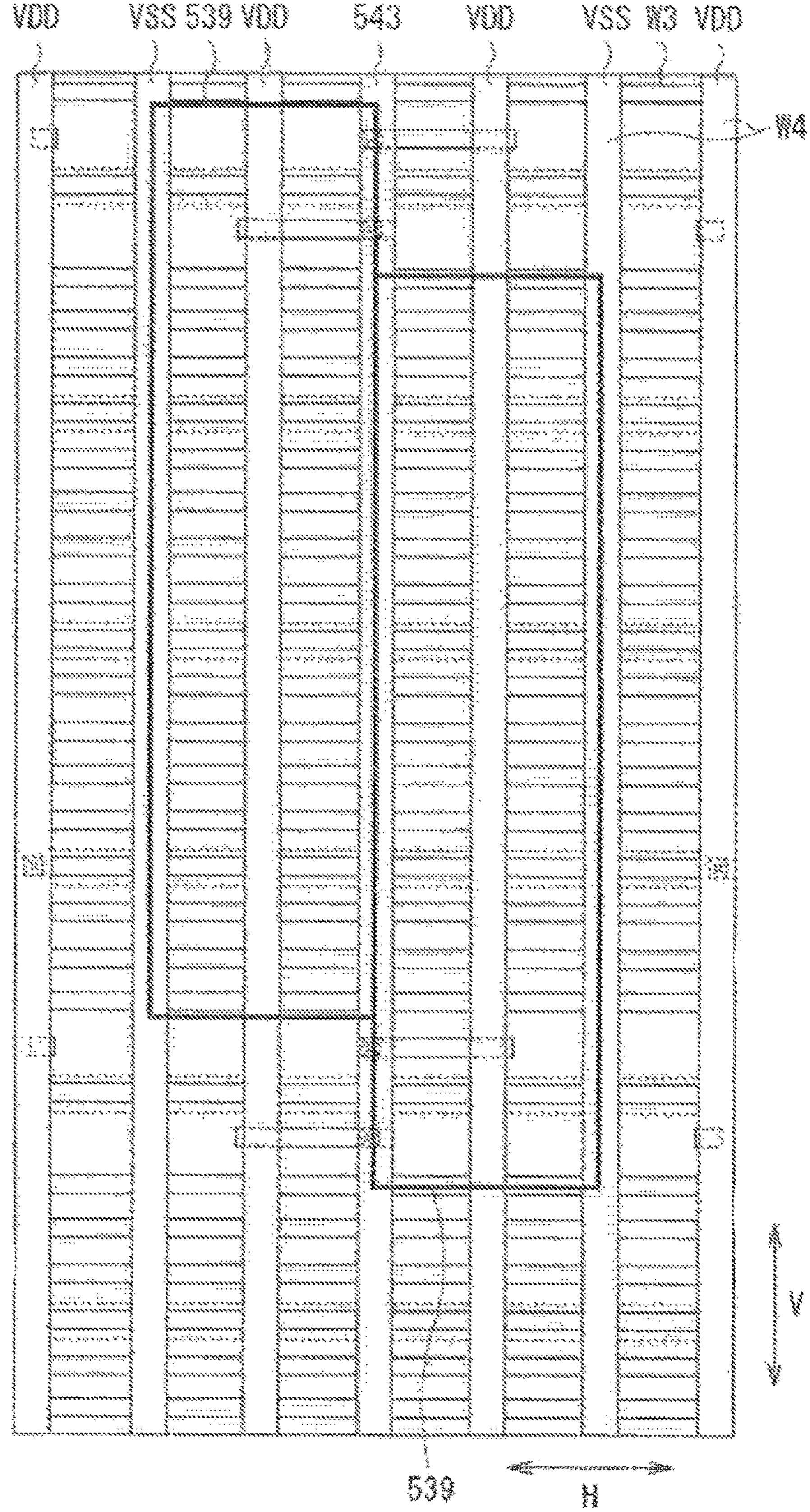
FIG. 56 is a schematic diagram illustrating an example of a planar configuration of a third interconnect layer and a fourth interconnect layer depicted in FIG. 49.

FIGS. 52 to 56 schematically illustrate an example of a planar configuration of the second substrate 260. FIG. 52 illustrates the configuration of the pixel circuit 210 provided in the vicinity of the front surface of the semiconductor layer 260S. FIG. 53 schematically illustrates the configuration of the interconnect layer 260T (specifically, a first interconnect layer W1 described below), the semiconductor layer 260S connected to the interconnect layer 260T, and each section of the first substrate 100. FIGS. 54 to 56 illustrate an example of a planar configuration of the interconnect layer 260T. The configuration of the second substrate 260 will be described below using FIGS. 52 to 56 along with FIG. 49. FIG. 52 and FIG. 53 illustrate the contour of the photodiode PD (boundary between the pixel isolation section 117 and the photodiode PD) by dashed lines, and illustrate, by dotted lines, the boundary between an element isolation region 213 or the insulating region 212 and a portion of the semiconductor layer 260S that overlaps the gate electrode of each transistor constituting the pixel circuit 210. Portions of the second substrate 260 that overlap the gate electrode of the amplifying transistor AMP are provided with, on one side of a channel width direction, the boundary between the semiconductor layer 260S and the element isolation region 213 and the boundary between the element isolation region 213 and the insulating region 212.

The second substrate 260 is provided with the insulating region 212 dividing the semiconductor layer 260S into pieces and the element isolation region 213 formed in a part of the semiconductor layer 260S in the thickness direction (FIG. 49). For example, in the insulating region 212 provided between the two pixel circuits 210 adjacent to each other in the H direction, the through electrodes 120E and 121E and through electrodes TGV (through electrodes TGV1, TGV2, TGV3, and TGV4) of the two pixel sharing units 539 connected to the two pixel circuits 210 are arranged (FIG. 53).

The insulating region 212 has approximately the same thickness as that of the semiconductor layer 260S (FIG. 49). The semiconductor layer 260S is divided into pieces by the insulating region 212. The through electrodes 120E and 121E and the through electrode TGV are arranged in the insulating region 212. The insulating region 212 includes, for example, silicon oxide.

The through electrodes 120E and 121E are provided to penetrate the insulating region 212 in the thickness direction. Upper ends of the through electrodes 120E and 121E are connected to interconnects in the interconnect layer 260T (a first interconnect W1, a second interconnect W2, a third interconnect W3, and a fourth interconnect W4 described below). The through electrodes 120E and 121E are provided to penetrate the insulating region 212, the junction film 124, the interlayer insulating film 123, and the passivation film 126, and are connected to the pad portions 120 and 121 at lower ends of the through electrodes 120E and 121E (FIG. 49). The through electrode 120E is intended to electrically connect the pad portion 120 and the pixel circuit 210. Specifically, the through electrode 120E electrically connects the floating diffusion FD of the first substrate 100 to the pixel circuit 210 of the second substrate 260. The through electrode 121E is intended to electrically connect the pad portion 121 and the reference potential line VSS in the interconnect layer 260T. Specifically, the through electrode 121E electrically connects the VSS contact region 118 of the first substrate 100 to the reference potential line VSS in the second substrate 260.

The through electrode TGV is provided to penetrate the insulating region 212 in the thickness direction. An upper end of the through electrode TGV is connected to an interconnect of the interconnect 260T. The through electrode TGV is provided to penetrate the insulating region 212, the junction film 124, the interlayer insulating film 123, the passivation film 126, and the interlayer insulating film 119 and is connected to the transfer gate TG at a lower end of the through electrode TGV (FIG. 49). The through electrode TGV as described above is intended to electrically connect the transfer gates TG (transfer gates TG1, TG2, TG3, and TG4) of the respective pixels 541A, 541B, 541C, and 541D to interconnects in the interconnect layer 260T (part of the row driving signal lines 542, specifically, interconnects TRG1, TRG2, TRG3, and TRG4 in FIG. 55 described below). Specifically, the through electrode TGV electrically connects the transfer gates TG of the first substrate 100 to the interconnects TRG of the second substrate 260 to transmit driving signals to the respective transfer transistors TR (transfer transistors TR1, TR2, TR3, and TR4).

The insulating region 212 is a region where the through electrodes 120E and 121E and the through electrode TGV for electrically connecting the first substrate 100 and the second substrate 260 are provided while being insulated from the semiconductor layer 260S. For example, in the insulating region 212 provided between the two pixel circuits 210 (sharing unit 539) adjacent to each other in the H direction, the through electrodes 120E and 121E and through electrodes TGV (through electrodes TGV1, TGV2, TGV3, and TGV4) connected to the two pixel circuits 210 are arranged. The insulating region 212 is provided, for example, to extend in the V direction (FIG. 52 and FIG. 53). In this regard, the arrangement of the horizontal portion TGb of the transfer gate TG is designed such that the H direction position of the through electrode TGV is closer to the H direction positions of the through electrodes 120E and 121E than the position of the vertical portion TGa (FIG. 50 and FIG. 53). For example, the through electrode TGV is disposed approximately at the same position as that of each of the through electrodes 120E and 121E in the H direction. This allows the through electrodes 120E and 121E and the through electrode TGV to be collectively provided in the insulating region 212 extending in the V direction. In another arrangement example, the horizontal portion TGb may be provided only in a region overlapping the vertical portion TGa. In this case, the through electrode TGV is formed substantially immediately above the vertical portion TGa, and, for example, the through electrode TGV is disposed approximately in the central portion of each pixel 541 in the H direction and the V direction. At this time, the H direction position of the through electrode TGV is significantly misaligned with the H direction position of each of the through electrodes 120E and 121E. For example, the insulating region 212 is provided around the through electrode TGV and the through electrodes 120E and 121E for electric insulation from the proximate semiconductor layer 260S. In a case where the H direction position of the through electrode TGV is significantly away from the H direction position of each of the through electrodes 120E and 121E, the insulating region 212 needs to be independently provided around each of the through electrodes 120E, 121E, and TGV. This divides the semiconductor layer 260S into smaller pieces. In contrast, the H direction dimension of the semiconductor layer 260S can be increased by the layout in which the through electrodes 120E and 121E and the through electrode TGV are collectively arranged in the insulating region 212 extending in the V direction. Thus, a large area can be provided for a semiconductor element formation region in the semiconductor layer 260S. This, for example, enables an increase in the size of the amplifying transistor AMP, allowing noise to be reduced.

As described with reference to FIG. 4, the pixel sharing unit 539 has a structure in which the pixel sharing unit 539 electrically connects the pieces of floating diffusion FD provided in the respective plurality of pixels 541, which share one pixel circuit 210. Further, the electric connection between the pieces of floating diffusion FD is made by the pad portion 120 provided in the first substrate 100 (FIG. 49 and FIG. 51). The electric connection portion (pad portion 120) provided in the first substrate 100 is electrically connected, via one through electrode 120E, to the pixel circuit 210 provided in the second substrate 260. In another structure example, the electric connection portion between the pieces of floating diffusion FD may be provided in the second substrate 260. In this case, the pixel sharing unit 539 is provided with four through electrodes connected to the respective pieces of floating diffusion FD1, FD2, FD3, and FD4. Accordingly, in the second substrate 260, more through electrodes penetrate the semiconductor layer 260S, enlarging the insulating region 212 insulating the peripheries of the through electrodes. In contrast, the structure with the pad portions 120 provided in the first substrate 100 (FIG. 49 and FIG. 51) enables a reduction in the number of through electrodes and in the size of the insulating region 212. Thus, a large area can be provided for the semiconductor element formation region in the semiconductor layer 260S. This enables, for example, an increase in the size of the amplifying transistor AMP, allowing possible noise to be reduced.

The element isolation region 213 is provided on the front side of the semiconductor layer 260S. The element isolation region 213 has an STI (Shallow Trench Isolation) structure. In the element isolation region 213, the semiconductor layer 260S is dug in the thickness direction (perpendicular to the principal surface of the second substrate 260), and an insulating film is embedded in the dug portion. The insulating film includes, for example, silicon oxide. The element isolation region 213 isolates the plurality of transistors constituting the pixel circuit 210 from one another, as elements, according to the layout of the pixel circuit 210. Below the element isolation region 213 (in a deep portion of the semiconductor layer 260S), the semiconductor layer 260S (specifically, the well region 211) extends.

Now, with reference to FIG. 50, FIG. 51, and FIG. 52, description will be given of a difference in external shape (external shape in the substrate plane direction) between the pixel sharing unit 539 in the first substrate 100 and the pixel sharing unit 539 in the second substrate 260.

In the imaging apparatus 1, the pixel sharing unit 539 is provided to span both the first substrate 100 and the second substrate 260. For example, the pixel sharing unit 539 provided in the first substrate 100 differs, in external shape, from the pixel sharing unit 539 provided in the second substrate 260.

In FIG. 50 and FIG. 51, contour lines of the pixels 541A, 541B, 541C, and 541D are illustrated by alternate long and short dash lines, and the external shape of the pixel sharing unit 539 is illustrated by thick lines. For example, the pixel sharing unit 539 of the first substrate 100 includes two pixels 541 (pixels 541A and 541B) disposed adjacent to each other in the H direction and two pixels 541 (pixels 541C and 541D) disposed adjacent to the pixels 541A and 541B in the V direction. Specifically, the pixel sharing unit 539 of the first substrate 100 includes the four pixels 541 in two adjacent rows and two adjacent columns, and has a generally square external shape. In the pixel array section 540, such pixel sharing units 539 are arranged adjacent to one another at a pitch of two pixels (pitch corresponding to two pixels 541) in the H direction and at a pitch of two pixels (pitch corresponding to two pixels 541) in the V direction.

In FIG. 52 and FIG. 53, the contour lines of the pixels 541A, 541B, 541C, and 541D are illustrated by alternate long and short dash lines, and the external shape of the pixel sharing unit 539 is illustrated by thick lines. For example, the external shape of the pixel sharing unit 539 of the second substrate 260 is smaller in the H direction but larger in the V direction than the external shape of the pixel sharing unit 539 of the first substrate 100. For example, the pixel sharing unit 539 of the second substrate 260 is formed in a size (region) corresponding to one pixel in the H direction and to four pixels in the V direction. Specifically, the pixel sharing unit 539 of the second substrate 260 is formed in a size corresponding to pixels arranged in one adjacent row and four adjacent columns, and has a generally rectangular external shape.

For example, each pixel circuit 210 includes the select transistor SEL, the amplifying transistor AMP, the reset transistor RST, and the FD conversion gain switching transistor FDG arranged in juxtaposition in this order in the V direction (FIG. 52). When each pixel circuit 210 has a generally rectangular external shape as described above, the four transistors (select transistor SEL, amplifying transistor AMP, reset transistor RST, and FD conversion gain switching transistor FDG) can be arranged in juxtaposition in one direction (in FIG. 52, the V direction). This allows the drain of the amplifying transistor AMP and the drain of the reset transistor RST to be shared in one diffusion region (diffusion region connected to the power supply line VDD). For example, a generally square formation region can be provided for each pixel circuit 210 (see FIG. 65 described below). In this case, two transistors are disposed along one direction, leading to difficulty in sharing the drain of the amplifying transistor AMP and the drain of the reset transistor RST in one diffusion region. Thus, by providing a generally rectangular formation region for the pixel circuit 210, the four transistors can easily be arranged in proximity to one another, allowing the formation region for the pixel circuit 210 to be made smaller. In other words, the pixels can be miniaturized. Additionally, when the formation region for the pixel circuit 210 need not be made smaller, the formation region for the amplifying transistor AMP can be enlarged to reduce noise.

For example, in addition to the select transistor SEL, the amplifying transistor AMP, the reset transistor RST, and the FD conversion gain switching transistor FDG, a VSS contact region 218 connected to the reference potential line VSS is provided in the vicinity of the front surface of the semiconductor layer 260S. The VSS contact region 218 includes, for example, a p-type semiconductor region. The VSS contact region 218 is electrically connected to the VSS contact region 118 of the first substrate 100 (semiconductor layer 100S) via the interconnect in the interconnect layer 260T and the through electrode 121E. The VSS contact region 218 is, for example, provided at a position adjacent to the source of the FD conversion gain switching transistor FDG across the element isolation region 213 (FIG. 52).

Now, with reference to FIG. 51 and FIG. 52, description will be given of a positional relation between the pixel sharing unit 539 provided in the first substrate 100 and the pixel sharing unit 539 provided in the second substrate 260. For example, one of the two pixel sharing units 539 (for example, the upper pixel sharing unit 539 in the page of FIG. 51) of the first substrate 100 arranged in juxtaposition in the V direction is connected to one of the two pixel sharing units 539 (for example, the left pixel sharing unit 539 in the page of FIG. 52) of the second substrate 260 arranged in juxtaposition in the H direction. For example, one of the two pixel sharing units 539 (for example, the lower pixel sharing unit 539 in the page of FIG. 51) of the first substrate 100 arranged in juxtaposition in the V direction is connected to one of the two pixel sharing units 539 (for example, the right pixel sharing unit 539 in the page of FIG. 52) of the second substrate 260 arranged in juxtaposition in the H direction.

For example, for the two pixel sharing units 539 of the second substrate 260 arranged in juxtaposition in the H direction, the internal layout (arrangement of transistors and the like) of one of the pixel sharing units 539 is approximately equal to the internal layout of the other pixel sharing unit 539 inverted in the V direction and the H direction. The effects of the layout will be described below.

In the two pixel sharing units 539 of the first substrate 100 arranged in juxtaposition in the V direction, each pad portion 120 is disposed in the central portion of the external shape of the pixel sharing unit 539, that is, in the central portion of the pixel sharing unit 539 in the V direction and the H direction (FIG. 51). On the other hand, the pixel sharing unit 539 of the second substrate 260 has a generally rectangular external shape that is long in the V direction, and thus, for example, the amplifying transistor AMP connected to the pad portion 120 is disposed at a position misaligned upward, in the page of the figure, with respect to the center of the pixel sharing unit 539 in the V direction. For example, when the two pixel sharing units 539 of the second substrate 260 arranged in juxtaposition in the H direction have the same internal layout, the distance between the amplifying transistor AMP of one of the pixel sharing units 539 and the pad portion 120 (for example, the pad portion 120 of the upper pixel sharing unit 539 in the page of FIG. 7) is relatively short. However, the distance between the amplifying transistor AMP of the other pixel sharing units 539 and the pad portion 120 (for example, the pad portion 120 of the lower pixel sharing unit 539 in the page of FIG. 7) is long. This increases the area of interconnects required to connect the amplifying transistor AMP and the pad portion 120, and the increased area may complicate the interconnect layout of the pixel sharing unit 539. This may in turn affect the miniaturization of the imaging apparatus 1.

In contrast, in a case where the internal layout of one of the two pixel sharing units 539 of the second substrate 260 arranged in juxtaposition in the H direction is inverted with respect to the internal layout of the other pixel sharing unit 539 at least in the V direction, the distance between the amplifying transistor AMP and the pad portion 120 can be reduced in both pixel sharing units 539. Thus, this configuration facilitates miniaturization of the imaging apparatus 1 compared to the configuration in which the two pixel sharing units 539 of the second substrate 260 arranged in juxtaposition in the H direction have the same layout. Note that the planar layout of each of the pixel sharing units 539 in the second substrate 260 is laterally symmetric to the extent illustrated in FIG. 52 but the planar layout including the layout of the first interconnect layer W1 illustrated in FIG. 53 described below is laterally asymmetric.

Additionally, preferably, the internal layout of one of the two pixel sharing units 539 of the second substrate 260 arranged in juxtaposition in the H direction is also inverted with respect to the internal layout of the other pixel sharing unit 539 in the H direction. The reason for this will be explained below. As depicted in FIG. 53, the two pixel sharing units 539 of the second substrate 260 arranged in juxtaposition in the H direction are respectively connected to the pad portions 120 and 121 of the first substrate 100. For example, the pad portions 120 and 121 are disposed in the central portion, in the H direction, of the two pixel sharing unit 539 of the second substrate 260 arranged in juxtaposition in the H direction (disposed between the two pixel sharing units 539 arranged in juxtaposition in the H direction). Thus, in a case where the internal layout of one of the two pixel sharing units 539 of the second substrate 260 arranged in juxtaposition in the H direction is also inverted with respect to the internal layout of the other pixel sharing unit 539 in the H direction, the distance between each of the plurality of pixel sharing units 539 of the second substrate 260 and each of the pad portions 120 and 121 can be reduced. In other words, miniaturization of the imaging apparatus 1 is further facilitated.

Additionally, the contour lines of the pixel sharing unit 539 of the second substrate 260 need not be aligned with any of the contour lines of the pixel sharing unit 539 of the first substrate 100. For example, one (for example, an upper contour line in the page of FIG. 53) of the V direction contour lines of one of the two pixel sharing units 539 of the second substrate 260 arranged in juxtaposition in the H direction (for example, the left pixel sharing unit 539 in the page of FIG. 53) is disposed outside a corresponding one (for example, an upper contour line in the page of FIG. 51) of the V direction contour lines of the pixel sharing unit 539 of the first substrate 100. Additionally, the other (for example, a lower contour line in the page of FIG. 53) of the V direction contour lines of the other of the two pixel sharing units 539 of the second substrate 260 arranged in juxtaposition in the H direction (for example, the right pixel sharing unit 539 in the page of FIG. 53) is disposed outside the corresponding other (for example, a lower contour line in the page of FIG. 51) of the V direction contour lines of the pixel sharing unit 539 of the first substrate 100. By thus disposing the pixel sharing unit 539 of the second substrate 260 and the pixel sharing unit 539 of the first substrate 100 with respect to each other, the distance between the amplifying transistor AMP and the pad portion 120 can be reduced. Consequently, the miniaturization of the imaging apparatus 1 is facilitated.

Additionally, the contour lines of the plurality of pixel sharing units 539 of the second substrate 260 need not be aligned with one another. For example, the V direction contour lines of the two pixel sharing units 539 of the second substrate 260 arranged in juxtaposition in the H direction are misaligned with each other. This enables a reduction in the distance between the amplifying transistor AMP and the pad portion 120. Accordingly, miniaturization of the imaging apparatus 1 is facilitated.

With reference to FIG. 51 and FIG. 53, repeated arrangement of the pixel sharing unit 539 in the pixel array section 540 will be described. The pixel sharing unit 539 of the first substrate 100 has a dimension corresponding to two pixels 541 in the H direction and a dimension corresponding to two pixels 541 in the V direction (FIG. 51). For example, in the pixel array section 540 of the first substrate 100, pixel sharing units 539 each having a dimension corresponding to the four pixels 541 described above are repeatedly arranged adjacent to one another at a pitch of two pixels (pitch corresponding to two pixels 541) in the H direction and at a pitch of two pixels (pitch corresponding to two pixels 541) in the V direction. Alternatively, in the pixel array section 540 of the first substrate 100, a pair of pixel sharing units 539 that includes two pixel sharing units 539 disposed adjacent to each other in the V direction may be provided. In the pixel array section 540 of the first substrate 100, for example, pairs of pixel sharing units 539 are repeatedly arranged adjacent to one another at a pitch of two pixels (pitch corresponding to two pixels 541) in the H direction and at a pitch of four pixels (pitch corresponding to four pixels 541) in the V direction. The pixel sharing unit 539 of the second substrate 260 has a dimension corresponding to one pixel 541 in the H direction and a dimension corresponding to four pixels 541 in the V direction (FIG. 53). For example, the pixel array section 540 of the second substrate 260 is provided with a pair of pixel sharing units 539 including two pixel sharing units 539 having a dimension corresponding to the four pixels 541 described above. Such pixel sharing units 539 are arranged adjacent to one another in the H direction but misaligned with one another in the V direction. In the pixel array section 540 of the second substrate 260, for example, pairs of pixel sharing units 539 are repeatedly arranged adjacent to one another with no gap at a pitch of two pixels (pitch corresponding to two pixels 541) in the H direction and at a pitch of four pixels (pitch corresponding to four pixels 541) in the V direction. Repeated arrangement of such pixel sharing units 539 enables the pixel sharing units 539 to be arranged with no gap. Accordingly, miniaturization of the imaging apparatus 1 is facilitated.

The amplifying transistor AMP preferably has, for example, a three-dimensional structure such as a Fin structure (FIG. 49). This increases the magnitude of an effective gate width, enabling possible noise to be reduced. The select transistor SEL, the reset transistor RST, and the FD conversion gain switching transistor FDG each have, for example, a planar structure. The amplifying transistor AMP may have a planar structure. Alternatively, the select transistor SEL, the reset transistor RST, and the FD conversion gain switching transistor FDG may have a three-dimensional structure.

The interconnect layer 260T includes, for example, a passivation film 221, an interlayer insulating film 222, and a plurality of interconnects (first interconnect layer W1, second interconnect layer W2, third interconnect layer W3, and fourth interconnect layer W4). The passivation film 221, for example, contacts the front surface of the semiconductor layer 260S and covers the entire front surface of the semiconductor layer 260S. The passivation film 221 covers the gate electrode of each of the select transistor SEL, the amplifying transistor AMP, the reset transistor RST, and the FD conversion gain switching transistor FDG. The interlayer insulating film 222 is provided between the passivation film 221 and the third substrate 300. The interlayer insulating film 222 separates the plurality of interconnects (first interconnect layer W1, second interconnect layer W2, third interconnect layer W3, and fourth interconnect layer W4) from one another. The interlayer insulating film 222 includes, for example, silicon oxide.

The interconnect layer 260T is, for example, provided with the first interconnect layer W1, the second interconnect layer W2, the third interconnect layer W3, the fourth interconnect layer W4, and the contact portions 261 and 261 in this order from the semiconductor layer 260S side, and the above components are insulated from one another by the interlayer insulating film 222. The interlayer insulating film 222 is provided with a plurality of connection portions connecting the first interconnect layer W1, the second interconnect layer W2, the third interconnect layer W3, or the fourth interconnect layer W4 to a lower layer of the interconnect layer. The connection portion includes a connection hole which is provided in the interlayer insulating film 222 and in which a conductive material is embedded. For example, the interlayer insulating film 222 is provided with a connection portion 218V connecting the first interconnect layer W1 and the VSS contact region 218 of the semiconductor layer 260S. For example, the connection portion connecting elements of the second substrate 260 has a pore diameter different from the pore diameter of each of the through electrodes 120E and 121E and the through electrode TGV. Specifically, the connection hole connecting elements of the second substrate 260 preferably has a smaller pore diameter than each of the through electrodes 120E and 121E and the through electrode TGV. The reason for this will be explained below. The connection portions provided in the interconnect layer 260T (connection portion 218V and the like) have a smaller depth than the through electrodes 120E and 121E and the through electrode TGV. Thus, a conductive material can be embedded in the connection hole of the connection portion more easily than in the through electrodes 120E and 121E and the through electrode TGV. By making the pore diameter of the connection portion smaller than the pore diameter of each of the through electrodes 120E and 121E and the through electrode TGV, miniaturization of the imaging apparatus 1 is facilitated.

For example, the first interconnect layer W1 connects the through electrode 120E to the gate of the amplifying transistor AMP and the source of the FD conversion gain switching transistor FDG (specifically, the connection hole reaching the source of the FD conversion gain switching transistor FDG). The first interconnect layer W1, for example, connects the through electrode 121E and the connection portion 218V, thus electrically connecting the VSS contact region 218 of the semiconductor layer 260S to the VSS contact region 118 of the semiconductor layer 100S.

Now, a planar configuration of the interconnect layer 260T will be described using FIGS. 54 to 56. FIG. 54 illustrates an example of a planar configuration of the first interconnect layer W1 and the second interconnect layer W2. FIG. 55 illustrates an example of a planar configuration of the second interconnect layer W2 and the third interconnect layer W3. FIG. 56 illustrates an example of a planar configuration of the third interconnect layer W3 and the fourth interconnect layer W4.

Figure 47:
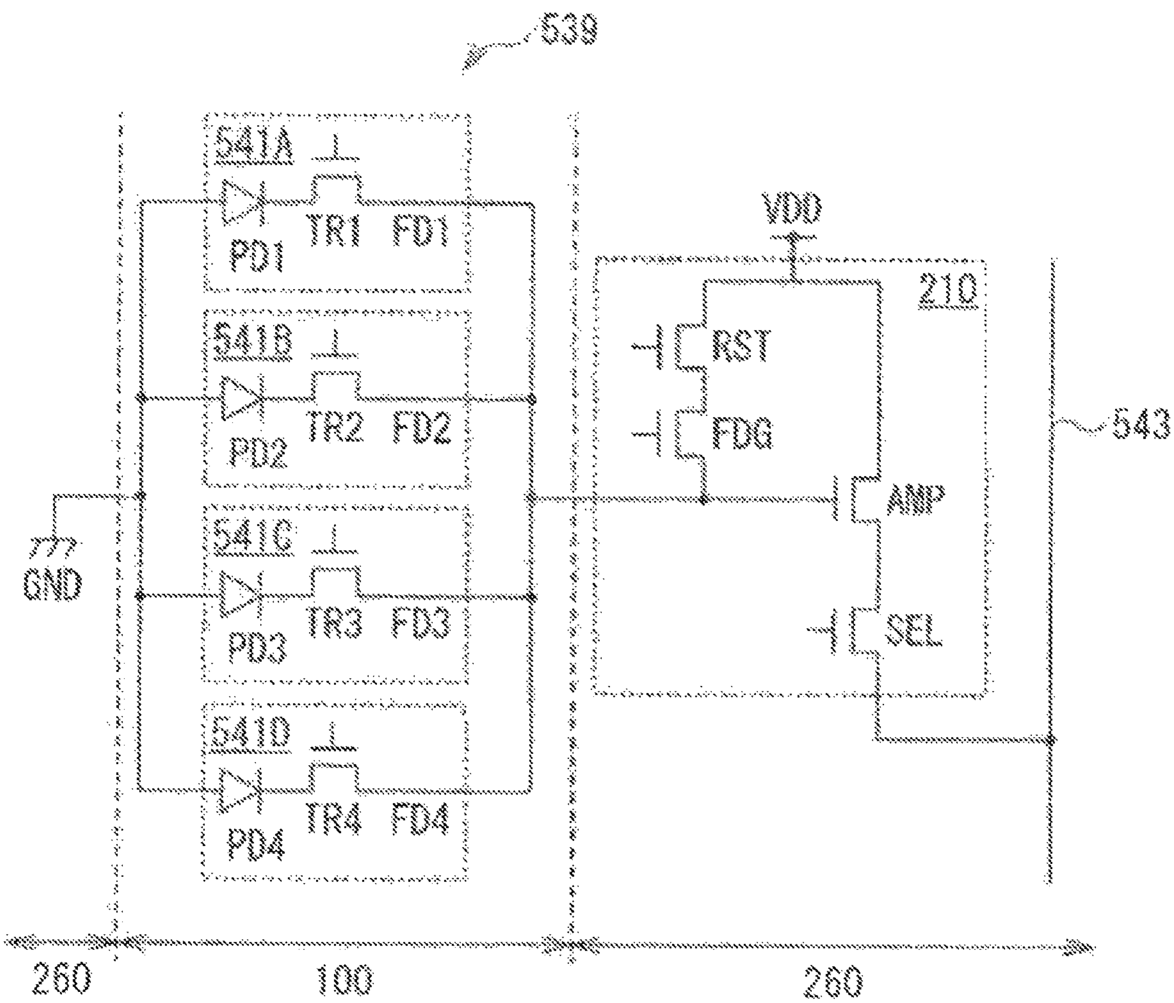
FIG. 47 is an equivalent circuit diagram of a pixel sharing unit depicted in FIG. 44.

For example, the third interconnect layer W3 includes interconnects TRG1, TRG2, TRG3, TRG4, SELL, RSTL, and FDGL extending in the H direction (row direction) (FIG. 55). The interconnects correspond to a plurality of row driving signal lines 542 described with reference to FIG. 47. The interconnects TRG1, TRG2, TRG3, and TRG4 are intended to respectively transmit driving signals to the transfer gates TG1, TG2, TG3, and TG4. The interconnects TRG1, TRG2, TRG3, and TRG4 are respectively connected to the transfer gates TG1, TG2, TG3, and TG4 via the second interconnect layer W2, the first interconnect layer W1, and the through electrode 120E. The interconnect SELL is intended to transmit a driving signal to the gate of the select transistor SEL, the interconnect RSTL is intended to transmit a driving signal to the gate of the reset transistor RST, and the interconnect FDGL is intended to transmit a driving signal to the gate of the FD conversion gain switching transistor FDG. The interconnects SELL, RSTL, and FDGL are respectively connected to the gates of the select transistor SEL, the reset transistor RST, and the FD conversion gain switching transistor FDG via the second interconnect layer W2, the first interconnect layer W1, and the connection portion.

For example, the fourth interconnect layer W4 includes the power supply line VDD, the reference potential line VSS, and the vertical signal line 543 extending in the V direction (column direction) (FIG. 56). The power supply line VDD is connected to the drain of the amplifying transistor AMP and the drain of the reset transistor RST via the third interconnect layer W3, the second interconnect layer W2, the first interconnect layer W1, and the connection portion. The reference potential line VSS is connected to the VSS contact region 218 via the third interconnect layer W3, the second interconnect layer W2, the first interconnect layer W1, and the connection portion 218V. Additionally, the reference potential line VSS is connected to the VSS contact region 118 of the first substrate 100 via the third interconnect layer W3, the second interconnect layer W2, the first interconnect layer W1, the through electrode 121E, and the pad portion 121. The vertical signal line 543 is connected to the source (Vout) of the select transistor SEL via the third interconnect layer W3, the second interconnect layer W2, the first interconnect layer W1, and the connection portion.

The contact portions 261 and 262 may be provided, in plan view, at a position where the contact portions 261 and 262 overlap the pixel array section 540 (for example, FIG. 46) or in a peripheral portion 540B outside the pixel array section 540 (for example, FIG. 49). The contact portions 261 and 262 are provided on the front surface (interconnect layer 260T-side surface) of the second substrate 260. The contact portions 261 and 262 include, for example, metal such as Cu (copper) and Al (aluminum). The contact portions 261 and 262 are exposed on the front surface (third substrate 300-side surface) of the interconnect layer 260T. The contact portions 261 and 262 are used to electrically connect the second substrate 260 and the third substrate 300 and to laminate the second substrate 260 to the third substrate 300.

FIG. 49 illustrates an example in which a peripheral circuit is provided in the peripheral portion 540B of the second substrate 260. The peripheral circuit may include a part of the row driving section 520, a part of the column signal processing section 550, or the like. Alternatively, as illustrated in FIG. 46, with no peripheral circuit disposed in the peripheral portion 540B of the second substrate 260, the connection hole portions H1 and H2 may be disposed in the vicinity of the pixel array section 540.

The third substrate 300 includes, for example, the interconnect layer 300T and the semiconductor layer 300S in this order from the second substrate 260 side. For example, the front surface of the semiconductor layer 300S is provided on the second substrate 260 side. The semiconductor layer 300S includes a silicon substrate. A circuit is provided in a front side portion of the semiconductor layer 300S. Specifically, the front side portion of the semiconductor layer 300S is provided with at least some of, for example, the input section 510A, the row driving section 520, the timing control section 530, the column signal processing section 550, the image signal processing section 560, and the output section 510B. The interconnect layer 300T provided between the semiconductor layer 300S and the second substrate 260 includes, for example, an interlayer insulating film, a plurality of interconnect layers separated from one another by the interlayer insulating film, and the contact portions 305 and 302. The contact portions 305 and 302 are exposed on the front surface of the interconnect layer 300T (second substrate 260-side surface), the contact portion 305 is in contact with the contact portion 261 of the second substrate 260, and the contact portion 302 is in contact with the contact portion 262 of the second substrate 260. The contact portions 305 and 302 are electrically connected to a circuit formed in the semiconductor layer 300S (for example, at least one of the input section 510A, the row driving section 520, the timing control section 530, the column signal processing section 550, the image signal processing section 560, or the output section 510B). The contact portions 305 and 302 include any of, for example, metal such as Cu (copper) and aluminum (Al). For example, an external terminal TA is connected to the input section 510A via the connection hole portion H1, and an external terminal TB is connected to the output section 510B via the connection hole portion H2.

Now, features of the imaging apparatus 1 will be described.

Normally, an imaging apparatus includes a photodiode and a pixel circuit as main components. In this regard, an increased area of the photodiode increases the amount of charge resulting from photoelectric conversion, resulting in an improved signal/noise ratio (S/N ratio) of pixel signals. This allows the imaging apparatus to output better image data (image information). On the other hand, an increased size of the transistor included in the pixel circuit (particularly, the size of the amplifying transistor) reduces possible noise in the pixel circuit, resulting in an improved S/N ratio of pixel signals. This allows the imaging apparatus to output better image data (image information).

However, in an imaging apparatus in which a photodiode and a pixel circuit are provided in the same semiconductor substrate, an increase in the area of the photodiode within the limited area of the semiconductor substrate may reduce the size of a transistor included in the pixel circuit. Additionally, an increase in the size of the transistor included in the pixel circuit may reduce the area of the photodiode.

To solve these problems, for example, the imaging apparatus 1 of the present embodiment uses a structure in which a plurality of pixels 541 share one pixel circuit 210 and in which the shared pixel circuit 210 is disposed overlapping the photodiode PD. This allows maximization of the area of the photodiode PD within the limited area of the semiconductor substrate and maximization of the size of the transistor included in the pixel circuit 210. Thus, the S/N ratio of the pixel signal can be improved, and the imaging apparatus 1 can output better image data (image information).

When a structure in which a plurality of pixels 541 share one pixel circuit 210 and in which the pixel circuit 210 is disposed overlapping the photodiode PD is achieved, a plurality of interconnects connected to the pixel circuit 210 extend from the pieces of floating diffusion FD of the respective plurality of pixels 541. To ensure a large area for the semiconductor substrate 260 forming the pixel circuit 210, for example, the plurality of extending interconnects can be connected together and formed into one integrated connection interconnect. For the plurality of interconnects extending from the VSS contact region 118 as well, the plurality of extending interconnects can be connected together and formed into one integrated connection interconnect.

For example, in a case where a connection interconnect is formed in the semiconductor substrate 260 forming the pixel circuit 210, the connection interconnect connecting and integrating together a plurality of interconnects extending from the pieces of floating diffusion FD of the respective plurality of pixels 541, the area in which the transistor included in the pixel circuit 210 is formed may be reduced. Similarly, in a case where a connection interconnect is formed in the semiconductor substrate 260 forming the pixel circuit 210, the connection interconnect connecting and integrating together, into one interconnect, a plurality of interconnects extending from the VSS contact regions 118 of the respective plurality of pixels 541, the area in which the transistor included in the pixel circuit 210 is formed may be reduced.

To solve these problems, for example, the imaging apparatus 1 of the present embodiment has a structure in which the plurality of pixels 541 share the one pixel circuit 210 and the shared pixel circuit 210 is disposed overlapping the photodiode PD and in which the first substrate 100 is provided with a connection interconnect connecting and integrating together the pieces of floating diffusion FD of the respective plurality of pixels 541 into one piece of floating diffusion FD and a connection interconnect connecting and integrating together the VSS contact regions 118 included in the respective plurality of pixels 541 into one VSS contact region 118.

In this regard, when the second manufacturing method described above is used as a manufacturing method for providing the first substrate 100 with the connection interconnect connecting and integrating together the pieces of floating diffusion FD of the respective plurality of pixels 541 into one piece of floating diffusion FD and the connection interconnect connecting and integrating together the VSS contact regions 118 included in the respective plurality of pixels 541 into one VSS contact region 118, for example, appropriate processes corresponding to the configurations of the first substrate 100 and the second substrate 260 can be used for manufacturing. Then, an imaging apparatus with high quality and high performance can be manufactured. Additionally, an easy process can be used to form a connection interconnect for the first substrate 100 and the second substrate 260. Specifically, in a case where the above-described second manufacturing method is used, an electrode connected to the floating diffusion FD and an electrode connected to the VSS contact region 118 are respectively provided on the front surface of the first substrate 100 and the front surface of the second substrate 260 constituting a lamination interface between the first substrate 100 and the second substrate 260. Further, when the first substrate 100 and the second substrate 260 are laminated, misalignment may occur between the electrodes provided on the two substrate front surfaces, and in such a case, to allow the electrodes formed on the two substrate front surfaces to come into contact with each other in spite of the misalignment, the electrodes formed on the two substrate front surfaces are preferably enlarged. This may lead to difficulty in disposing the electrode in the limited area of each pixel included in the imaging apparatus 1.

To eliminate the disadvantageous need for large electrodes at the lamination interface between the first substrate 100 and the second substrate 260, for example, the imaging apparatus 1 of the present embodiment can use the first manufacturing method described above as a manufacturing method in which the plurality of pixels 541 share the one pixel circuit 210 and in which the shared pixel circuit 210 is disposed overlapping the photodiode PD. This facilitates alignment between the elements formed in the first substrate 100 and the elements formed in the second substrate 260, allowing manufacturing of an imaging apparatus with high quality and high performance. Further, a specific structure that results from the use of this manufacturing method can be provided. Specifically, provided is a structure in which the semiconductor layer 100S and interconnect layer 100T of the first substrate 100 and the semiconductor layer 260S and interconnect layer 260T of the second substrate 260 are laminated in this order, in other words, provided is a structure in which the first substrate 100 and the second substrate 260 are laminated face-to-back. Furthermore, provided are the through electrodes 120E and 121E are extend from the front side of the semiconductor layer 260S of the second substrate 260 through the semiconductor layer 260S and the interconnect layer 100T of the first substrate 100 to the front surface of the semiconductor layer 100S of the first substrate 100.

In regard to the structure in which the first substrate 100 is provided with the connection interconnect connecting and integrating together the pieces of floating diffusion FD of the respective plurality of pixels 541 into one piece of floating diffusion FD and the connection interconnect connecting and integrating together the VSS contact regions 118 included in the respective plurality of pixels 541 into one VSS contact region 118, when this structure and the second substrate 260 are laminated using the first manufacturing method and the pixel circuit 210 is formed in the second substrate 260, heat treatment required during formation of active elements included in the pixel circuit 210 may adversely affect the connection interconnect formed in the first substrate 100.

Thus, to solve the problem of adverse effects of heat treatment on the connection interconnect during formation of the active elements, the imaging apparatus 1 of the present embodiment is desirably configured such that a conductive material with high heat resistance is used for the connection interconnect connecting and integrating together the pieces of floating diffusion FD of the respective plurality of pixels 541 into one piece of floating diffusion FD and the connection interconnect connecting and integrating together the VSS contact regions 118 included in the respective plurality of pixels 541 into one VSS contact region 118. Specifically, as the conductive material with high heat resistance, a material that has a higher melting point than at least a part of an interconnect material included in the interconnect layer 260T of the second substrate 260 can be used.

As described above, for example, the imaging apparatus 1 of the present embodiment includes (1) the structure in which the first substrate 100 and the second substrate 260 are laminated face-to-back (specifically, the semiconductor layer 100S and interconnect layer 100T of the first substrate 100 and the semiconductor layer 260S and interconnect layer 260T of the second substrate 260 are laminated in this order), (2) the structure in which through electrodes 120E and 125E that extend from the front side of the semiconductor layer 260S of the second substrate 260 through the semiconductor layer 260S and the interconnect layer 100T of the first substrate 100 to the front surface of the semiconductor layer 100S of the first substrate 100 are provided, and (3) the structure in which the conductive material with high heat resistance is used to form the connection interconnect connecting and integrating together the pieces of floating diffusion FD included in the respective plurality of pixels 541 into one piece of floating diffusion FD and the connection interconnect connecting and integrating together the VSS contact regions 118 included in the respective plurality of pixels 541 into one VSS contact region 118. This enables provision of the first substrate 100 with the connection interconnect connecting and integrating together the pieces of floating diffusion FD included in the respective plurality of pixels 541 into one piece of floating diffusion FD and the connection interconnect connecting and integrating together the VSS contact regions 118 included in the respective plurality of pixels 541 into one VSS contact region 118, with no large electrode provided at the interface between the first substrate 100 and the second substrate 260.

[Operation of Imaging Apparatus 1]

Figure 57:
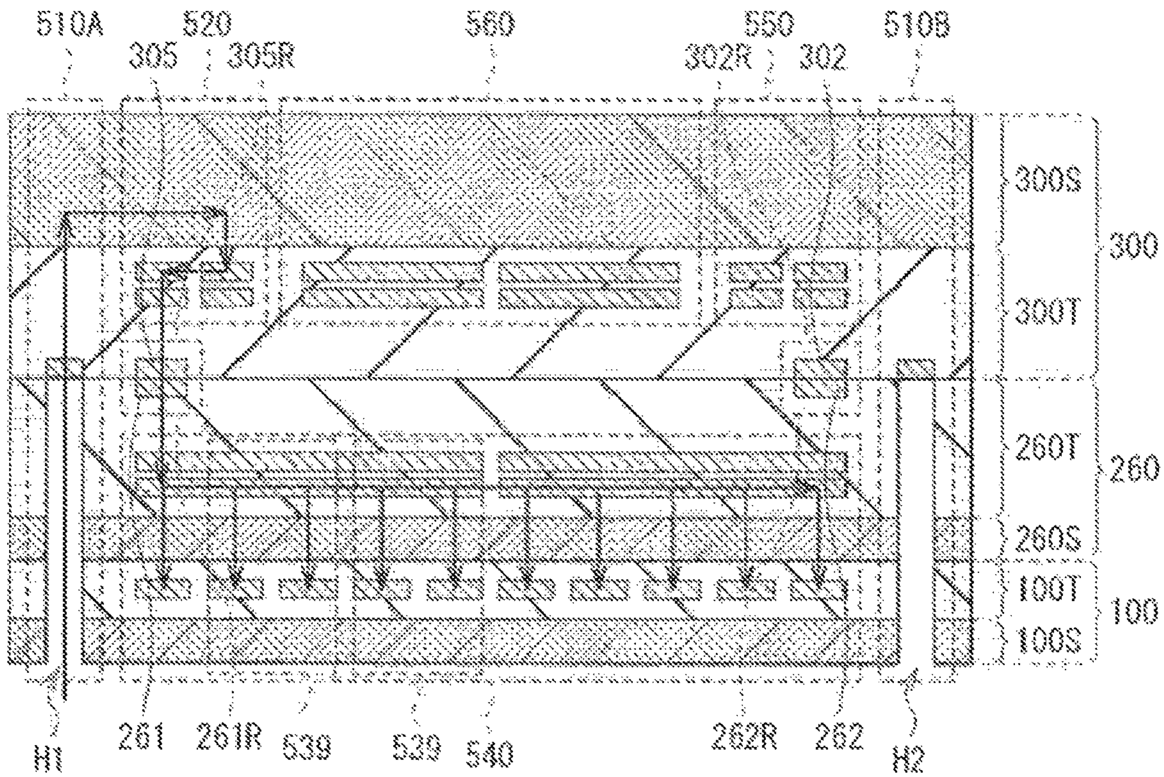
FIG. 57 is a schematic diagram of assistance in describing a path of an input signal to the imaging apparatus depicted in FIG. 46.
Figure 58:
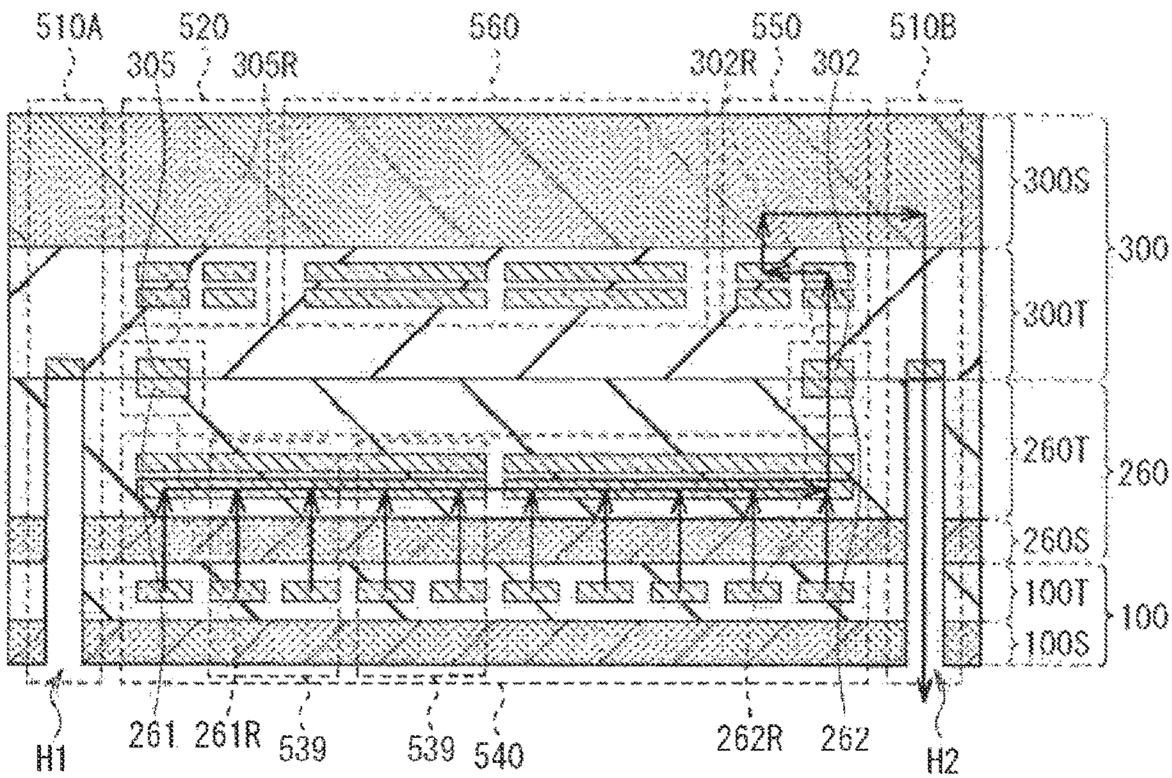
FIG. 58 is a schematic diagram of assistance in describing a signal path of a pixel signal to the imaging apparatus depicted in FIG. 46.

Now, operation of the imaging apparatus 1 will be described with reference to FIG. 57 and FIG. 58. FIG. 57 and FIG. 58 correspond to FIG. 46 to which arrows indicating paths of signals are added. FIG. 57 illustrates, by arrows, input signals externally input to the imaging apparatus 1 and paths of the power supply potential and the reference potential. FIG. 58 illustrates, by arrows, signal paths of pixel signals output from the imaging apparatus 1 to the outside. For example, an input signal (for example, a pixel clock and a synchronization signal) input to the imaging apparatus 1 via the input section 510A is transmitted to the row driving section 520 of the third substrate 300, which creates row driving signals. The row driving signals are transmitted to the second substrate 260 via the contact portions 305 and 261. Further, the row driving signals reach the respective pixel sharing units 539 of the pixel array section 540 via the row driving signal lines 542 in the interconnect layer 260T. For the row driving signals having reached the respective pixel sharing units 539 of the second substrate 260, the driving signals other than those for the transfer gates TG are input to the pixel circuit 210 to drive the transistors included in the pixel circuit 210. The driving signals for the transfer gates TG are input via the through electrodes TGV to the transfer gates TG1, TG2, TG3, and TG4 of the first substrate 100 to drive the pixels 541A, 541B, 541C, and 541D (FIG. 57). Additionally, the power supply potential and the reference potential supplied to the input section 510A (input terminal 511) of the third substrate 300 are transmitted to the second substrate 260 via the contact portions 305 and 261 and supplied to the pixel circuit 210 of each pixel sharing unit 539 via the interconnects in the interconnect layer 260T. The reference potential is further supplied to the pixels 541A, 541B, 541C, and 541D of the first substrate 100 via the through electrodes 125E. On the other hand, pixel signals subjected to photoelectric conversion by the pixels 541A, 541B, 541C, and 541D of the first substrate 100 are transmitted to the pixel circuits 210 of the second substrate 260 for each pixel sharing unit 539 via the through electrodes 120E. Pixel signals based on the pixel signals are transmitted from the pixel circuits 210 to the third substrate 300 via the vertical signal lines 543 and the contact portions 262 and 302. The pixel signals are processed by the column signal processing section 550 and image signal processing section 560 of the third substrate 300 and then output to the outside via the output section 510B.

[Effects]

In the present embodiment, the pixels 541A, 541B, 541C, and 541D (pixel sharing unit 539) and the pixel circuits 210 are provided in different substrates (first substrate 100 and second substrate 260). This configuration enables an increase in the areas of the pixels 541A, 541B, 541C, and 541D and the pixel circuits 210 compared to the configuration in which the pixels 541A, 541B, 541C, and 541D and the pixel circuits 210 are formed in the same substrate. As a result, the amount of pixel signals resulting from photoelectric conversion can be increased, and possible transistor noise from the pixel circuit 210 can be reduced. Thus, the signal/noise ratio of pixel signals can be improved, and the imaging apparatus 1 can output better pixel data (image information). Additionally, miniaturization of the imaging apparatus 1 (in other words, a reduction in pixel size and in the size of the imaging apparatus 1) can be realized. The reduced pixel size allows the imaging apparatus 1 to increase the number of pixels per unit area and to output high-quality images.

Additionally, in the imaging apparatus 1, the first substrate 100 and the second substrate 260 are electrically connected to each other by the through electrodes 120E and 125E provided in the insulating region 212. For example, the following method is also possible: the first substrate 100 and the second substrate 260 are connected by joining pad electrodes to each other, or by using through electrodes (for example, TSVs (Through Si Vias)) penetrating the semiconductor layer for connection. Compared to such a method, providing the through electrodes 120E and 125E in the insulating region 212 enables a reduction in the area required to connect the first substrate 100 and the second substrate 260. This enables a reduction in the pixel size and in the size of the imaging apparatus 1. Additionally, the area per pixel is further reduced to enable an increase in resolution. When chip size reduction is unnecessary, the formation regions for the pixels 541A, 541B, 541C, and 541D and the pixel circuits 210 can be enlarged. As a result, the amount of pixel signals resulting from photoelectric conversion can be increased, and possible transistor noise from the transistors included in the pixel circuit 210 can be reduced. Thus, the signal/noise ratio of pixel signals can be improved, and the imaging apparatus 1 can output better pixel data (image information).

Additionally, in the imaging apparatus 1, the pixel circuit 210 and both the column signal processing section 550 and the image signal processing section 560 are provided in different substrates (second substrate 260 and third substrate 300). This configuration enables an increase in the areas of the pixel circuit 210 and the areas of the column signal processing section 550 and the image signal processing section 560 compared to the configuration in which the pixel circuit 210 and both the column signal processing section 550 and the image signal processing section 560 are formed in the same substrate. This enables a reduction in possible noise from the column signal processing section 550 and allows a more advanced image processing circuit to be mounted in the image signal processing section 560. Thus, the signal/noise ratio of pixel signals can be improved, and the imaging apparatus 1 can output better pixel data (image information).

Additionally, in the imaging apparatus 1, the pixel array section 540 is provided in the first substrate 100 and the second substrate 260, and the column signal processing section 550 and the image signal processing section 560 are provided in the third substrate 300. In addition, the contact portions 261, 262, 305, and 302 connecting the second substrate 260 and the third substrate 300 are formed above the pixel array section 540. Thus, the contact portions 261, 262, 305, and 302 can be freely laid out without being interfered with by various interconnects included in the pixel array. Accordingly, the contact portions 261, 262, 305, and 302 can be used to electrically connect the second substrate 260 and the third substrate 300. The use of the contact portions 261, 262, 305, and 302, for example, allows the column signal processing section 550 and the image signal processing section 560 to be more freely laid out. This enables a reduction in possible noise from the column signal processing section 550 and allows a more advanced image processing circuit to be mounted in the image signal processing section 560. Consequently, the signal/noise ratio of pixel signals can be improved, and the imaging apparatus 1 can output better pixel data (image information).

Additionally, in the imaging apparatus 1, the pixel isolation section 117 penetrates the semiconductor layer 100S. Thus, even in a case where a reduced area per pixel reduces the distance between the adjacent pixels (pixels 541A, 541B, 541C, and 541D), possible color mixing between the pixels 541A, 541B, 541C, and 541D can be reduced. Accordingly, the signal/noise ratio of pixel signals can be improved, and the imaging apparatus 1 can output better pixel data (image information).

Additionally, in the imaging apparatus 1, the pixel circuit 210 is provided in each of the pixel sharing units 539. This configuration enables enlargement of the formation region for the transistors constituting the pixel circuit 210 (amplifying transistor AMP, reset transistor RST, select transistor SEL, and FD conversion gain switching transistor FDG) compared to the configuration in which the pixel circuit 210 is provided in each of the pixels 541A, 541B, 541C, and 541D. For example, the enlarged formation region for the amplifying transistor AMP enables possible noise to be reduced. Thus, the signal/noise ratio of pixel signals can be improved, and the imaging apparatus 1 can output better pixel data (image information).

Further, in the imaging apparatus 1, the first substrate 100 is provided with the pad portions 120 electrically connecting the pieces of floating diffusion FD (pieces of floating diffusion FD FD1, FD2, FD3, and FD4) of the four pixels 541A, 541B, 541C, and 541D. This configuration enables a reduction in the number of through electrodes connecting the first substrate 100 and the second substrate 260 (through electrodes 120E) compared to the configuration in which the pad portions 120 as described above are provided in the second substrate 260. Accordingly, the insulating region 212 can be miniaturized to provide a formation region (semiconductor layer 260S) with a sufficient size for the transistors constituting the pixel circuit 210. This enables a reduction in possible noise from the transistors included in the pixel circuit 210 and allows the signal/noise ratio of pixel signals to be improved, while allowing the imaging apparatus 1 to output better pixel data (image information).

Modified examples of the imaging apparatus 1 according to the above-described embodiments will be described below. In the modified examples described below, components common to the above-described embodiments are denoted by the same reference signs for description.

Modified Example 1

Figure 59:
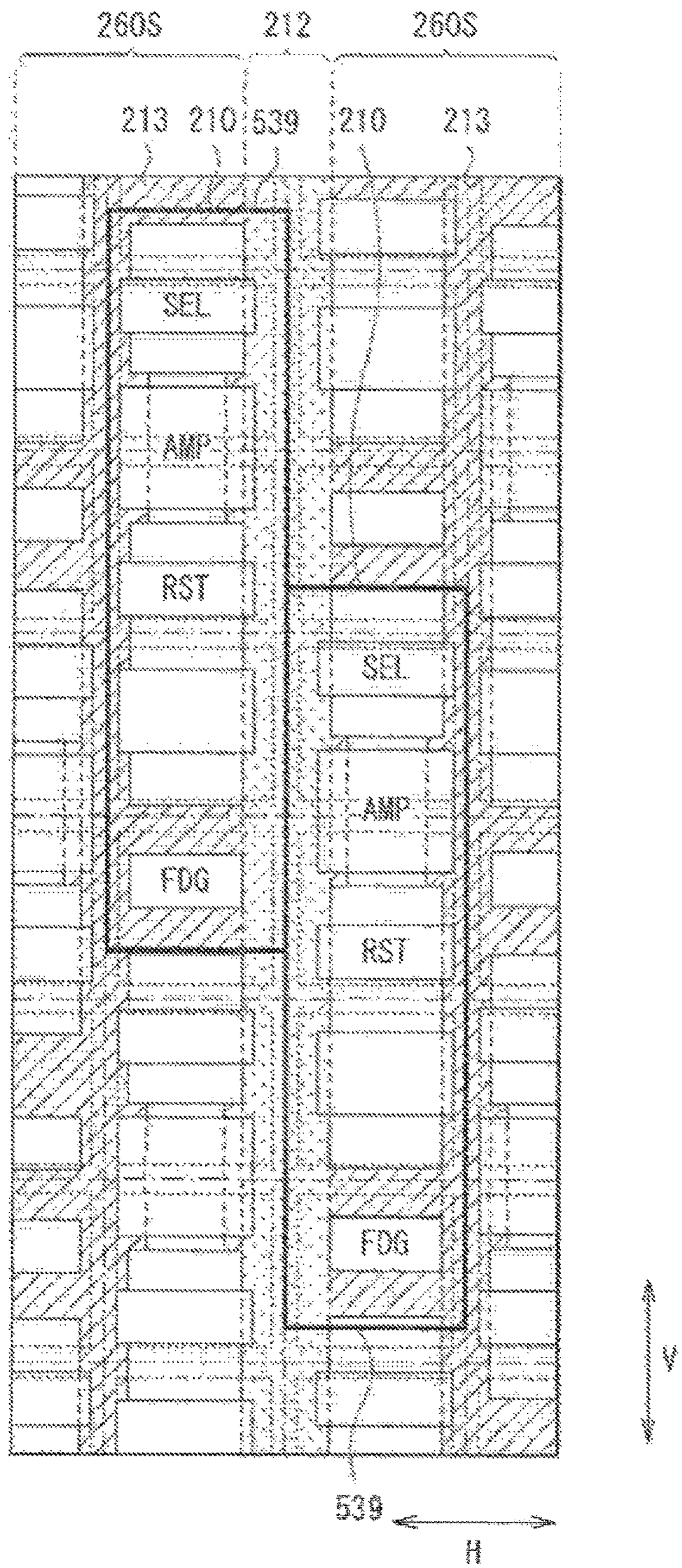
FIG. 59 is a schematic diagram illustrating a modified example of a planar configuration of a second substrate (semiconductor layer) depicted in FIG. 52.
Figure 60:
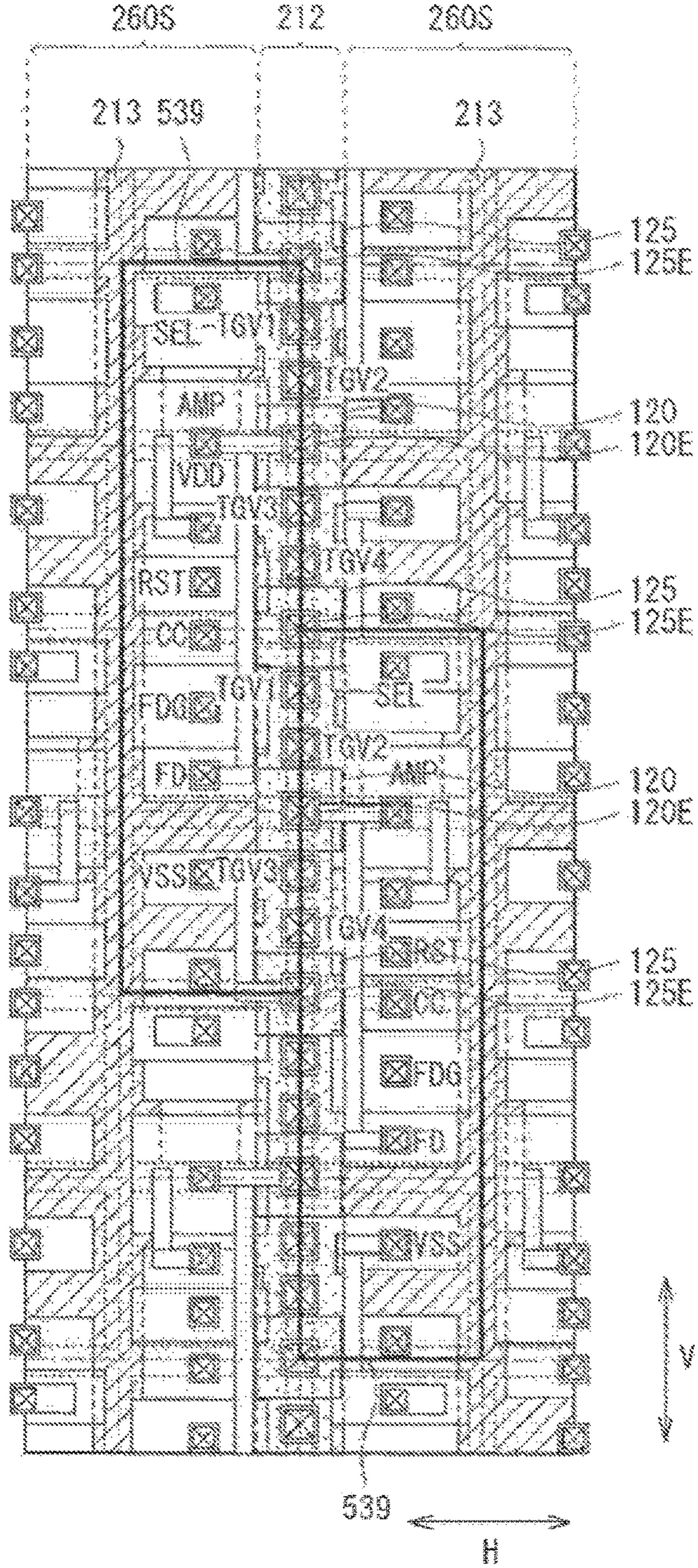
FIG. 60 is a schematic diagram illustrating a planar configuration of main parts of a first interconnect layer and a first substrate along with pixel circuits depicted in FIG. 59.
Figure 61:
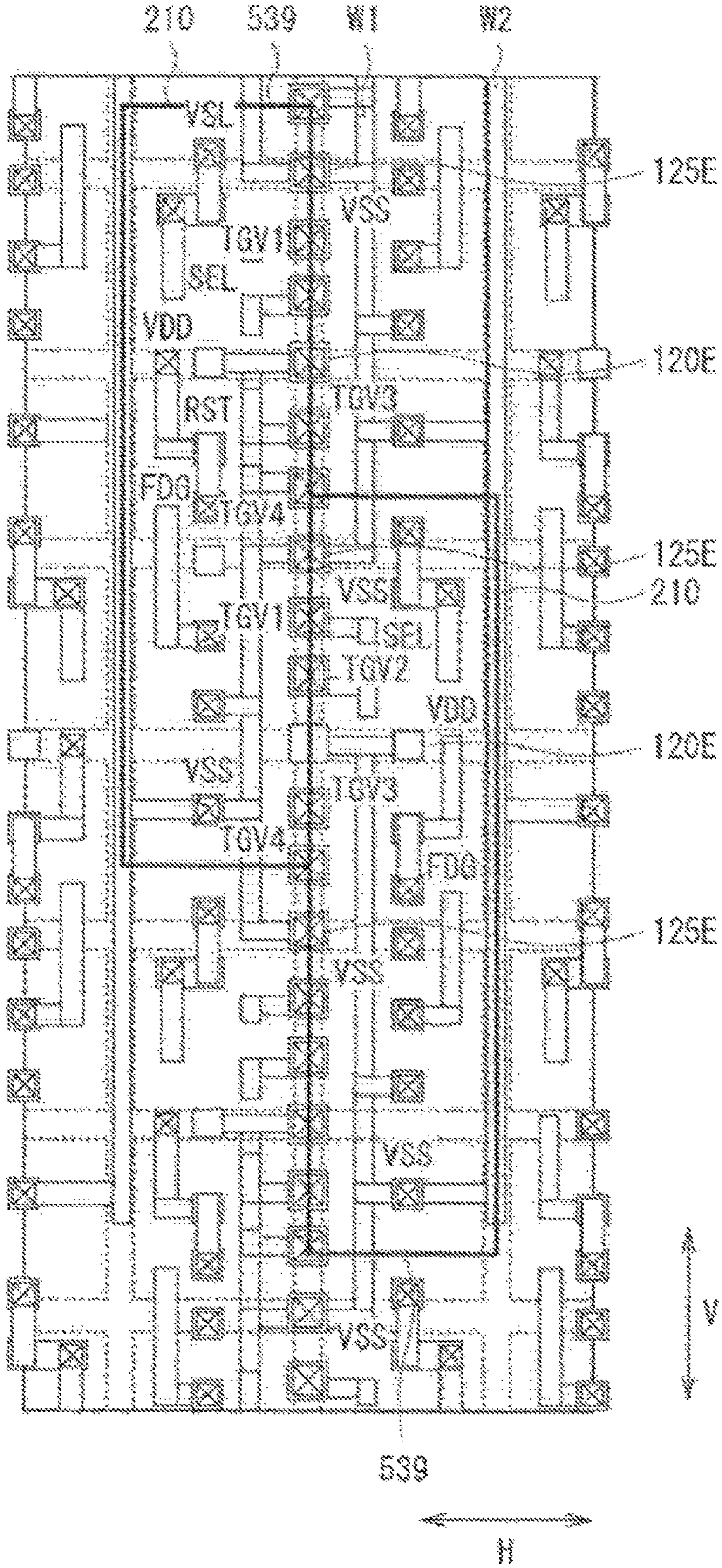
FIG. 61 is a schematic diagram illustrating a planar configuration of a second interconnect layer along with the first interconnect layer depicted in FIG. 60.
Figure 62:
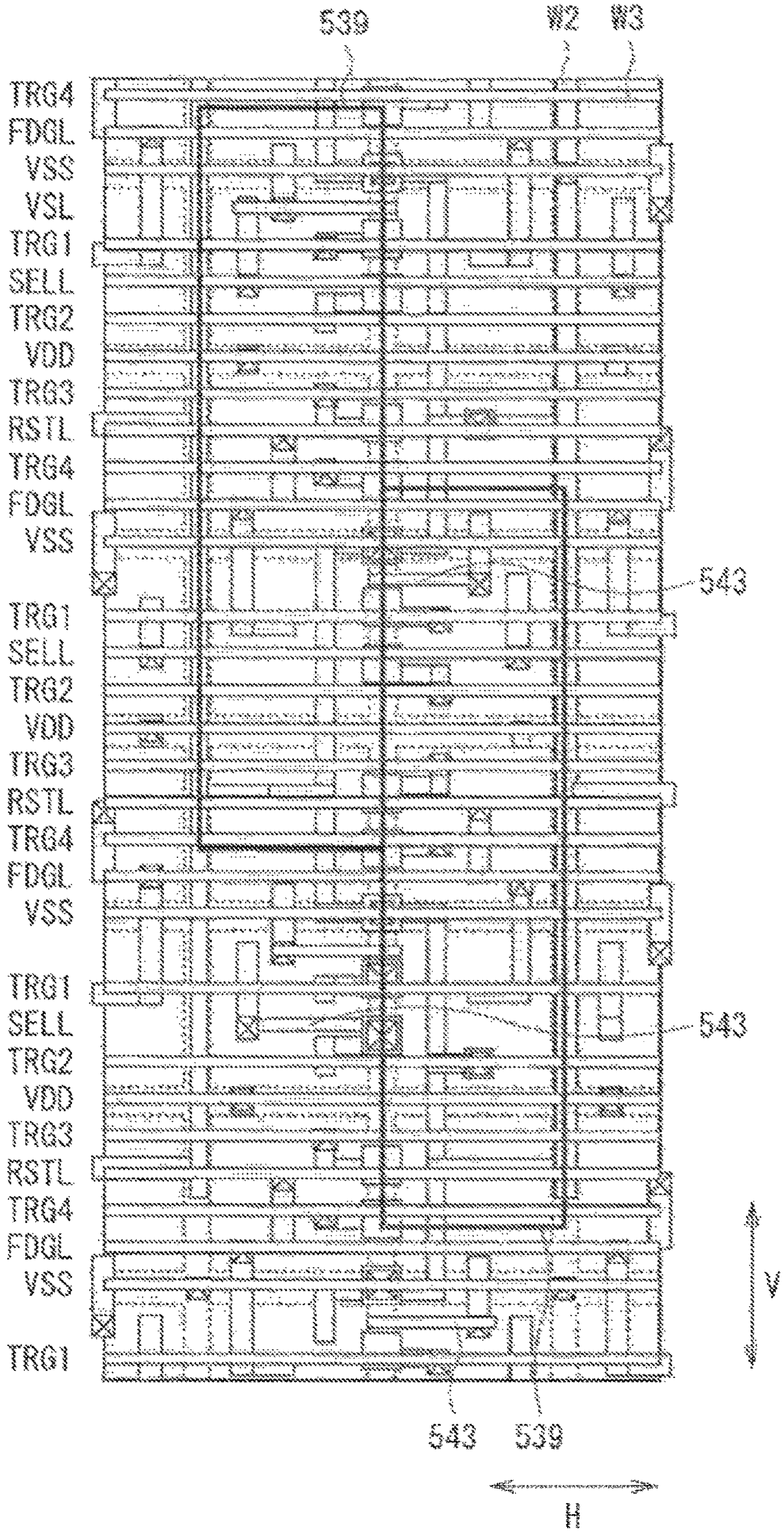
FIG. 62 is a schematic diagram illustrating a planar configuration of a third interconnect layer along with the second interconnect layer depicted in FIG. 61.
Figure 63:
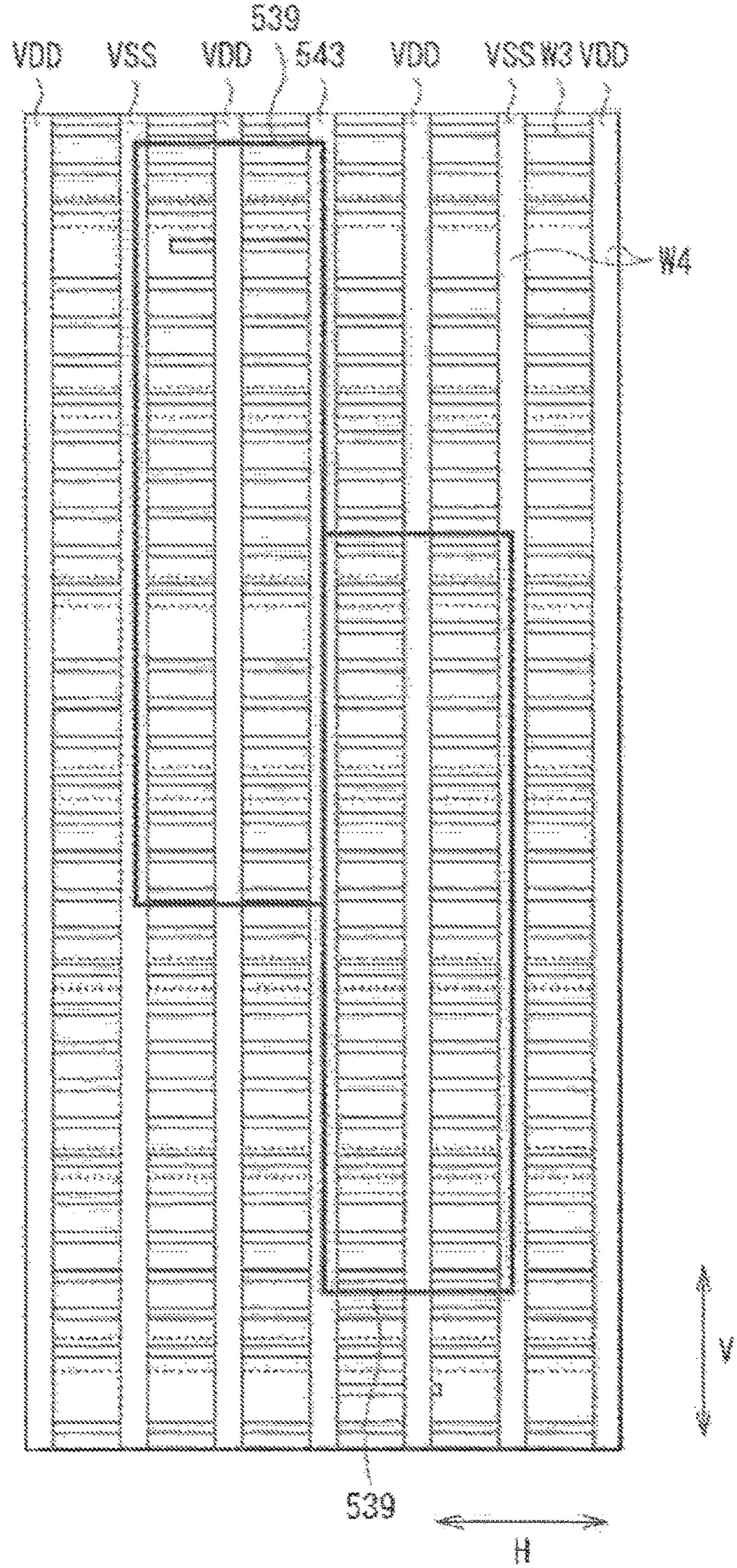
FIG. 63 is a schematic diagram illustrating a planar configuration of a fourth interconnect layer along with the third interconnect layer depicted in FIG. 62.

FIGS. 59 to 63 illustrate a modified example of a planar configuration of the imaging apparatus 1 according to the embodiments described above. FIG. 59 schematically illustrates a planar configuration of the vicinity of the front surface of the semiconductor layer 260S of the second substrate 260 and corresponds to FIG. 52 described above in the embodiments. FIG. 60 schematically illustrates a configuration of the first interconnect layer W1, the semiconductor layer 260S connected to the first interconnect layer W1, and the sections of the first substrate 100 and corresponds to FIG. 53 described above in the embodiments. FIG. 61 illustrates an example of a planar configuration of the first interconnect layer W1 and the second interconnect layer W2 and corresponds to FIG. 54 described above in the embodiments. FIG. 62 illustrates an example of a planar configuration of the second interconnect layer W2 and the third interconnect layer W3 and corresponds to FIG. 55 described above in the embodiments. FIG. 63 illustrates an example of a planar configuration of the third interconnect layer W3 and the fourth interconnect layer W4 and corresponds to FIG. 56 described above in the embodiments.

The present modified example illustrates a configuration in which one (for example, the right pixel sharing unit 539 in the page of the figure) of the two pixel sharing units 539 of the second substrate 260 arranged in juxtaposition in the H direction has an internal layout inverted, only in the H direction, with respect to the internal layout of the other pixel sharing unit 539 (for example, the left pixel sharing unit 539 in the page of the figure) as depicted in FIG. 60. Additionally, the misalignment between the contour line of the one pixel sharing unit 539 and the contour line of the other pixel sharing unit 539 in the V direction is more significant than the misalignment described above in the embodiments (FIG. 53). The more significant misalignment in the V direction enables a reduction in the distance between the amplifying transistor AMP of the other pixel sharing unit 539 and the pad portion 120 connected to the amplifying transistor AMP (pad portion 120 for the other of the two pixel sharing units 539 illustrated in FIG. 7 and arranged in juxtaposition in the V direction (the lower pixel sharing unit 539 in the page of the figure)). With such a layout, Modified Example 1 of the imaging apparatus 1 illustrated in FIGS. 59 to 63 allows, without inversion, in the V direction, of the planar layouts of the two pixel sharing units 539 arranged in juxtaposition in the H direction with respect to each other, the pixel sharing unit 539 to be made equal in area to the pixel sharing unit 539 of the second substrate 260 described above in the embodiments. Note that the planar layout of the pixel sharing unit 539 of the first substrate 100 is the same as the planar layout described above in the embodiments (FIG. 50 and FIG. 51). Consequently, the imaging apparatus 1 of the present modified example can produce effects similar to the effects of the imaging apparatus 1 described above in the embodiments. The arrangement of the pixel sharing units 539 of the second substrate 260 is not limited to the arrangement described above in the embodiments or in the present modified example.

Modified Example 2

Figure 64:
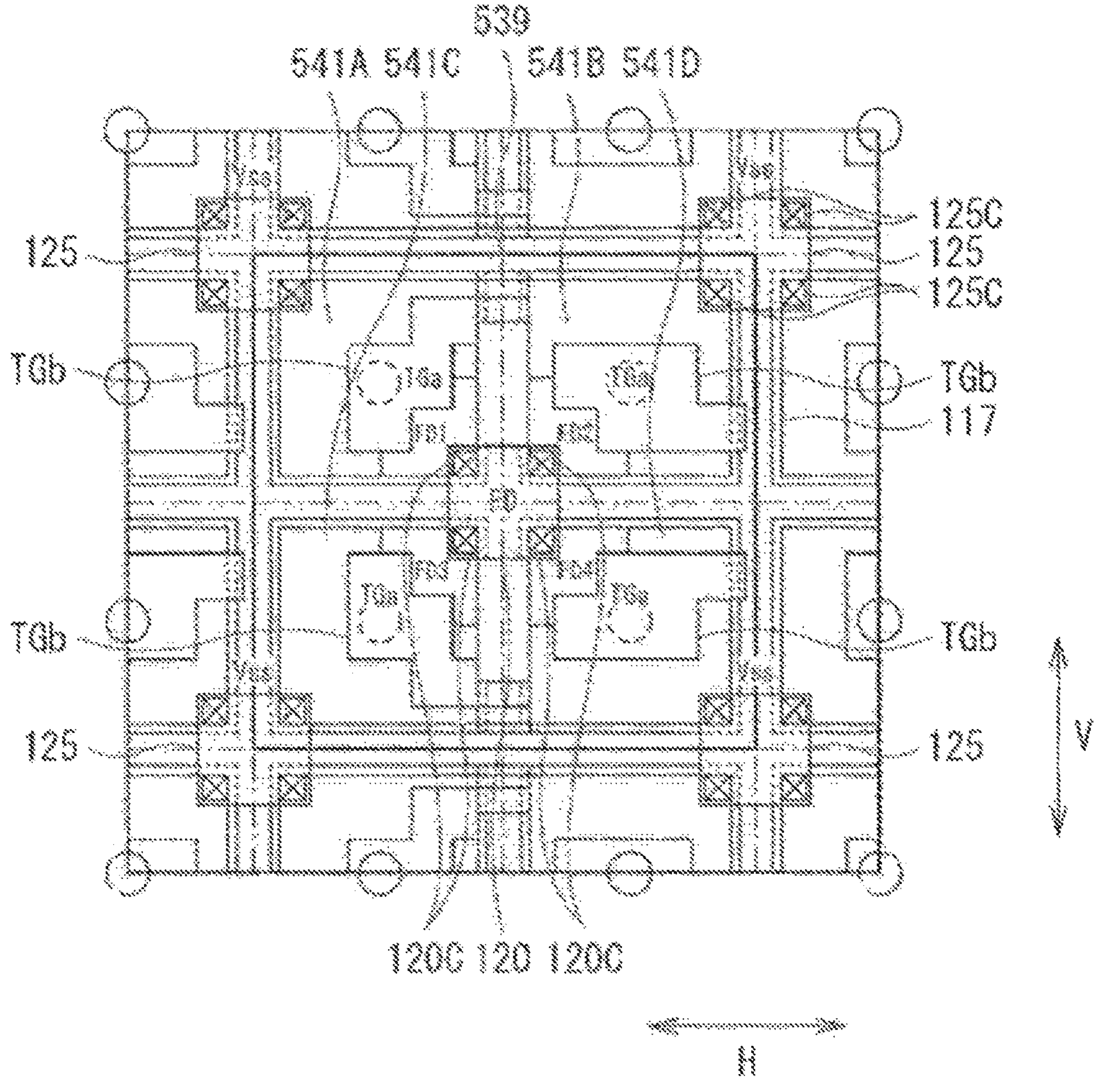
FIG. 64 is a schematic diagram illustrating a modified example of a planar configuration of the first substrate depicted in FIG. 50.
Figure 65:
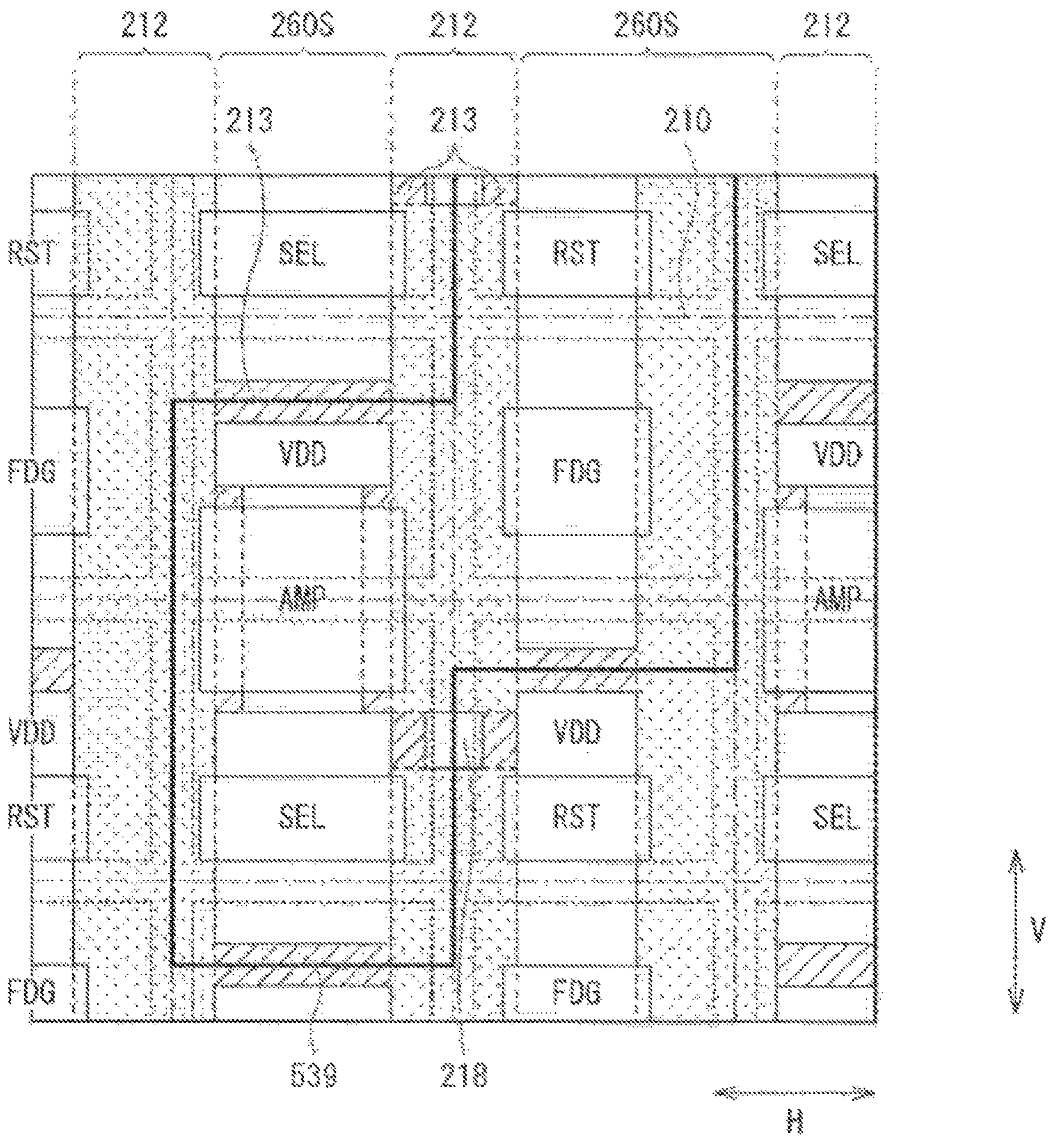
FIG. 65 is a schematic diagram illustrating an example of a planar configuration of a second substrate (semiconductor layer) stacked on the first substrate depicted in FIG. 64.
Figure 66:
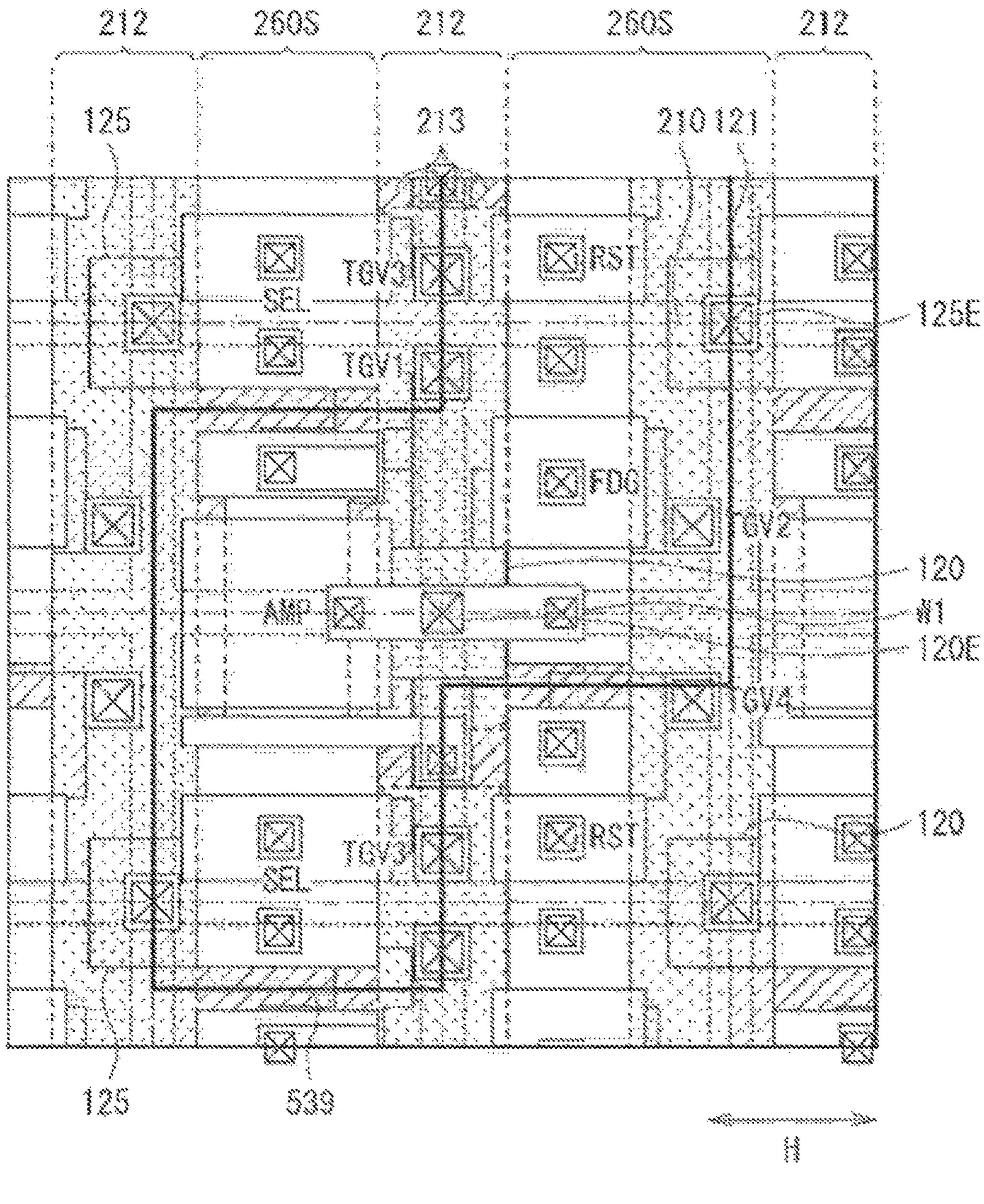
FIG. 66 is a schematic diagram illustrating an example of a planar configuration of a first interconnect layer along with pixel circuits depicted in FIG. 65.
Figure 67:
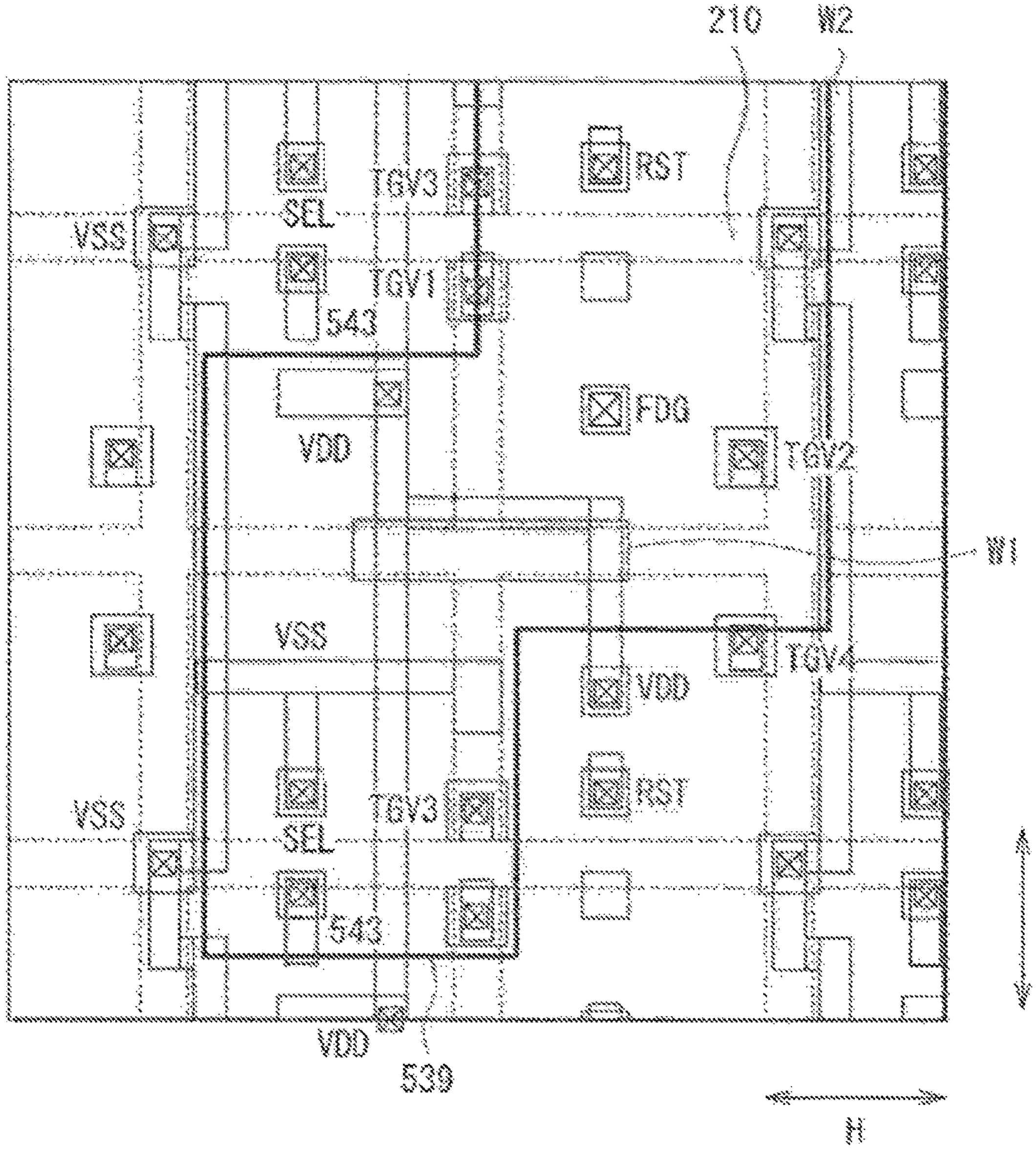
FIG. 67 is a schematic diagram illustrating an example of a planar configuration of a second interconnect layer along with the first interconnect layer depicted in FIG. 66.
Figure 68:
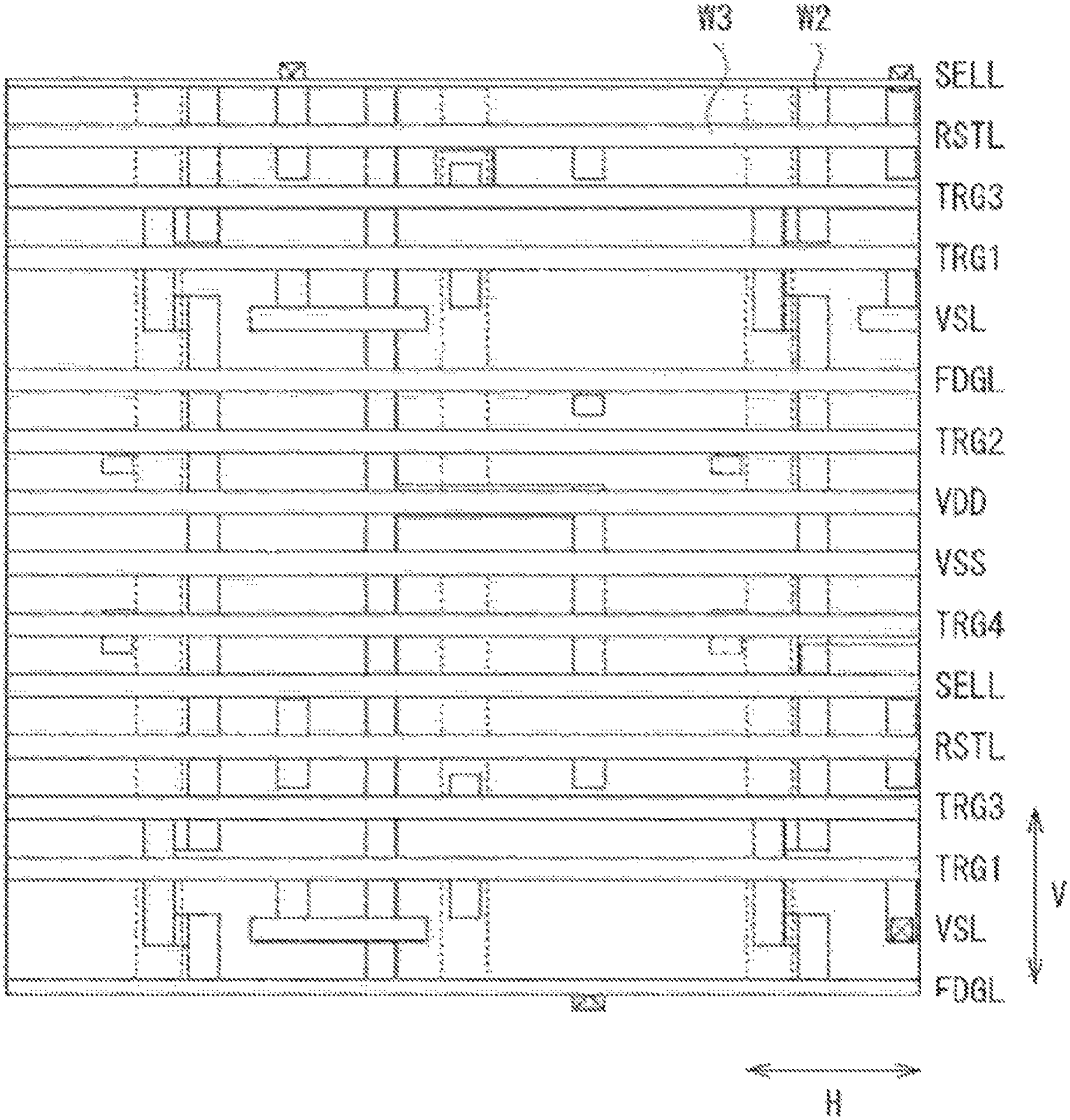
FIG. 68 is a schematic diagram illustrating an example of a planar configuration of a third interconnect layer along with the second interconnect layer depicted in FIG. 67.
Figure 69:
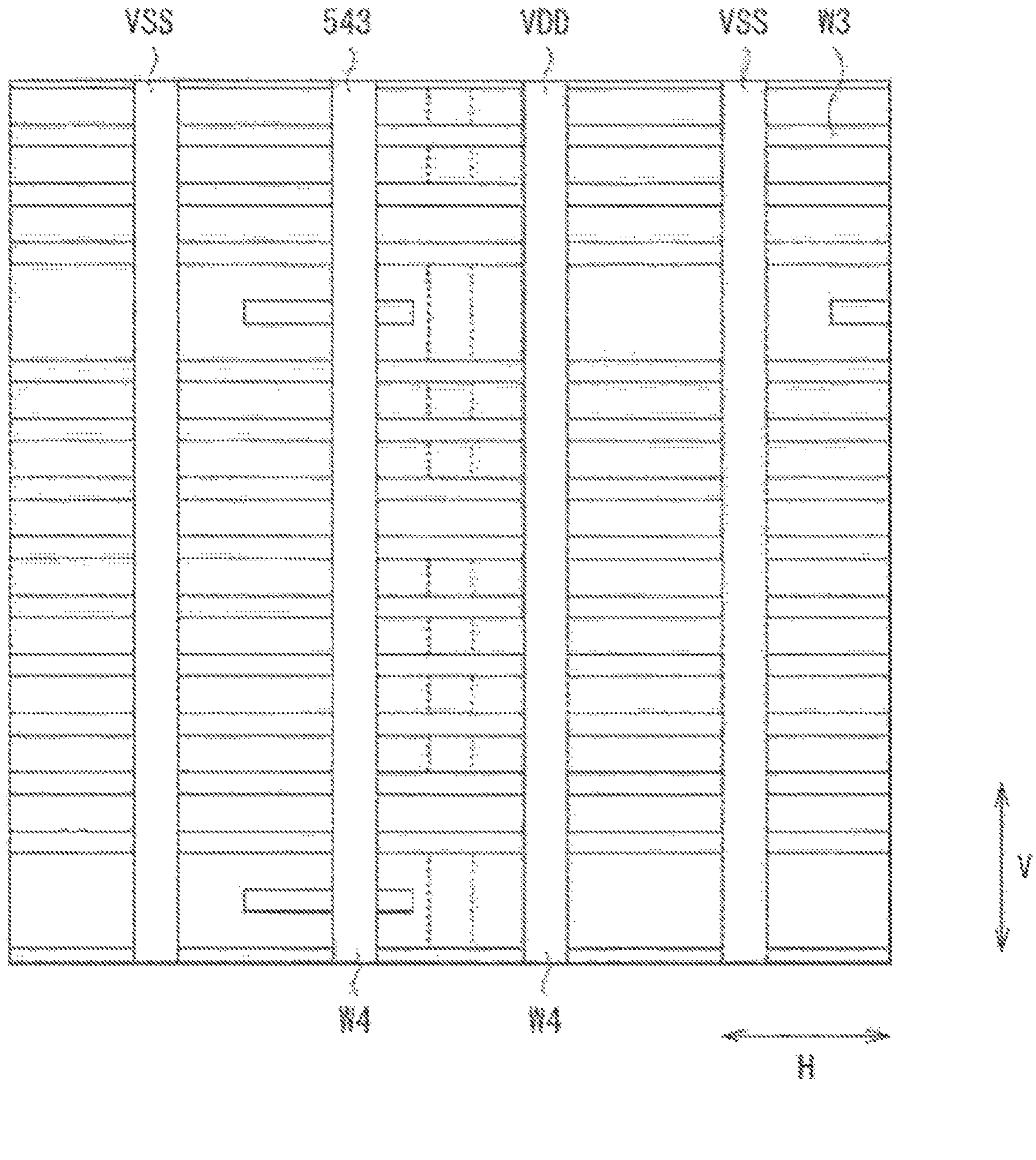
FIG. 69 is a schematic diagram illustrating an example of a planar configuration of a fourth interconnect layer along with the third interconnect layer depicted in FIG. 68.

FIGS. 64 to 69 illustrate a modified example of a planar configuration of the imaging apparatus 1 according to the above-described embodiments. FIG. 64 schematically illustrates a planar configuration of the first substrate 100 and corresponds to FIG. 50 described above in the embodiments. FIG. 65 schematically illustrates a planar configuration of the vicinity of the front surface of the semiconductor layer 260S of the second substrate 260 and corresponds to FIG. 52 described above in the embodiments. FIG. 66 schematically illustrates a configuration of the first interconnect layer W1, the semiconductor layer 260S connected to the first interconnect layer W1, and the sections of the first substrate 100, and corresponds to FIG. 53 described above in the embodiments. FIG. 67 illustrates an example of a planar configuration of the first interconnect layer W1 and the second interconnect layer W2 and corresponds to FIG. 54 described above in the embodiments. FIG. 68 illustrates an example of a planar configuration of the second interconnect layer W2 and the third interconnect layer W3 and corresponds to FIG. 55 described above in the embodiments. FIG. 69 illustrates an example of a planar configuration of the third interconnect layer W3 and the fourth interconnect layer W4 and corresponds to FIG. 56 described above in the embodiments.

In the present modified example, the external shape of each pixel circuit 210 has a generally square planar shape (FIG. 65 and the like). In this regard, the planar configuration of the imaging apparatus 1 in the present modified example differs from the planar configuration of the imaging apparatus 1 described above in the embodiments.

For example, each of the pixel sharing units 539 of the first substrate 100 is formed over a pixel region in two rows and two columns and has a generally square planar shape, as described above in the embodiments (FIG. 64). For example, in each of the pixel sharing units 539, the horizontal portions TGb of the transfer gates TG1 and TG3 of the pixel 541A and the pixel 541C in one of the pixel columns extend from a position where the horizontal portion TGb overlaps the vertical portion TGa toward the central portion of the pixel sharing unit 539 in the H direction (more specifically, in a direction toward outer edges of the pixels 541A and 541C and a direction toward the central portion of the pixel sharing unit 539), and the horizontal portions TGb of the transfer gates TG2 and TG4 of the pixel 541B and the pixel 541D in the other pixel column extend from a position where the horizontal portion TGb overlaps the vertical portion TGa toward the outside of the pixel sharing unit 539 in the H direction (more specifically, in a direction toward outer edges of the pixels 541B and 541D and a direction toward the outside of the pixel sharing unit 539). The pad portion 120 connected to the floating diffusion FD is provided in the central portion of the pixel sharing unit 539 (the central portion of the pixel sharing unit 539 in the H direction and the V direction). The pad portions 125 connected to the VSS contact regions 118 are provided at ends of the pixel sharing unit 539 at least in the H direction (in FIG. 64, in the H direction and the V direction).

In another arrangement example, the horizontal portions TGb of the transfer gates TG1, TG2, TG3, and TG4 may be provided only in regions facing the vertical portion TGa. At this time, as described above in the embodiments, the semiconductor layer 260S is likely to be divided into small pieces. Accordingly, forming large transistors in the pixel circuit 210 becomes difficult. On the other hand, when the horizontal portions TGb of the transfer gates TG1, TG2, TG3, and TG4 are extended in the H direction from the position where the horizontal portion TGb overlaps the vertical portion TGa, the width of the semiconductor layer 260S can be increased, as described above in the embodiments.

Specifically, the through electrodes TGV1 and TGV3 connected to the transfer gates TG1 and TG3 can be disposed such that H direction positions of the through electrodes TGV1 and TGV3 are in close proximity to the H direction position of the through electrode 120E, and the through electrodes TGV2 and TGV4 connected to the transfer gates TG2 and TG4 can be disposed such that H direction positions of the through electrodes TGV2 and TGV4 are in close proximity to the H direction position of the through electrode 125E (FIG. 66). This enables an increase in the width (dimension in the H direction) of the semiconductor layer 260S extending in the V direction as described above in the embodiments. Thus, the size of each of the transistors in the pixel circuit 210, particularly, the size of the amplifying transistor AMP, can be increased. As a result, the signal/noise ratio of pixel signals can be improved, and the imaging apparatus 1 can output better pixel data (image information).

Each of the pixel sharing units 539 of the second substrate 260 is, for example, approximately as large as each of the pixel sharing units 539 of the first substrate 100 in the H direction and the V direction and is, for example, provided over a region corresponding to the pixel region in substantially two rows and two columns. For example, in each of the pixel circuits 210, the select transistor SEL and the amplifying transistor AMP are arranged in juxtaposition in the V direction in one semiconductor layer 260S extending in the V direction, and the FD conversion gain switching transistor FDG and the reset transistor RST are arranged in juxtaposition in the V direction in one semiconductor layer 260S extending in the V direction. The one semiconductor layer 260S in which the select transistor SEL and the amplifying transistor AMP are provided is disposed next, via the insulating region 212 and in the H direction, to the one semiconductor layer 260S in which the FD conversion gain switching transistor FDG and the reset transistor RST are provided. The insulating region 212 extends in the V direction (FIG. 65).

Now, the external shape of each of the pixel sharing units 539 of the second substrate 260 will be described with reference to FIG. 65 and FIG. 66. For example, the pixel sharing unit 539 of the first substrate 100 depicted in FIG. 64 is connected to the amplifying transistor AMP and the select transistor SEL provided on one side of the pad portion 120 in the H direction (on the left of the page of FIG. 66) and to the FD conversion gain switching transistor FDG and the reset transistor RST provided on the other side of the pad portion 120 in the H direction (on the right side of the page of FIG. 66). Four outer edges described below determine the external shape of the sharing unit 541 of the second substrate 260 including the amplifying transistor AMP, the select transistor SEL, the FD conversion gain switching transistor FDG, and the reset transistor RST.

A first outer edge is an outer edge at one V-direction end (upper end in the page of FIG. 66) of the semiconductor layer 260S including the select transistor SEL and the amplifying transistor AMP. The first outer edge is provided between the amplifying transistor AMP included in the pixel sharing unit 539 and the select transistor SEL included in the pixel sharing unit 539 adjacent to the above-described pixel sharing unit 539 on one side in the V direction (on the upper side in the page of FIG. 66). More specifically, the first outer edge is provided in the central portion, in the V direction, of the element isolation region 213 between the amplifying transistor AMP and the select transistor SEL. A second outer edge is an outer edge at the other V-direction end (lower end in the page of FIG. 66) of the semiconductor layer 260S including the select transistor SEL and the amplifying transistor AMP. The second outer edge is provided between the select transistor SEL included in the pixel sharing unit 539 and the amplifying transistor AMP included in the pixel sharing unit 539 adjacent to the above-described pixel sharing unit 539 on the other side in the V direction (on the lower side in the page of FIG. 66). More specifically, the second outer edge is provided in the central portion, in the V direction, of the element isolation region 213 between the select transistor SEL and the amplifying transistor AMP. A third outer edge is an outer edge at the other V-direction end (lower end in the page of FIG. 66) of the semiconductor layer 260S including the reset transistor RST and the FD conversion gain switching transistor FDG. The third outer edge is provided between the FD conversion gain switching transistor FDG included in the pixel sharing unit 539 and the reset transistor RST included in the pixel sharing unit 539 adjacent to the above-described pixel sharing unit 539 on the other side in the V direction (on the lower side in the page of FIG. 66). More specifically, the third outer edge is provided in the central portion, in the V direction, of the element isolation region 213 between the FD conversion gain switching transistor FDG and the reset transistor RST. A fourth outer edge is an outer edge at the one V-direction end (upper end in the page of FIG. 66) of the semiconductor layer 260S including the reset transistor RST and the FD conversion gain switching transistor FDG. The fourth outer edge is provided between the reset transistor RST included in the pixel sharing unit 539 and the FD conversion gain switching transistor FDG (not depicted) included in the pixel sharing unit 539 adjacent to the above-described pixel sharing unit 539 on the one side in the V direction (on the upper side in the page of FIG. 66). More specifically, the fourth outer edge is provided in the central portion, in the V direction, of the element isolation region 213 (not depicted) between the reset transistor RST and the FD conversion gain switching transistor FDG.

In the external shape of the pixel sharing unit 539 of the second substrate 260 including such first, second, third, and fourth outer edges, the third and fourth outer edges are disposed in misalignment with the first and second edges toward one side in the V direction (in other words, disposed offset to the one side in the V direction). The use of such a layout enables both the gate of the amplifying transistor AMP and the source of the FD conversion gain switching transistor FDG to be disposed as close as possible to the pad portion 120. Accordingly, the external shape serves to reduce the area of the interconnects connecting the above-described components, facilitating miniaturization of the imaging apparatus 1. Note that the VSS contact region 218 is provided between the semiconductor layer 260S including the select transistor SEL and the amplifying transistor AMP and the semiconductor layer 260S including the reset transistor RST and the FD conversion gain switching transistor FDG. For example, the plurality of pixel circuits 210 have the same arrangement.

The imaging apparatus 1 with the second substrate 260 as described above also produces effects similar to the effects described above in the embodiments. The arrangement of the pixel sharing units 539 of the second substrate 260 is not limited to the arrangement described in the embodiments and the present modified example.

Modified Example 3

Figure 70:
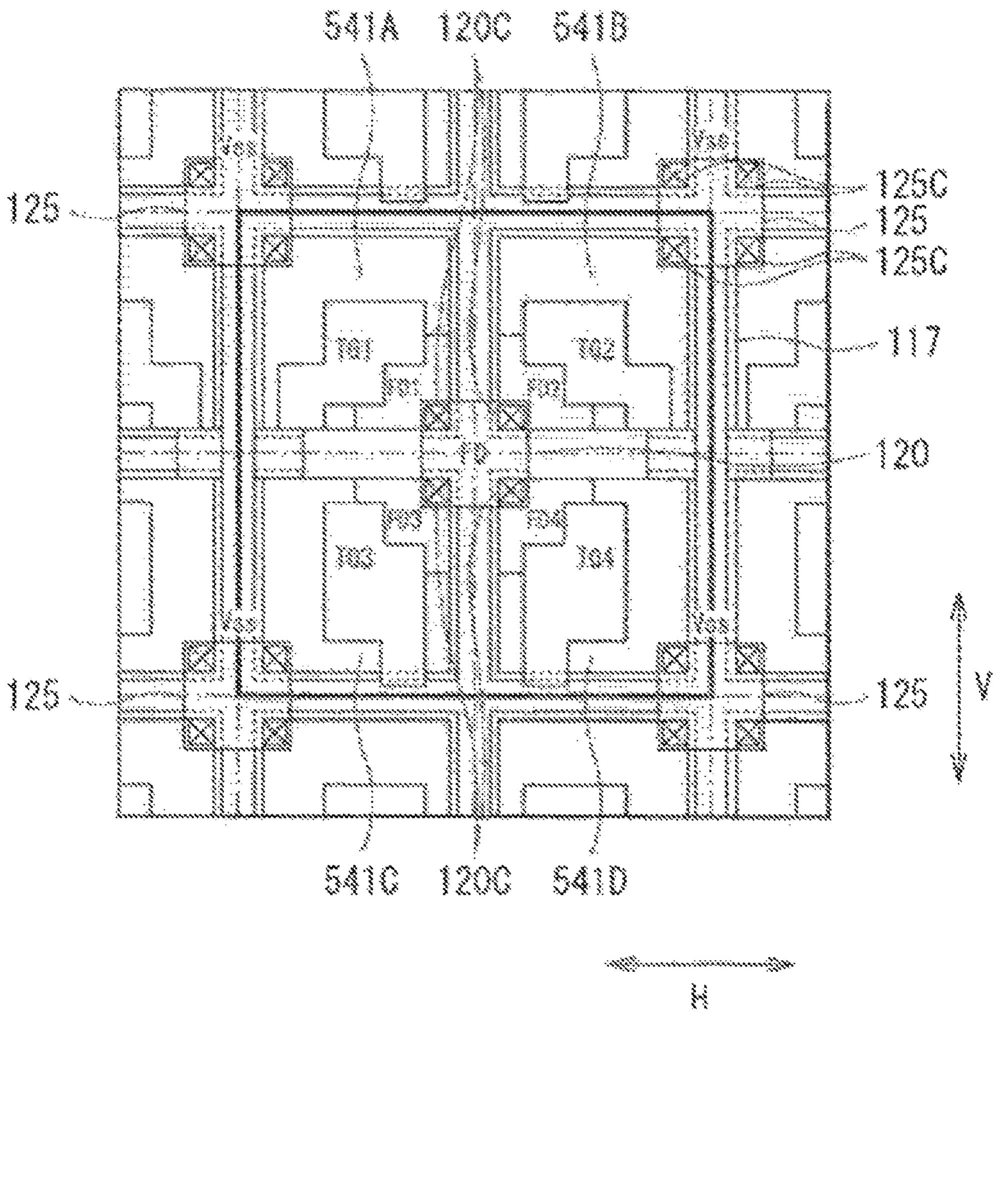
FIG. 70 is a schematic diagram illustrating another example of the planar configuration of the first substrate depicted in FIG. 64.
Figure 71:
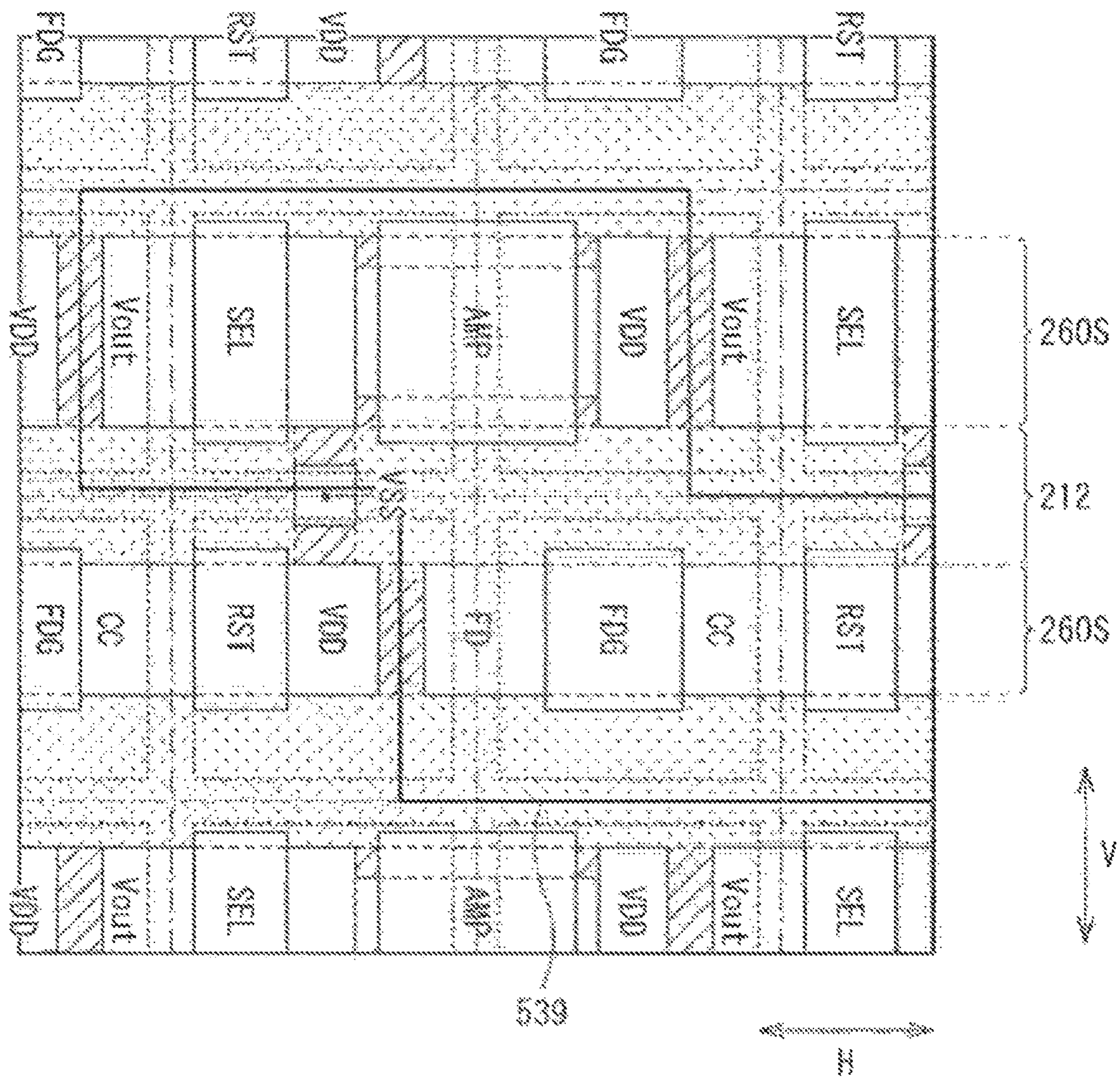
FIG. 71 is a schematic diagram illustrating an example of a planar configuration of a second substrate (semiconductor layer) stacked on the first substrate depicted in FIG. 70.
Figure 72:
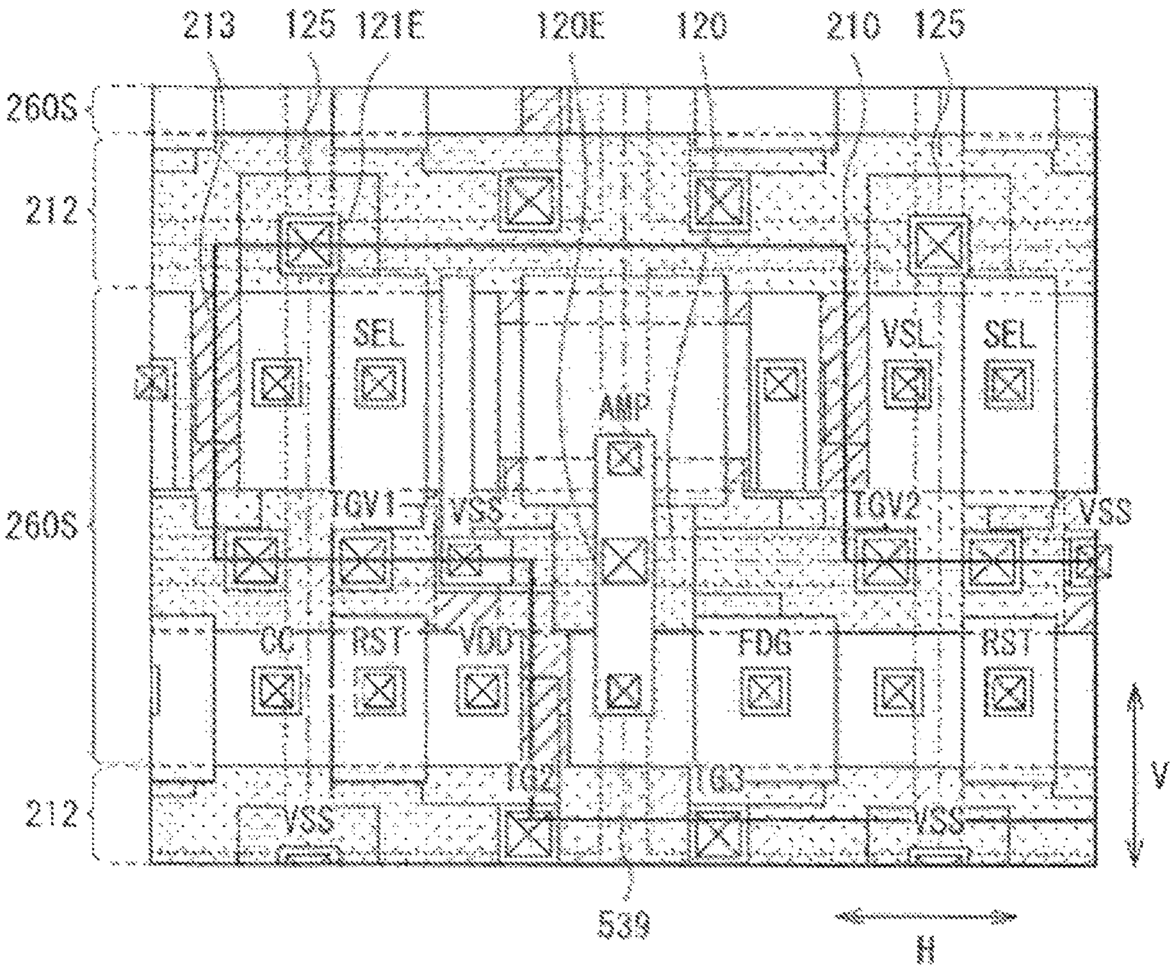
FIG. 72 is a schematic diagram illustrating an example of a planar configuration of a first interconnect layer along with pixel circuits depicted in FIG. 71.
Figure 73:
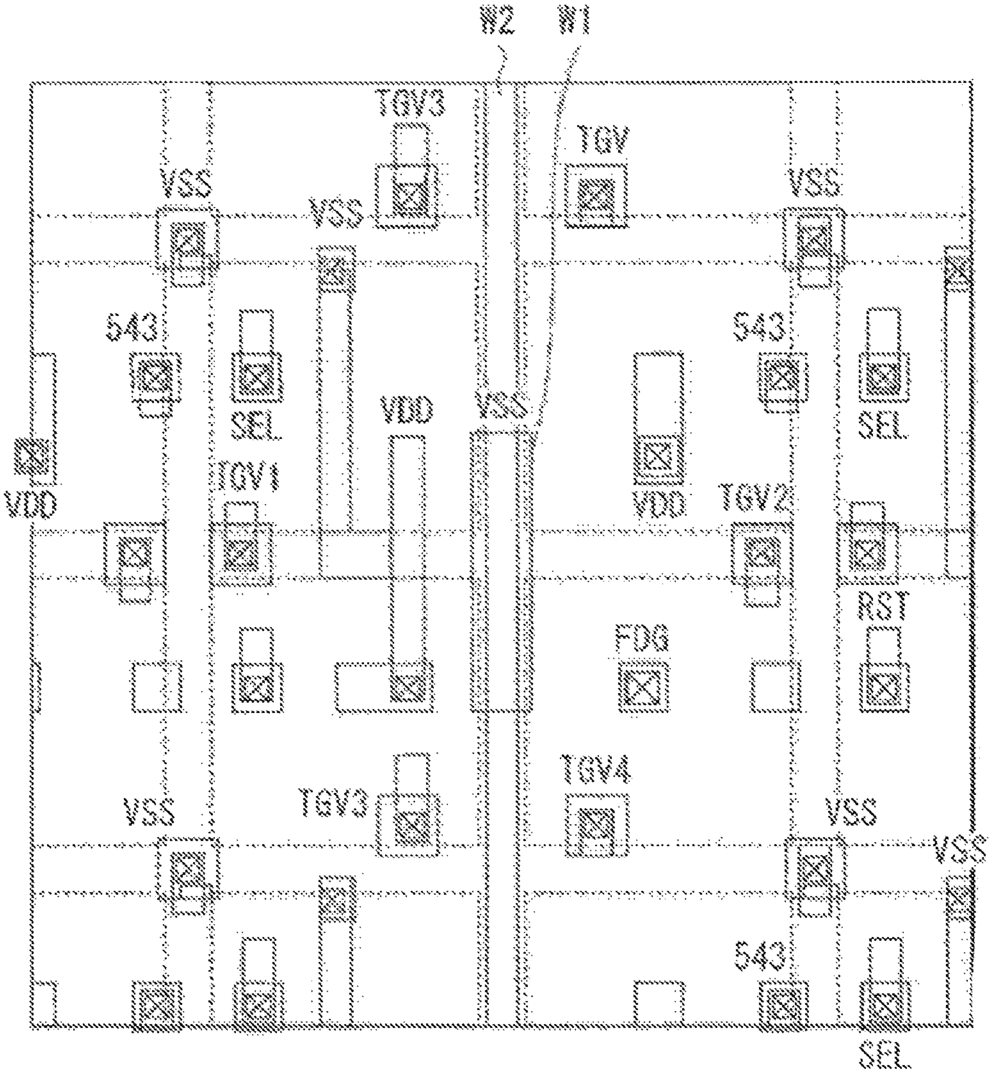
FIG. 73 is a schematic diagram illustrating an example of a planar configuration of a second interconnect layer along with the first interconnect layer depicted in FIG. 72.
Figure 74:
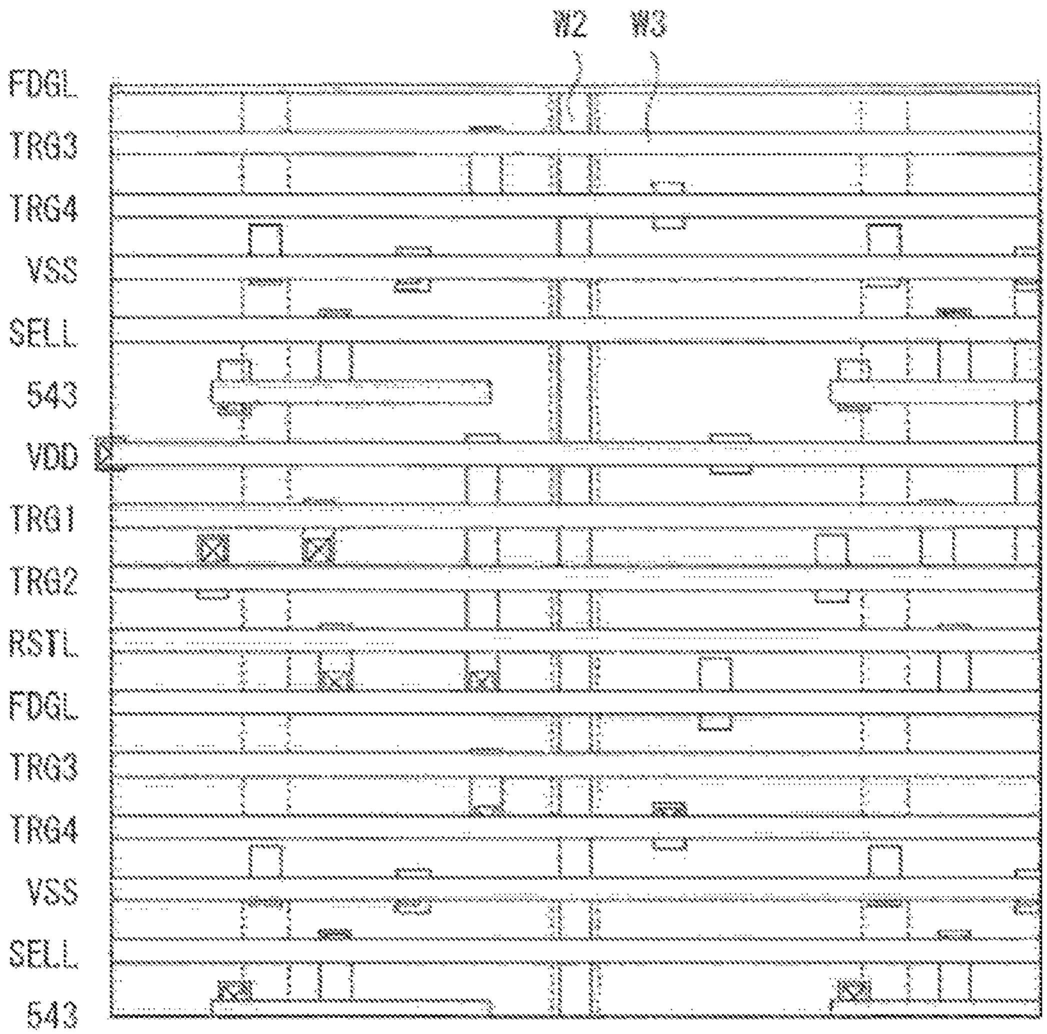
FIG. 74 is a schematic diagram illustrating an example of a planar configuration of a third interconnect layer along with the second interconnect layer depicted in FIG. 73.
Figure 75:
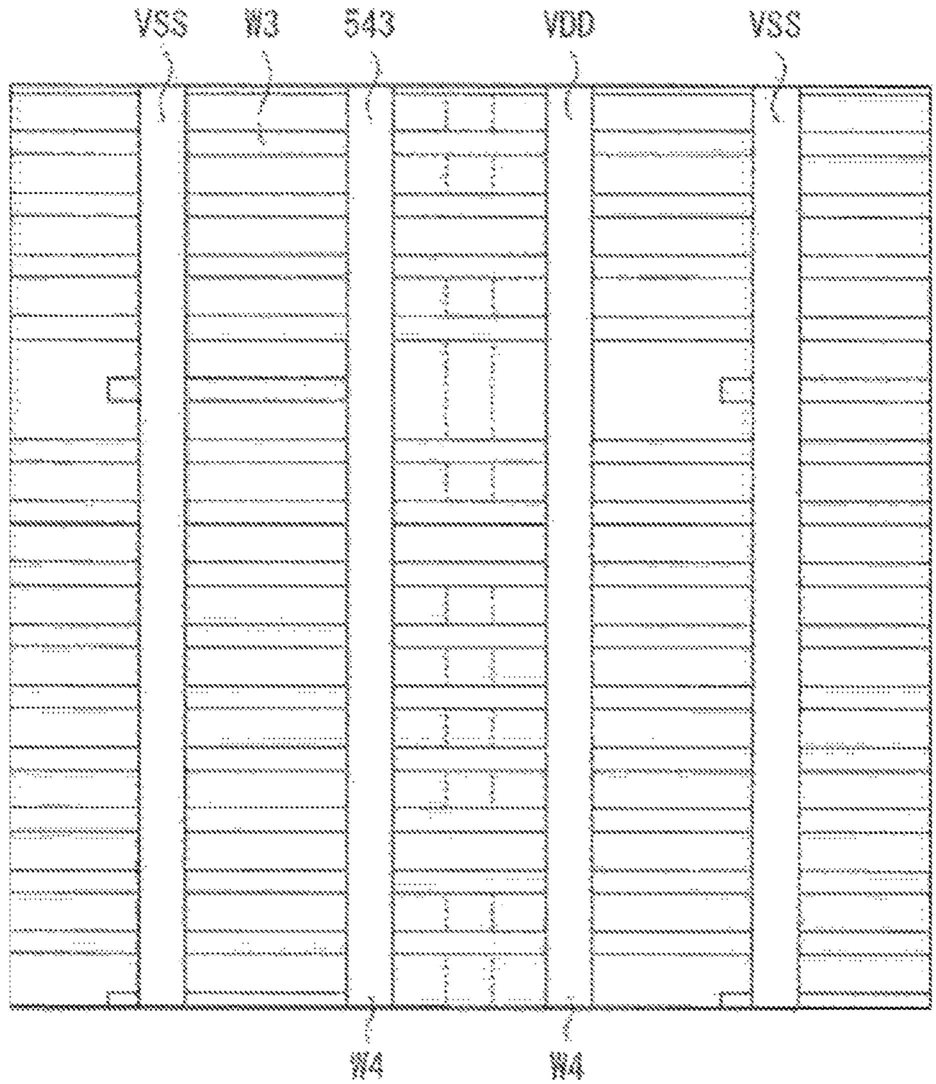
FIG. 75 is a schematic diagram illustrating an example of a planar configuration of a fourth interconnect layer along with the third interconnect layer depicted in FIG. 74.

FIGS. 70 to 75 illustrate a modified example of a planar configuration of the imaging apparatus 1 according to the above-described embodiments. FIG. 70 schematically illustrates a planar configuration of the first substrate 100 and corresponds to FIG. 51 described above in the embodiments. FIG. 71 schematically illustrates a planar configuration of the vicinity of the front surface of the semiconductor layer 260S of the second substrate 260 and corresponds to FIG. 52 described above in the embodiments. FIG. 72 schematically illustrates a configuration of the first interconnect layer W1, the semiconductor layer 260S connected to the first interconnect layer W1, and the sections of the first substrate 100 and corresponds to FIG. 53 described above in the embodiments. FIG. 73 illustrates an example of a planar configuration of the first interconnect layer W1 and the second interconnect layer W2 and corresponds to FIG. 54 described above in the embodiments. FIG. 74 illustrates an example of a planar configuration of the second interconnect layer W2 and the third interconnect layer W3 and corresponds to FIG. 55 described above in the embodiments. FIG. 75 illustrates an example of a planar configuration of the third interconnect layer W3 and the fourth interconnect layer W4 and corresponds to FIG. 56 described above in the embodiments.

In the present modified example, the semiconductor layer 260S of the second substrate 260 extends in the H direction (FIG. 72). Specifically, the present modified example substantially corresponds to a configuration obtained by rotating, through 90 degrees, the planar configuration of the imaging apparatus 1 depicted in FIG. 65 and the like described above.

For example, each of the pixel sharing units 539 of the first substrate 100 is formed over a pixel region in two rows and two columns and has a generally square planar shape (FIG. 70), as described above in the embodiments. For example, in each of the pixel sharing units 539, the transfer gates TG1 and TG2 of the pixel 541A and the pixel 541B in one of the pixel rows extend toward the central portion of the pixel sharing unit 539 in the V direction, and the transfer gates TG3 and TG4 of the pixel 541C and the pixel 541D in the other pixel row extend toward the outside of the pixel sharing unit 539 in the V direction. The pad portion 120 connected to the floating diffusion FD is provided in the central portion of the pixel sharing unit 539, and the pad portions 125 connected to the VSS contact regions 118 are provided at ends of the pixel sharing unit 539 at least in the V direction (in FIG. 70, in the V direction and the H direction). In this case, the V direction positions of the through electrodes TGV1 and TGV2 of the transfer gates TG1 and TG2 are closer to the V direction position of the through electrode 120E, and the V direction positions of the through electrodes TGV3 and TGV4 of the transfer gates TG3 and TG4 are closer to the V direction position of the through electrode 125E (FIG. 72). Accordingly, for a reason similar to the reason explained above in the embodiments, the width (dimension in the V direction) of the semiconductor layer 260S extending in the H direction can be increased. Thus, the size of the amplifying transistor AMP can be increased, enabling possible noise to be reduced.

In each of the pixel circuits 210, the select transistor SEL and the amplifying transistor AMP are arranged in juxtaposition in the H direction, and the reset transistor RST is disposed at a position where the reset transistor RST is adjacent to the select transistor SEL in the V direction across the insulating region 212 (FIG. 71). The FD conversion gain switching transistor FDG is disposed next, in the H direction, to the reset transistor RST. The VSS contact region 118 is provided in an island shape in the insulating region 212. For example, the third interconnect layer W3 extends in the H direction (FIG. 74), and the fourth interconnect layer W4 extends in the V direction (FIG. 75).

The imaging apparatus 1 with the second substrate 260 as described above also produces effects similar to the effects described above in the embodiments. The arrangement of the pixel sharing units 539 of the second substrate 260 is not limited to the arrangement described in the embodiments and the present modified example. For example, the semiconductor layer 260S described above in the embodiments and Modified Example 1 may extend in the H direction.

Modified Example 4

Figure 76:
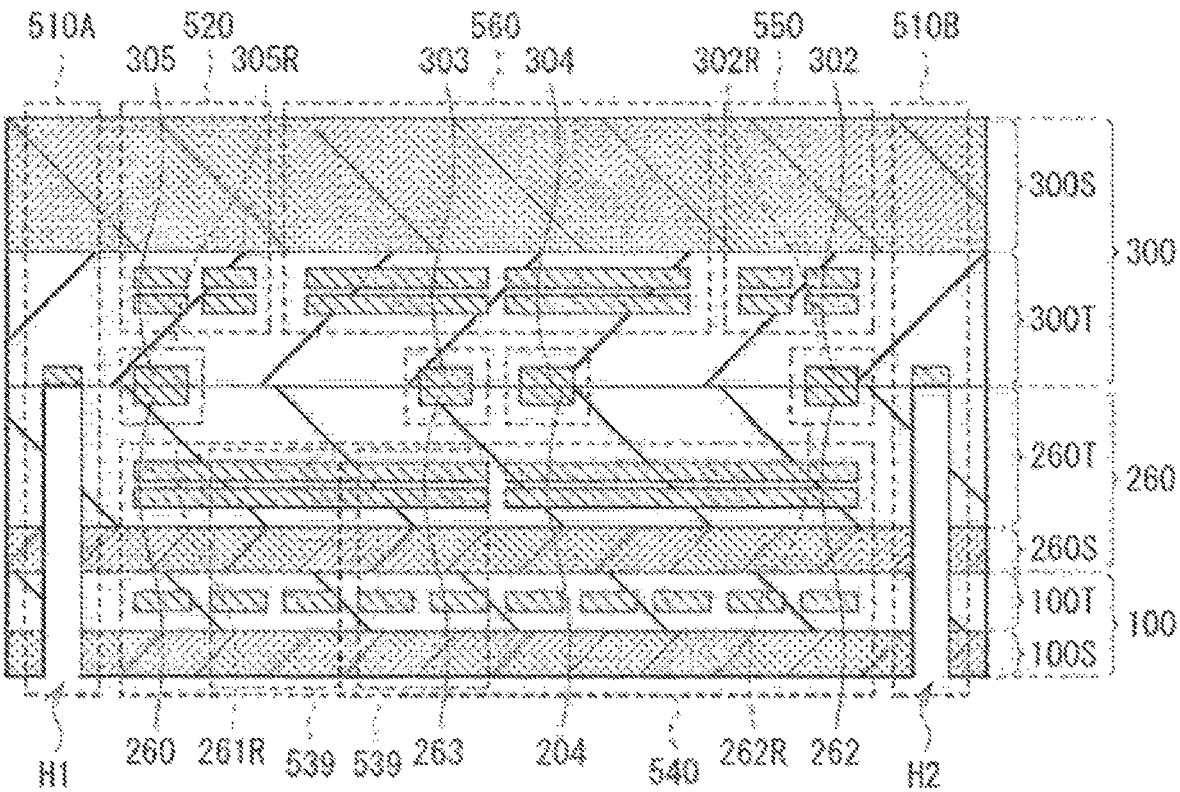
FIG. 76 is a schematic cross-sectional view illustrating another example of the imaging apparatus depicted in FIG. 46.

FIG. 76 schematically illustrates a modified example of a cross-sectional configuration of the imaging apparatus 1 according to the above-described embodiments. FIG. 76 corresponds to FIG. 46 described above in the embodiments. In the present modified example, the imaging apparatus 1 includes contact portions 263, 204, 303, and 304 at a position corresponding to the central portion of the pixel array section 540, in addition to the contact portions 261, 262, 305, and 302. In this regard, the imaging apparatus 1 in the present modified example differs from the imaging apparatus 1 described above in the embodiments.

The contact portions 263 and 204 are provided in the second substrate 260 and exposed at the junction surface between the second substrate 260 and the third substrate 300. The contact portions 303 and 304 are provided in the third substrate 300 and exposed at the junction surface between the third substrate 300 and the second substrate 260. The contact portion 263 is in contact with the contact portion 303, and the contact portion 204 is in contact with the contact portion 304. Specifically, in the imaging apparatus 1, the second substrate 260 and the third substrate 300 are connected by the contact portions 263, 204, 303, and 304 as well as by the contact portions 261, 262, 305, and 302.

Figure 77:
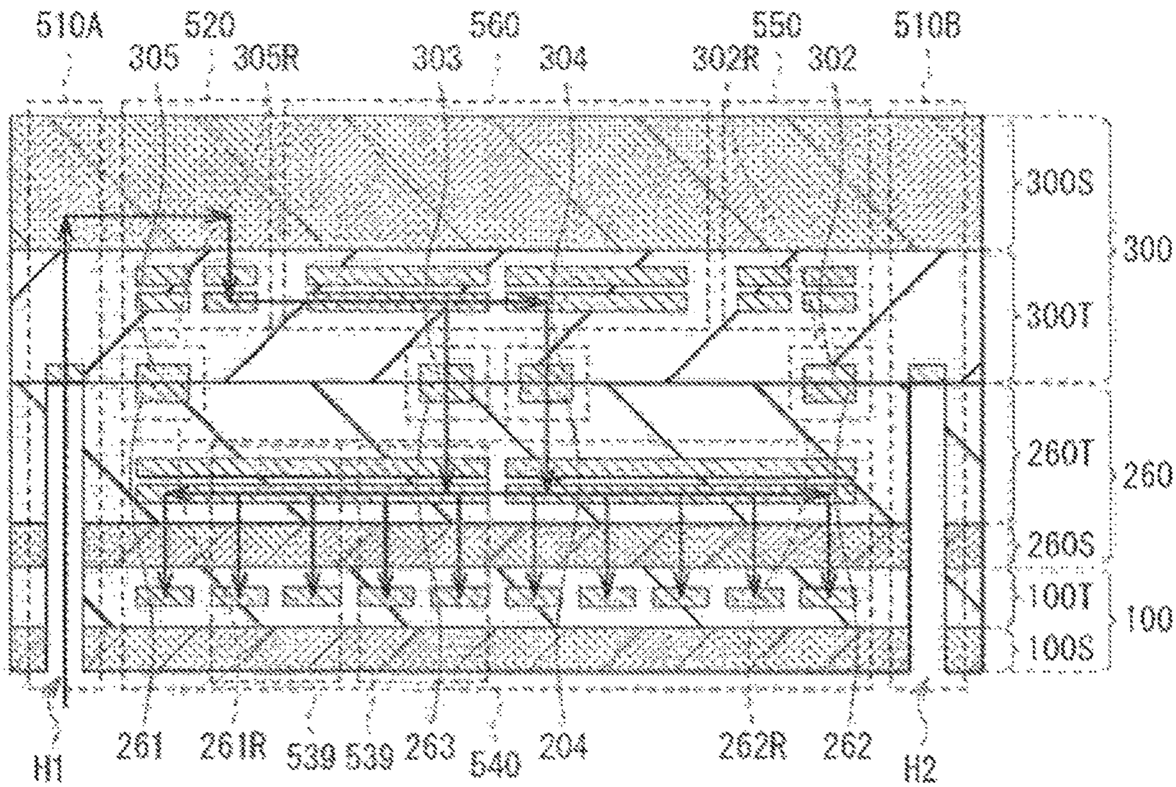
FIG. 77 is a schematic diagram of assistance in describing a path of an input signal to the imaging apparatus depicted in FIG. 76.
Figure 78:
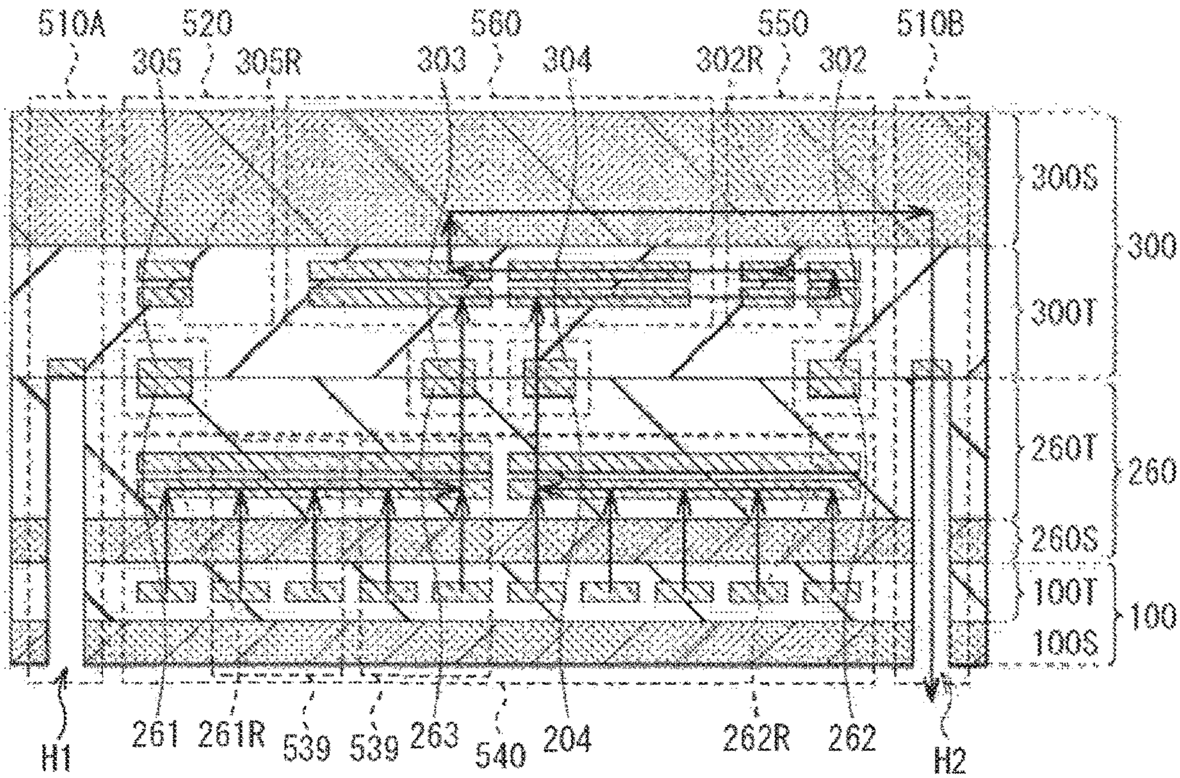
FIG. 78 is a schematic diagram of assistance in describing a signal path of a pixel signal to the imaging apparatus depicted in FIG. 76.

Now, operation of the imaging apparatus 1 will be described using FIG. 77 and FIG. 78. FIG. 77 illustrates, by arrows, input signals externally input to the imaging apparatus 1 and paths of the power supply potential and the reference potential. FIG. 78 illustrates, by arrows, signal paths of pixel signals output from the imaging apparatus 1 to the outside. For example, an input signal input to the imaging apparatus 1 via the input section 510A is transmitted to the row driving section 520 of the third substrate 300, which creates row driving signals. The row driving signals are transmitted to the second substrate 260 via the contact portions 303 and 263. Further, the row driving signals reach the respective pixel sharing units 539 of the pixel array section 540 via the row driving signal lines 542 in the interconnect layer 260T. For the row driving signals having reached the respective pixel sharing units 539 of the second substrate 260, the driving signals other than those for the transfer gates TG are input to the pixel circuit 210 to drive the transistors included in the pixel circuit 210. The driving signals for the transfer gates TG are input to the transfer gates TG1, TG2, TG3, and TG4 of the first substrate 100 via the through electrodes TGV, to drive the pixels 541A, 541B, 541C, and 541D. Additionally, the power supply potential and the reference potential supplied to the input section 510A (input terminal 511) of the third substrate 300 from outside of the imaging apparatus 1 are transmitted to the second substrate 260 via the contact portions 303 and 263 and supplied to the pixel circuits 210 of the respective pixel sharing unit 539 via the interconnects in the interconnect layer 260T. The reference potential is further supplied to the pixels 541A, 541B, 541C, and 541D of the first substrate 100 via the through electrodes 125E. On the other hand, pixel signals subjected to photoelectric conversion by the pixels 541A, 541B, 541C, and 541D of the first substrate 100 are transmitted to the pixel circuits 210 of the second substrate 260 for each pixel sharing unit 539. Pixel signals based on the pixel signals are transmitted from the pixel circuits 210 to the third substrate 300 via the vertical signal lines 543 and the contact portions 204 and 304. The pixel signals are processed by the column signal processing section 550 and image signal processing section 560 of the third substrate 300 and then output to the outside via the output section 510B.

The imaging apparatus 1 with the contact portions 263, 204, 303, and 304 as described above also produces effects similar to the effects described above in the embodiments. The positions, the number, and the like of contact portions can be changed depending on the design of, for example, the circuit of the third substrate 300, to which the interconnects are connected via the contact portions 303 and 304.

Modified Example 5

Figure 79:
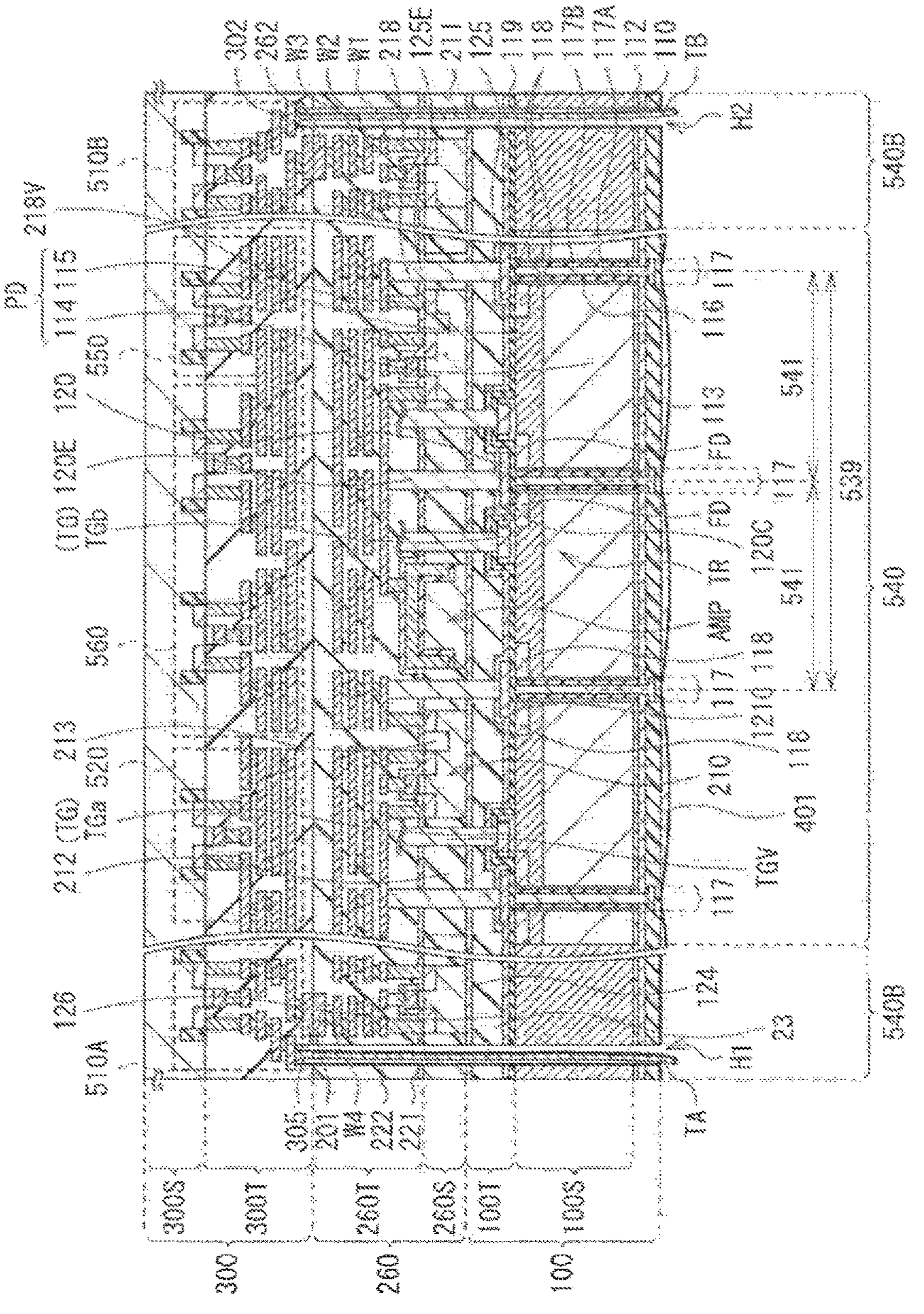
FIG. 79 is a schematic cross-sectional view illustrating another example of the imaging apparatus depicted in FIG. 49.

FIG. 79 illustrates a modified example of a cross-sectional configuration of the imaging apparatus 1 according to the above-described embodiments. FIG. 79 corresponds to FIG. 49 described above in the embodiments. In the present modified example, a transfer transistor TR with a planar structure is provided in the first substrate 100. In this regard, the imaging apparatus 1 in the present modified example differs from the imaging apparatus 1 described above in the embodiments.

In the transfer transistor TR, the transfer gate TG includes only the horizontal portion TGb. In other words, the transfer gate TG includes no vertical portion TGa and is provided facing the semiconductor layer 100S.

The imaging apparatus 1 with the transfer transistor TR with the planar structure as described above also produces effects similar to the effects described in the above-described embodiment. Further, compared to the vertical transfer gate TG provided in the first substrate 100, the planar transfer gate TG provided in the first substrate 100 may allow the photodiode PD to be formed to extend closer to the front surface of the semiconductor layer 100S, thus increasing the amount of saturated signals (Qs). Additionally, compared to the method in which the vertical transfer gate TG is formed in the first substrate 100, the method in which the planar transfer gate TG is formed in the first substrate 100 may involve fewer manufacturing steps and may be less likely to cause adverse effects to the photodiode PD owing to the manufacturing steps.

Modified Example 6

Figure 80:
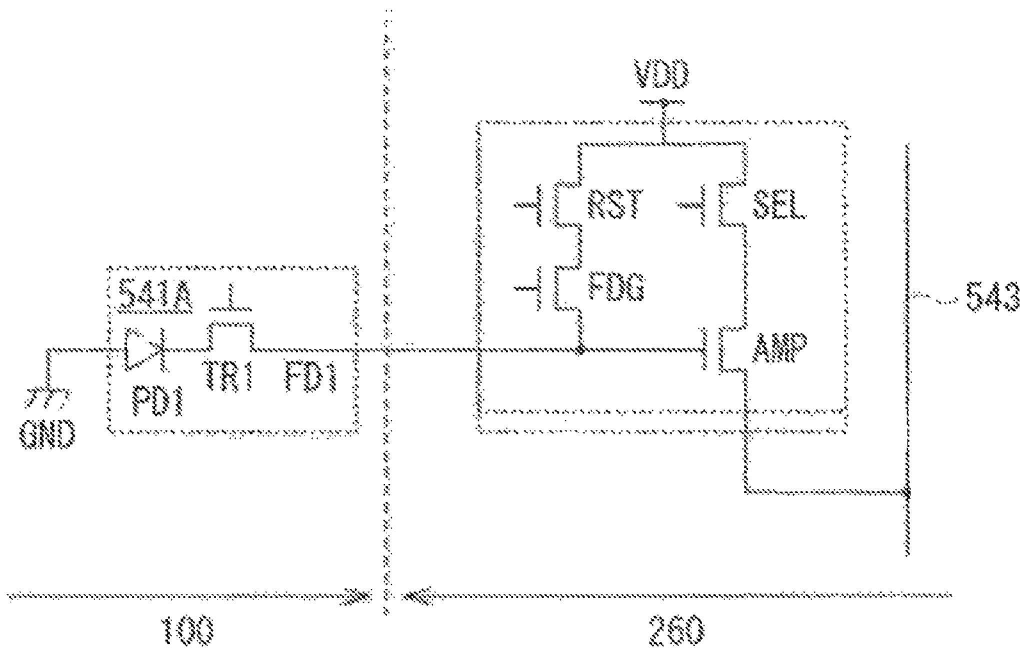
FIG. 80 is a diagram illustrating another example of an equivalent circuit depicted in FIG. 4.

FIG. 80 is a modified example of a pixel circuit in the imaging apparatus 1 according to the above-described embodiments. FIG. 80 corresponds to FIG. 47 described above in the embodiments. In the present modified example, the pixel circuit 210 is provided in each pixel (pixel 541A). Specifically, the pixel circuit 210 is not shared by a plurality of pixels. In this regard, the imaging apparatus 1 in the present modified example differs from the imaging apparatus 1 described above in the embodiments.

The imaging apparatus 1 in the present modified example is the same as the imaging apparatus 1 described in the above-described embodiments in that the pixel 541A and the pixel circuit 210 are provided in different substrates (first substrate 100 and second substrate 260). Thus, the imaging apparatus 1 in the present modified example can also produce effects similar to the effects of the above-described embodiments.

Modified Example 7

Figure 81:
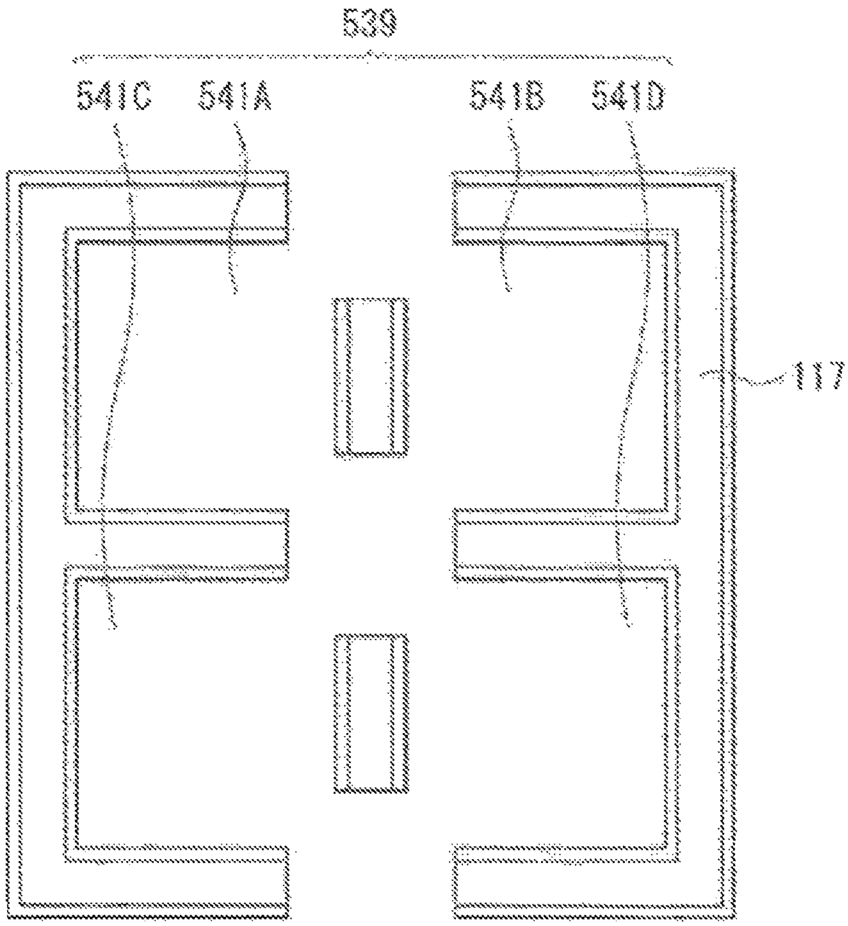

FIG. 81 illustrates a modified example of a planar configuration of the pixel isolation section 117 described above in the embodiments. Gaps may be formed in the pixel isolation section 117 enclosing each of the pixels 541A, 541B, 541C, and 541D. Specifically, not the entire perimeter of the pixels 541A, 541B, 541C, and 541D needs to be enclosed by the pixel isolation section 117. For example, the gap in the pixel isolation section 117 may be formed in the vicinity of the pad portions 120 and 125 (see FIG. 51).

In the above-described embodiments, the example in which the pixel isolation section 117 has an FTI structure in which the pixel isolation section 117 penetrates the semiconductor layer 100S (see FIG. 49) has been described. However, the pixel isolation section 117 may have a configuration other than the FTI structure. For example, the pixel isolation section 117 need not be provided to completely penetrate the semiconductor layer 100S and may have what is generally called a DTI (Deep Trench Isolation) structure.

Applied Example

Figure 82:
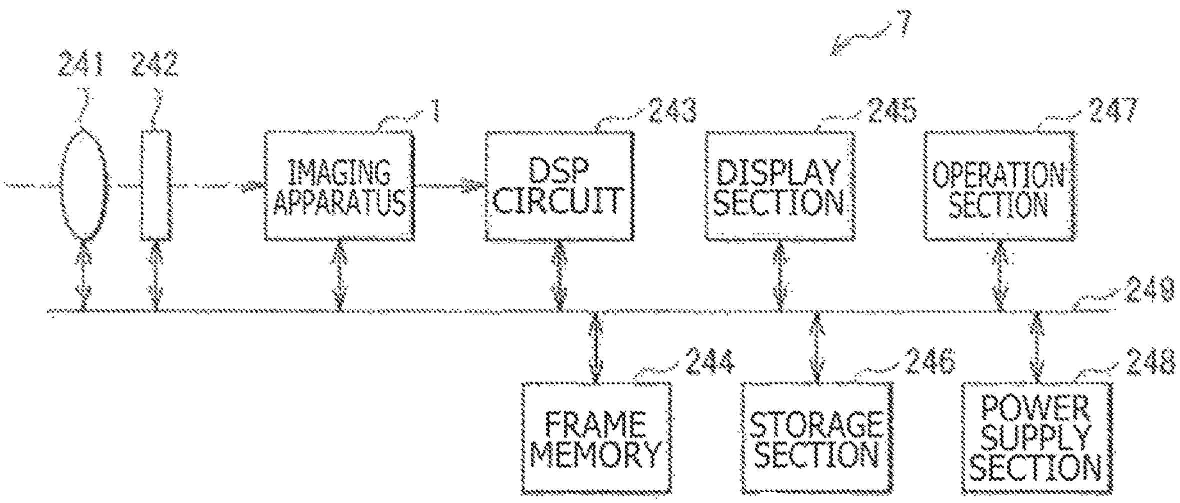
FIG. 82 is a diagram illustrating an example of a general configuration of an imaging system including an imaging apparatus according to the embodiments and the modified examples described above.

FIG. 82 illustrates an example of a general configuration of an imaging system 7 including the imaging apparatus 1 according to the above-described embodiments and the modified examples of the embodiments.

The imaging system 7 is, for example, an imaging apparatus such as a digital still camera or a video camera, or electronic equipment such as a portable terminal apparatus, for example, a smartphone or a tablet terminal. The imaging system 7 includes, for example, the imaging apparatus 1 according to the above-described embodiments and the modified examples of the embodiments, a DSP circuit 243, a frame memory 244, a display section 245, a storage section 246, an operation section 247, and a power supply section 248. In the imaging system 7, the imaging apparatus 1 according to the above-described embodiments and the modified examples of the embodiments, the DSP circuit 243, the frame memory 244, the display section 245, the storage section 246, the operation section 247, and the power supply section 248 are connected together via a bus line 249.

The imaging apparatus 1 according to the above-described embodiments and the modified examples of the embodiments outputs image data corresponding to incident light. The DSP circuit 243 is a signal processing circuit processing a signal (image data) output from the imaging apparatus 1 according to the above-described embodiments and the modified examples of the embodiments. The frame memory 244 temporarily holds, in units of frames, the image data processed by the DSP circuit 243. The display section 245 includes, for example, a panel display device such as a liquid crystal panel or an organic EL (Electro Luminescence), and displays moving images or still images captured by the imaging apparatus 1 according to the above-described embodiments and the modified examples of the embodiments. The storage section 246 records, in a recording medium such as a semiconductor memory or a hard disk, image data of the moving images or still images captured by the imaging apparatus 1 according to the above-described embodiments and the modified examples of the embodiments. The operation section 247 issues operation commands for various functions of the imaging system 7 according to the operation by a user. The power supply section 248 provides various power supplies used as operating power supplies for the imaging apparatus 1 according to the above-described embodiments and the modified examples of the embodiments, the DSP circuit 243, the frame memory 244, the display section 245, the storage section 246, and the operation section 247, to these supply targets as appropriate.

Now, an imaging procedure in the imaging system 7 will be described.

Figure 83:
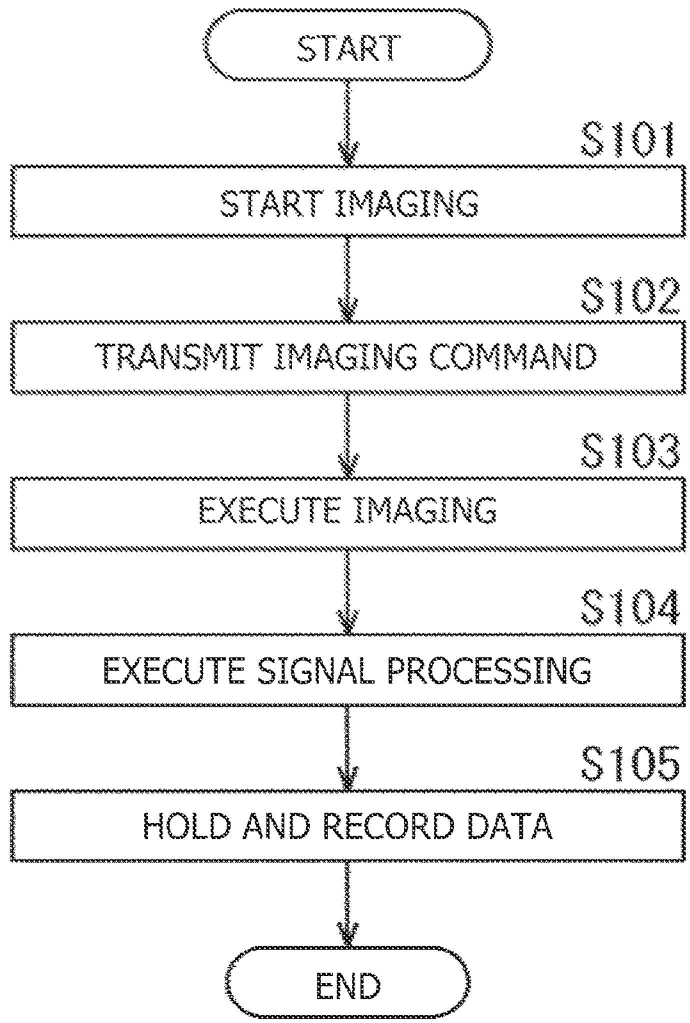
FIG. 83 is a diagram illustrating an example of an imaging procedure of the imaging system depicted in FIG. 82.

FIG. 83 illustrates an example of a flowchart of an imaging operation in the imaging system 7. The user operates the operation section 247 to give an instruction on start of imaging (step S101). Then, the operation section 247 transmits an imaging command to the imaging apparatus 1 (step S102). The imaging apparatus 1 (specifically, a system control circuit 36) receives the imaging command and then performs imaging in accordance with a predetermined imaging scheme (step S103).

The imaging apparatus 1 outputs, to the DSP circuit 243, image data resulting from the imaging. Here, the image data is data for all pixels in pixel signals generated on the basis of charge temporarily held in the floating diffusion FD. The DSP circuit 243 executes predetermined signal processing (for example, noise reduction processing and the like) on the basis of image data input from the imaging apparatus 1 (step S104). The DSP circuit 243 causes the frame memory 244 to hold the image data subjected to the predetermined signal processing, and the frame memory 244 causes the storage section 246 to store the image data (step S105). In the above-described manner, the imaging system 7 performs imaging.

In the present applied example, the imaging apparatus 1 according to the above-described embodiments and the modified examples of the embodiments is applied to the imaging system 7. This enables a reduction in the size of the imaging apparatus 1 or an increase in definition for the imaging apparatus 1, thus allowing provision of a small or high-definition imaging system 7.

<Example of Application to Endoscopic Surgery System>

Further, the technology according to the present disclosure (present technology) may be applied to an endoscopic surgery system.

Figure 84:
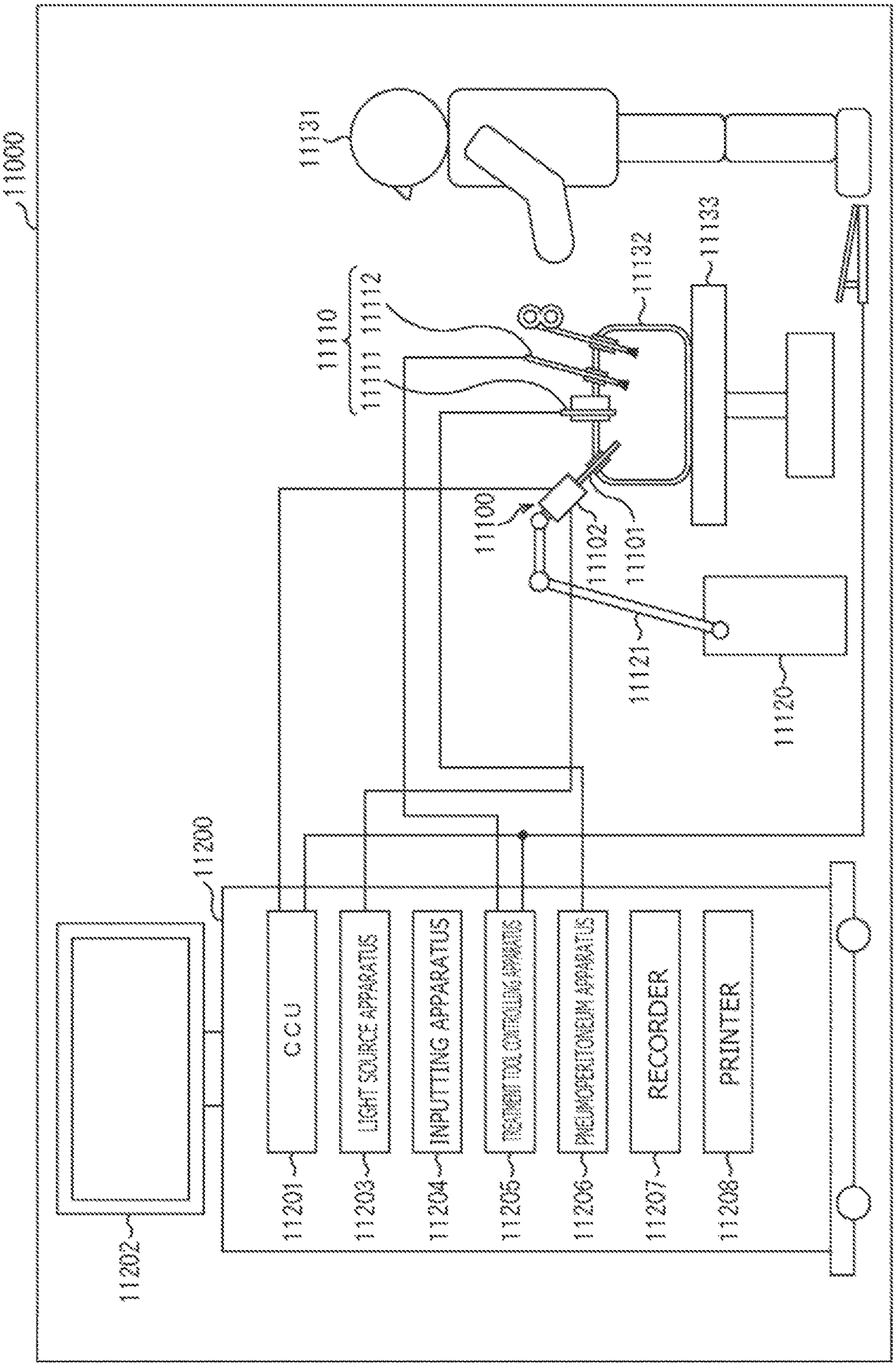
FIG. 84 is a view depicting an example of a schematic configuration of an endoscopic surgery system.

FIG. 84 is a view depicting an example of a schematic configuration of an endoscopic surgery system to which the technology according to an embodiment of the present disclosure (present technology) can be applied.

In FIG. 84, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 85:
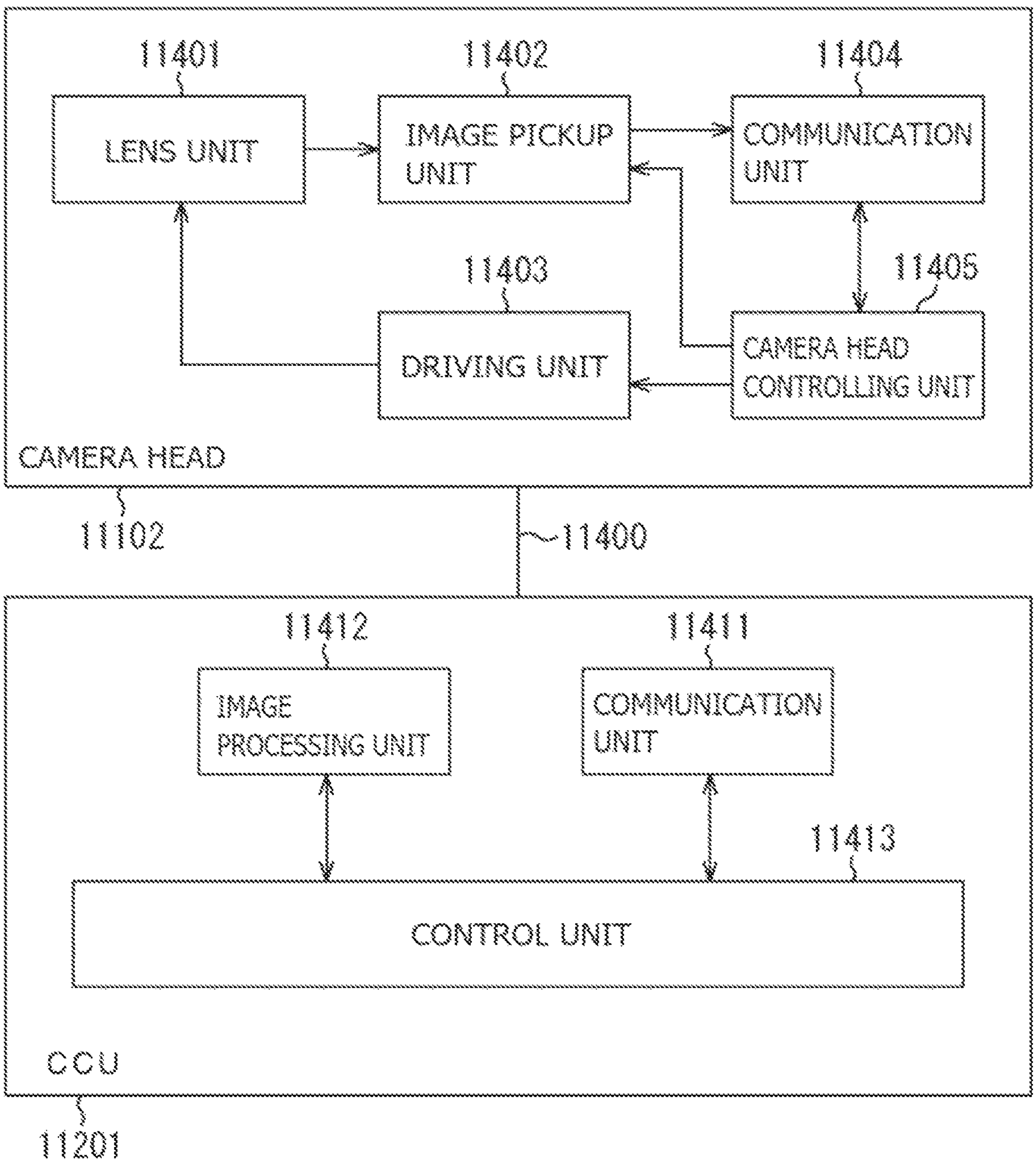
FIG. 85 is a block diagram depicting an example of a functional configuration of a camera head and a camera control unit (CCU).

FIG. 85 is a block diagram depicting an example of a functional configuration of the camera head 11102 and the CCU 11201 depicted in FIG. 84.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405.

Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Note that the endoscopic surgery system has been described as an example but the technology according to the present disclosure may be applied to any other surgery system, for example, a microscopic surgery system or the like.

<Example of Application to Mobile Body>

Additionally, for example, the technology according to the present disclosure may be implemented as an apparatus mounted in any type of mobile body such as an automobile, an electric vehicle, a hybrid electric vehicle, a motor cycle, a bicycle, a personal mobility apparatus, an airplane, a drone, a ship, or a robot.

Figure 86:
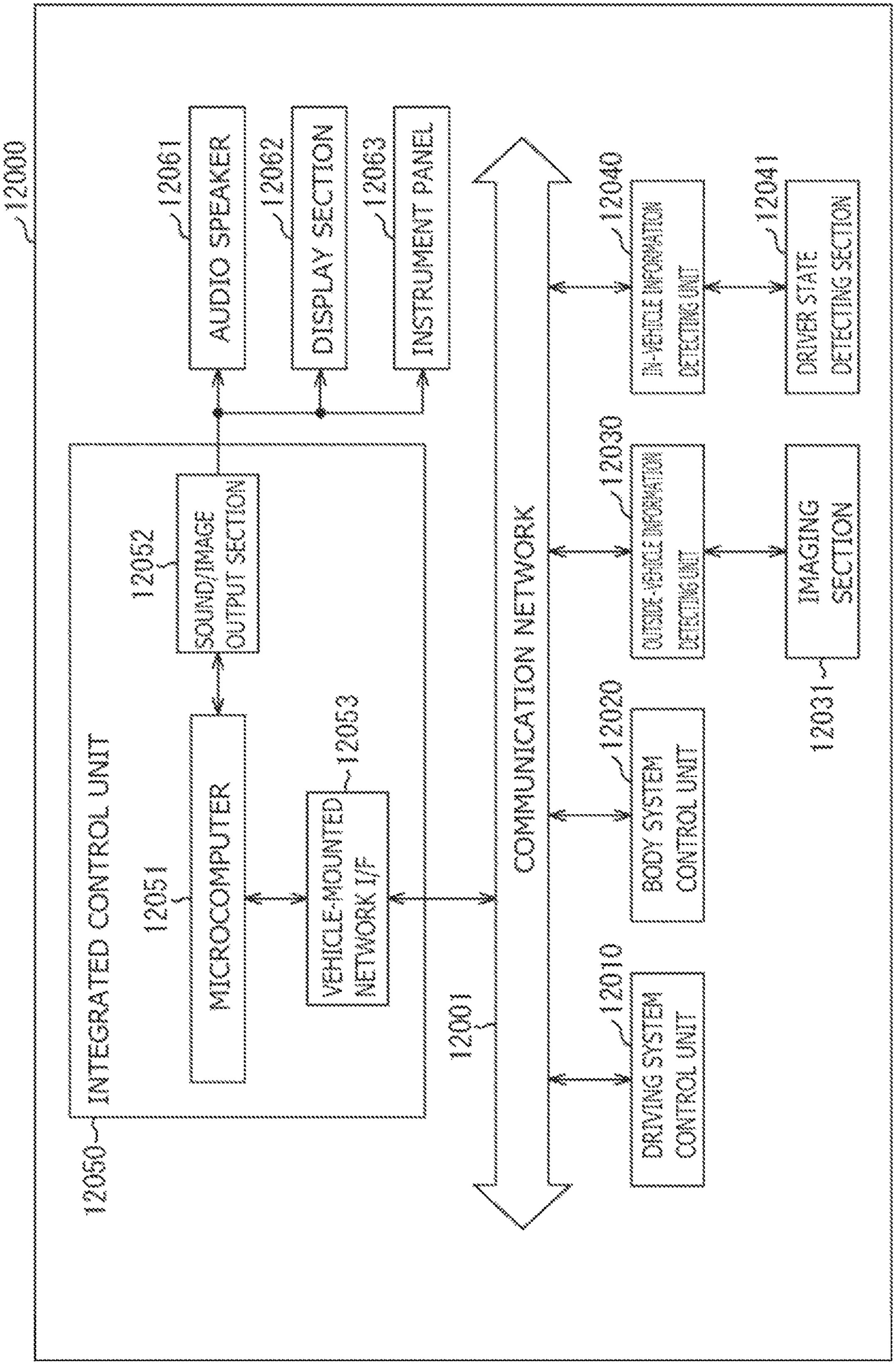
FIG. 86 is a block diagram depicting an example of schematic configuration of a vehicle control system.

FIG. 86 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 86, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 86, an audio speaker 12061, a display section 12062, and an instrument panel 12063 are illustrated as the output device. The display section 12062 may, for example, include at least one of an on-board display and a head-up display.

Figure 87:
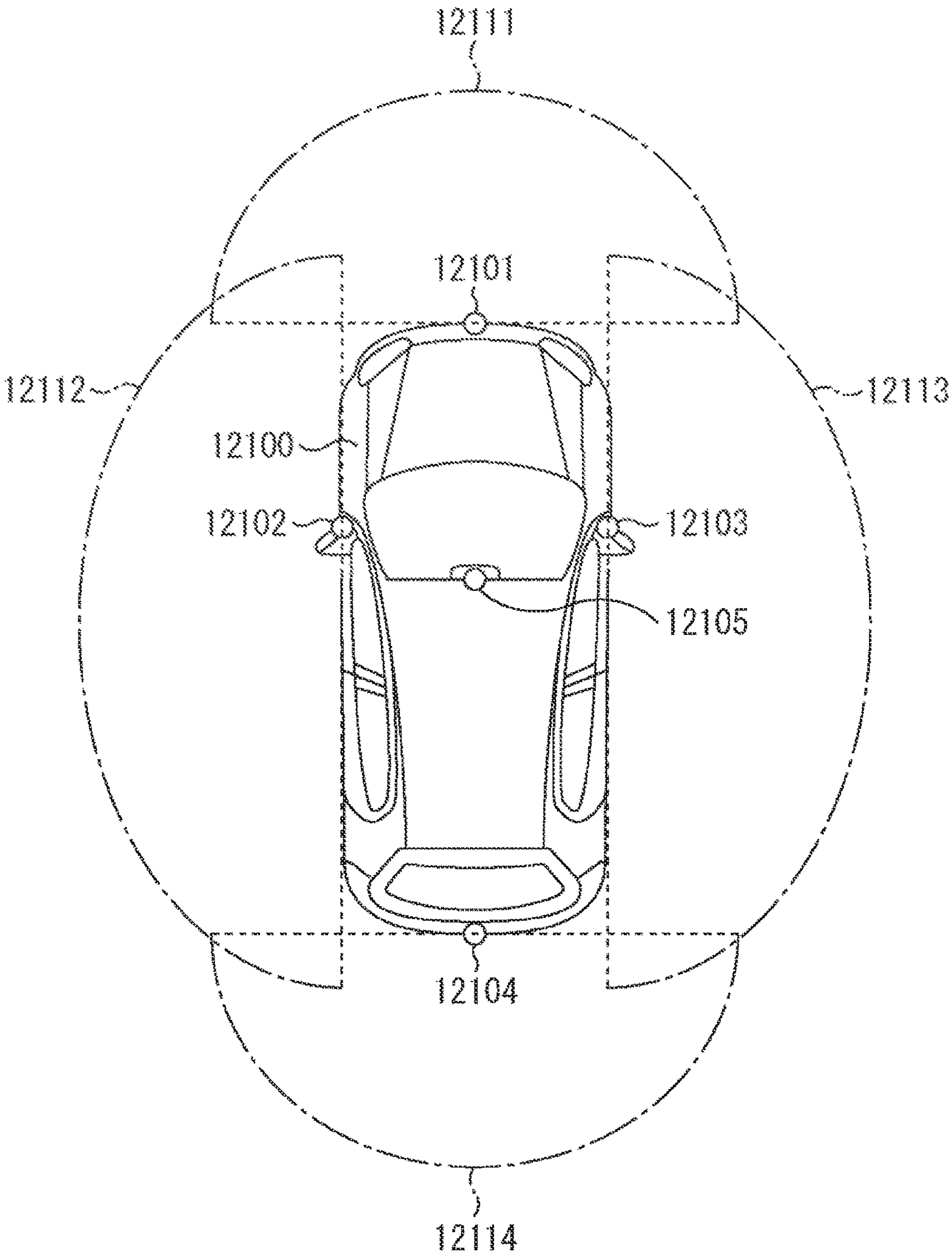
FIG. 87 is a diagram of assistance in explaining an example of installation positions of an outside-vehicle information detecting section and an imaging section.

FIG. 87 is a diagram depicting an example of the installation position of the imaging section 12031.

In FIG. 87, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 87 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Note that the embodiments of the present technology are not limited to the embodiments described above and various changes can be made to the embodiments without departing from the spirit of the present technology.

The present technology can also take the following configurations.

(1)

An imaging element including:
- a substrate;
- a first photoelectric conversion region provided in the substrate;
- a second photoelectric conversion region provided in the substrate, the second photoelectric conversion region being adjacent to the first photoelectric conversion region;
- a pixel isolation section provided in the substrate and between the first photoelectric conversion region and the second photoelectric conversion region; and
- a junction region provided in a side wall of the pixel isolation section, the junction region including a first impurity region including first impurities and a second impurity region including second impurities,
- in which a length of a side of the first impurity region formed in the side wall of the pixel isolation section, the side perpendicularly intersecting two parallel sides of four sides of the pixel isolation section enclosing the first photoelectric conversion region, is larger than a length between the two parallel sides of the pixel isolation section.

(2)

The imaging element according to (1) described above, in which, when the length between the two parallel sides of the pixel isolation section is used as a reference, the length of the side of the first impurity region is at least 1.3 times as large as the length between the two parallel sides of the pixel isolation section.

(3)

The imaging element according to (1) or (2) described above, in which the first impurity region includes protruding portions on the second impurity region side.

(4)

The imaging element according to any one of (1) to (3) described above, in which the pixel isolation section includes protruding portions.

(5)

The imaging element according to (3) or (4) described above, in which each of the protruding portions is formed in a rectangular shape.

(6)

The imaging element according to (3) or (4) described above, in which each of the protruding portions is formed in a triangular shape.

(7)

The imaging element according to any one of (1) or (6) described above, in which a junction surface between the first impurity region and the second impurity region is shaped to include recesses and protrusions.

(8)

The imaging element according to any one of (1) or (7) described above, in which a wall surface of the pixel isolation section is shaped to include recesses and protrusions.

(9)

The imaging element according to any one of (1) or (8) described above, further including:

the junction region in at least one of four corners of the first photoelectric conversion region.

(10)

The imaging element according to any one of (1) to (9) described above, further including:

the pixel isolation section shaped like a cross; and the junction region on a side surface of the pixel isolation section shaped like a cross.

(11)

The imaging element according to any one of (1) to (10) described above, in which the pixel isolation section partly includes a discontinued portion, and the first impurity region in the discontinued portion is formed in a curved shape.

(12)

The imaging element according to (11) described above, in which a plurality of the discontinued portions are provided on one side.

(13)

The imaging element according to any one of (1) to (12) described above, in which the first impurities are N-type impurities and the second impurities are P-type impurities, or the first impurities are P-type impurities and the second impurities are N-type impurities.

(14)

The imaging element according to any one of (1) to (13) described above, in which the pixel isolation section includes protruding portions, and a tip of each of the protruding portions faces a gate of a transfer transistor.

(15)

The imaging element according to any one of (1) to (6), (13), and (14) described above, in which the pixel isolation section includes the protruding portions, and each of the protruding portions is formed not to penetrate the substrate.

(14)

Electronic equipment equipped with an imaging element, the imaging element including:

a substrate;

a first photoelectric conversion region provided in the substrate;

a second photoelectric conversion region provided in the substrate, the second photoelectric conversion region being adjacent to the first photoelectric conversion region;

a pixel isolation section provided in the substrate and between the first photoelectric conversion region and the second photoelectric conversion region; and a junction region provided in a side wall of the pixel isolation section, the junction region including a first impurity region including first impurities and a second impurity region including second impurities, in which a length of a side of the first impurity region formed in the side wall of the pixel isolation section, the side perpendicularly intersecting two parallel sides of four sides of the pixel isolation section enclosing the first photoelectric conversion region, is larger than a length between the two parallel sides of the pixel isolation section.

REFERENCE SIGNS LIST

10: Imaging apparatus
11: Lens group
12: Imaging element
13: DSP circuit
14: Frame memory
15: Display section
16: Recording section
17: Operation system
18: Power supply system
19: Bus line
20: CPU
31: Pixel
33: Vertical signal line
41: Pixel array section
42: Vertical driving section
43: Column processing section
44: Horizontal driving section
45: System control section
46: Pixel driving line
47: Vertical signal line
48: Signal processing section
49: Data storage section
50: Pixel
70: Si substrate
72: P-type region
73: Planarization film
74: Light shielding film
75: Back surface Si interface
77: Active region
79: Interconnect layer
80: Transfer transistor
81: Vertical transistor trench
83: P-type solid phase diffusion layer
84: N-type solid phase diffusion layer
85: Side wall film
86: Filler
92: Reset transistor
93: Amplifying transistor

94: Select transistor
101: Film
121: P-type region
122: N-type region
131: MOS capacitor
151: Well contact portion
152: Contact
153: Cu interconnect
200: Silicon oxide film
201: Insulating film
202: PSG film
203: Impurity region
204: BSG film
205: Resist
206: Impurity region
301: RP film
1: Imaging apparatus
7: Imaging system
100: First substrate
100S, 260S, 300S: Semiconductor layer
100T, 260T, 300T: Interconnect layer
111: Insulating film
112: Fixed charge film
113: First pinning region
114: n-type semiconductor region
115: p well layer
116: Second pinning region
117: Pixel isolation section
117A: Light shielding film
117B: Insulating film
118, 218: VSS contact region
119, 123, 222: Interlayer insulating film
120, 121: Pad portion
120E, 121E: Through electrode
126, 221: Passivation film
124: Junction film
260: Second substrate
261, 262, 263, 204, 305, 302, 303, 304: Contact portion
212: Insulating region
213: Element isolation region
218V: Connection portion
TGV: Through electrode
300: Third substrate
401: Light receiving lens
541A, 541B, 541C, 541D: Pixel
TR: Transfer transistor
TG: Transfer gate
RST: Reset transistor
AMP: Amplifying transistor
SEL: Select transistor
FDG: FD transfer transistor
FD: Floating diffusion

What is claimed is:

1. An imaging element, comprising:
a substrate;
a first photoelectric conversion region provided in the substrate;
a second photoelectric conversion region provided in the substrate, the second photoelectric conversion region being adjacent to the first photoelectric conversion region;
a pixel isolation section provided in the substrate and between the first photoelectric conversion region and the second photoelectric conversion region; and
a junction region provided in a side wall of the pixel isolation section, the junction region including a first impurity region including first impurities and a second impurity region including second impurities,
wherein a length of a side of the first impurity region formed in a side wall of the pixel isolation section, the side perpendicularly intersecting two parallel sides of four sides of the pixel isolation section enclosing the first photoelectric conversion region, is larger than a length between the two parallel sides of the pixel isolation section,
wherein the first impurity region includes protruding portions on the second impurity region side, and
wherein a horizontal portion of the protruding portions has a greater length than a vertical surface of the protruding portions furthest from the pixel isolation section in a plan view.

2. The imaging element according to claim 1, wherein, when the length between the two parallel sides of the pixel isolation section is used as a reference, the length of the side of the first impurity region is at least 1.3 times as large as the length between the two parallel sides of the pixel isolation section.

3. The imaging element according to claim 1, wherein the pixel isolation section includes protruding portions.

4. The imaging element according to claim 1, wherein each of the protruding portions is formed in a rectangular shape.

5. The imaging element according to claim 1, wherein a junction surface between the first impurity region and the second impurity region is shaped to include recesses and protrusions.

6. The imaging element according to claim 1, wherein a wall surface of the pixel isolation section is shaped to include recesses and protrusions.

7. The imaging element according to claim 1, further comprising:
the junction region in at least one of four corners of the first photoelectric conversion region.

8. The imaging element according to claim 1, further comprising:
the pixel isolation section shaped like a cross; and
the junction region on a plurality of side surfaces of the pixel isolation section shaped like a cross.

9. The imaging element according to claim 1, wherein the pixel isolation section partly includes a discontinuous portion, and
the first impurity region in the discontinued portion is formed in a curved shape.

10. The imaging element according to claim 9, wherein a plurality of the discontinuous portions is provided on one side.

11. The imaging element according to claim 1, wherein the first impurities are N-type impurities and the second impurities are P-type impurities, or the first impurities are P-type impurities and the second impurities are N-type impurities.

12. The imaging element according to claim 1, wherein the pixel isolation section includes protruding portions, and
a tip of each of the protruding portions faces a gate of a transfer transistor.

13. The imaging element according to claim 1, wherein the pixel isolation section includes protruding portions, and
each of the protruding portions is formed not to penetrate the substrate.

14. Electronic equipment, comprising:
an imaging element including:
a substrate;

a first photoelectric conversion region provided in the substrate;

a second photoelectric conversion region provided in the substrate, the second photoelectric conversion region being adjacent to the first photoelectric conversion region;

a pixel isolation section provided in the substrate and between the first photoelectric conversion region and the second photoelectric conversion region; and a junction region provided in a side wall of the pixel isolation section, the junction region including a first impurity region including first impurities and a second impurity region including second impurities, wherein a length of a side of the first impurity region formed in a side wall of the pixel isolation section, the side perpendicularly intersecting two parallel sides of four sides of the pixel isolation section enclosing the first photoelectric conversion region, is larger than a length between the two parallel sides of the pixel isolation section, wherein the first impurity region includes protruding portions on the second impurity region side and, wherein a horizontal portion of the protruding portions has a greater length than a vertical surface of the protruding portions furthest from the pixel isolation section in a plan view.

15. The electronic equipment according to claim 14, wherein, when the length between the two parallel sides of the pixel isolation section is used as a reference, the length of the side of the first impurity region is at least 1.3 times as large as the length between the two parallel sides of the pixel isolation section.

16. The electronic equipment according to claim 14, wherein the pixel isolation section includes protruding portions.

17. The electronic equipment according to claim 14, wherein each of the protruding portions is formed in a rectangular shape.

* * * * *